US008866244B2

(12) United States Patent
Nitta

(10) Patent No.: US 8,866,244 B2
(45) Date of Patent: Oct. 21, 2014

(54) SEMICONDUCTOR DEVICE

(75) Inventor: Fumihiko Nitta, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 339 days.

(21) Appl. No.: 13/349,266

(22) Filed: Jan. 12, 2012

(65) Prior Publication Data

US 2012/0199895 A1 Aug. 9, 2012

(30) Foreign Application Priority Data

Feb. 4, 2011 (JP) ................................. 2011-022918

(51) Int. Cl.
| H01L 27/22 | (2006.01) |
| G11C 11/14 | (2006.01) |
| H01L 29/82 | (2006.01) |
| H01L 43/12 | (2006.01) |
| H01L 43/08 | (2006.01) |

(52) U.S. Cl.
CPC ................. *G11C 11/14* (2013.01); *H01L 29/82* (2013.01); *H01L 27/222* (2013.01); *H01L 27/226* (2013.01); *H01L 43/12* (2013.01); *H01L 43/08* (2013.01); *H01L 27/228* (2013.01)
USPC .................. 257/421; 257/295; 257/E21.663; 257/E21.664; 257/E21.665; 257/E27.006; 257/E29.323; 438/3

(58) Field of Classification Search
CPC ... H01L 27/222; H01L 27/226; H01L 27/228; H01L 43/12; H01L 29/82
USPC ...................................... 438/3; 257/295, 421, 257/E21.663–E21.665, E27.104, E29.323, 257/E27.006
See application file for complete search history.

(56) References Cited

U.S. PATENT DOCUMENTS

| 6,900,490 B2 | 5/2005 | Asao et al. |
| 7,745,894 B2 | 6/2010 | Asao et al. |
| 7,932,572 B2 | 4/2011 | Tsujiuchi |
| 2005/0041456 A1* | 2/2005 | Saito ............................. 365/145 |
| 2006/0120147 A1 | 6/2006 | Peng et al. |
| 2010/0001356 A1* | 1/2010 | Kim ............................. 257/421 |
| 2010/0232210 A1 | 9/2010 | Kajiyama et al. |

FOREIGN PATENT DOCUMENTS

| JP | 2004-296869 A | 10/2004 |
| JP | 2008-130995 A | 6/2008 |
| JP | 2009-194210 A | 8/2009 |
| JP | 2010-219098 A | 9/2010 |

* cited by examiner

*Primary Examiner* — Ermias Woldegeorgis
(74) *Attorney, Agent, or Firm* — McDermott Will & Emery LLP

(57) ABSTRACT

A semiconductor device includes: a spin torque written in-plane magnetization magnetoresistive element, placed over the main surface of a semiconductor substrate, whose magnetization state can be changed according to the direction of a current flow; and a first wiring electrically coupled with the magnetoresistive element and extended toward the direction along the main surface. The aspect ratio of the magnetoresistive element as viewed in a plane is a value other than 1. In a memory cell area where multiple memory cells in which the magnetoresistive element and a switching element are electrically coupled with each other are arranged, the following measure is taken: multiple magnetoresistive elements adjoining to each other in the direction of length of each magnetoresistive element as viewed in a plane are so arranged that they are not on an identical straight line extended in the direction of length.

10 Claims, 110 Drawing Sheets

SEMICONDUCTOR DEVICE

CROSS-REFERENCE TO RELATED APPLICATIONS

The disclosure of Japanese Patent Application No. 2011-22918 filed on Feb. 4, 2011 including the specification, drawings and abstract is incorporated herein by reference in its entirety.

BACKGROUND

The present invention relates to semiconductor devices and more specifically to a semiconductor device having a magnetoresistive element.

As a semiconductor device, such as a semiconductor integrated circuit, for storage, DRAMs (Dynamic Random Access Memories) and SRAMs (Static Random Access Memories) have been conventionally in wide use. Meanwhile, MRAMs (Magnetic Random Access Memories) are a device (magnetoresistive element) that stores information by magnetism and has excellent features as compared with other memory technologies in high-speed operation, rewriting endurance, nonvolatility, and the like.

In conjunction with recent miniaturization of semiconductor integrated circuits, a contrivance may be given to the layout of memory elements in MRAM or the like as viewed in a plane. Specifically, the means disclosed in, for example, Japanese Unexamined Patent Publication No. 2010-219098 (hereafter, referred to as "Patent Document 1") and Japanese Unexamined Patent Publication No. 2008-130995 (hereafter, referred to as "Patent Document 2") are taken. That is, memory elements adjoining to one another in the direction in which wirings are extended are so arranged that they are not placed on identical wirings. Specifically, the straight lines coupling the individual memory elements (magnetoresistive elements) adjoining to one another are extended in a direction oblique to the direction in which wirings are extended. Further integration of magnetoresistive elements is promoted and variation in operating characteristics from recording element to recording element is reduced by adopting this configuration.

There are also the following types of MRAMs: STT (Spin Transfer Torque)-MRAMs and domain-wall-motion MRAMs. In the STT-MRAM, recorded information is written by spin injection using spin torque. In the domain wall motion MRAM, recorded information is written by using spin torque to move a domain wall. The STT-MRAM and the domain wall motion MRAM are spin torque written MRAMs having memory elements in which recorded information is read or written by a current passed through magnetoresistive elements themselves. In the spin torque written MRAM, there is demand to further reduce a current used to read/write information. This is because if this current is increased, it is necessary to increase the size of each switching element (transistor) making up a memory cell and this may incur increase in the plane area of the memory cell.

However, if an information rewriting current is reduced, there is a possibility that the following takes place: for example, when information recorded in another memory cell is read, recorded information in a (unintended) memory cell adjoining to the other memory cell is erroneously rewritten by a current passed at that time. Or, also when an entire integrated circuit is left standing and is not actively operated, there is similarly a possibility that recorded information in a memory cell is unintentionally rewritten by a minute electric current. In MRAMs, as mentioned above, reduction in a current used to read/write information from/to a magnetoresistive element and a characteristic to suppress read/write error in a magnetoresistive element are in the trade-off relation.

To improve this trade-off relation, it is desirable to take the means described in, for example, Japanese Unexamined Patent Publication No. 2004-296869 (hereafter, referred to as "Patent Document 3") and Japanese Unexamined Patent Publication No. 2009-194210 (hereafter, referred to as "Patent Document 4"). That is, to improve the above trade-off relation, it is desirable to set the aspect ratio of each magnetoresistive element as viewed in a plane to a value that is not 1 and largely deviated from 1. That is, each magnetoresistive element is formed in such a shape, for example, an oblong shape or an oval shape, that it is longer in one direction than in another direction orthogonal to the one direction. US Published Application No. 2006/0120147A1 (hereafter, referred to as "Patent Document 5") discloses the following technology: in MRAMs of such a type that information is written by the current-induced magnetic field of a word line, cross talk is reduced by meandering word lines to increase the distance between them and adjoining magnetoresistive elements.

[Patent Document 1]
Japanese Unexamined Patent Publication No. 2010-219098
[Patent Document 2]
Japanese Unexamined Patent Publication No. 2008-130995
[Patent Document 3]
Japanese Unexamined Patent Publication No. 2004-296869
[Patent Document 4]
Japanese Unexamined Patent Publication No. 2009-194210
[Patent Document 5]
US Published Application No. 2006/0120147A1

SUMMARY

However, when each magnetoresistive element is so shaped that its aspect ratio is a value other than 1 as disclosed in Patent Document 3 and Patent Document 4, a problem arises. Especially, when magnetoresistive elements are more densely arranged as described in Patent Document 1 and Patent Document 2, there is a possibility that adjoining magnetoresistive elements are short-circuited to each other. The reason for this is as described below. For example, when adjoining magnetoresistive elements are arranged in a straight line in the direction of length as viewed in a plane, the following takes place: the distance between the end portions of magnetoresistive elements adjoining to each other in the direction of length is very short and there is a possibility that the pair of the end portions are brought into contact with each other. To sufficiently ensure this distance, it is desirable, for example, to increase the area of each memory cell as viewed in a plane without changing the size or planar shape of each magnetoresistive element. This makes it difficult to achieve both the improvement of the above-mentioned trade-off relation and the enhancement of the degree of integration. Patent Document 1 or Patent Document 2 does not describe increase or decrease in the area of each memory cell as viewed in a plane. Though the layout of a semiconductor device whose degree of integration is enhanced by more densely arranging magnetoresistive elements is disclosed, there is a possibility that it dose not lead to the microminiaturization of each element because of the foregoing.

In the MRAM using current-induced magnetic field described in Patent Document 5, writing word lines are indispensable. Unlike the spin torque written MRAM, it is necessary to increase the size of each magnetoresistive element to reduce a rewriting current in the MRAM using current-induced magnetic field. Therefore, to improve the above-mentioned trade-off relation in the MRAM using current-induced magnetic field, it is necessary to increase the area and volume of each magnetoresistive element. In addition, when the meandering word line described in Patent Document 5 is applied to the MRAM using current-induced magnetic field, the size of each memory cell as viewed in a plane is further increased as compared with ordinary MRAMs in which word lines are linearly extended. For this reason, in the MRAM using current-induced magnetic field, it is difficult to achieve both the improvement of the above-mentioned trade-off and the enhancement of the degree of integration.

The invention has been made in consideration of the above problems. It is an object thereof to provide a semiconductor device having an integrated circuit in which it is possible to reduce the value of current used to read and write information from and to each magnetoresistive element without increasing the area of each memory cell as viewed in a plane and reduce read/write errors and short-circuiting between magnetoresistive elements is suppressed.

A semiconductor device in a working example of the invention has the configuration described below. The semiconductor device includes: a semiconductor substrate having a main surface; a switching element having a source region and a drain region, placed over the main surface of the semiconductor substrate; a flat plate-like lead-out wiring placed above the switching element; a spin torque written, in-plane magnetization magnetoresistive element that is positioned above the lead-out wiring and whose magnetization state can be varied according to the direction of a current flow; and a first wiring electrically coupled with the magnetoresistive element and extended in the direction along the main surface. The aspect ratio of the above magnetoresistive element as viewed in a plane is a value other than 1. In a memory cell area where multiple memory cells in which the magnetoresistive element and the switching element are electrically coupled with each other are arranged, the following measure is taken: in a first direction, or the direction of the length of the magnetoresistive element as viewed in a plane, multiple adjoining magnetoresistive elements are so arranged that they are not placed on an identical straight line extended along the first direction.

A semiconductor device in another working example of the invention has the configuration described below. The semiconductor device includes: a semiconductor substrate having a main surface; a switching element placed over the main surface of the semiconductor substrate; a spin torque written, domain wall motion magnetoresistive element positioned above the switching element and having a domain wall motion layer that is extended in the direction along the main surface and whose magnetization state can be varied according to the direction of a current flow and a magnetization pinned layer placed over the domain wall motion layer with a tunnel insulating layer in between; and a first wiring electrically coupled with the domain wall motion layer and extended in the direction along the main surface. The aspect ratio of the above magnetoresistive element as viewed in a plane is a value other than 1. In a memory cell area where multiple memory cells in which the magnetoresistive element and the switching element are electrically coupled with each other are arranged, the following measure is taken: in a first direction, or the direction of the length of the magnetoresistive element as viewed in a plane, multiple adjoining magnetoresistive elements are so arranged that they are not placed on an identical straight line extended in the first direction.

In the semiconductor devices in the working example and the other working example of the invention, the difference between the following distances can be reduced: the distance in the direction of length between long magnetoresistive elements whose aspect ratio is not 1 as viewed in a plane and the distance between them in the direction orthogonal to the direction of length. This facilitates processing of the end portions of magnetoresistive elements in the direction of length as viewed in a plane and it is possible to suppress short-circuiting between the end portions of a pair of adjoining magnetoresistive elements in the direction of length. Further, it is possible to provide a semiconductor device having an integrated circuit in which it is possible to reduce the value of a current used to read and write information from and to a magnetoresistive element and suppress read/write errors without increasing the area of each memory cell as viewed in a plane.

DETAILED DESCRIPTION

Hereafter, description will be given to embodiments of the invention with reference to the drawings.

First Embodiment

First, description will be given to a semiconductor device in the form of chip in this embodiment with reference to FIG. 1.

Figure 1:
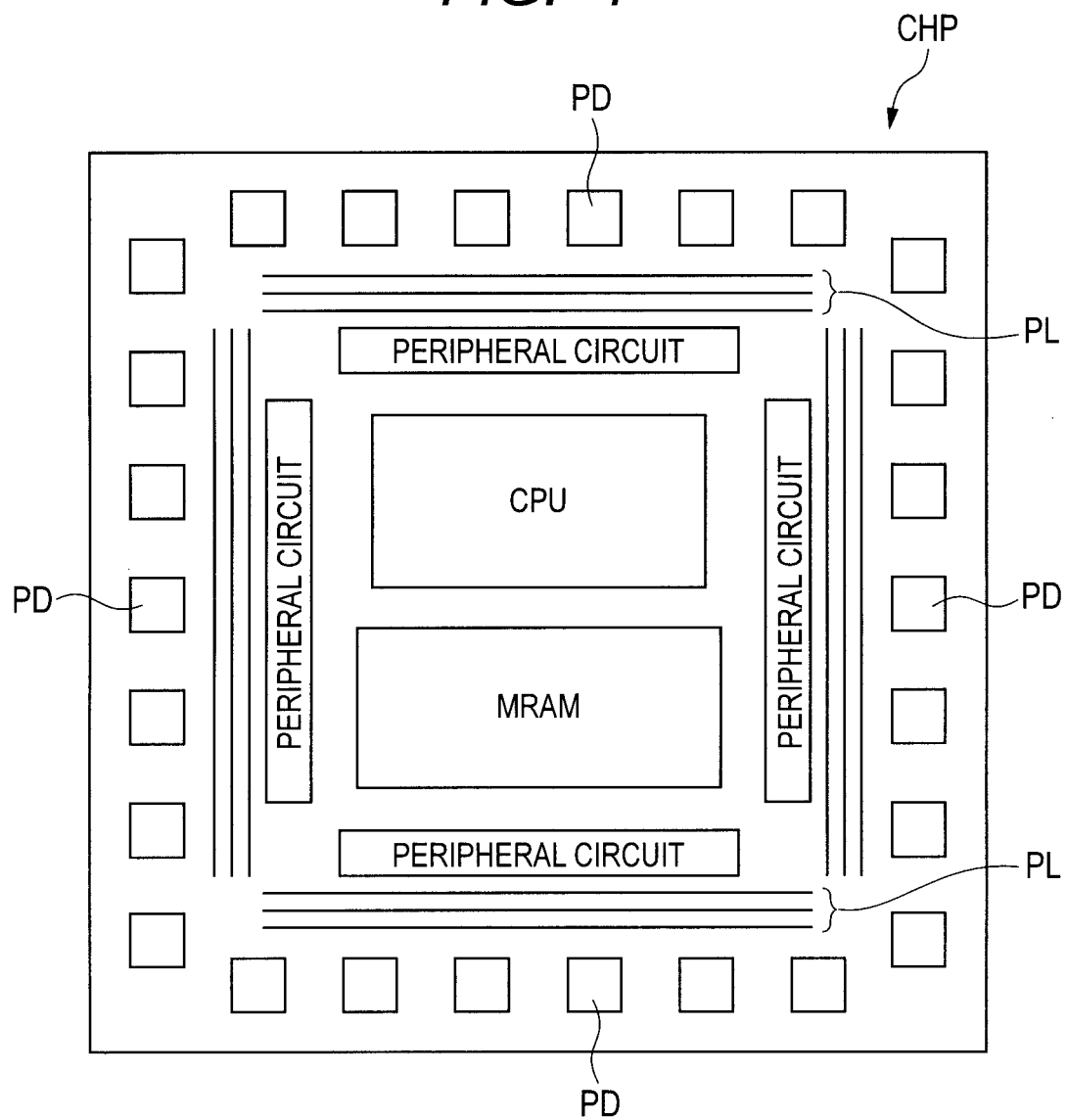
FIG. 1 is a plan view of an entire semiconductor device in a first embodiment of the invention.

As illustrated in FIG. 1, the semiconductor chip CHP in this embodiment includes CPU (Central Processing Unit), MRAM, peripheral circuits, and power lines PL. Pads PD are placed in the peripheral area of the semiconductor chip CHP.

The CPU is a circuit also referred to as central processing unit and reads instructions from a storage device, interprets them, and carries out varied computation and control based thereon. For this reason, high-speed processing is required of the CPU.

The MRAM is an element from and to which memory information can be read and written in a random manner utilizing magnetism. The MRAM has not only a function as a nonvolatile memory in which memory information is held even after the power supply is turned off but also has a high-speed random access function. The MRAM includes: a memory cell (magnetoresistive element); a circuit for writing information to the memory devices and reading information from the memory devices; a selection transistor for selecting a device from or to which information should be read or written from among multiple arranged memory devices; and the like.

The peripheral circuits are circuits for configuring the system of the semiconductor device together with the CPU and the MRAM and are made up of, for example, a power supply circuit, a clock circuit, a reset circuit, and the like. The peripheral circuits include digital circuits that process digital signals and analog circuits that process analog signals. The analog circuits are circuits that handle signals of voltage, current, and the like continuously varying with time, that is, analog signals. They are made up of, for example, an amplification circuit, a conversion circuit, a modulation circuit, an oscillation circuit, a power supply circuit, and the like.

The power lines PL are lines for supplying voltage for operating the CPU, MRAM, and peripheral circuits and are made up of a power supply line and a ground line. The CPU, MRAM, and peripheral circuits are coupled with power lines and can operate by power supplied through the power lines.

The pads PD are external connection terminals for input/output between the semiconductor chip CHP and external equipment (circuit) coupled thereto. Input signals are inputted to the CPU or the like formed in the semiconductor chip CHP through the pads PD. Output signals from the CPU are outputted to external equipment (circuit) coupled to the semiconductor chip CHP through the pads PD.

Description will be given to the configuration of the area (memory cell area) where memory cells having a magnetoresistive element are formed in FIG. 1 with reference to FIG. 2 to FIG. 12.

Figure 2:
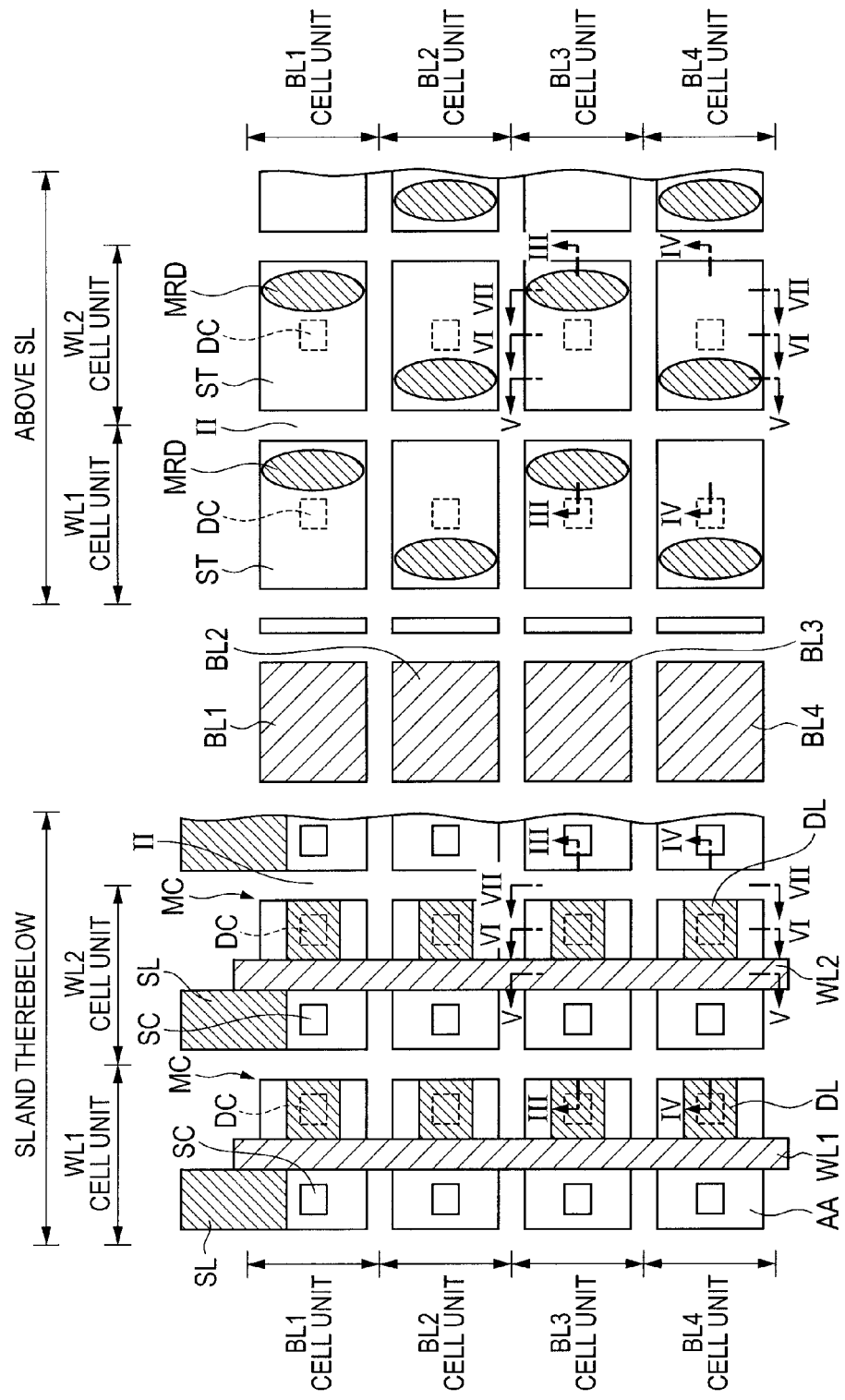
FIG. 2 is a plan view illustrating in detail the configuration of, especially, a memory cell area in the area where MRAM is formed in FIG. 1.

As illustrated in FIG. 2, as each magnetoresistive element MRD formed in the memory cell area in this embodiment, there can be exemplified a STT-MRAM that is a spin injection MRAM in which information is written by spin injection using spin torque. In a circuit composed of STT-MRAM, in general, the multiple memory cells MC of the MRAM are arranged in a matrix with n rows in the horizontal direction and m columns in the vertical direction. That is, the MRAM makes up a memory cell array made up of multiple memory cells MC arranged in an array.

Word lines WL1 to WLn (word lines WL1, WL2 in FIG. 2: third wiring) and source lines SL1 to SLn (multiple source lines SL in FIG. 2: second wiring) are arranged along the columns of the memory cell array. The word lines and the source lines are so arranged that they are extended in parallel with each other. Bit lines BL1 to BLm (bit lines BL1, BL2, BL3, BL4 in FIG. 2: first wiring) are arranged in parallel with one another so that they are extended in the horizontal direction of the memory cell array. Though not shown in the drawing, the word lines are electrically coupled with a word line driver band and the source lines are electrically coupled with a circuit for reading information. The bit lines are electrically coupled with a circuit for writing information.

Under "SL AND THEREBELOW" on the left of FIG. 2, the configuration of source lines SL and the layers closer to the semiconductor substrate, described later, than the source lines SL are is shown. That is, an active region AA of the semiconductor substrate, a word line WL1, and the like are formed in the layers located below the source lines SL. In addition, a source contact SC that electrically couples together the switching element described later and a source line SL, a drain contact DC that couples together a drain region DR and any other region, and the like are placed. The multiple active regions AA are separated from one another by a trench groove TR formed of, for example, an insulating film.

Under "ABOVE SL" on the right of FIG. 2, the configuration of the layers above the source lines SL farther from the semiconductor substrate described later than the source lines SL are is shown. That is, in the layers above the source lines SL, a strap wiring ST (lead-out wiring) as a bottom electrode, a magnetoresistive element MRD, a drain contact DC, a bit line BL1, and the like are so arranged that they are electrically coupled with one another.

The bit line BL1 and the like are actually arranged so that they are extended in the horizontal direction throughout the area located above the SLs in FIG. 2. In FIG. 2, however, they are independently shown at the central part for facilitating visualization. Therefore, "SL AND THEREBELOW" and "ABOVE SL" in FIG. 2 separately show the lower layers and the upper layers. The source lines SL are also actually extended so that they overlap with each memory cell MC as viewed in a plane; however, this diagrammatic representation is omitted in FIG. 2.

Each magnetoresistive element MRD has an oval planar shape and is long, for example, in the vertical direction of FIG. 2. As the result of adoption of this oval shape, the aspect ratio of each magnetoresistive element MRD takes a value other than 1. In this example, it is desirable that the aspect ratio of each magnetoresistive element MRD as viewed in a plane should largely deviate from 1. Specifically, when the aspect ratio is greater than 1, it is desirable that it should be 2 or above. When the aspect ratio is less than 1, it is desirable that it should be 0.5 or below. However, the shape of the magnetoresistive element MRD is not limited to oval and it may be in the shape of rectangle, such as oblong, having the direction of length.

The magnetoresistive elements MRD of two memory cells MC adjoining to each other in the vertical direction of FIG. 2 are so arranged that they are not on an identical straight line extended in the vertical direction. That is, two magnetoresistive elements MRD adjoining to each other in the vertical direction, or the direction (first direction) in which the direction of length is extended, are arranged in different coordinates in the horizontal direction, or the direction (second direction) intersecting with the first direction. For example, the magnetoresistive elements MRD of the BL1 cell unit in FIG. 2 are placed on the right of a strap wiring ST while the magnetoresistive elements MRD of the BL2 cell unit are placed on the left of a strap wiring ST. The magnetoresistive elements MRD of the BL3 cell unit are placed in the same coordinates as the magnetoresistive elements MRD of the BL1 cell unit in the second direction. Therefore, they are placed on an identical straight line extended along the first direction. The magnetoresistive elements MRD of the BL4 cell unit are placed in the same coordinates as the magnetoresistive elements MRD of the BL2 cell unit in the second direction. As mentioned above, the magnetoresistive elements MRD are arranged in a staggered configuration so that they are alternately placed with respect to the positions of the drain contacts DC and the strap wirings ST.

As illustrated in the sectional views in FIG. 3 to FIG. 7, each memory cell MC, each element, and each wiring mentioned above are formed over the main surface of a semiconductor substrate SUB formed of, for example, a single crystal of silicon. More specific description will be given. A transistor TM (switching element) is formed in an active region AA over the main surface of the semiconductor substrate SUB and a flat plate-like strap wiring ST, a magnetoresistive element MRD, a bit line BL, and the like are placed thereabove.

The transistor TM includes: a pair of a source region SO and a drain region DR as an impurity diffusion layer containing, for example, boron, phosphorus, arsenic, or the like; a gate insulating layer GI comprised of a silicon oxide film; and a gate electrode layer, not shown, formed of a conductor, such as polysilicon, metal film, or the like. The word lines WL1, WL2 are placed substantially directly above the gate electrode layer. The pair of source region SO/drain region DR are placed in the main surface of the semiconductor substrate SUB at a distance from each other. The gate electrode layer is formed over the surface of the semiconductor substrate SUB sandwiched between the pair of source region SO/drain region DR with the gate insulating layer GI in between. The surfaces of the pair of source region SO/drain region DR and the gate electrode layer may be cilicided.

Each magnetoresistive element MRD is positioned over the main surface of the semiconductor substrate SUB where an access transistor TM is formed with multiple interlayer insulating layers II in between. It is desirable that the interlayer insulating layers II should be interlayer insulating layers made up of, for example, four layers of silicon oxide films. In FIG. 3 to FIG. 7, however, they are shown as are simplified to two or three layers. The interlayer insulating layers II are also formed in areas sandwiched between memory cells MC adjoining to each other as viewed in a plane.

Figure 3:
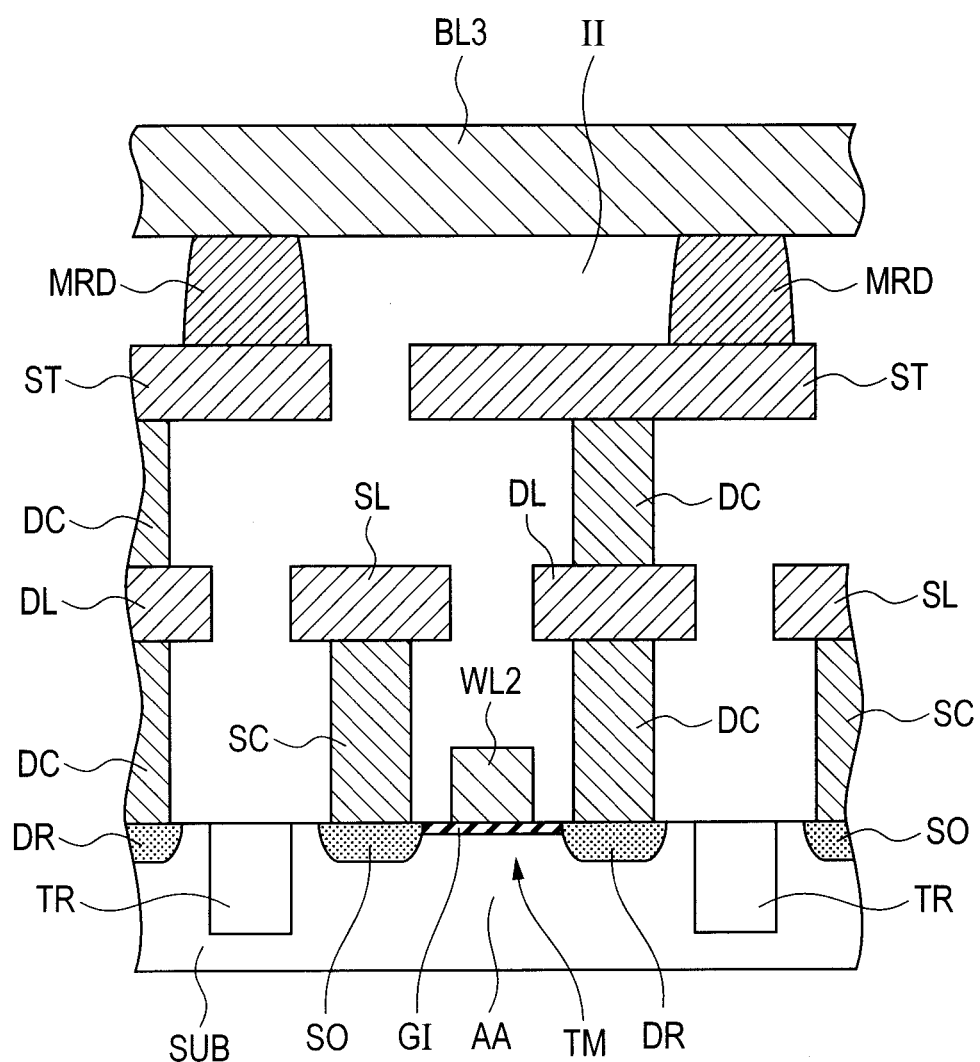
FIG. 3 is a schematic sectional view of the memory cell area in FIG. 2, taken along line of FIG. 2.

Each magnetoresistive element MRD is so formed that the under surface thereof is in contact with the surface of a strap wiring ST. The strap wiring ST is electrically coupled to the drain region DR of a transistor TM through a source line SL and a drain contact DC. In this case, as illustrated in FIG. 3, the drain contacts DC located above SLs are placed in positions where they overlap with the drain contacts DC located below SLs as viewed in a plane. A source region SO and a source line SL are electrically coupled with each other through a source contact SC. In the same layer as the source lines SL, a drain coupling layer DL that electrically couples a pair of drain contacts DC together is placed. However, a drain contact DC directly coupled with a drain region DR and a drain contact DC directly coupled with a strap wiring ST may be directly coupled with each other without interposing a drain coupling layer DL. In other words, a drain region DR and a strap wiring ST may be electrically coupled with each other through a single drain contact DC. At this time, a single drain contact DC extended from the drain region DR to the strap wiring ST may be formed by forming the source contact SC and the drain contact DC at different steps.

Figure 4:
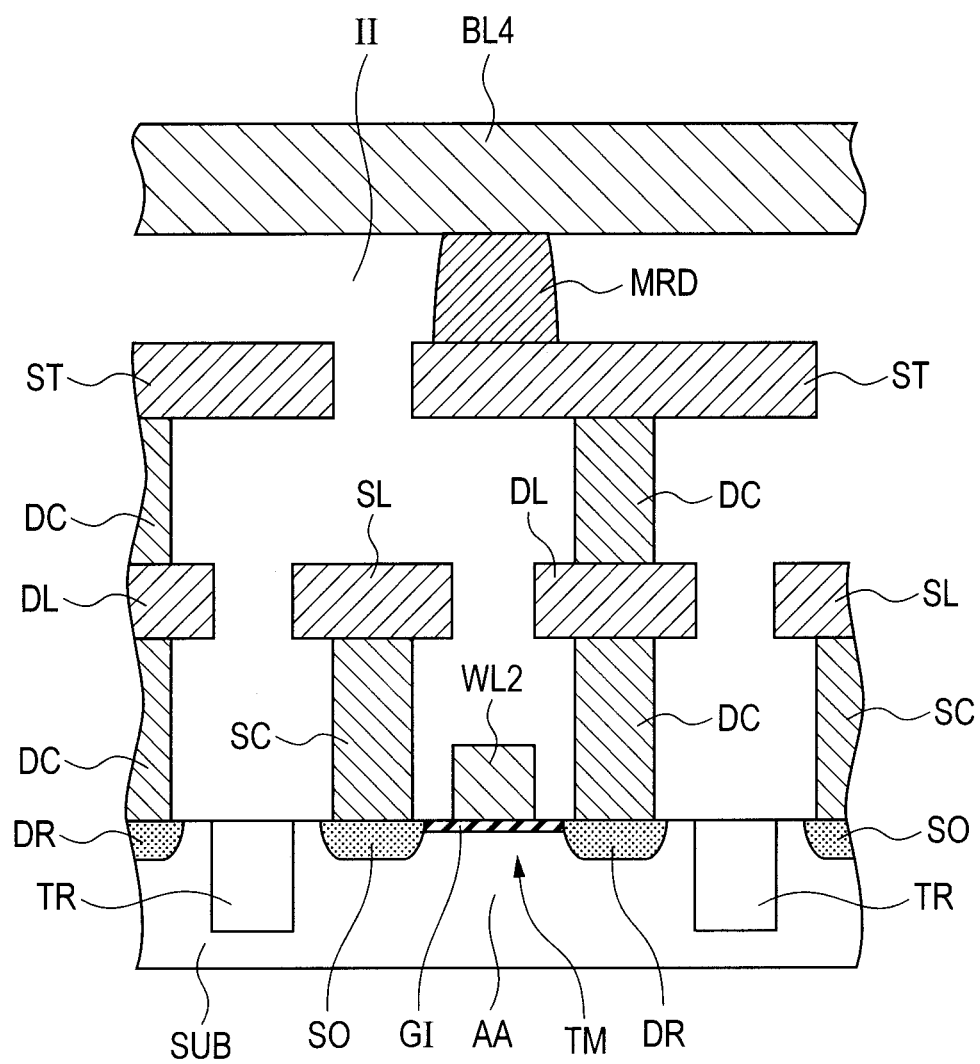
FIG. 4 is a schematic sectional view of the memory cell area in FIG. 2, taken along line IV-IV of FIG. 2.
Figure 5:
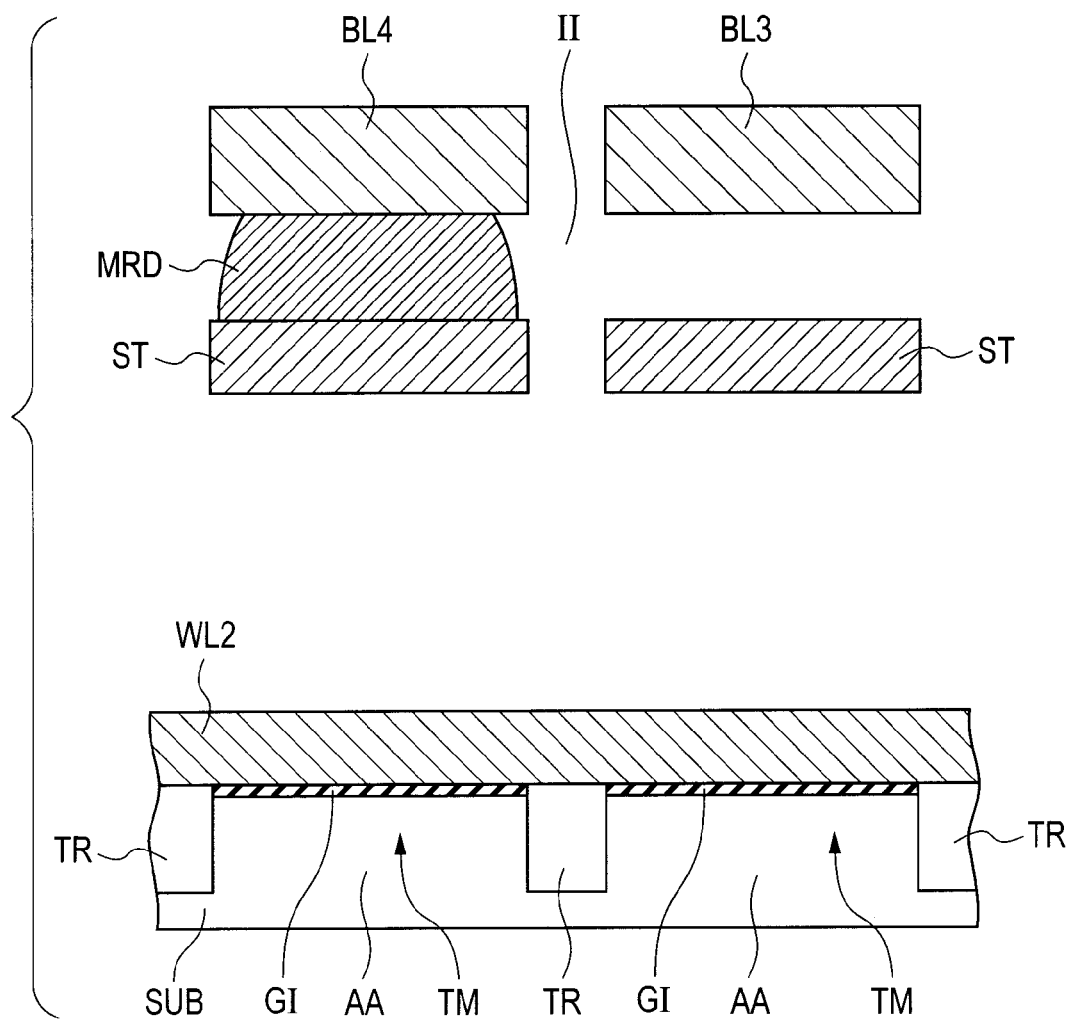
FIG. 5 is a schematic sectional view of the memory cell area in FIG. 2, taken along line V-V of FIG. 2.
Figure 6:
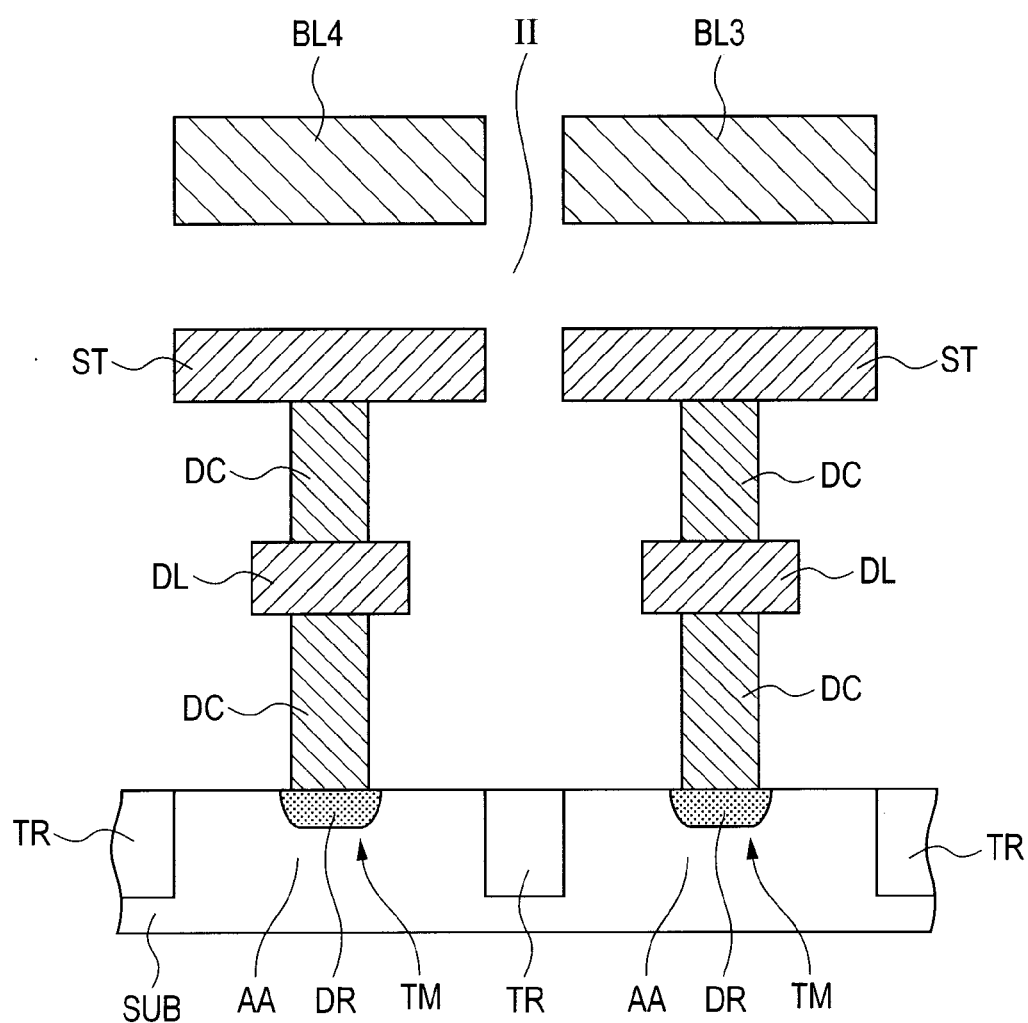
FIG. 6 is a schematic sectional view of the memory cell area in FIG. 2, taken along line VI-VI of FIG. 2.
Figure 7:
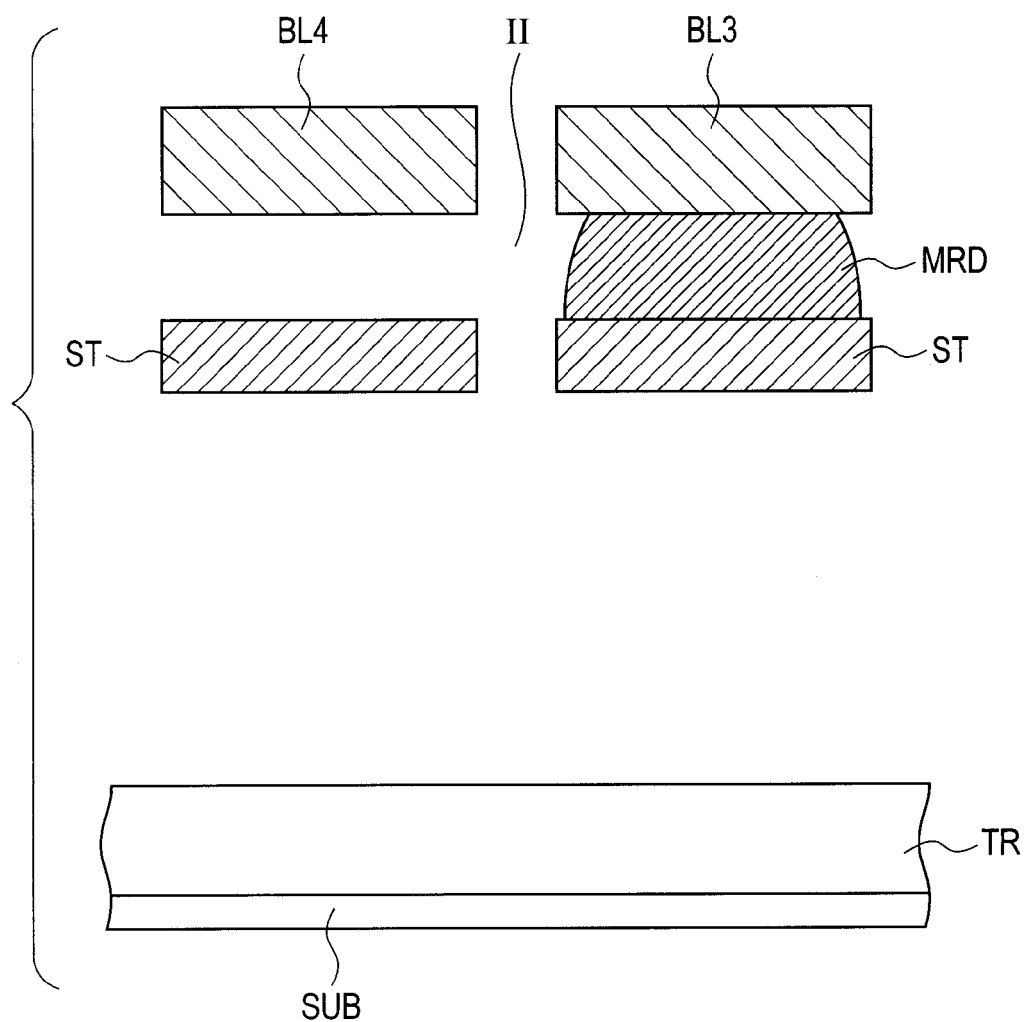
FIG. 7 is a schematic sectional view of the memory cell area in FIG. 2, taken along line VII-VII of FIG. 2.

As illustrated mainly in FIG. 2 to FIG. 4, the areas where each active region AA is formed as viewed in a plane and the areas where each strap wiring ST is formed as viewed in a plane are both arranged in a matrix as viewed in a plane. That is, the active regions AA and the strap wirings ST in the individual memory cells MC are both arranged at certain intervals so that the following is implemented: they are extended in the vertical direction (third direction) and the horizontal direction (fourth direction) substantially orthogonal to each other in, for example, FIG. 2.

Even in an identical memory cell MC, there is an area where each active region AA and each strap wiring ST do not partly overlap with each other. That is, in each memory cell MC, the strap wiring ST is so placed that it is slightly shifted to the right from the active region AA.

Even in an identical memory cell MC, as mentioned above, the area occupied in a plane is different between the upper layers and the lower layers. There may be an area where the upper layers and the lower layers do not at least partly overlap with each other. For this reason, the cell units are defined on a basis slightly different from that for the memory cells MC.

That is, the cell units are so defined that they roughly correspond to the positions where the individual memory cells MC are placed with the areas where multiple word lines WL and bit lines BL are placed in the center. Specifically, the cell units (the WL1 cell unit and the WL2 cell unit) arranged in the horizontal direction are placed with the word lines WL1, WL2 in the center. In addition, the four cell units in total, including the BL1 cell unit and the like, arranged in the vertical direction are placed with the bit lines BL1, BL2, BL3, BL4 in the center. In this embodiment, for this reason, the position of each memory cell as viewed in a plane slightly differ between the layers located above the source lines SL and the layers located therebelow. In FIG. 2, for example, the leftmost drain contact DC is formed in the WL1 cell unit but the leftmost magnetoresistive element MRD may be placed in proximity to the boundary between the WL1 cell unit and the WL2 cell unit or in the WL2 cell unit.

In each memory cell MC, as mentioned above, for example, the strap wiring ST (upper layer) and an active region AA (lower layer) are so arranged that they do not partly overlap with each other. This makes it possible to further enhance the degree of freedom in the positions (layout) where each magnetoresistive element MRD is placed over the main surface of the semiconductor substrate SUB. Specifically, it is possible to prevent a magnetoresistive element MRD from being placed directly above a drain contact DC and arrange the memory cells MC in the above-mentioned staggered configuration. Further, it is possible to enhance the effect of preventing short-circuiting between the ends of a pair of magnetoresistive elements MRD adjoining to each other in the direction of length without increasing the area of each memory cell MC as viewed in a plane. As a result, the degree of integration of the MRAM can be further enhanced.

In the examples in FIG. 2 to FIG. 7, the magnetoresistive elements MRD are arranged in a staggered configuration in the direction of length. As mentioned above, the magnetoresistive element MRD and the drain contact DC in each memory cell MC are so arranged that they do not overlap with each other (are away from each other) as viewed in a plane. For example, each strap wiring ST so formed that it is in contact with a drain contact DC and the upper surface of an interlayer insulating layer II is degraded in flatness over the drain contact DC than over the interlayer insulating layer II. This is caused by the difference in material between the drain contact DC and the interlayer insulating layer II. To cope with this, each magnetoresistive element MRD is formed in an area away from a drain contact DC. This makes it possible to ensure the flatness of each magnetoresistive element MRD, especially, that of the free layer MFL thereof. To ensure the flatness of each magnetoresistive element MRD more reliably, it is desirable to take the following measure in each memory cell MC: the shortest distance between the magnetoresistive element MRD and the drain contact DC as viewed in a plane is set to 40 nm or above. It is more desirable that this shortest distance should be not less than 40 nm and not more than 100 nm.

In FIG. 2 to FIG. 7, the distance between the magnetoresistive element MRD and the drain contact DC in each memory cell MC as viewed in a plane is substantially constant. This makes it possible to make substantially constant the flatness and the like of the vicinity (surrounding area) of each magnetoresistive element MRD as viewed in a plane. Therefore, it is possible to reduce variation in functionality, such as electrical characteristics, from magnetoresistive element MRD to magnetoresistive element MRD.

In each example in FIG. 3 to FIG. 7, it is desirable that various wirings, such as bit lines BL and source lines SL, source contacts SC, drain contacts DC, and drain coupling layers DL should be formed of the following: a conductive film of copper or the like. It is desirable that barrier metal should be formed in these wirings and contacts so that the side walls and upper surfaces (or lower surfaces) thereof are covered therewith. In these drawings, however, these films are omitted. As the same layer as the bit lines BL, for example, an interlayer insulating layer formed of, for example, a silicon nitride film may be placed in an area where a bit line BL is not placed. Further, as the same layer as the magnetoresistive elements MRD, a protective layer made up of, for example, a silicon nitride film may be formed around each magnetoresistive element MRD as viewed in a plane. In the above drawings, however, this insulating layer of a silicon nitride film is also omitted.

The barrier metal cited here is a film for suppressing the diffusion of metal materials forming each wiring to the outside. It is desirable that a thin film of nonmagnetic tantalum or TaN (tantalum nitride) obtained by adding nitrogen thereto should be used for this purpose.

Figure 8:
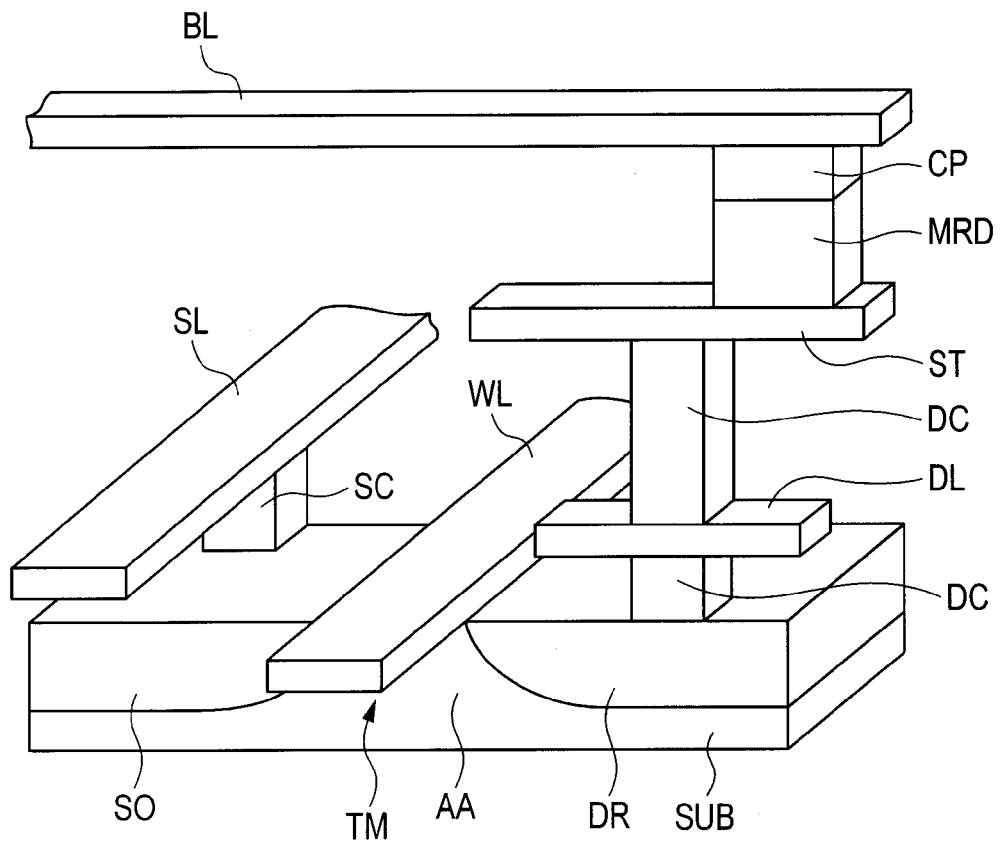
FIG. 8 is a schematic perspective view illustrating the configuration of a memory cell in which the magnetoresistive elements illustrated in FIG. 2 to FIG. 7 are formed.
Figure 9:
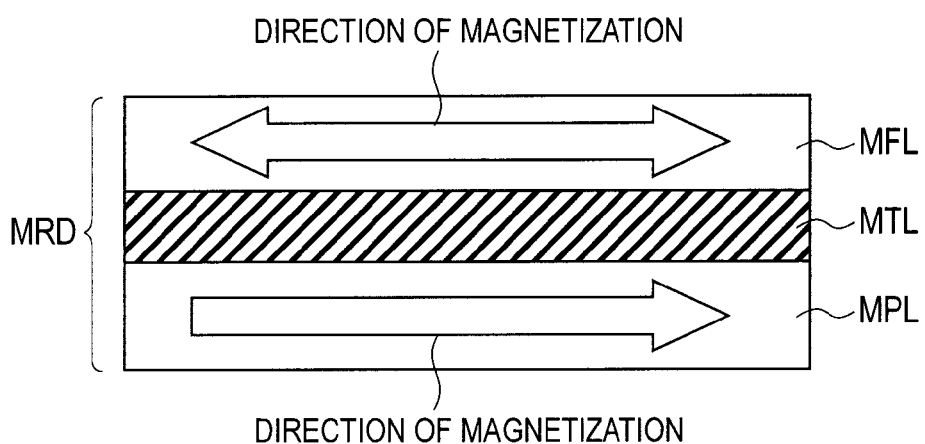
FIG. 9 is a schematic sectional view illustrating a first example of the configuration of a magnetoresistive element in the first embodiment.

FIG. 8 three-dimensionally shows the configuration of one of the memory cells illustrated in FIG. 2 to FIG. 7. In FIG. 8, the magnetoresistive element MRD depicted in an oval shape as viewed in a plane in FIG. 2 is depicted in a rectangular shape. As illustrated in FIG. 8 and FIG. 9, each magnetoresistive element MRD so placed that it is in contact with the upper surface of a strap wiring ST includes a magnetization pinned layer MPL, a tunnel insulating layer MTL, and a free layer MFL. It has a laminated structure in which, for example, the magnetization pinned layer MPL, tunnel insulating layer MTL, and free layer MFL are laminated from bottom in this order. A cap layer CP as a top electrode is formed over the free layer MFL; however, the cap layer CP is omitted in each drawing except FIG. 8.

Each of the magnetization pinned layer MPL and the free layer MFL is a magnetic layer having magnetic properties. Data is written to the magnetoresistive element MRD by the direction of magnetization of the free layer MFL being changed according to the direction of current passed through the magnetoresistive element MRD. It is desirable that, especially, the magnetoresistive element MRD making up STT-MRAM in this embodiment should be the following magnetoresistive element: a so-called in-plane magnetization magnetoresistive element whose direction of magnetization is along the main surfaces of the semiconductor substrate SUB and each laminated thin film.

In each magnetoresistive element MRD, as mentioned above, two magnetic layers (a magnetization pinned layer MPL and a free layer MFL) are laminated with a tunnel insulating layer MTL in between. The resistance value of the magnetoresistive element MRD is varied depending on whether the directions of magnetization of these two magnetic layers are identical with or opposite to each other. In FIG. 9, for example, the magnetization in the magnetization pinned layer MPL is oriented to the right. When the magnetization in the free layer MFL is oriented to the left at this time, the directions of magnetization of the magnetization pinned layer MPL and the free layer MFL are opposite to each other. At this time, the resistance of the magnetoresistive element MRD is high. Conversely, when the magnetization in the magnetization pinned layer MPL is oriented to the right and the magnetization in the free layer MFL is oriented to the right, their directions of magnetization are identical. At this time, the resistance of the magnetoresistive element MRD is low.

The direction of magnetization of each magnetoresistive element MRD is changed according to the direction in which a current is passed through a current path running from a bit line BL to a transistor TM by way of the magnetoresistive element MRD. The direction of magnetization of each magnetoresistive element MRD is read by detecting the electrical resistance varied according to the direction of magnetization of the magnetoresistive element MRD.

Figure 10:
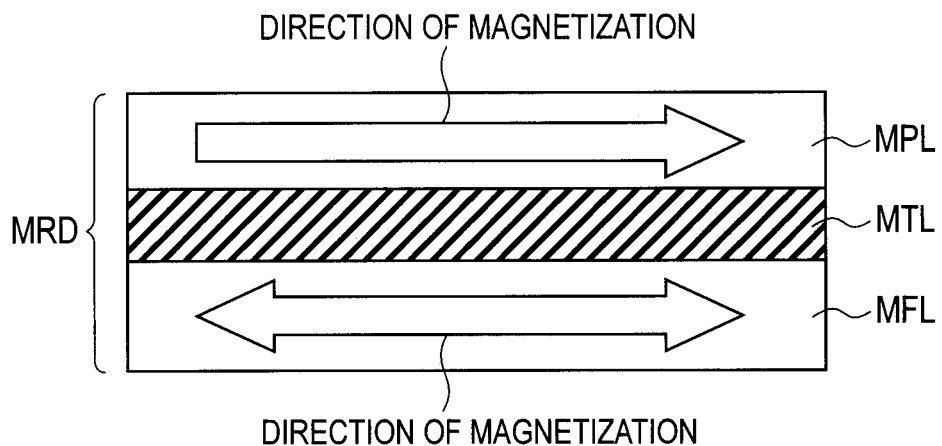
FIG. 10 is a schematic sectional view illustrating a second example of the configuration of a magnetoresistive element in the first embodiment.
Figure 11:
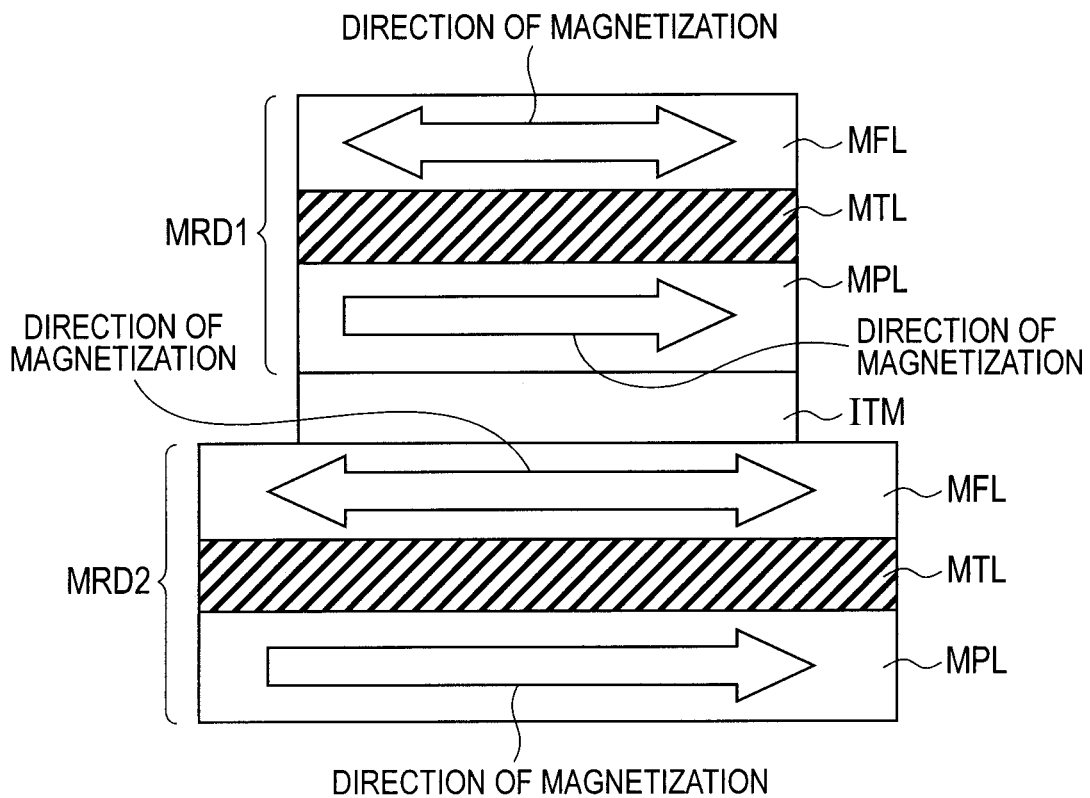
FIG. 11 is a schematic sectional view illustrating a third example of the configuration of magnetoresistive elements in the first embodiment.
Figure 12:
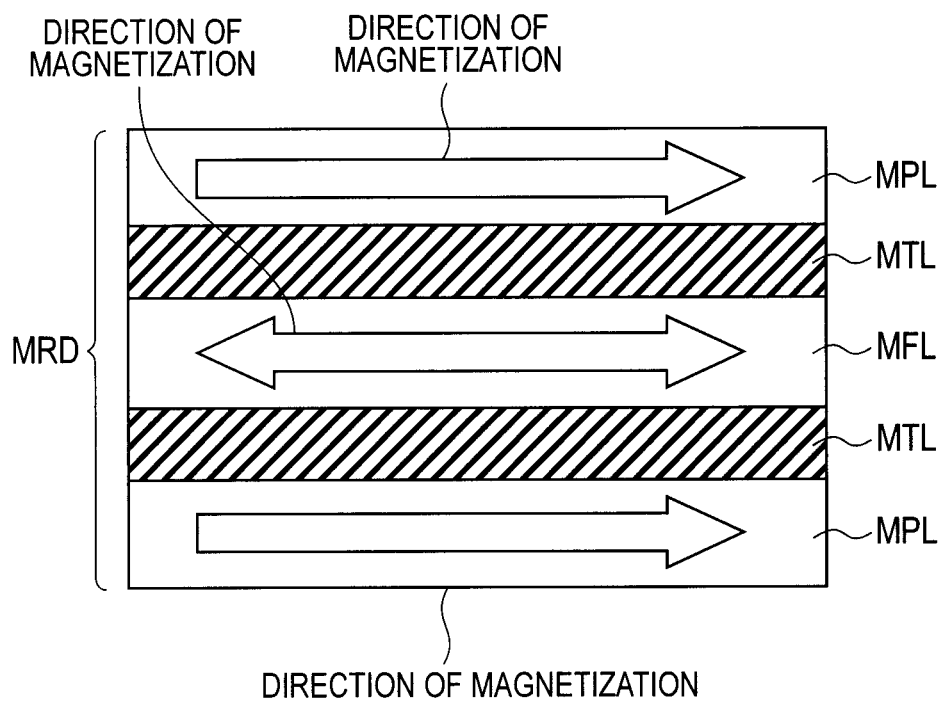
FIG. 12 is a schematic sectional view illustrating a fourth example of the configuration of a magnetoresistive element in the first embodiment.

In this embodiment, as illustrated in FIG. 10, each magnetoresistive element MRD may have such a laminated structure that a free layer MFL, a tunnel insulating layer MTL, and a magnetization pinned layer MPL are laminated from bottom in this order. As illustrated in FIG. 11, each magnetoresistive element MRD may include a magnetoresistive element MRD1 and a magnetoresistive element MRD2 in each of which a magnetization pinned layer MPL, a tunnel insulating layer MTL, and a free layer MFL are laminated in this order. The magnetoresistive element MRD1 and the magnetoresistive element MRD2 are electrically coupled with each other through buried metal ITM. Similarly to the magnetoresistive element MRD in FIG. 10, the magnetoresistive elements MRD1, MRD2 in FIG. 11 may have such a structure that a magnetization pinned layer MPL is laminated above a free layer MFL. In this embodiment, as illustrated in FIG. 12, each magnetoresistive element MRD may have the following configuration: a configuration in which a tunnel insulating layer MTL and a magnetization pinned layer MPL are laminated over a magnetization pinned layer MPL, a tunnel insulating layer MTL, and a free layer MFL laminated in the same order as in FIG. 9. This configuration makes it possible to enhance the efficiency of the spin torque described later and further reduce a current used to rewrite data to the magnetoresistive element MRD.

Description will be given to the material, film thickness, and the like of each part. It is desirable that the magnetization pinned layer MPL should be a thin film comprised of a ferromagnetic layer. Specifically, it is desirable that the magnetization pinned layer MPL should be a film of single metal or alloy comprised of one or more selected from a group made up of cobalt (Co), iron (Fe), boron (B), ruthenium (Ru), platinum (Pt), and manganese (Mn). In FIG. 9 to FIG. 11, the magnetization pinned layer MPL is depicted as a single layer. In general, however, the following structures are used for the magnetization pinned layer MPL: a two-layered structure in which a ferromagnetic layer is laminated over an antiferromagnetic layer; a four-layered structure in which a ferromagnetic layer, a nonmagnetic layer, and a ferromagnetic layer are laminated in this order over an antiferromagnetic layer; a five-layered structure; or the like. However, the number of laminated layers or the order in which layers are laminated is not limited to the foregoing. It is desirable that the overall thickness of the magnetization pinned layer MPL should be not less than 20 nm and not more than 100 nm. In the magnetoresistive element MRD in FIG. 12, for example, the lower magnetization pinned layer MPL is so configured that alloy layers of PtMn, CoFe, Ru, and CoFeB are laminated in this order; and the upper magnetization pinned layer MPL is so configured that alloy layers of CoFeB, Ru, CoFe, and PtMn are laminated in this order.

It is desirable that the tunnel insulating layer MTL is an insulating film comprised of any of aluminum oxide ($AlO_x$), magnesium oxide (MgO), and hafnium oxide (HfO). It is desirable that the thickness thereof should be not less than 0.5 nm and not more than 2.0 nm; and it is more desirable that the thickness should be not less than 0.6 nm and not more than 1.5 nm.

It is desirable that the free layer MFL should be a thin film formed of a ferromagnetic layer. Specifically, it is desirable that the free layer MFL should be a film of single metal or alloy comprised of one or more selected from a group made up of nickel (Ni), cobalt (Co), iron (Fe), boron (B), and ruthenium (Ru). It may be configured by laminating multiple thin films comprised of the above alloys different in material. It is desirable that the overall thickness thereof should be not less than 2.0 nm and not more than 10 nm; and it is more desirable that the thickness should be not less than 3.0 nm and not more than 9.0 nm. In the magnetoresistive element MRD in FIG. 12, for example, the free layer MFL can be comprised of CoFeB.

It is desirable that the strap wiring ST is formed of a metal film of, for example, tantalum (Ta), tantalum nitride (TaN), ruthenium, titanium nitride (TiN), or the like. The strap wiring ST may be of single layer or it may be so configured that multiple thin films comprised of the different materials mentioned above are laminated. It is desirable that the thickness of the strap wiring ST should be, for example, not less than 10 nm and not more than 70 nm; and it is more desirable that the thickness should be not less than 20 nm and not more than 50 nm (for example, 35 nm).

It is desirable that the cap layer CP should be formed of a metal film of, for example, tantalum, tantalum nitride, ruthenium, titanium nitride, or the like similarly to the strap wiring ST. The cap layer CP may also be of single layer or may be configured by laminating multiple thin films comprised of the different materials mentioned above. It is desirable that the thickness of the cap layer CP should be, for example, not less than 60 nm and not more than 70 nm. When the cap layer CP is configured by laminating two layers, for example, it is desirable that the thickness of the lower cap layer CP should be, for example, not less than 30 nm and not more than 70 nm; and it is more desirable that the thickness should be not less than 35 nm and not more than 65 nm (for example, 60 nm). It is desirable that the thickness of the upper cap layer CP should be, for example, not less than 5 nm and not more than 100 nm. As an example, the following cap layer CP is possible: a cap layer CP so configured that a thin film, 60 nm in thickness, comprised of Ta is laminated over a thin film, 7.5 nm in thickness, comprised of Ru.

It is desirable that the buried metal ITM shown in, for example, FIG. 11 should be formed of a metal film of Ta or the like and it is desirable that the thickness thereof should be, for example, not less than 5 nm and not more than 100 nm.

Detailed description will be given to the principle through which information is rewritten in the above-mentioned STT-type magnetoresistive element MRD with reference to FIG. 13 to FIG. 18.

Figure 13:
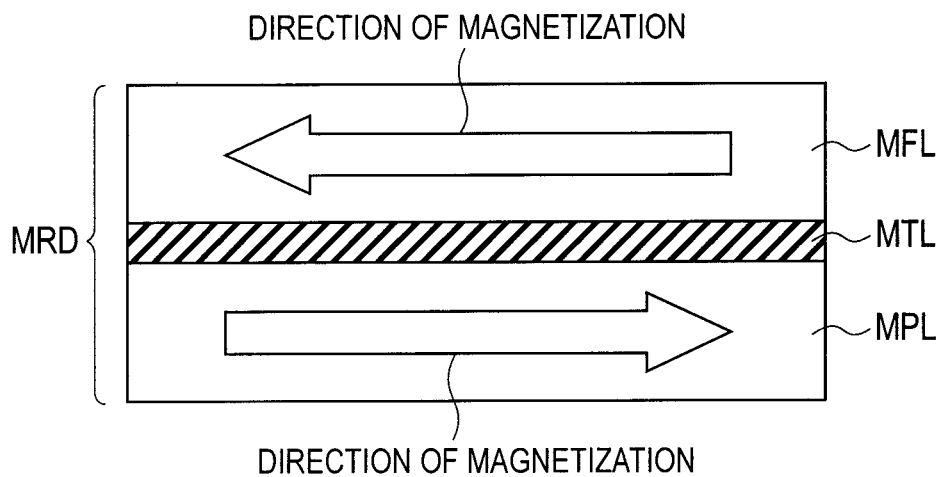
FIG. 13 is a schematic sectional view illustrating the initial state of STT-MRAM in which the free layer and the magnetization pinned layer of an in-plane magnetization magnetoresistive element are different in the direction of magnetization from each other.
Figure 14:
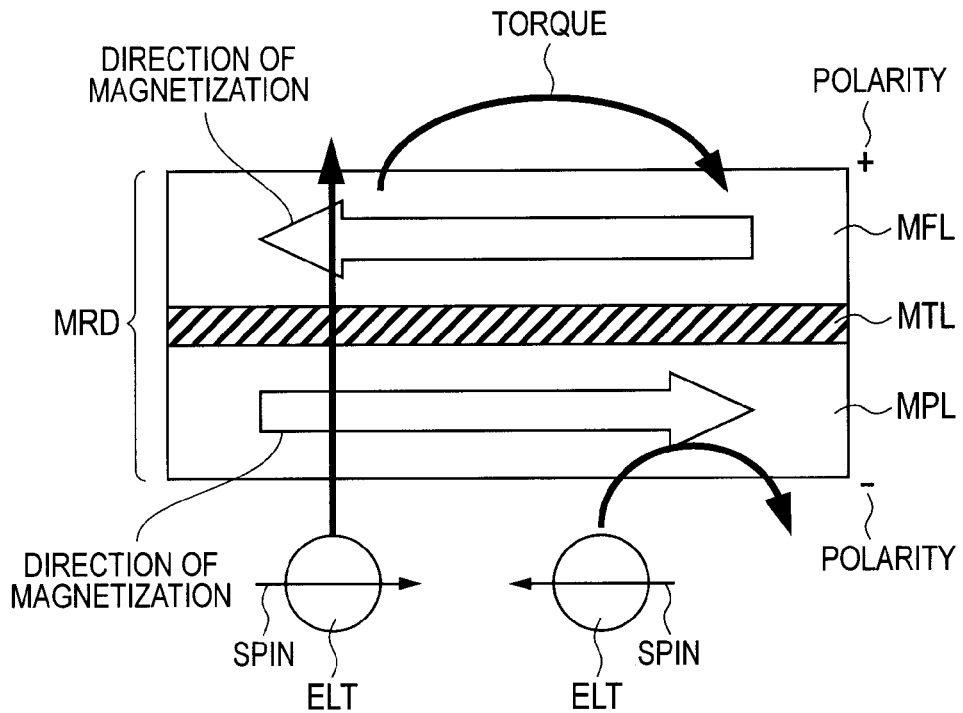
FIG. 14 is a schematic sectional view illustrating an operation in which the direction of magnetization of the in-plane magnetization magnetoresistive element in FIG. 13 is inverted.

As illustrated in FIG. 13, it will be assumed that the directions of magnetization of the magnetization pinned layer MPL and the free layer MFL are opposite to each other in an STT-type magnetoresistive element MRD having the laminated structure illustrated in, for example, FIG. 9. When the directions of magnetization of the magnetization pinned layer MPL and the free layer MFL are opposite to each other, the resistance of the magnetoresistive element MRD is high as mentioned above. As illustrated in FIG. 14, a positive potential is applied to the free layer MFL side of the magnetoresistive element MRD in the state in FIG. 13 and a negative potential is applied to the magnetization pinned layer MPL side thereof. Thus conduction electrons flow from a layer below the magnetization pinned layer MPL to a layer above the free layer MFL.

Of the above conduction electrons, electrons having spin torque substantially in the same direction as the direction of magnetization of the magnetization pinned layer MPL can pass through the magnetization pinned layer MPL and flow toward the tunnel insulating layer MTL and the free layer MFL. Meanwhile, electrons having spin in the opposite direction to the direction of magnetization of the magnetization pinned layer MPL cannot pass through the magnetization pinned layer MPL and are repelled. As a result, the following torque is applied to the interior of the free layer MFL magnetized in the opposite direction to that of the magnetization pinned layer MPL: torque that rotates the direction of magnetization to substantially the same direction as that of magnetization of conduction electrons (magnetization pinned layer MPL).

Figure 15:
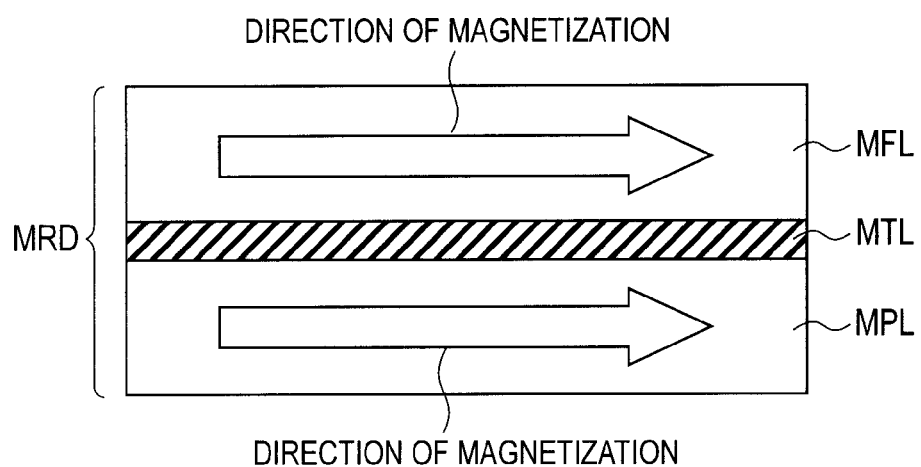
FIG. 15 is a schematic sectional view illustrating a state in which the free layer and the magnetization pinned layer of the in-plane magnetization magnetoresistive element become identical in the direction of magnetization as the result of the operation in FIG. 14.

As the result of the application of the above torque to the free layer MFL, as illustrated in FIG. 15, the direction of magnetization of the free layer MFL becomes identical with the direction of magnetization of the magnetization pinned layer MPL. In this state, as mentioned above, the resistance of the magnetoresistive element MRD is low. The resistance of the magnetoresistive element MRD can be switched from high to low by causing conduction electrons to flow from the magnetization pinned layer MPL side to the free layer MFL side as mentioned above. The state in which the resistance of each magnetoresistive element MRD is high or low is stored as data possessed by the magnetoresistive element MRD.

Figure 16:
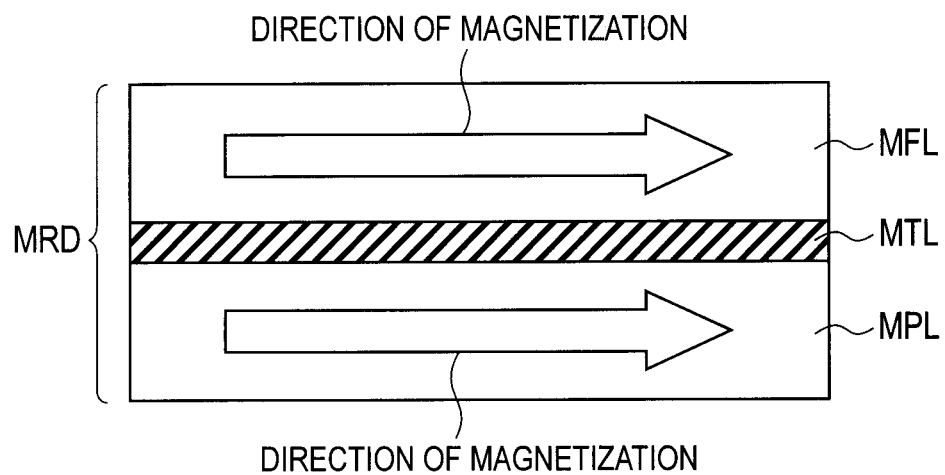
FIG. 16 is a schematic sectional view illustrating the initial state in which the free layer and the magnetization pinned layer of an in-plane magnetization magnetoresistive element are identical with each other in the direction of magnetization.
Figure 17:
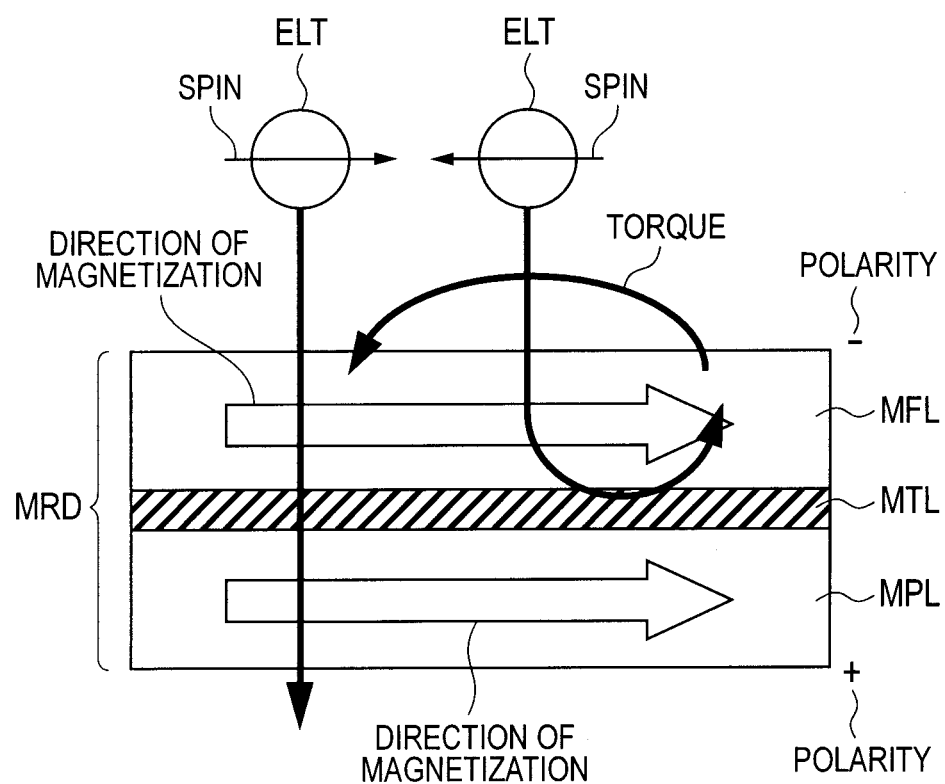
FIG. 17 is a schematic sectional view illustrating an operation in which the direction of magnetization of the magnetoresistive element in FIG. 16 is inverted.

As illustrated in FIG. 16, it will be assumed that the directions of magnetization of the magnetization pinned layer MPL and the free layer MFL are identical in an STT-type magnetoresistive element MRD having the same laminated structure as in FIG. 13 to FIG. 15. In this state, as mentioned above, the resistance of the magnetoresistive element MRD is low. As illustrated in FIG. 17, a negative potential is applied to the free layer MFL side of the magnetoresistive element MRD in the state in FIG. 16 and a positive potential is applied to the magnetization pinned layer MPL side. Thus conduction electrons flow from a layer above the free layer MFL to a layer below the magnetization pinned layer MPL.

Of the above conduction electrons, electrons having spin torque substantially in the same direction as the direction of magnetization of the free layer MFL can pass through the free layer MFL and flow toward the tunnel insulating layer MTL and the magnetization pinned layer MPL. Meanwhile, electrons having spin in the opposite direction to the direction of magnetization of the free layer MFL cannot pass through the free layer MFL and are repelled. As a result, the following torque is applied to the interior of the free layer MFL magnetized in the same direction as the magnetization pinned layer MPL is: torque that rotates the direction of magnetization to substantially the same direction as that of conduction electrons repelled at the free layer MFL (the opposite direction to that of magnetization of the magnetization pinned layer MPL).

Figure 18:
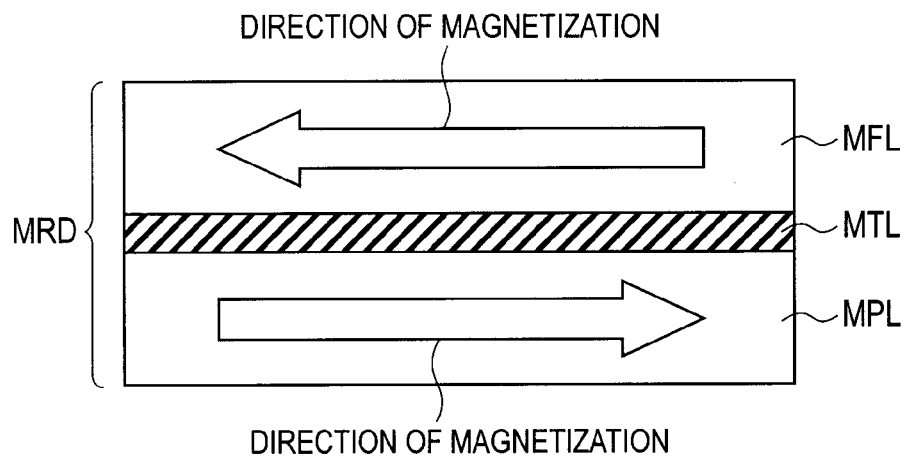
FIG. 18 is a schematic sectional view illustrating a state in which the free layer and the magnetization pinned layer of the in-plane magnetization magnetoresistive element become opposite to each other in the direction of magnetization as the result of the operation in FIG. 17.

As the result of the application of the above torque to the free layer MFL, as illustrated in FIG. 18, the direction of magnetization of the free layer MFL becomes opposite to the direction of magnetization of the magnetization pinned layer MPL. In this state, the resistance of the magnetoresistive element MRD is high. The resistance of the magnetoresistive element MRD can be switched from low to high by causing conduction electrons to flow from the free layer MFL side to the magnetization pinned layer MPL side as mentioned above.

Description will be given to the effect obtained by making the aspect ratio of each magnetoresistive element MRD as viewed in a plane larger (smaller) than 1 with reference to FIG. 19 and FIG. 20.

Figure 19:
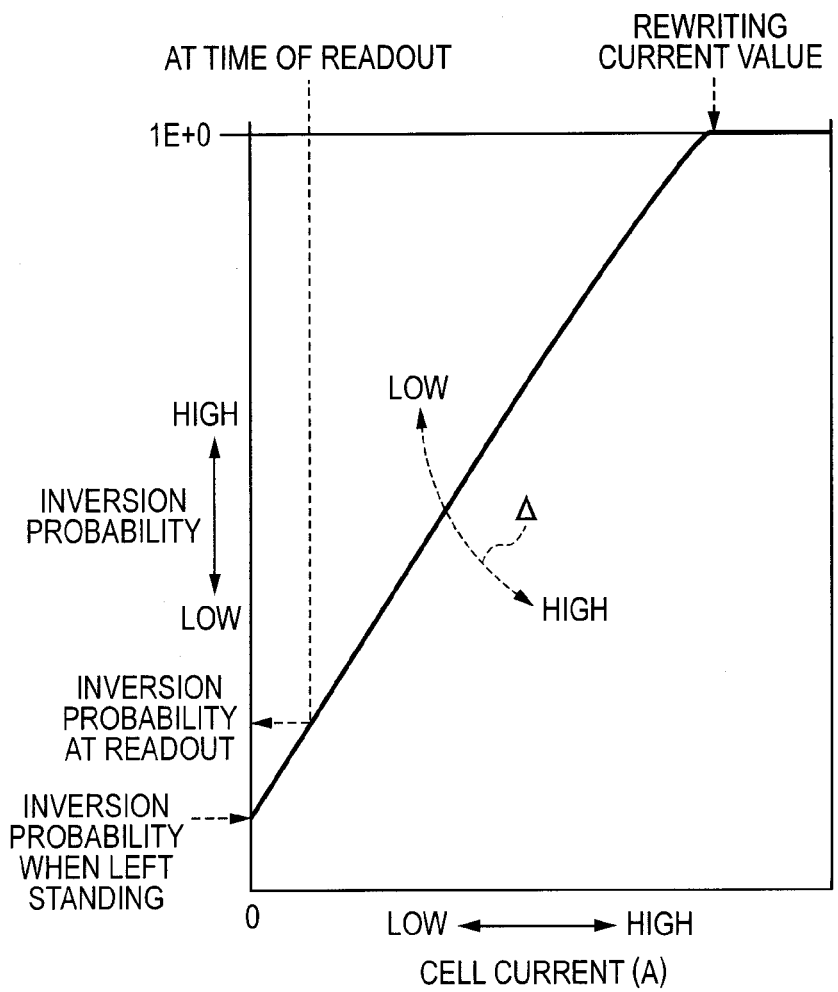
FIG. 19 is a graph indicating the relation between a current passed through a magnetoresistive element and inversion probability.

The horizontal axis (cell current) of the graph in FIG. 19 indicates the current value arising from conduction electrons used to rewrite information in the magnetoresistive element MRD illustrated in FIG. 14 or FIG. 17. The vertical axis (inversion probability) of the graph in FIG. 19 indicates the probability that the direction of magnetization of the free layer MFL is actually inverted with the value of current used to rewrite information.

As illustrated in FIG. 19, the value of cell current when the value on the vertical axis is "1E+0," that is, the inversion probability is 1 is equivalent to the so-called rewriting current value of the magnetoresistive element MRD. This rewriting current value means the value of current at which the direction of magnetization can be inverted without fail by passing that current. To reduce the size of a switching element (transistor) making up a memory cell, it is desirable that the rewriting current value should be lower. When the rewriting current value is made lower, the value of current passed through the tunnel insulating layer MTL of the magnetoresistive element MRD is reduced. Therefore, it is possible to increase the number of times by which a current can be passed through the tunnel insulating layer MTL. That is, the life of the tunnel insulating layer MTL can be lengthened.

To prevent information in a magnetoresistive element MRD from being erroneously rewritten, it is desirable that the inversion probability when the cell current is 0 or minute should be lower. The information recorded in a magnetoresistive element MRD is read by passing a minute cell current through the magnetoresistive element MRD and measuring the electrical resistance value thereof. To prevent an information rewrite error, it is desirable that the following inversion probability should be lower: the inversion probability arising from a minute cell current passed through the magnetoresistive element MRD when information is read. (This inversion probability is equivalent to "INVERSION PROBABILITY AT READOUT" in FIG. 19.) (This minute cell current is equivalent to the cell current value "AT TIME OF READOUT" in FIG. 19.) The following is seen from FIG. 19: when the rewriting current value is constant, the inversion probability at the time of readout can be made lower with increase in the gradient (thermal stability parameters) of the straight line of the graph indicated by $\Delta$ in the drawing.

Figure 20:
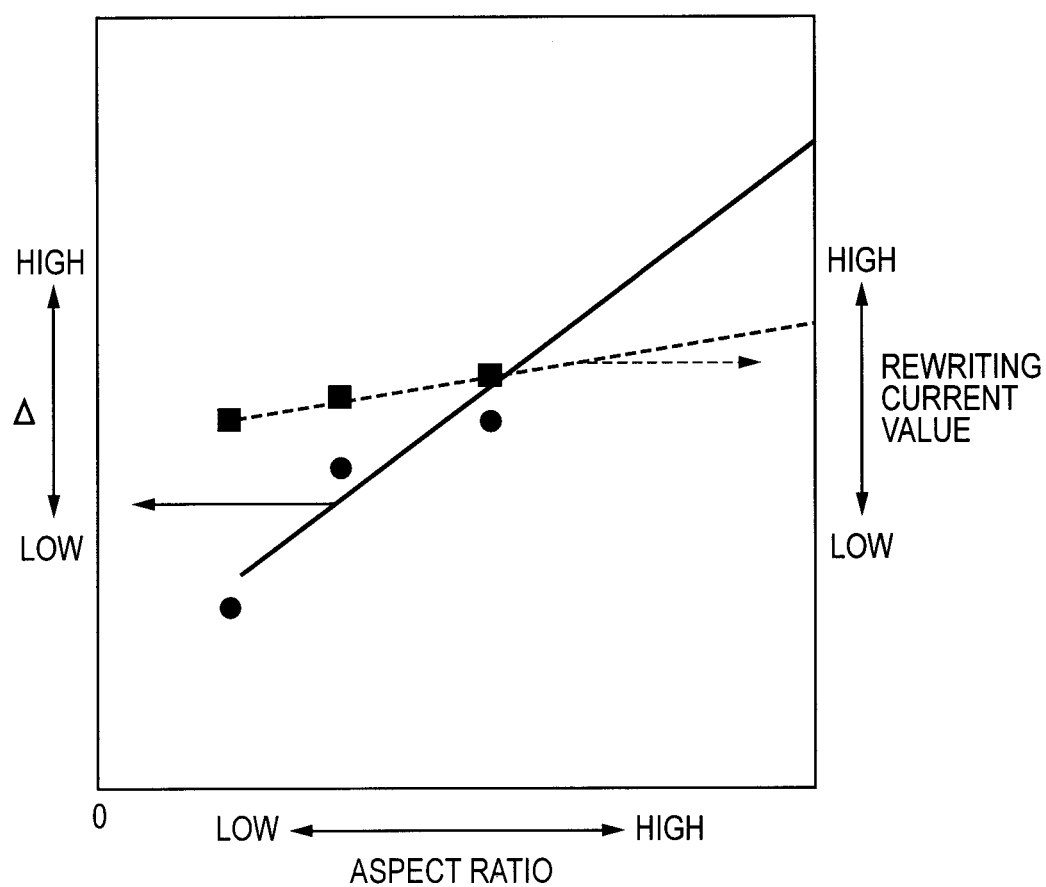
FIG. 20 is a graph indicating the relation between the aspect ratio of a magnetoresistive element and thermal stability parameters and rewriting current value.

In FIG. 20, the horizontal axis of the graph of a solid line indicates the aspect ratio (greater than 1) of the magnetoresistive element MRD and the vertical axis indicates the value of $\Delta$. In FIG. 20, the horizontal axis of the graph of a broken line indicates the aspect ratio (greater than 1) of the magnetoresistive element MRD and the vertical axis indicates the rewriting current value.

It is seen from FIG. 20 that as the aspect ratio of the magnetoresistive element MRD becomes further greater than 1, the value of $\Delta$ is increased and the occurrence of an information rewrite error can be suppressed. It is also seen that even when the aspect ratio of the magnetoresistive element MRD is greater than 1, the amount of increase in rewriting current value is small. When the graphs in FIG. 20 were derived, the following magnetoresistive element was used as a magnetoresistive element MRD whose aspect ratio is higher: a magnetoresistive element MRD whose length in the direction of a shorter part as viewed in a plane is constant and whose length in the direction of a longer part is made longer. In the example in FIG. 20, for this reason, the rewriting current value is slightly increased because the area of the magnetoresistive element MRD as viewed in a plane is slightly increased with increase in aspect ratio. Therefore, it can be concluded that the rewriting current density per unit area is hardly increased even when the aspect ratio is increased. If the aspect ratio is increased so that the area of the magnetoresistive element MRD as viewed in a plane is not varied, the rewriting current value is hardly varied despite increase in aspect ratio.

Because of the foregoing, the following can be implemented by making the aspect ratio of a magnetoresistive element MRD greater than 1: it is possible to suppress increase in the value of current for rewriting information to the magnetoresistive element MRD and suppress an information rewrite error.

Description will be given to the action and effect of this embodiment with reference to FIG. 21 to FIG. 26 illustrating a comparative example to this embodiment.

As illustrated in FIG. 21 to FIG. 26, the memory cell area in the comparative example to this embodiment also has substantially the same configuration as that of the memory cell area in this embodiment illustrated in FIG. 2 to FIG. 7. In FIG. 21 to FIG. 26, for this reason, the same elements as in FIG. 2 to FIG. 7 will be marked with the same reference codes and the description thereof will not be repeated. This is the same with the second and following embodiments described below.

Figure 21:
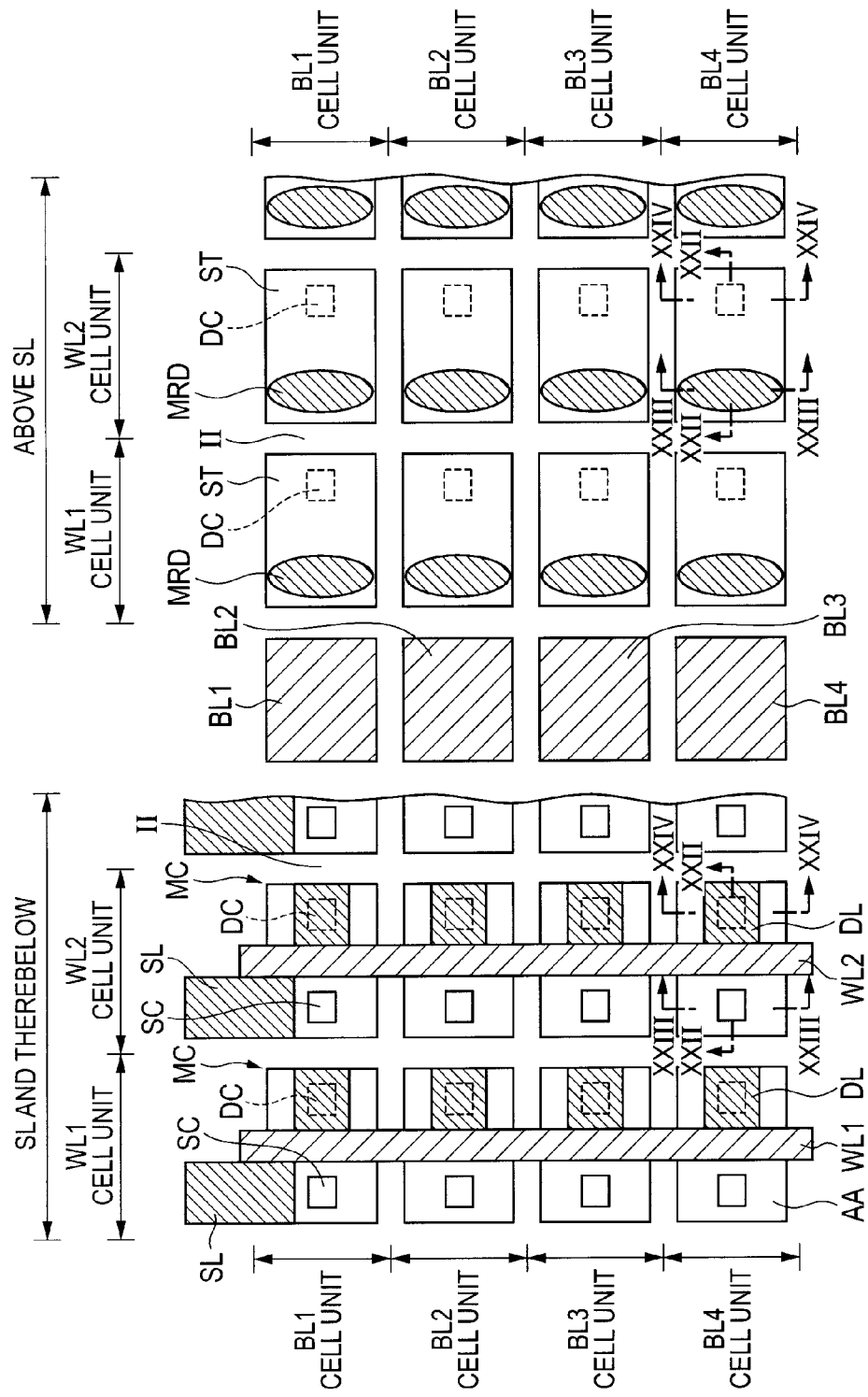
FIG. 21 is a plan view illustrating in detail the configuration of a memory cell area in a semiconductor device in a comparative example to the first embodiment.
Figure 22:
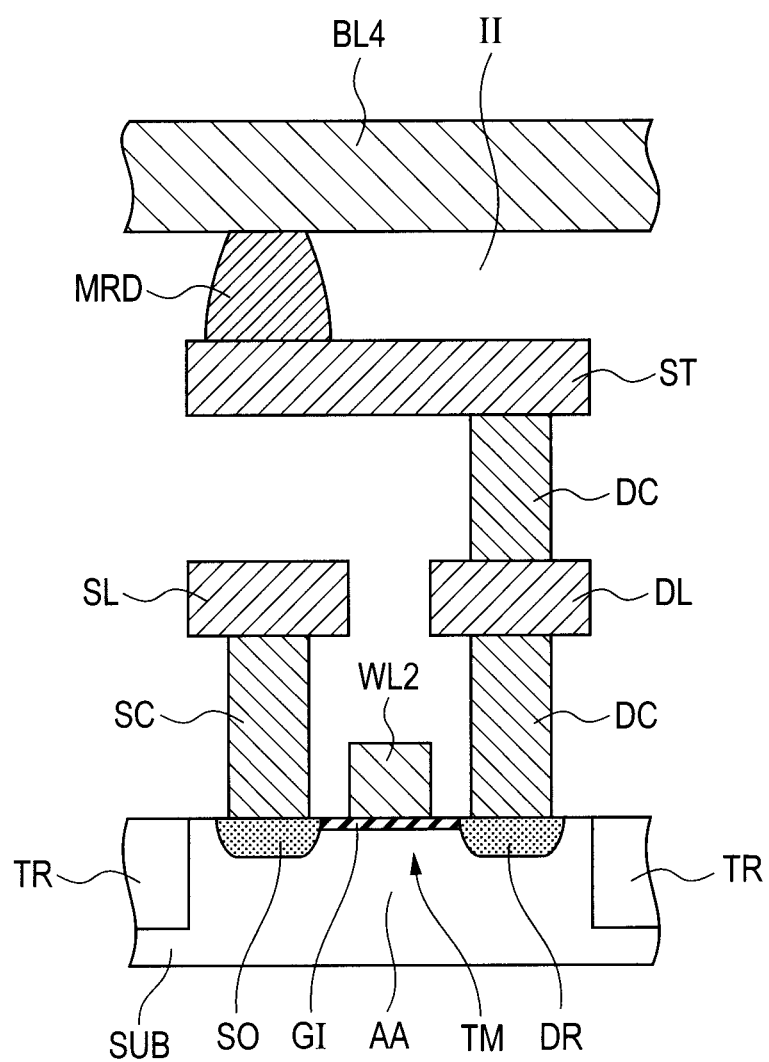
FIG. 22 is a schematic sectional view of the memory cell area in FIG. 21, taken along line XXII-XXII of FIG. 21.
Figure 23:
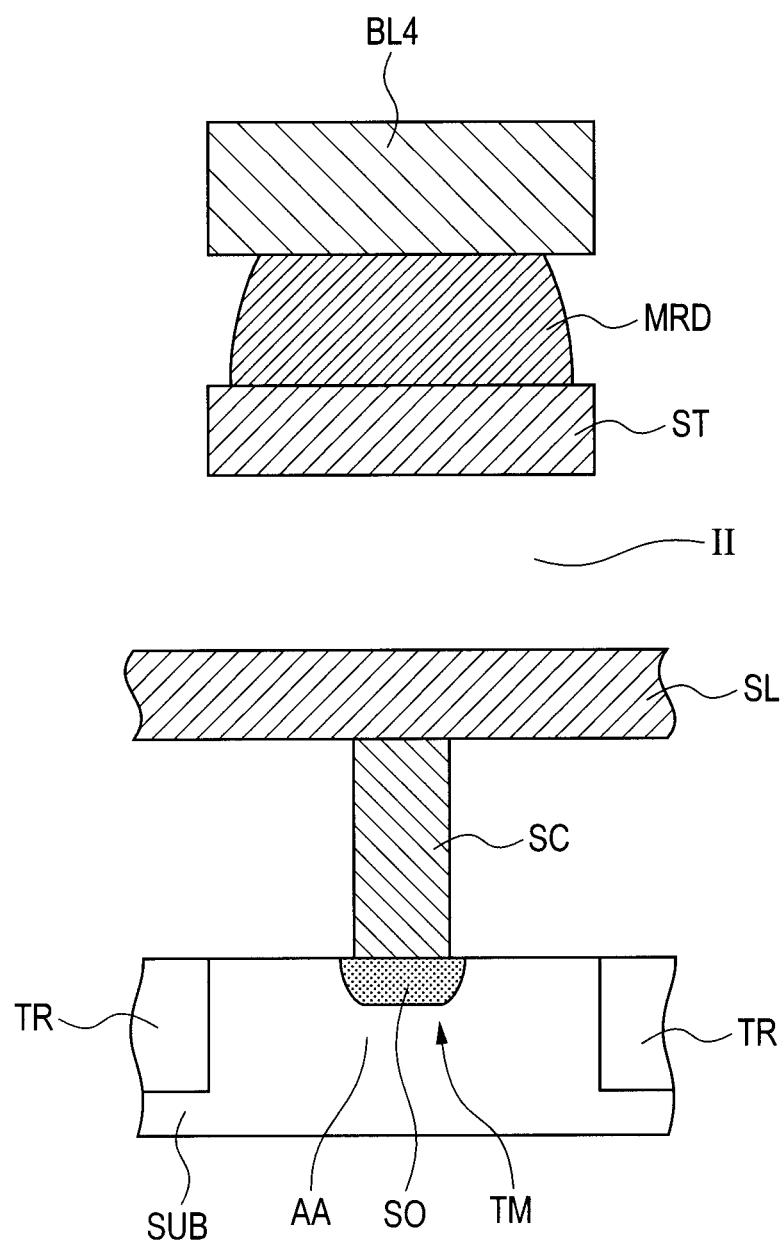
FIG. 23 is a schematic sectional view of the memory cell area in FIG. 21, taken along line XXIII-XXIII of FIG. 21.
Figure 24:
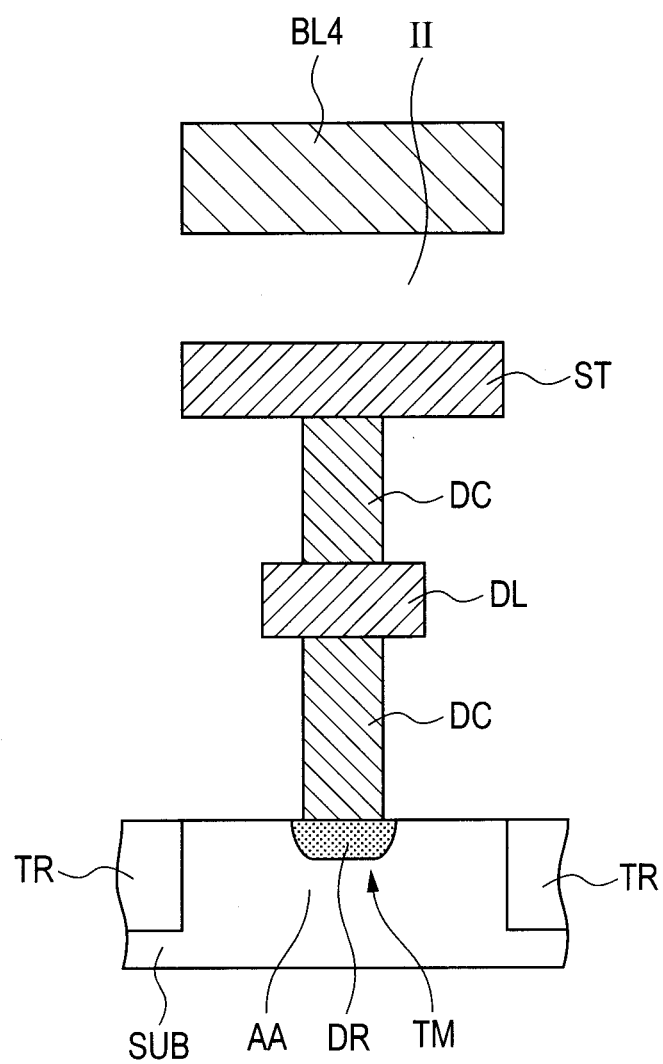
FIG. 24 is a schematic sectional view of the memory cell area in FIG. 21, taken along line XXIV-XXIV of FIG. 21.

In the comparative example in FIG. 21, two magnetoresistive elements MRD adjoining to each other in the vertical direction in FIG. 21 are so arranged that they are on an identical straight line extended in the vertical direction. Therefore, all the memory cells are so arranged that they have the same layout as viewed in a plane. As illustrated in the sectional views in FIG. 22 to FIG. 24, in each memory cell, the following measure is taken: a part located below a source line SL (for example, an active region AA) and a part located above the source line SL (for example, a strap wiring ST) are so arranged that they substantially completely overlap with each other as viewed in a plane.

Figure 25:
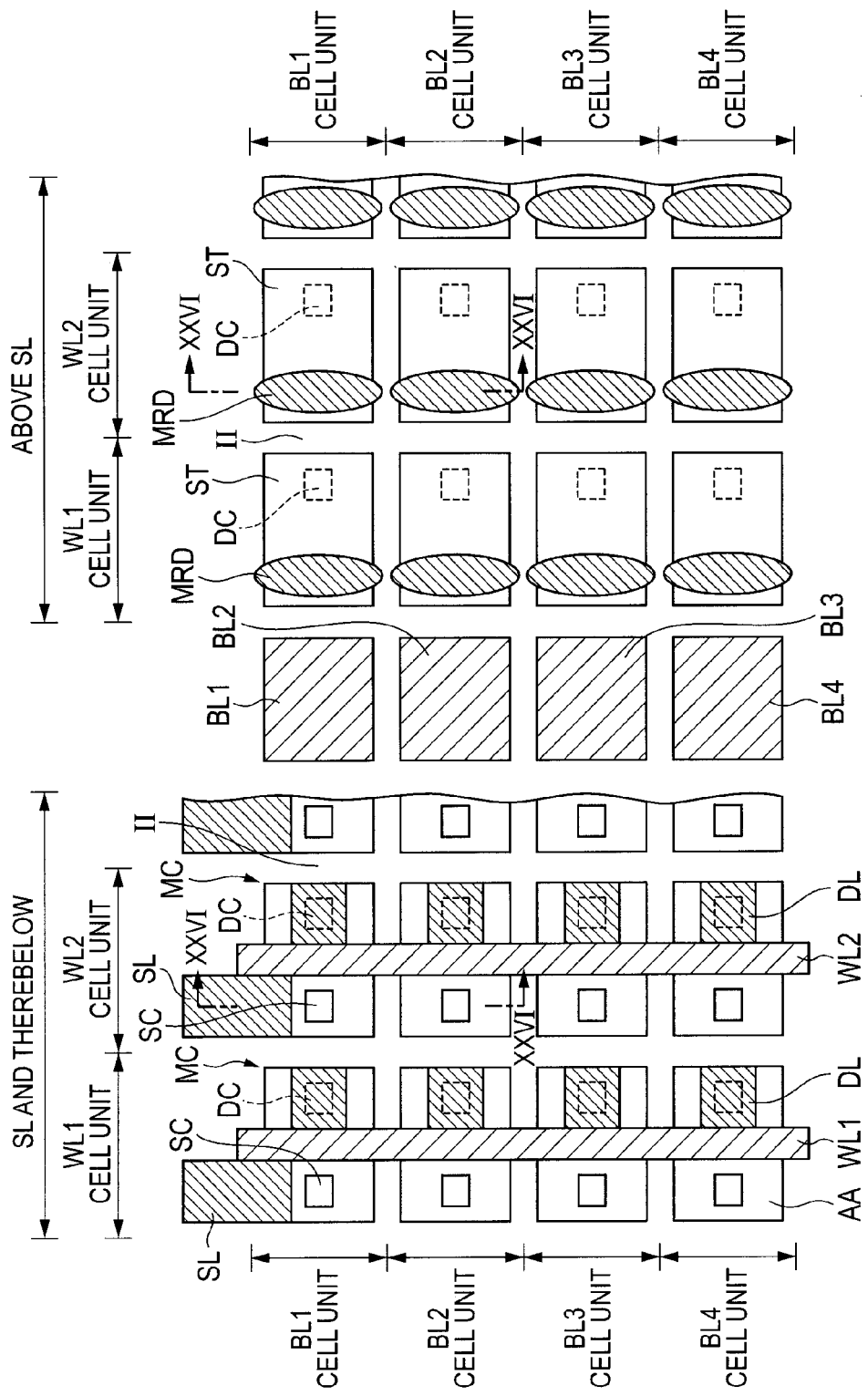
FIG. 25 is a plan view illustrating a state in which the aspect ratio of the magnetoresistive elements in FIG. 21 becomes further larger than 1.
Figure 26:
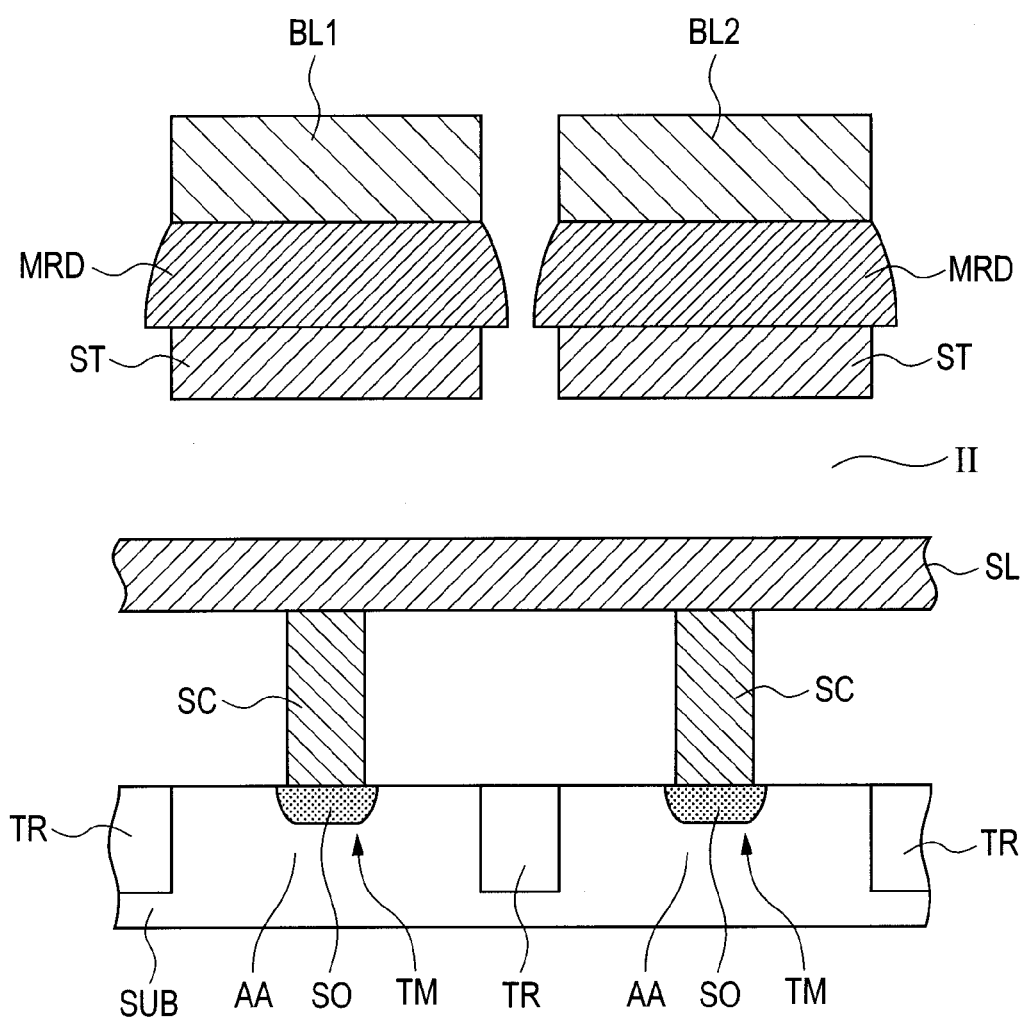
FIG. 26 is a schematic sectional view of the memory cell area in FIG. 25, taken along line XXVI-XXVI of FIG. 25.

In the above comparative example, as illustrated in FIG. 25 and FIG. 26, the following takes place when the aspect ratio of each magnetoresistive element MRD is very large as compared with 1: the distance between paired magnetoresistive elements MRD adjoining to each other in the direction of the length of the magnetoresistive elements MRD becomes very short. This increases the possibility that paired magnetoresistive elements MRD adjoining to each other in the direction of length are short-circuited to each other. To prevent the short-circuiting when the aspect ratio of each magnetoresistive element MRD is much higher than 1, it is necessary to increase the area of each memory cell MC as viewed in a plane or reduce the number of integrated memory cells MC.

However, when the magnetoresistive elements MRD are arranged as in this embodiment illustrated in FIG. 2 to FIG. 7, the distance between paired magnetoresistive elements MRD adjoining to each other in the direction of length is increased. That is, in this embodiment, the following can be implemented even when the aspect ratio of each magnetoresistive element MRD is much higher than 1: short-circuiting between magnetoresistive elements MRD can be suppressed without increasing the area of each memory cell MC as viewed in a plane. Therefore, it is possible to provide a semiconductor device having an integrated circuit in which the following can be implemented: it is possible to reduce the value of current used to read/write information from/to a magnetoresistive element MRD and suppress an read/write error without increasing the area of each memory cell MC as viewed in a plane or reducing the number of integrated memory cells MC; and short-circuiting between magnetoresistive elements MRD is suppressed.

To further enhance the effect of this embodiment, it is desirable that the area of each memory cell MC as viewed in a plane should be not less than 0.02 μm$^2$ and not more than 0.5 μm$^2$. When the individual memory cells slightly differ in position as viewed in a plane, for example, between upper layers and lower layers, the above area is defined as the area as viewed in a plane in each layer. Even when a memory cell differs in position between layers, basically, it is substantially identical in area in every layer.

Even when the aspect ratio of each magnetoresistive element MRD is much higher than 1, as mentioned above, it is possible to increase the distance between magnetoresistive elements MRD adjoining to each other. For this reason, it is possible to reduce the following difference: a difference between the distance between magnetoresistive elements MRD adjoining to each other in the direction of the longer part of each magnetoresistive element MRD and that in the direction of the shorter part thereof. This makes it possible to process the end portions of a magnetoresistive element MRD in the direction of length as viewed in a plane. That is, it is possible to suppress the following problems, for example: the end portions are excessively etched or the shape thereof becomes unstable when the magnetoresistive elements MRD are processed (patterned by etching). As a result, it is possible to suppress short-circuiting between the end portions of a pair of magnetoresistive elements MRD in the direction of length.

When magnetoresistive elements MRD are arranged in a staggered configuration as viewed in a plane, a difference in denseness as viewed in a plane with which the magnetoresistive elements MRD are arranged can be reduced. For this reason, it is possible to reduce variation in functionality, such as electrical characteristics, from magnetoresistive element MRD to magnetoresistive element MRD and make the functionality of the entire memory cell area more stable.

Second Embodiment

The second embodiment of the invention is different from the first embodiment in the arrangement of magnetoresistive elements MRD and the configuration of bit lines BL. Hereafter, description will be given to the configuration of this embodiment with reference to FIG. 27 to FIG. 47.

Figure 27:
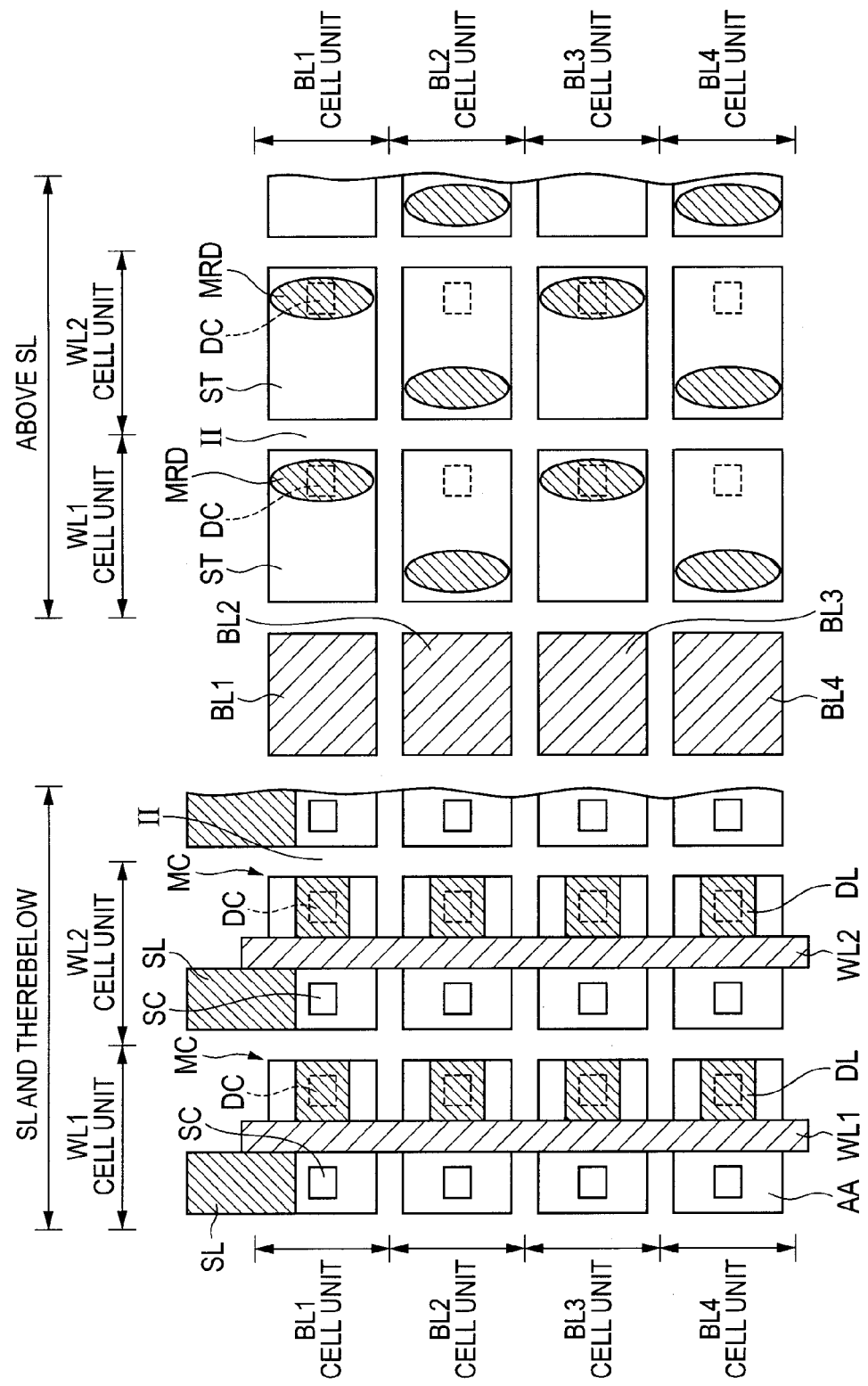
FIG. 27 is a plan view illustrating in detail the configuration of a memory cell area in a semiconductor device in a first example of a second embodiment of the invention.

As illustrated in FIG. 27, the memory cell area in a first example of this embodiment also has substantially the same configuration as the memory cell area in the first embodiment illustrated in FIG. 2 to FIG. 7. In the example in FIG. 27, however, the magnetoresistive elements MRD and the drain contacts DC are so arranged that they overlap with each other as viewed in a plane.

More specific description will be given. Of the magnetoresistive elements MRD arranged in a staggered configuration, the magnetoresistive elements MRD of the BL1 cell unit and the BL3 cell unit are placed on the right of each strap wiring ST. The magnetoresistive elements MRD of the BL2 cell unit and the BL4 cell unit are placed on the left of each strap wiring ST. The drain contact DC in contact with the under surface of each strap wiring ST is placed on the right of the strap wiring ST in every memory cell MC. For this reason, the magnetoresistive elements MRD of the BL1 cell unit and the BL3 cell unit are placed in positions where they overlap with a drain contact DC. FIG. 27 is different from FIG. 2 in this respect.

In terms of the principle of STT-MRAM, the magnetoresistive elements MRD may be so placed that they are away from the drain contacts DC as viewed in a plane as in the first embodiment. Or, the magnetoresistive elements MRD may be so placed that they overlap with the drain contacts DC as viewed in plane as illustrated in FIG. 27. Especially, when the flatness of each magnetoresistive element MRD (free layer MFL) does not depend on whether or not it is located directly above a drain contact DC, the magnetoresistive elements MRD may be so placed that they overlap with the drain contacts DC as viewed in a plane.

It is possible to simultaneously achieve all of the following as in the first embodiment also by adopting such a configuration as in FIG. 27: suppression of short-circuiting between magnetoresistive elements MRD by making the aspect ratio of each magnetoresistive element MRD greater than 1; reduction in information rewriting current; and enhancement of the degree of integration of magnetoresistive elements MRD.

Figure 28:
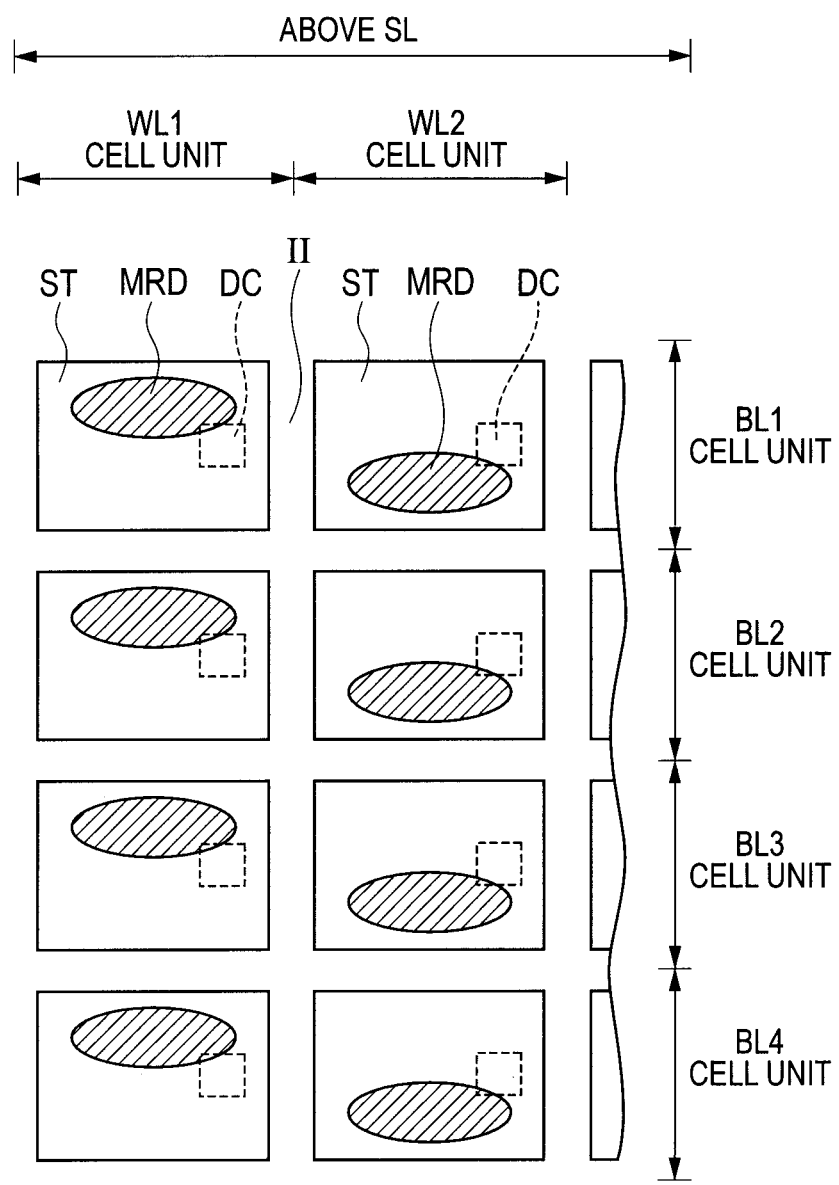
FIG. 28 is a plan view illustrating in detail only the layers above source lines in the configuration of a memory cell area in a semiconductor device in a second example of the second embodiment of the invention.

As illustrated in FIG. 28, the memory cell area in a second example of this embodiment also has substantially the same configuration as the memory cell area in the first example illustrated in FIG. 27. In the example in FIG. 28, however, the direction of length (first direction) of each magnetoresistive element MRD as viewed in a plane is extended in the direction (horizontal direction in the drawing) in which bit lines BL are extended. FIG. 28 is different from FIG. 27 in this respect.

In terms of the principle of STT-MRAM, the magnetoresistive elements MRD may be so placed that they are extended in the vertical direction as in FIG. 27. Or, the magnetoresistive elements MRD may be so placed that they overlap with the drain contact DC as viewed in a plane as illustrated in FIG. 28. More specific description will be given. Unlike ordinary MRAMs in which an external magnetic field is utilized to rewrite information, the STT-MRAM is not provided in layers below the magnetoresistive elements MRD with a wiring designated as digit line. For this reason, the magnetoresistive elements MRD and the drain contacts DC may be so arranged that they overlap with each other as viewed in a plane. The direction of length of each magnetoresistive element MRD can be extended in any direction, including, for example, the horizontal direction as illustrated in FIG. 28.

For this reason, the following takes place when, for example, each strap wiring ST is long in the horizontal direction and short in the vertical direction as illustrated in FIG. 28: a longer distance can be enhanced between the end portions of magnetoresistive elements MRD adjoining to each other in the direction of length, especially, by placing the magnetoresistive elements MRD so that they are extended in the horizontal direction of the drawing. For this reason, it is possible to more reliably suppress short-circuiting between the end portions of magnetoresistive elements MRD adjoining to each other in the direction of length.

As illustrated in FIG. 28, a pair of magnetoresistive elements MRD adjoining to each other in the direction of length, extended in the horizontal direction of the drawing, are so arranged that the following is implemented: they are not on an identical straight line extended in the direction of the length. That is, also in FIG. 28, the magnetoresistive elements MRD are arranged in a staggered configuration. This makes it possible to reduce a difference in denseness as viewed in a plane with which the magnetoresistive elements MRD are placed. For this reason, it is possible to reduce variation in functionality, such as electrical characteristics, from magnetoresistive element MRD to magnetoresistive element MRD and make the functionality of the entire memory cell area more stable. The magnetoresistive elements MRD may be so arranged that they overlap with the drain contacts DC in contact with the under surfaces of the strap wirings ST or may be so arranged that they are away from the drain contacts DC.

Figure 29:
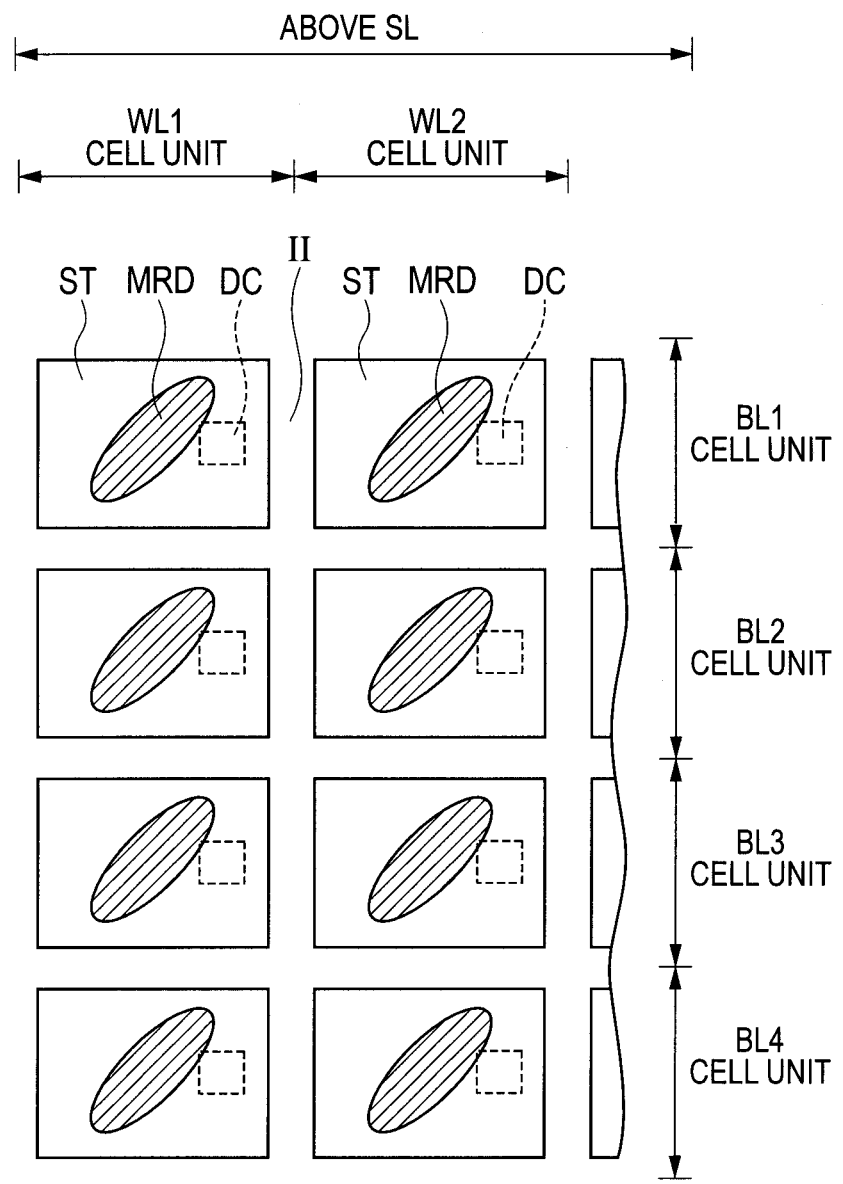
FIG. 29 is a plan view illustrating in detail only the layers above source lines in the configuration of a memory cell area in a semiconductor device in a third example of the second embodiment of the invention.

As illustrated in FIG. 29, the memory cell area in a third example of this embodiment also has substantially the same configuration as the memory cell area in the first example illustrated in FIG. 27. In the example in FIG. 29, however, the magnetoresistive elements MRD are extended in a direction (oblique direction in FIG. 29) different from both the directions in which multiple memory cells MC are arranged in an array. That is, the magnetoresistive elements MRD are extended in a direction (oblique direction in FIG. 29) different from both of the vertical direction (third direction) and the horizontal direction (fourth direction) orthogonal to each other. FIG. 29 is different from FIG. 27 in this respect.

In terms of the principle of STT-MRAM, the magnetoresistive elements MRD may be so placed that they are extended in a direction oblique to the directions in which memory cells MC are arranged, as in FIG. 29. When the magnetoresistive elements MRD are so arranged that the direction of their length is extended to a direction oblique to each strap wiring ST, the following can be implemented: it is possible to ensure a distance between the end portions in the direction of length of a pair of magnetoresistive elements MRD of memory cells MC adjoining to each other. For this reason, it is possible to make the aspect ratio of each magnetoresistive element MRD much higher (1 or above). It is possible to suppress short-circuiting between a pair of the magnetoresistive elements MRD of memory cells MC adjoining to each other. The magnetoresistive elements MRD may be so arranged that they overlap with the drain contacts DC in contact with the under surfaces of the strap wirings ST or may be so arranged that they are away from the drain contacts DC.

Figure 30:
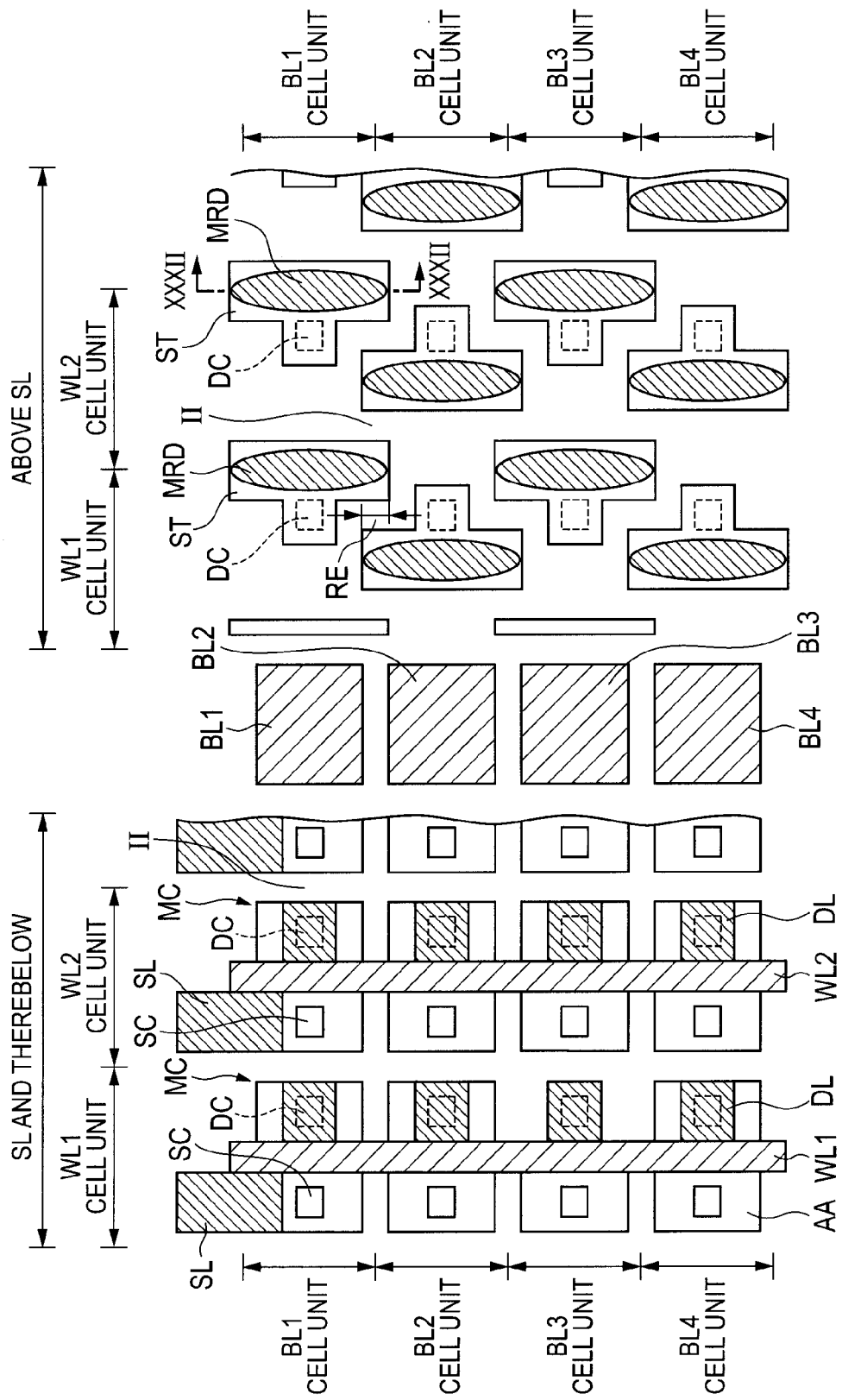
FIG. 30 is a plan view illustrating in detail the configuration of a memory cell area in a semiconductor device in a fourth example of the second embodiment of the invention.

As illustrated in FIG. 30, the memory cell area in a fourth example of this embodiment also has substantially the same configuration as the memory cell area in the first embodiment illustrated in FIG. 2 to FIG. 7. In the example in FIG. 30, however, the following measure is taken with respect to the magnetoresistive elements MRD arranged in a staggered configuration: they are made longer than in FIG. 2 in the direction of their length and the aspect ratio thereof is further higher than 1. Each magnetoresistive element MRD is very long in the direction of length (first direction). Therefore, a pair of magnetoresistive elements MRD adjoining to each other in the direction of the length are so arranged that the following is implemented: they at least partly (for example, their end portions) overlap with each other as viewed from the second direction (horizontal direction of the drawing) intersecting with the first direction. In FIG. 30, these overlap areas are indicated by RE as an example.

As a concrete example, consideration will be given to the following magnetoresistive elements MRD: the magnetoresistive element MRD of the memory cell MC in the area where the BL1 cell unit and the WL1 cell unit intersect with each other; and the magnetoresistive element MRD of the memory cell MC in the area, adjoining thereto in the first direction, where the BL2 cell unit and the WL1 cell unit intersect with each other. The following end portions are identical in coordinates in the first direction: the lower end portion of the magnetoresistive element MRD in the area where the BL1 cell unit and the WL1 cell unit intersect with each other; and the upper end portion of the magnetoresistive element MRD in the area where the BL2 cell unit and the WL1 cell unit intersect with each other.

This make is possible to further enhance the degree of freedom in layout with which individual memory cells MC (magnetoresistive elements MRD) are arranged over a semiconductor substrate. Specifically, it is possible to place magnetoresistive elements MRD higher in aspect ratio without increasing the area of each memory cell MC. As a result, it is possible to easily further enhance the degree of integration of the memory cell area.

The strap wiring ST of each magnetoresistive element MRD in FIG. 30 has a planar shape corresponding to the arrangement of the magnetoresistive elements MRD of the individual memory cells and the drain contacts DC in contact with the under surfaces of the strap wirings ST. That is, each strap wiring ST has a so-called T shape and is extended in the first direction and protruded to the direction in which a drain contact DC is placed so that the following is implemented: it overlaps with the magnetoresistive element MRD and the drain contact DC as viewed in a plane.

That is, each strap wiring ST has a shape in which it is extended in the third direction (substantially the same as the first direction) in which it is extended and the fourth direction (substantially the same as the second direction) (substantially) orthogonal to the third direction. The length by which each strap wiring ST is protruded in the fourth direction (substantially the same as the second direction) is shorter than the following length: the length of the strap wiring ST in, for example, FIG. 2 in the fourth direction (substantially the same as the second direction). In FIG. 30, that is, each strap wiring ST and each source contact SC hardly overlap with each other as viewed in a plane. FIG. 30 is different from FIG. 2 in each of the above respects.

Provision of this shape makes it possible to prevent a pair of strap wirings ST adjoining to each other from overlapping with each other as viewed in a plane. The following can be implemented even when the aspect ratio of each magnetoresistive element MRD is greater than 1 and the size of each strap wiring ST in the third direction (vertical direction) as viewed in a plane is increased: it is possible to suppress increase in the area of each strap wiring ST and further enhance the degree of integration of memory cells MC. This is because, for the magnetoresistive elements MRD identical in size with those in, for example, FIG. 30, the area of each strap wiring ST in the fourth direction (horizontal direction) as viewed in a plane is smaller than in cases where it has an oblong shape as in the first embodiment.

It is possible to reduce an area in each strap wiring ST where it overlaps with neither a magnetoresistive element MRD nor a drain contact DC as viewed in a plane as compared with cases where each strap wiring ST has an oblong shape. For this reason, it is possible to more effectively utilize a space as viewed in a plane in layout. In the fourth example, therefore, it is possible to further enhance the degree of integration of strap wirings ST and memory cells MC including them.

Figure 31:
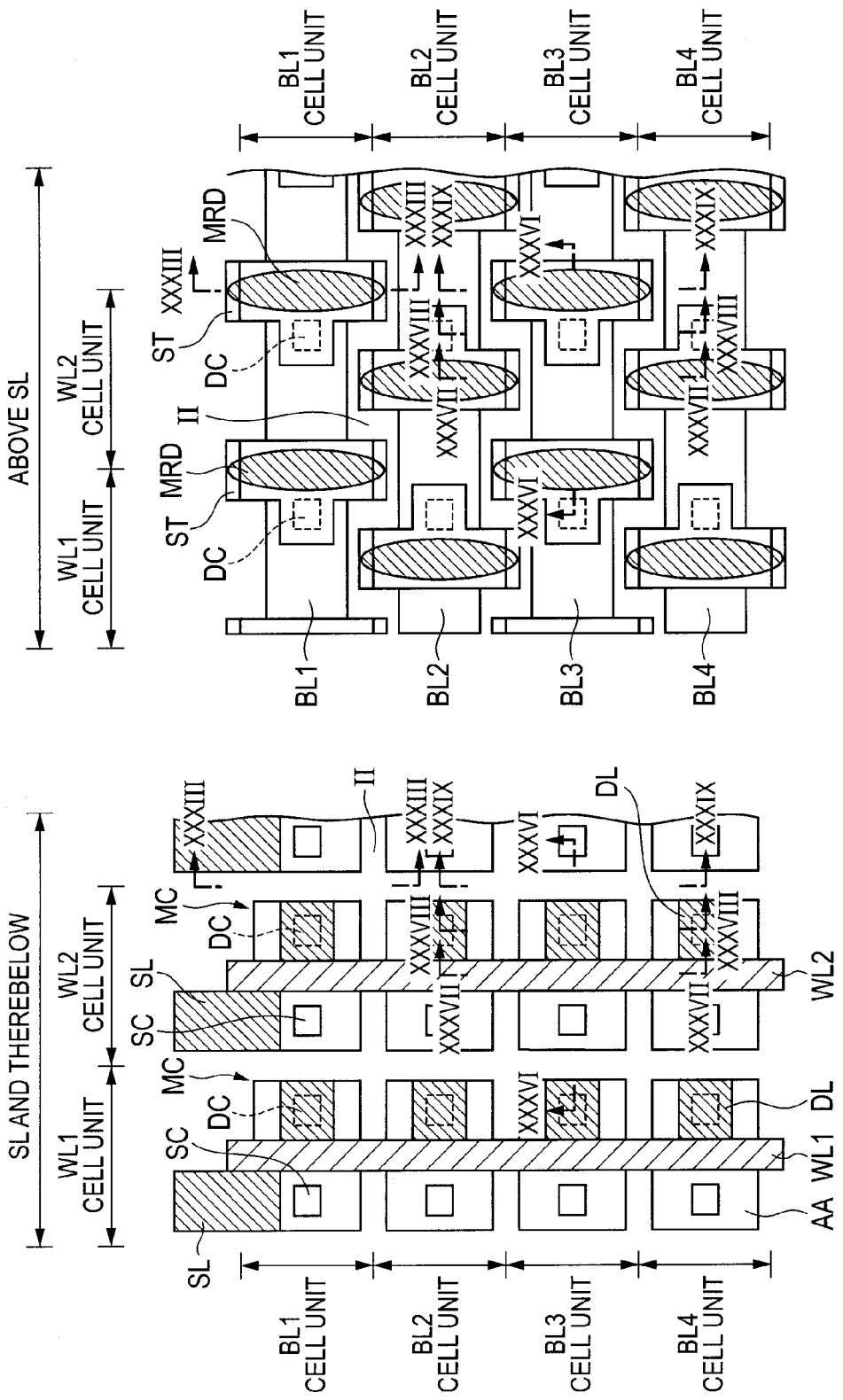
FIG. 31 is a plan view illustrating in detail the configuration of a memory cell area in a semiconductor device in a fifth example of the second embodiment of the invention.

As illustrated in FIG. 31, the memory cell area in a fifth example of this embodiment also has substantially the same configuration as the memory cell area in the fourth example illustrated in FIG. 30. In FIG. 31, the shape of each bit line BL as viewed in a plane is made different. Specifically, the following measure is taken in positions where the bit lines BL1 to BL4 overlap with a magnetoresistive element MRD: in the vertical direction (third direction) of the drawing, each bit line is extended (protruded) along the direction in which each magnetoresistive element MRD is extended. In other words, the following measure is taken in areas where each bit line BL1 to BL4 overlaps with a magnetoresistive element MRD as viewed in a plane: the width of the bit line BL1 to BL4 in the direction (third direction) orthogonal to the direction in which it is extended is larger in the overlap areas than in the areas other than the overlap areas.

Figure 32:
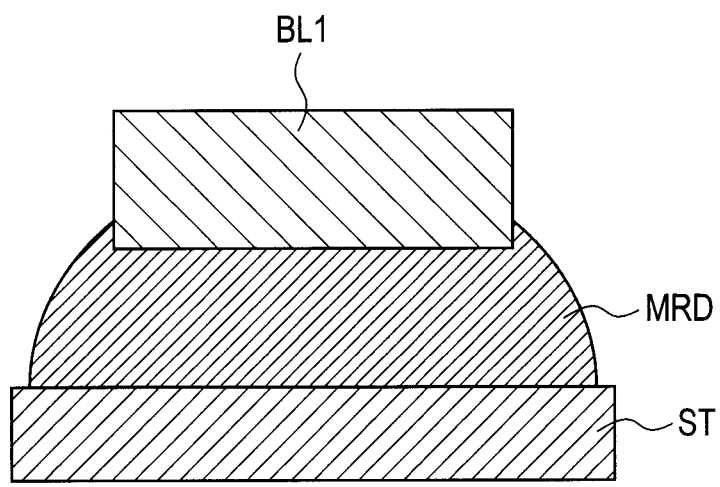
FIG. 32 is a schematic sectional view of a magnetoresistive element taken along line XXXII-XXXII of FIG. 30.
Figure 33:
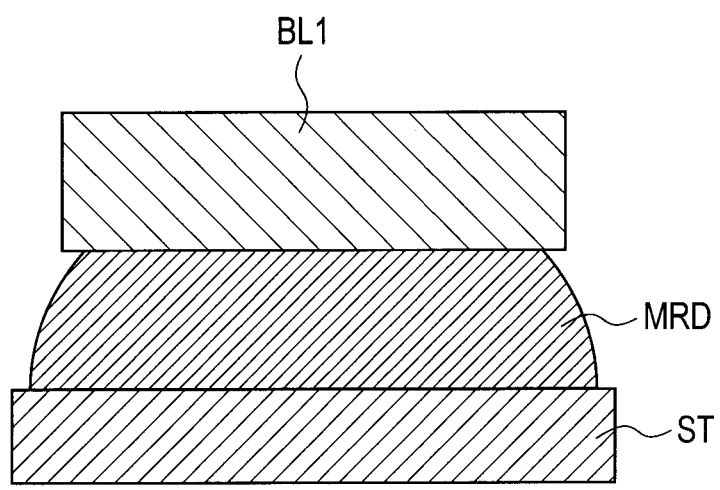
FIG. 33 is a schematic sectional view of a magnetoresistive element taken along line XXXIII-XXXIII of FIG. 31.

With this configuration, the following takes place even when the length of each magnetoresistive element MRD in the direction of length is larger than the length of each bit line BL1 to BL4 in the direction of width (vertical direction of the drawing): the vicinities of the end portions of the magnetoresistive element MRD and the bit line BL overlap with each other as viewed in a plane. As illustrated in FIG. 32 and FIG. 33, for this reason, the area where each bit line BL1 to BL4 and each magnetoresistive element MRD overlap with each other as viewed in a plane is larger in FIG. 31 than in FIG. 30.

Description will be given to the action and effect of the configuration in FIG. 31 with reference to the sectional views in FIG. 34 to FIG. 43 as appropriate.

Figure 34:
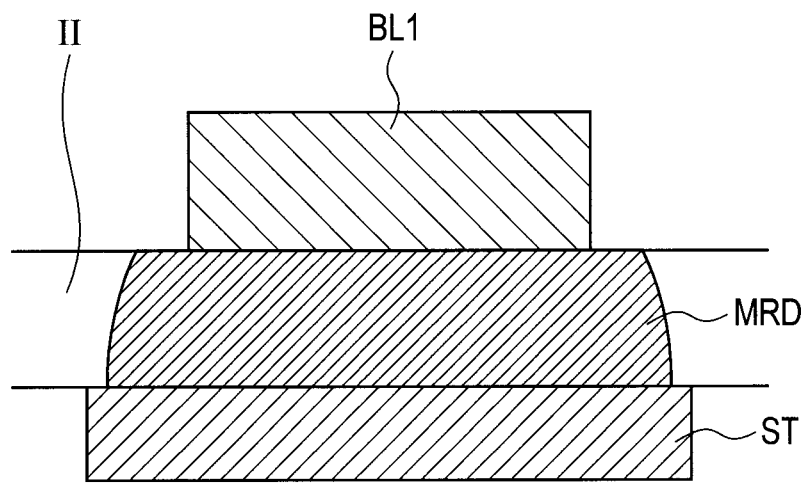
FIG. 34 is a schematic sectional view identical with FIG. 32, illustrating a mode in which the upper surface of the magnetoresistive element in FIG. 32 is flattened.
Figure 35:
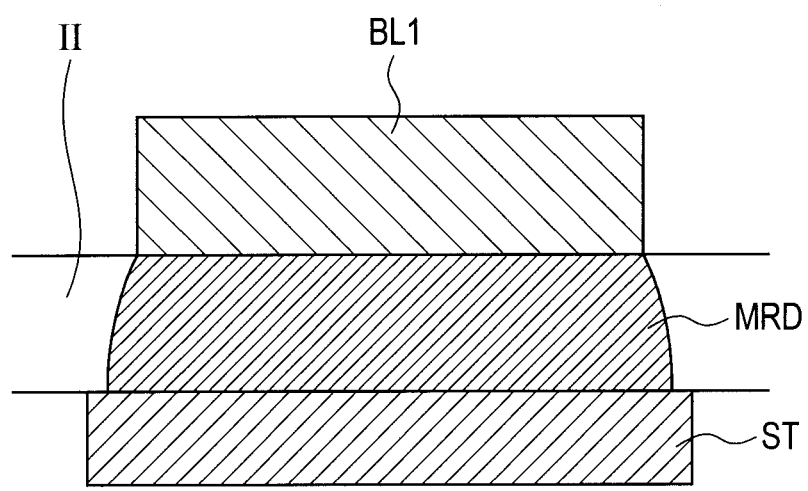
FIG. 35 is a schematic sectional view identical with FIG. 33, illustrating a mode in which the upper surface of the magnetoresistive element in FIG. 33 is flattened.
Figure 36:
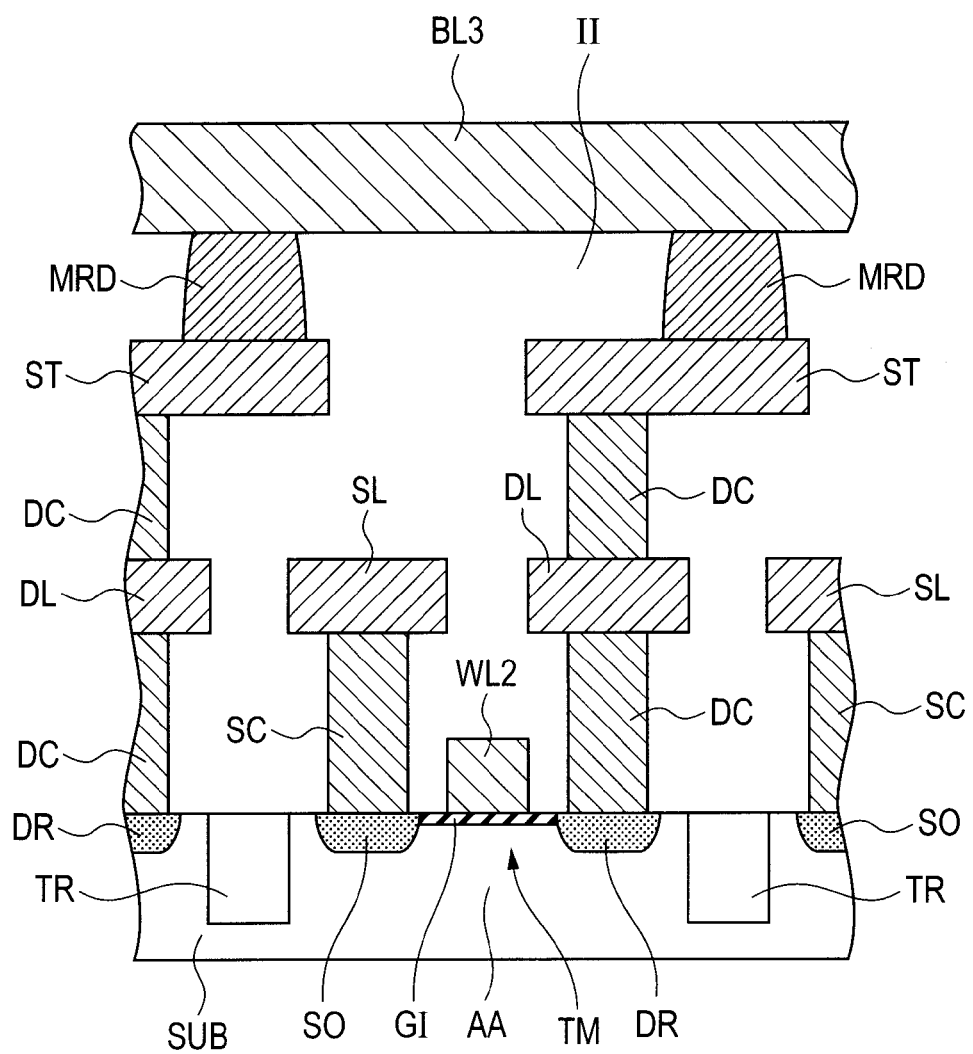
FIG. 36 is a schematic sectional view of the memory cell area in FIG. 31, taken along line XXXVI-XXXVI of FIG. 31.
Figure 37:
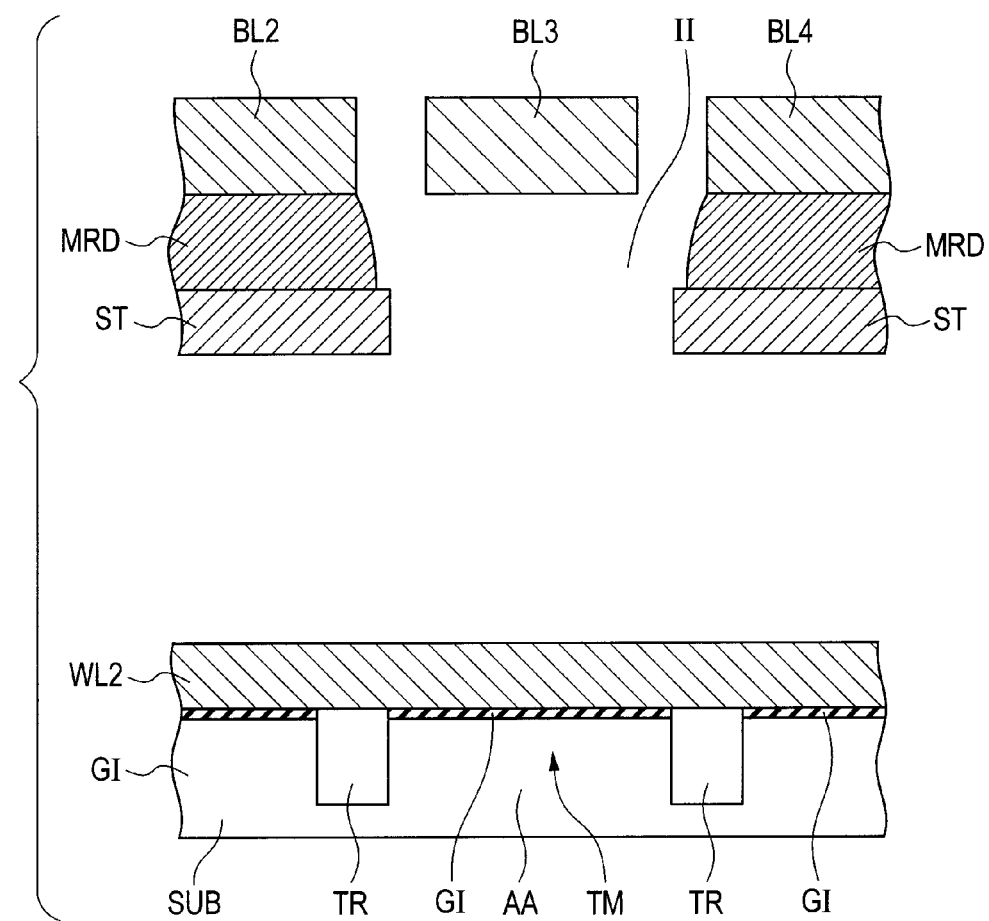
FIG. 37 is a schematic sectional view of the memory cell area in FIG. 31, taken along line XXXVII-XXXVII of FIG. 31.
Figure 38:
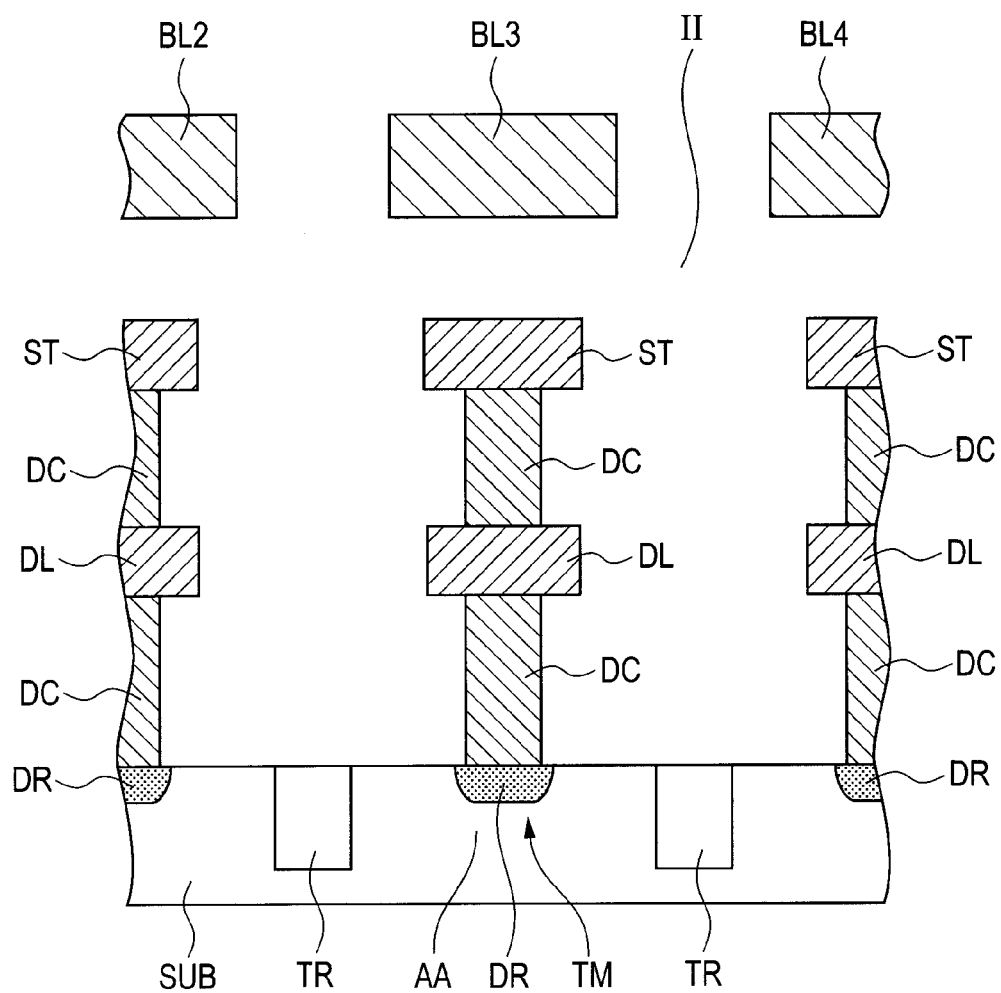
FIG. 38 is a schematic sectional view of the memory cell area in FIG. 31, taken along line XXXVIII-XXXVIII of FIG. 31.
Figure 39:
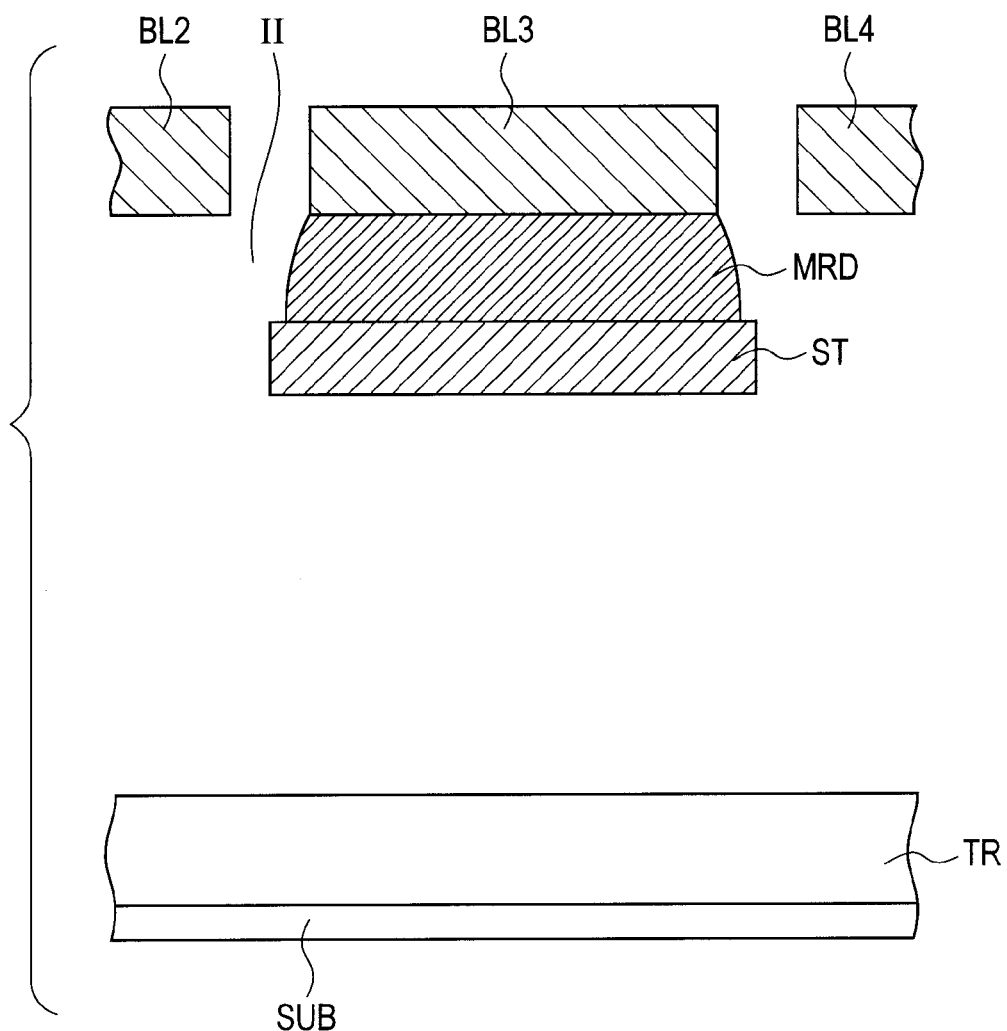
FIG. 39 is a schematic sectional view of the memory cell area in FIG. 31, taken along line XXXIX-XXXIX of FIG. 31.
Figure 40:
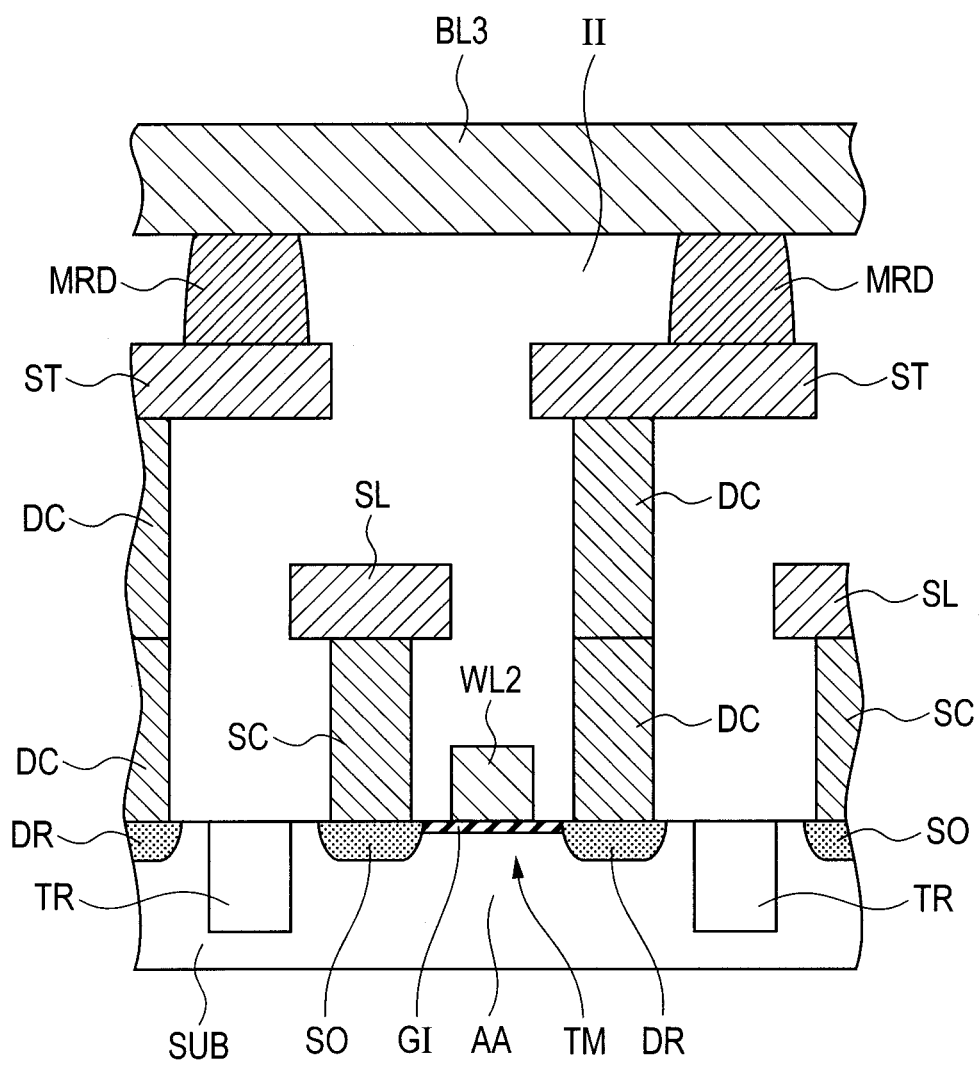
FIG. 40 is a schematic sectional view illustrating a first modification to the area illustrated in FIG. 36.
Figure 41:
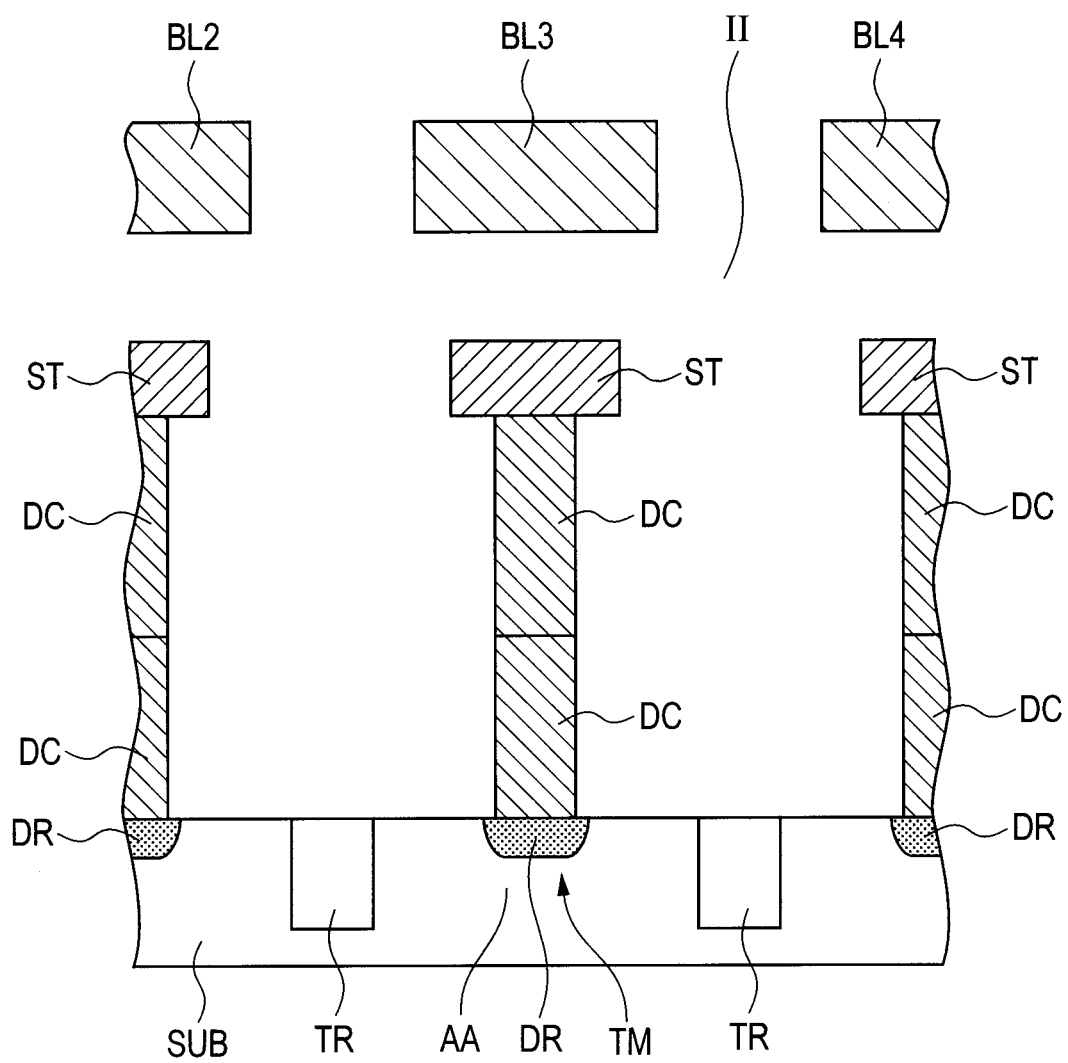
FIG. 41 is a schematic sectional view illustrating a first modification to the area illustrated in FIG. 38.
Figure 42:
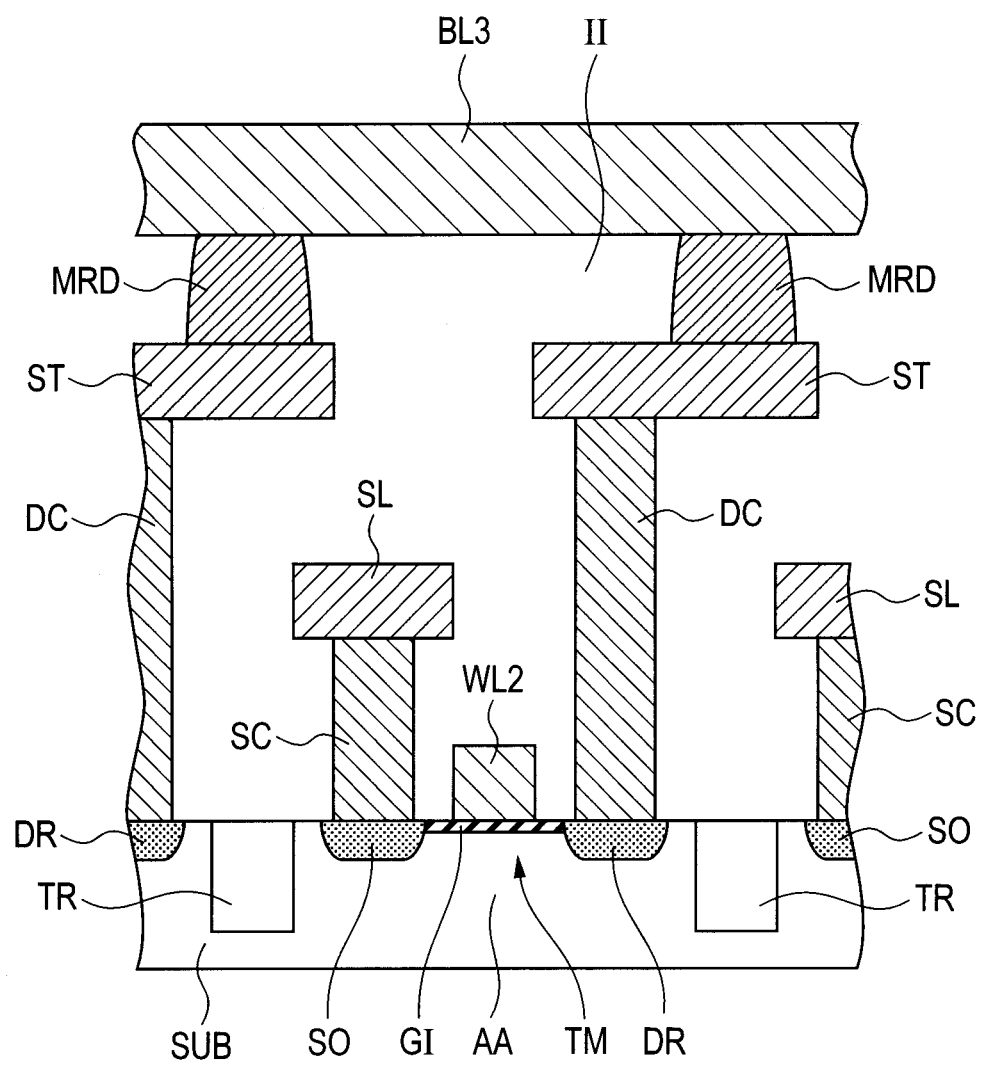
FIG. 42 is a schematic sectional view illustrating a second modification to the area illustrated in FIG. 36.
Figure 43:
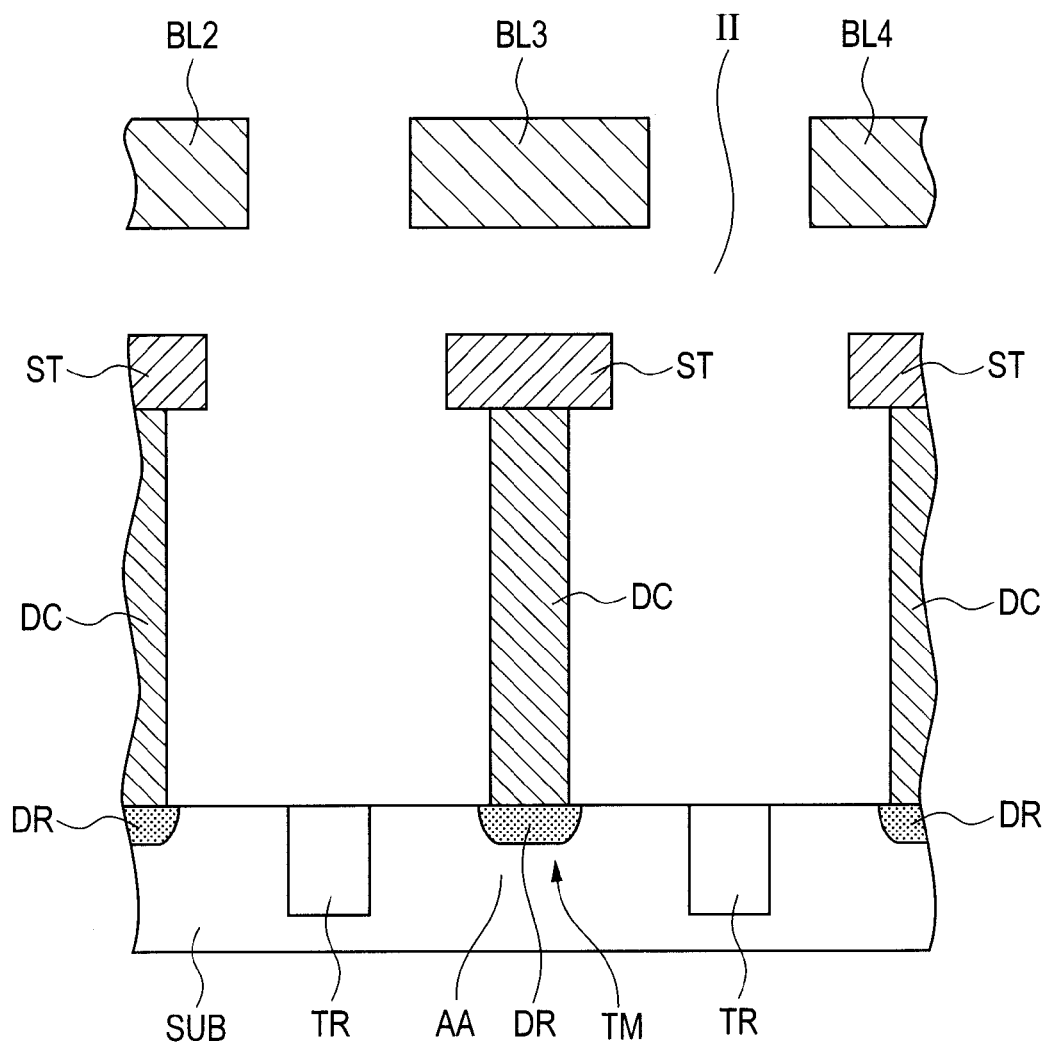
FIG. 43 is a schematic sectional view illustrating a second modification to the area illustrated in FIG. 38.

As illustrated in FIG. 34 and FIG. 35, processing may be carried out to enhance the flatness of the upper surface (the cap layer CP in FIG. 8) of each magnetoresistive element MRD before the bit lines BL1 to BL4 in FIG. 30 to FIG. 33 are formed. For this processing, for example, polishing designated as CMP (Chemical Mechanical Polishing) is carried out. At this time, the area of contact between a magnetoresistive element MRD and a bit line is larger in the configuration in FIG. 31 (FIG. 33) than in the configuration in, for example, FIG. 30 (FIG. 32). Therefore, electrical coupling between the bit lines BL1 to BL4 and the magnetoresistive elements MRD can be made more reliable by adopting the configuration in FIG. 31 (FIG. 33). FIG. 37 and FIG. 39 illustrate the bit line BL3 having the same configuration as the bit line BL1 illustrated in FIG. 35.

As illustrated in FIG. 34 and FIG. 36 to FIG. 39, the memory cells MC in this embodiment basically have the same cross-sectional configuration as the memory cells MC in the first embodiment in FIG. 3 and FIG. 4. That is, each drain contact DC has such a configuration that it is separated into two layers, an upper layer and a lower layer, so that a source line SL is sandwiched therebetween. As illustrated in, for example, FIG. 40 and FIG. 41, however, the drain contacts may be so configured that a pair of an upper drain contact DC and a drain contact DC are directly coupled with each other without a source line SL sandwiched therebetween. As illustrate in FIG. 42 and FIG. 43, a configuration in which a drain region DR and a strap wiring ST are coupled with each other through a single layer of drain contact DC may be adopted.

Figure 44:
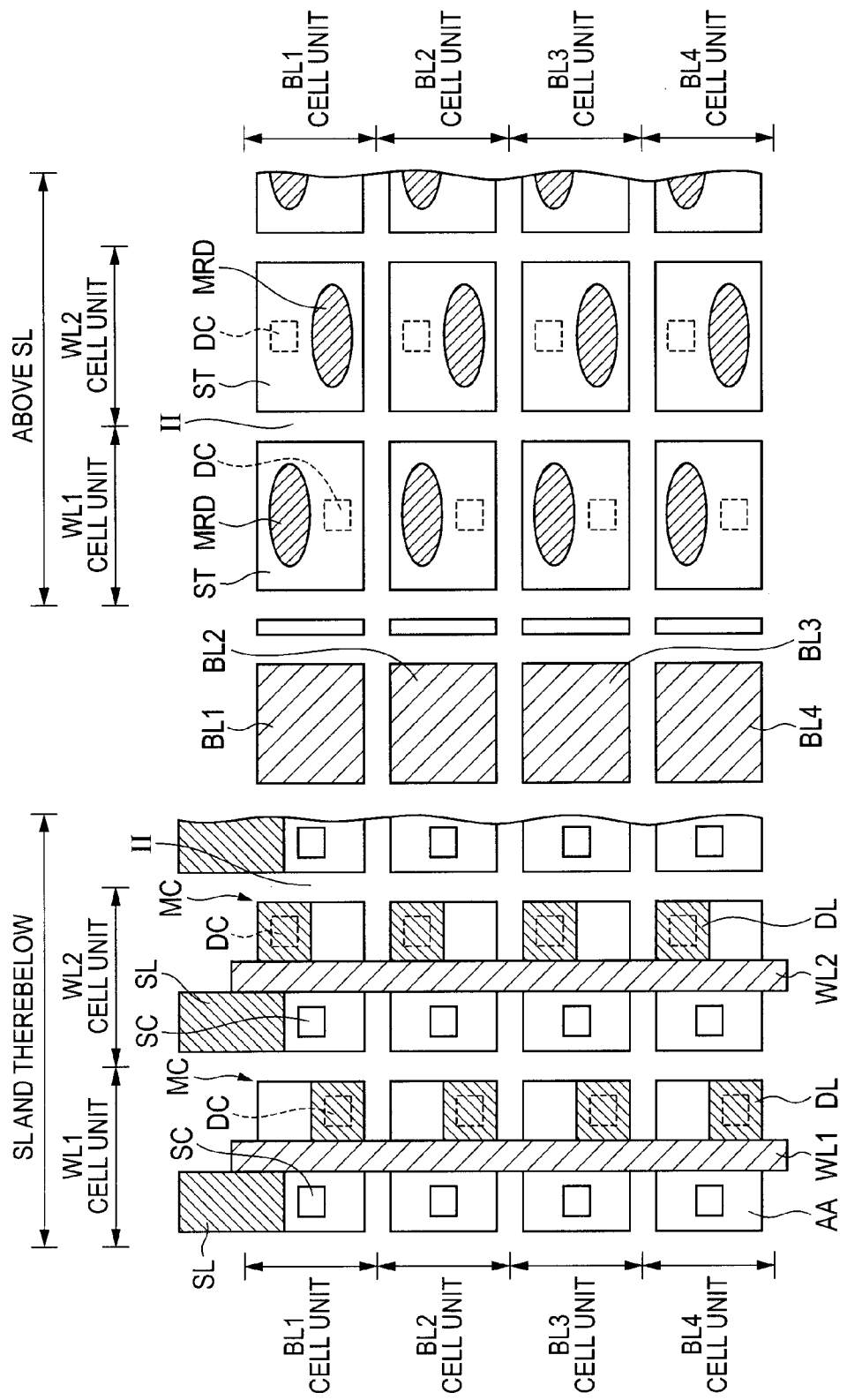
FIG. 44 is a plan view illustrating in detail the configuration of a memory cell area in a semiconductor device in a sixth example of the second embodiment of the invention.

As illustrated in FIG. 44, the memory cell area in a sixth example of this embodiment also has substantially the same configuration as the memory cell area in the second example of this embodiment in FIG. 28. In FIG. 44, however, the drain contact DC in each memory cell MC is placed in a position slightly different from each of the drain contacts DC in FIG. 28. Specifically, the drain contacts DC of the WL1 cell unit in FIG. 44 are placed slightly below (at the lower left of) those in FIG. 28; and the drain contacts DC of the WL2 cell unit in FIG. 44 are placed slightly above (at the upper left of) those in FIG. 28.

For this reason, in each memory cell MC in FIG. 44, the magnetoresistive element MRD and the drain contact DC are away from each other and the shortest distance therebetween as viewed in a plane is substantially constant. In FIG. 44, that is, the shortest distance between the magnetoresistive elements MRD and the drain contacts DC arranged in a staggered configuration along the direction of length in which the bit lines BL are extended is substantially constant.

This can bring about the following: the above-mentioned action and effect of the enhancement of the electrical characteristics by the arrangement of the magnetoresistive elements MRD in a staggered configuration; the effect of the enhancement of the flatness of each magnetoresistive element MRD by ensuring the shortest distance between the magnetoresistive elements MRD and the drain contact DC; and the effect of the reduction in variation in electrical characteristics.

Figure 45:
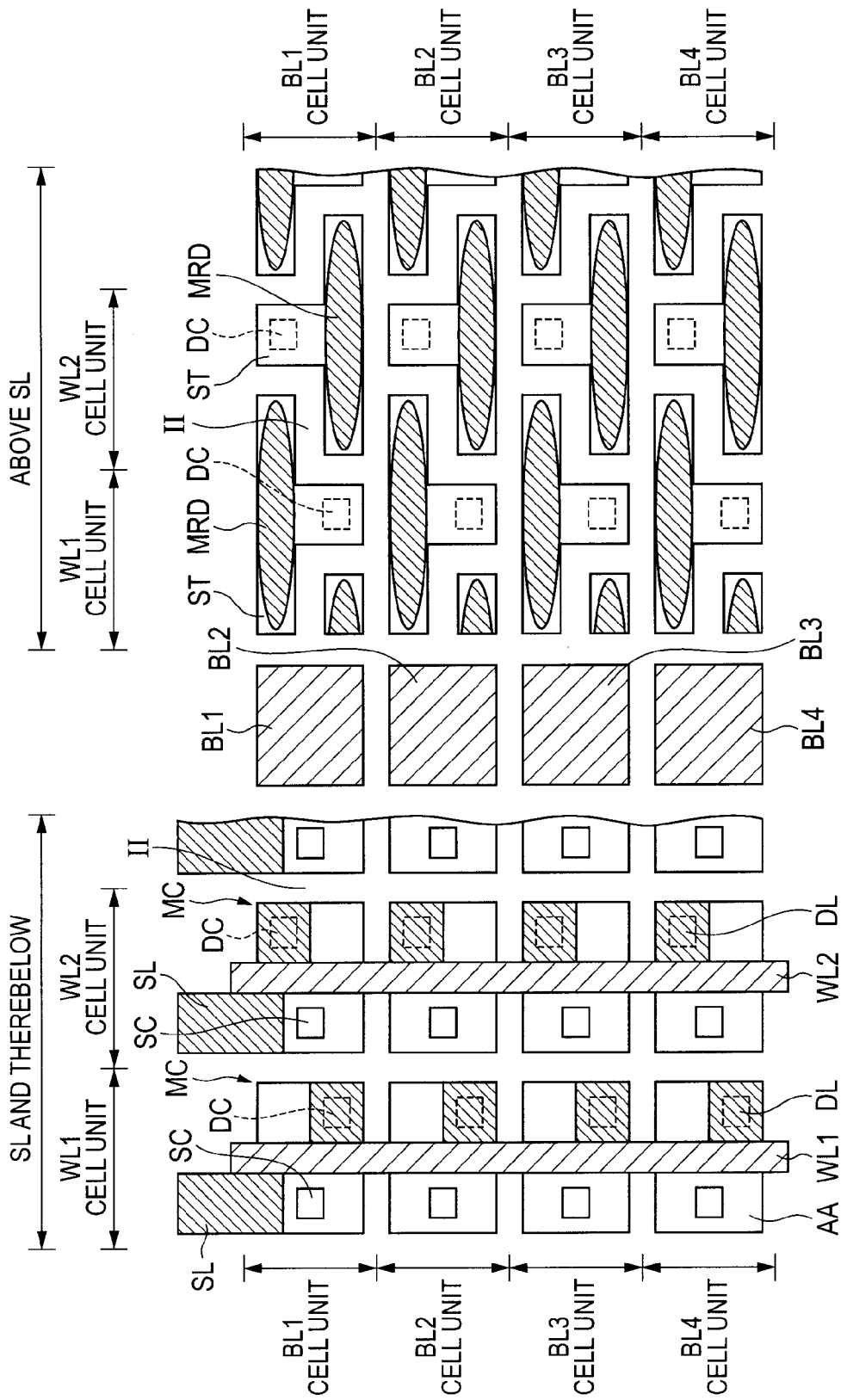
FIG. 45 is a plan view illustrating in detail the configuration of a memory cell area in a semiconductor device in a seventh example of the second embodiment of the invention.

As illustrated in FIG. 45, the memory cell area in a seventh example of this embodiment includes the following memory cells: memory cells in which the aspect ratio of each magnetoresistive element MRD in FIG. 44 is further higher than 1 and each strap wiring ST is provided with the same shape as in FIG. 30. This makes it possible to bring about the action and effect of the memory cells MC in FIG. 30 in addition to the action and effect of the memory cells MC in FIG. 44. That is, it is possible to suppress increase in the area of each memory cell MC and make higher the degree of integration of the memory cells MC.

Figure 46:
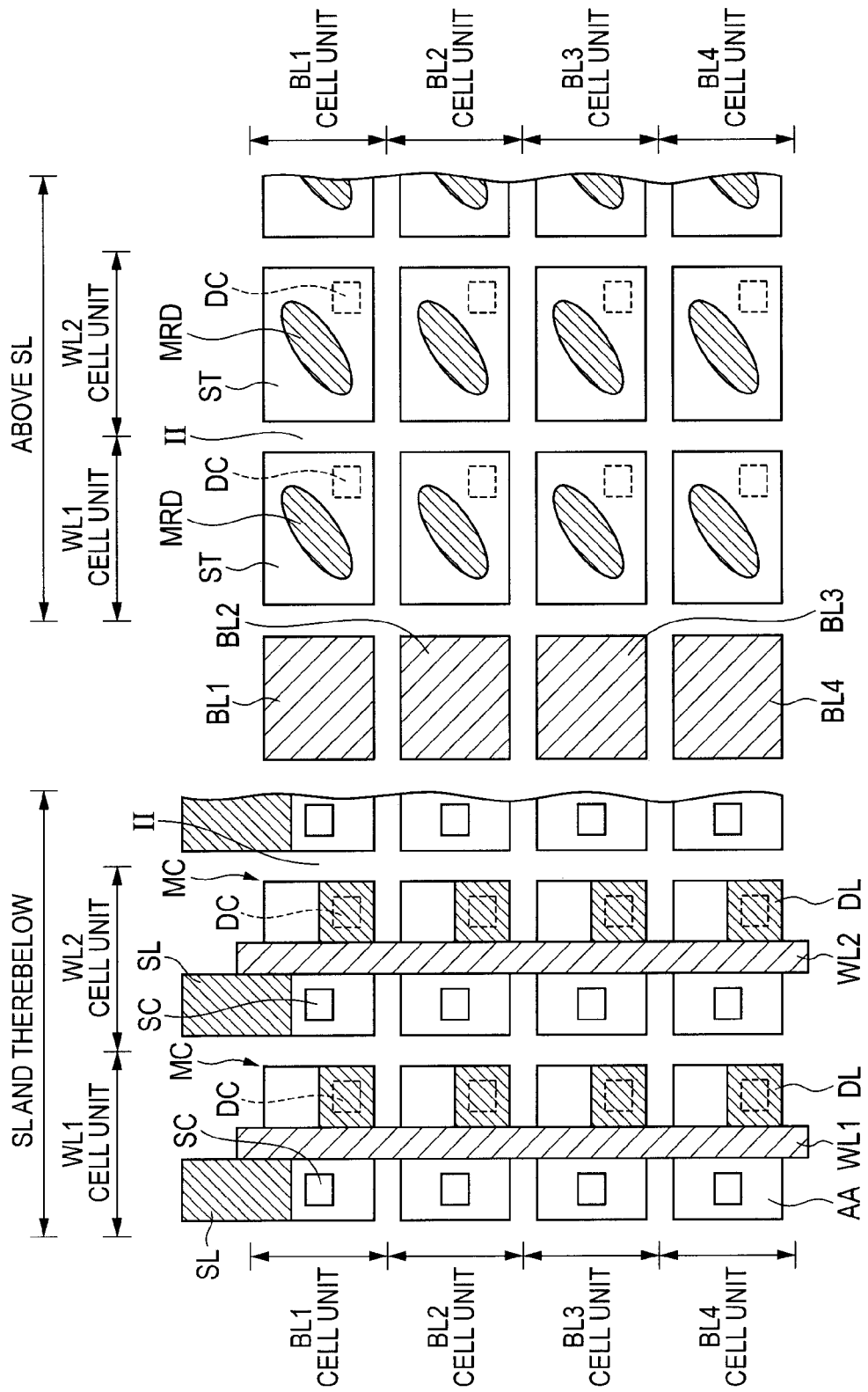
FIG. 46 is a plan view illustrating in detail the configuration of a memory cell area in a semiconductor device in an eighth example of the second embodiment of the invention.
Figure 47:
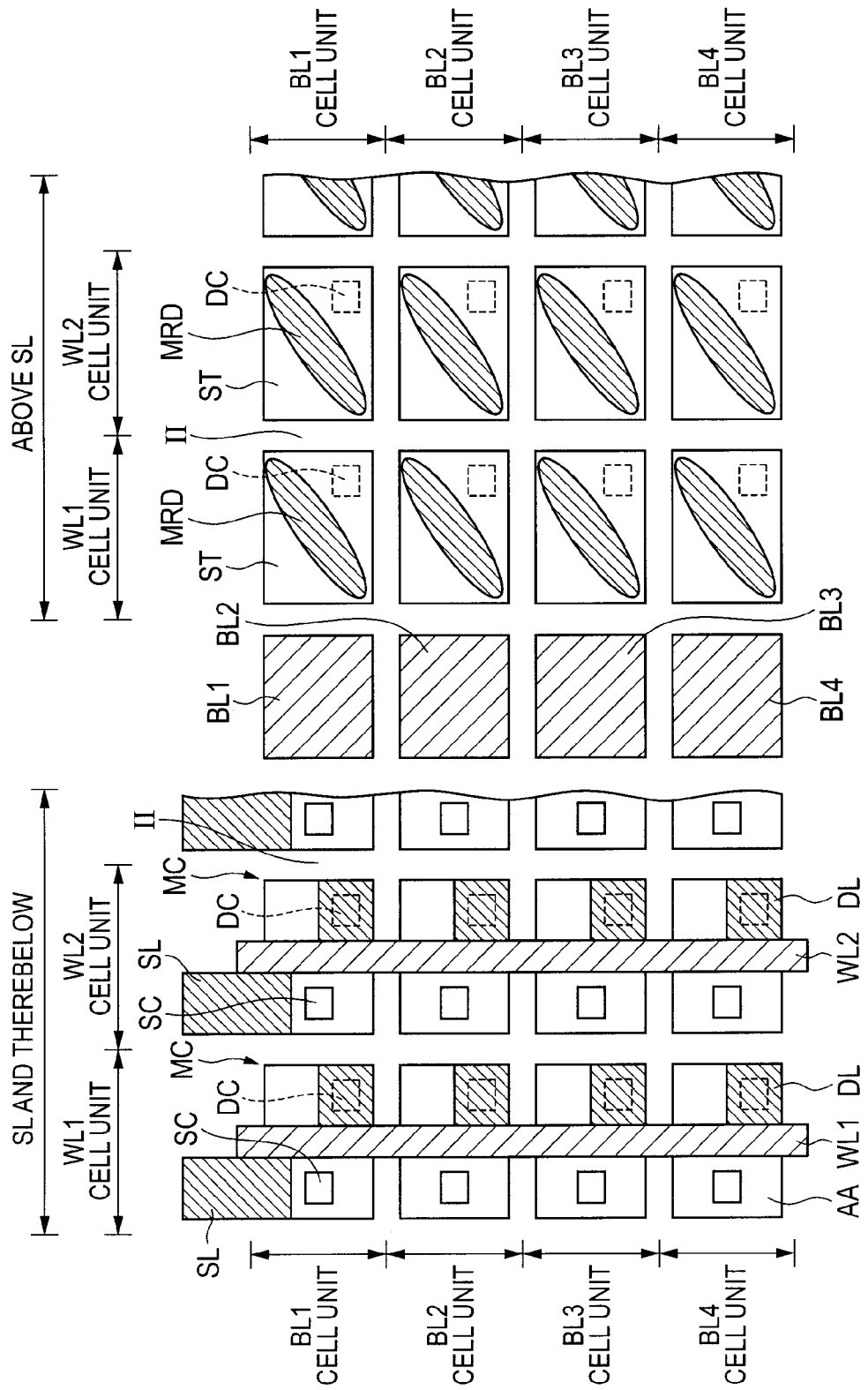
FIG. 47 is a plan view illustrating in detail the configuration of an area where magnetoresistive elements whose aspect ratio is further higher than 1 as compared with those in FIG. 46, in a semiconductor device in the eighth example of the second embodiment of the invention.

As illustrated in FIG. 46 and FIG. 47, the memory cell area in an eighth example of this embodiment includes memory cells in which the following arrangements are combined with each other: the arrangement of drain contacts DC illustrated in FIG. 44 and FIG. 45 and the arrangement of magnetoresistive elements MRD illustrated in FIG. 29. This makes it possible to bring about the action and effect of the memory cells MC in FIG. 29 in addition to the action and effect of the memory cells MC illustrated in FIG. 44. That is, it is possible to suppress short-circuiting between the end portions of magnetoresistive elements MRD in the direction of length and to bring about the effect of further enhancement of the degree of integration of memory cells MC. In FIG. 47, the size of each magnetoresistive element MRD in the direction of length is further larger than in FIG. 46. The direction of length of each magnetoresistive element MRD is extended in the direction along a diagonal line of each strap wiring ST. The length in the direction along a diagonal line of each strap wiring ST is larger than the dimensions in directions in which multiple strap wirings ST are arranged in an array. For this reason, it is possible to increase the size of each magnetoresistive element MRD in the direction of length as in FIG. 47.

The second embodiment of the invention is different from the first embodiment of the invention only in each of the above-mentioned respects. That is, with respect to the second embodiment of the invention, configurations, conditions, procedures, effects, and the like that are not described above are all in accordance with the first embodiment of the invention.

Third Embodiment

The third embodiment of the invention is different from the first embodiment in the arrangements of source contacts and drain contacts and the configuration of source lines SL. Hereafter, description will be given to the configuration of this embodiment with reference to FIG. 48 to FIG. 77.

Figure 48:
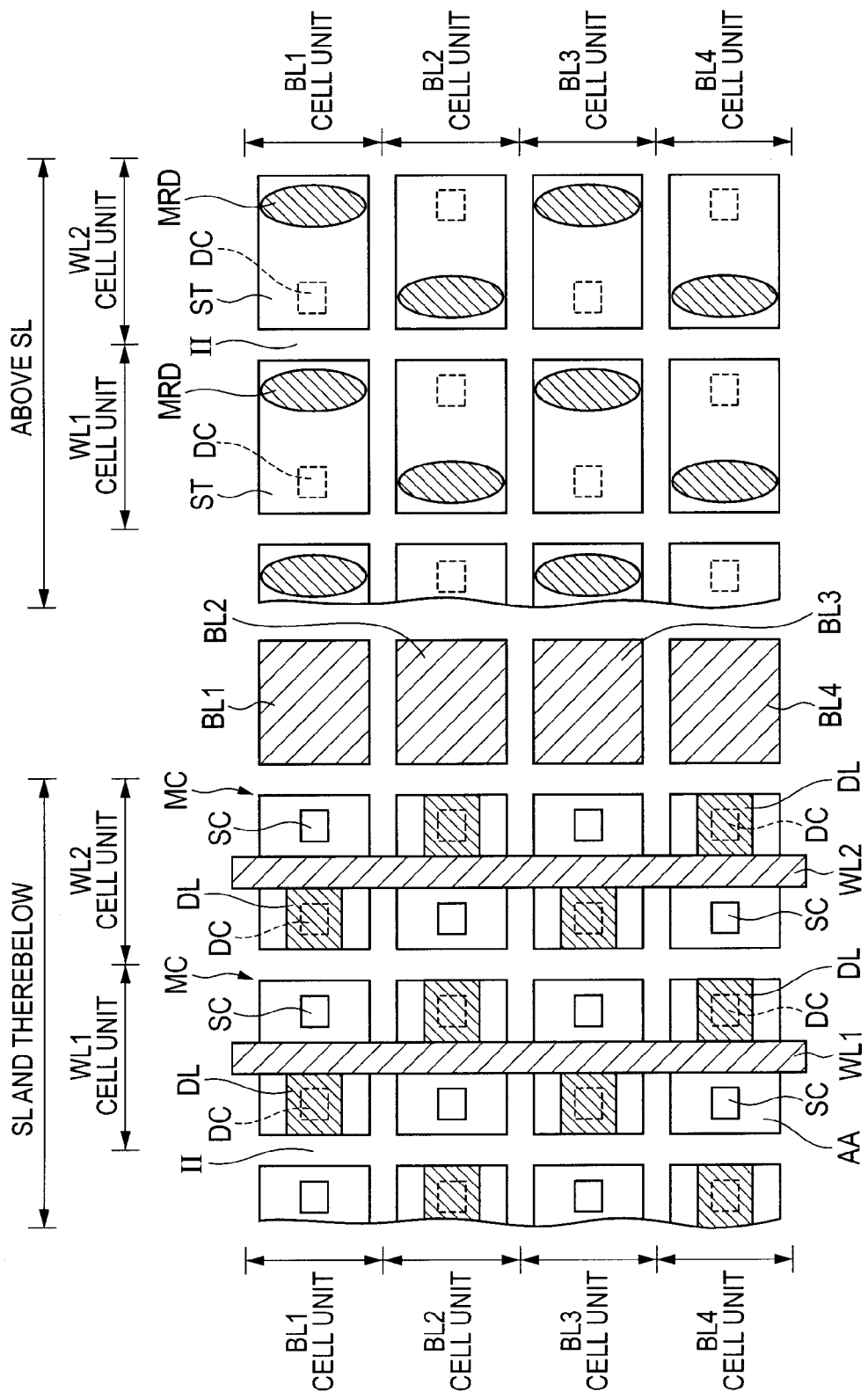
FIG. 48 is a plan view illustrating in detail the configuration of a memory cell area in a semiconductor device in a first example of a third embodiment of the invention.

In a first example of this embodiment, as illustrated in FIG. 48, the magnetoresistive elements MRD are so placed that they are arranged in a staggered configuration with respect to each strap wiring ST as in FIG. 2 referred to in relation to the first embodiment. In this embodiment, in addition to the above feature, the source contacts SC and the drain contacts DC are also arranged in a staggered configuration similarly to the magnetoresistive elements MRD.

More specific description will be given. For example, the source contacts SC and the drain contacts DC of two memory cells MC adjoining to each other in the vertical direction of FIG. 48 are so arranged that they are not on an identical straight line extended in the vertical direction. That is, two source contacts SC and two drain contacts DC adjoining to each other in the vertical direction, or the direction (first direction) in which the direction of length is extended, are placed as follows: they are placed in different coordinates in the horizontal direction, or the direction (second direction) intersecting with the first direction. For example, in the BL1 and BL3 cell units in FIG. 48, the source contacts SC are placed on the right of each active region AA (memory cell MC) and the drain contacts DC are placed on the left thereof. In the BL2 and BL4 cell units in FIG. 48, the source contacts SC are placed on the left of each active region AA (memory cell MC) and the drain contacts DC are placed on the right thereof. The source contacts SC and drain contacts DC of two memory cells MC adjoining to each other in the horizontal direction of FIG. 48 are also in the same relation as mentioned above. As mentioned above, the source contacts SC and the drain contacts DC are arranged in a staggered configuration so that they are alternated with respect to the positions of the active regions AA and the strap wirings ST.

In the first example of this embodiment illustrated in FIG. 48, the drain contacts DC and the magnetoresistive elements MRD are arranged in a staggered configuration as viewed in a plane. That is, each source contact SC and each magnetoresistive element MRD are placed in positions where they substantially overlap with each other as viewed in a plane. For this reason, the active region AA and strap wiring ST of each memory cell MC are placed in positions where they substantially overlap with each other as viewed in a plane. FIG. 48 is different from FIG. 2 in each of the above-mentioned respects.

In the first example of this embodiment illustrated in FIG. 48, it is desirable to take, for example, the following measure when the source lines SL are extended as in FIG. 2: a hole is provided in an area that overlaps with a drain contact DC (drain coupling layer DL) as viewed in a plane. This makes it possible to suppress short-circuiting between a source line SL and a drain contact DC (drain coupling layer DL).

As illustrated in FIG. 49 to FIG. 52, it is desirable to configure the source lines SL so that the following is implemented: they are bent or protruded in the directions in which they are extended (the directions (third and fourth directions) in which the memory cells MC are arranged in an array). This makes it possible to suppress short-circuiting between a source line SL and a drain contact DC.

Figure 49:
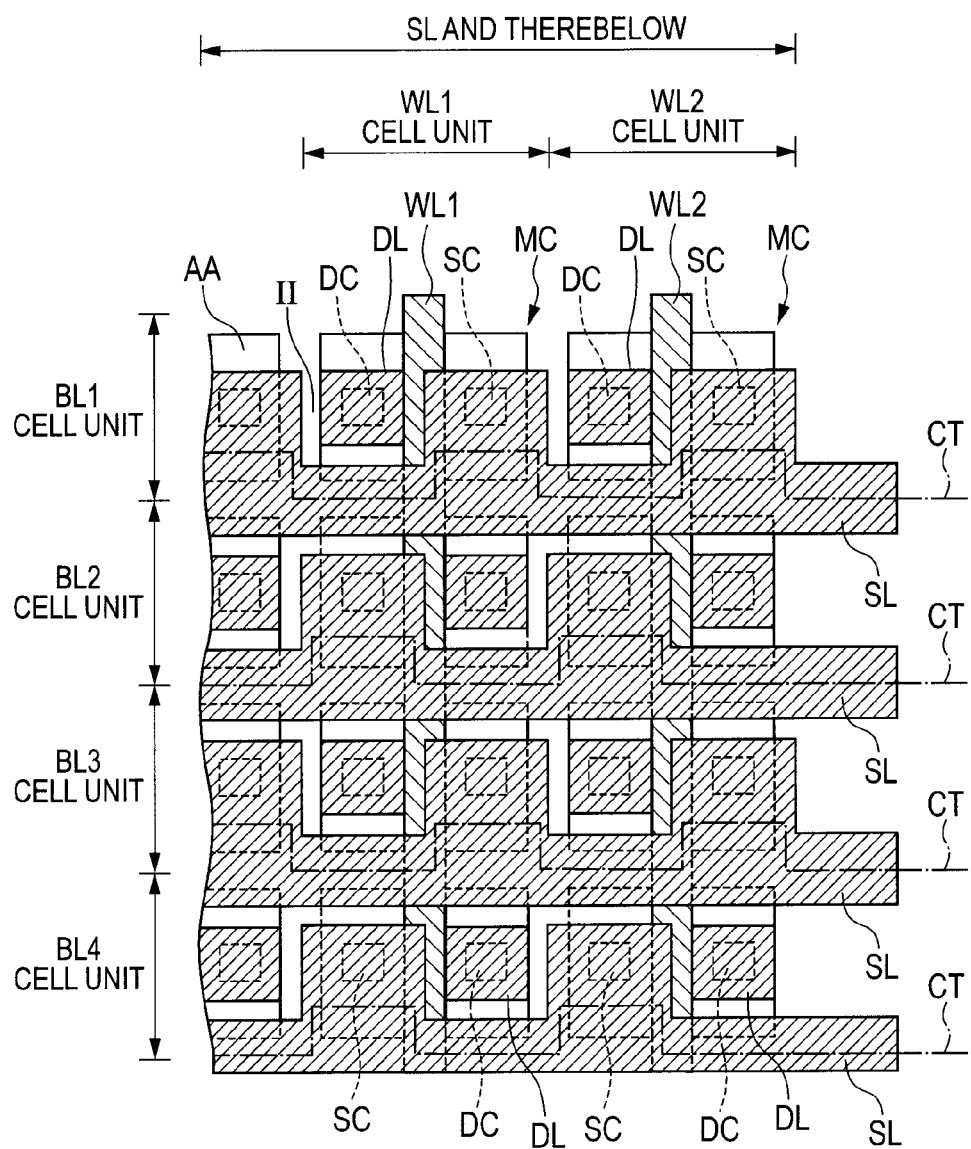
FIG. 49 is a schematic plan view of a first modification to the shape of the source lines in FIG. 48 as viewed in a plane, illustrating only the source lines and the layers located therebelow.
Figure 50:
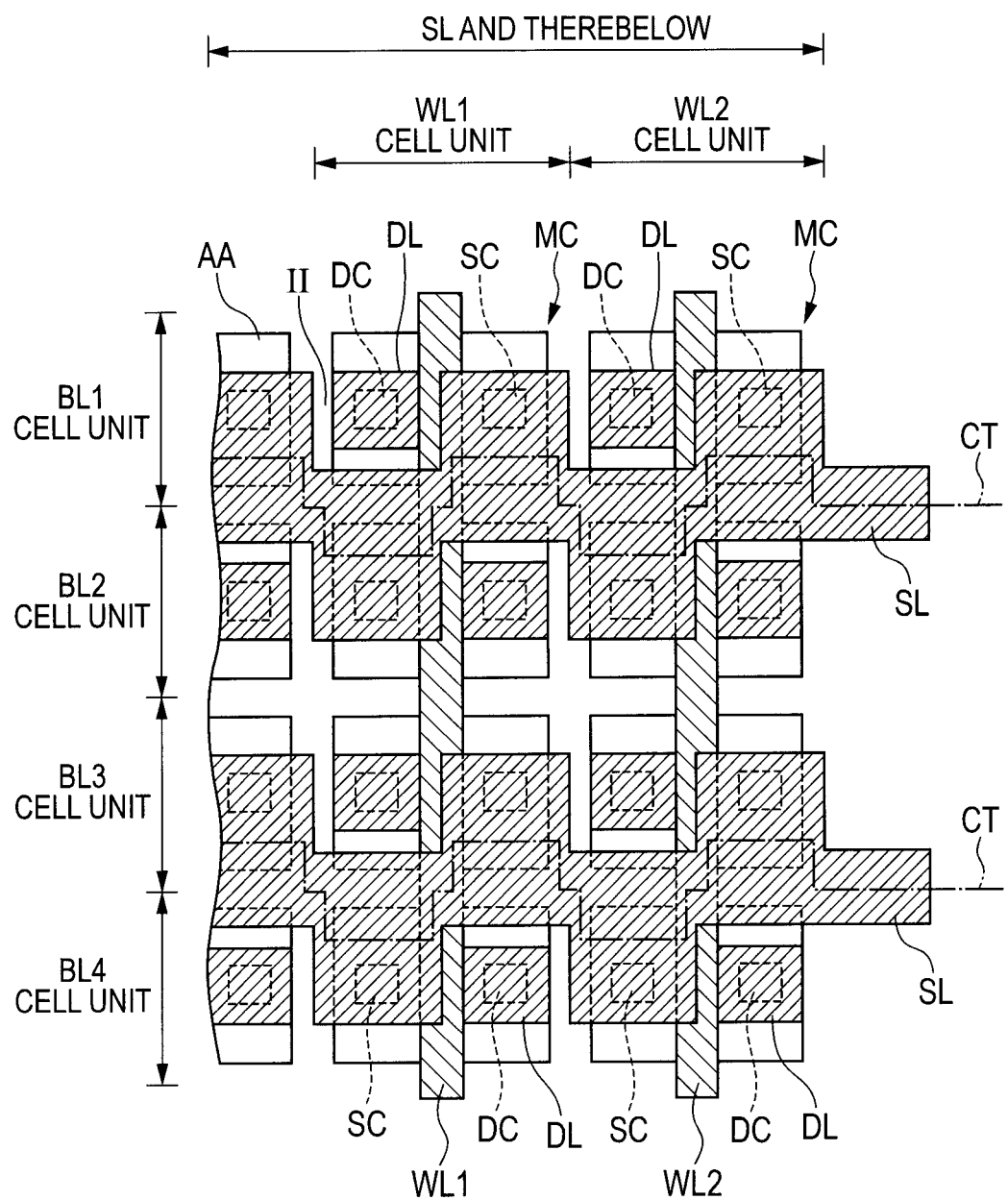
FIG. 50 is a schematic plan view of a second modification to the shape of the source lines in FIG. 48 as viewed in a plane, illustrating only the source lines and the layers located therebelow.

As illustrated in FIG. 49 and FIG. 50, specifically, the source lines SL may be in such a shape that they are extended in the horizontal direction and overlap with the source contacts SC arranged in a staggered configuration as viewed in a plane. For the source lines SL to overlap with the source contacts SC arranged in a staggered configuration as viewed in a plane, it is desirable that the center lines CT thereof should be bent in the direction in which the source lines SL are extended.

In FIG. 49, a single source line SL1 to SL4 is placed in each of the BL1 to BL4 cell units. For this reason, each source line extended in the horizontal direction of the drawing is in such a shape that it is protruded upward in the drawing in positions where a source contact SC and the source line SL1 to SL4 overlap with each other.

In FIG. 50, meanwhile, a single source line SL is so placed that it overlaps (is coupled) with the two sets of source contacts SC of the BL1 cell unit and the BL2 cell unit, as viewed in a plane. Another single source line SL is so placed that it overlaps (is coupled) with the two sets of source contacts SC of the BL3 cell unit and the BL4 cell unit as viewed in a plane. Therefore, each source line SL extended in the horizontal direction of the drawing is in such a shape that it is periodically bent and protruded upward or downward in the drawing.

Figure 51:
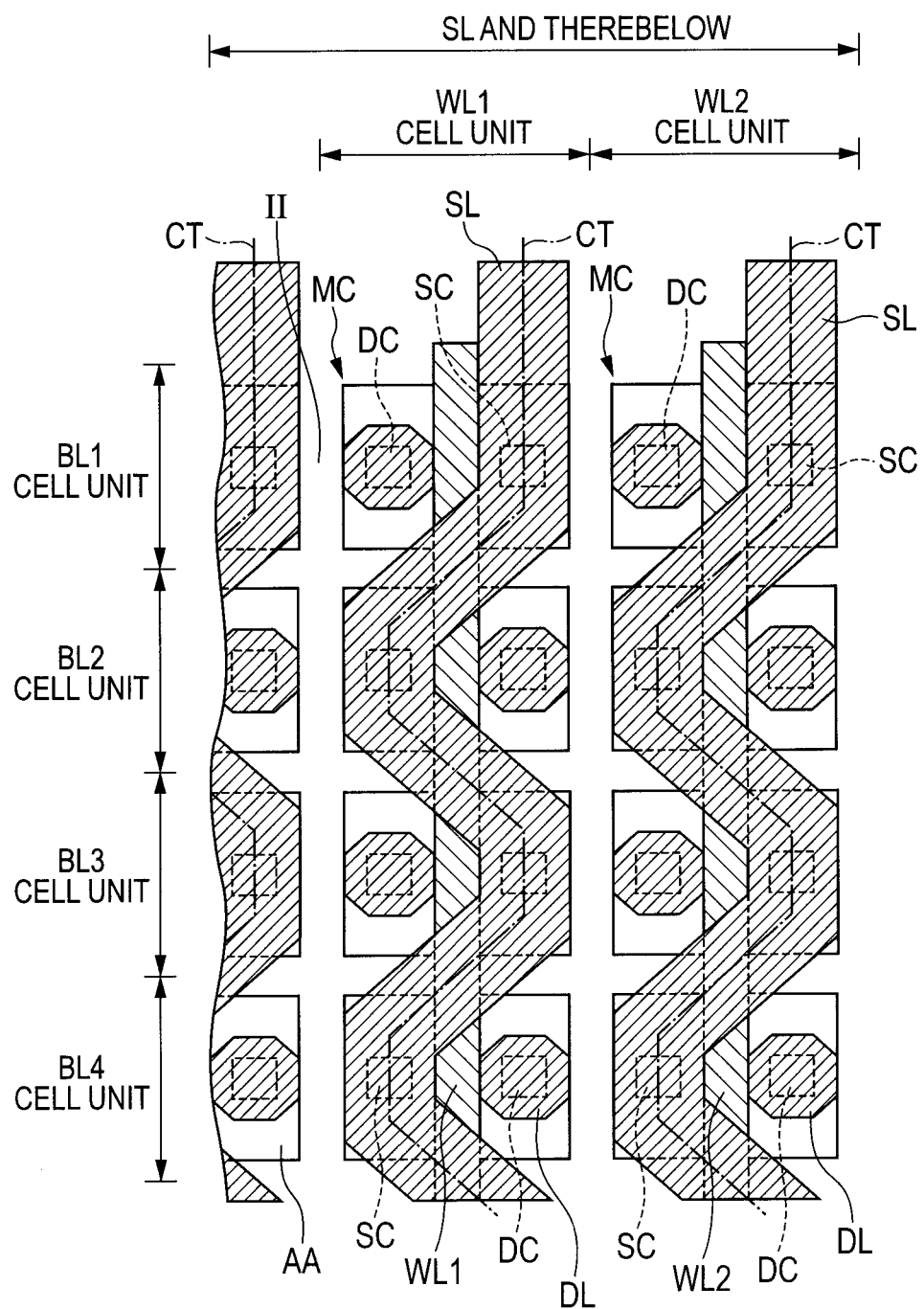
FIG. 51 is a schematic plan view of a third modification to the shape of the source lines in FIG. 48 as viewed in a plane, illustrating only the source lines and the layers located therebelow.
Figure 52:
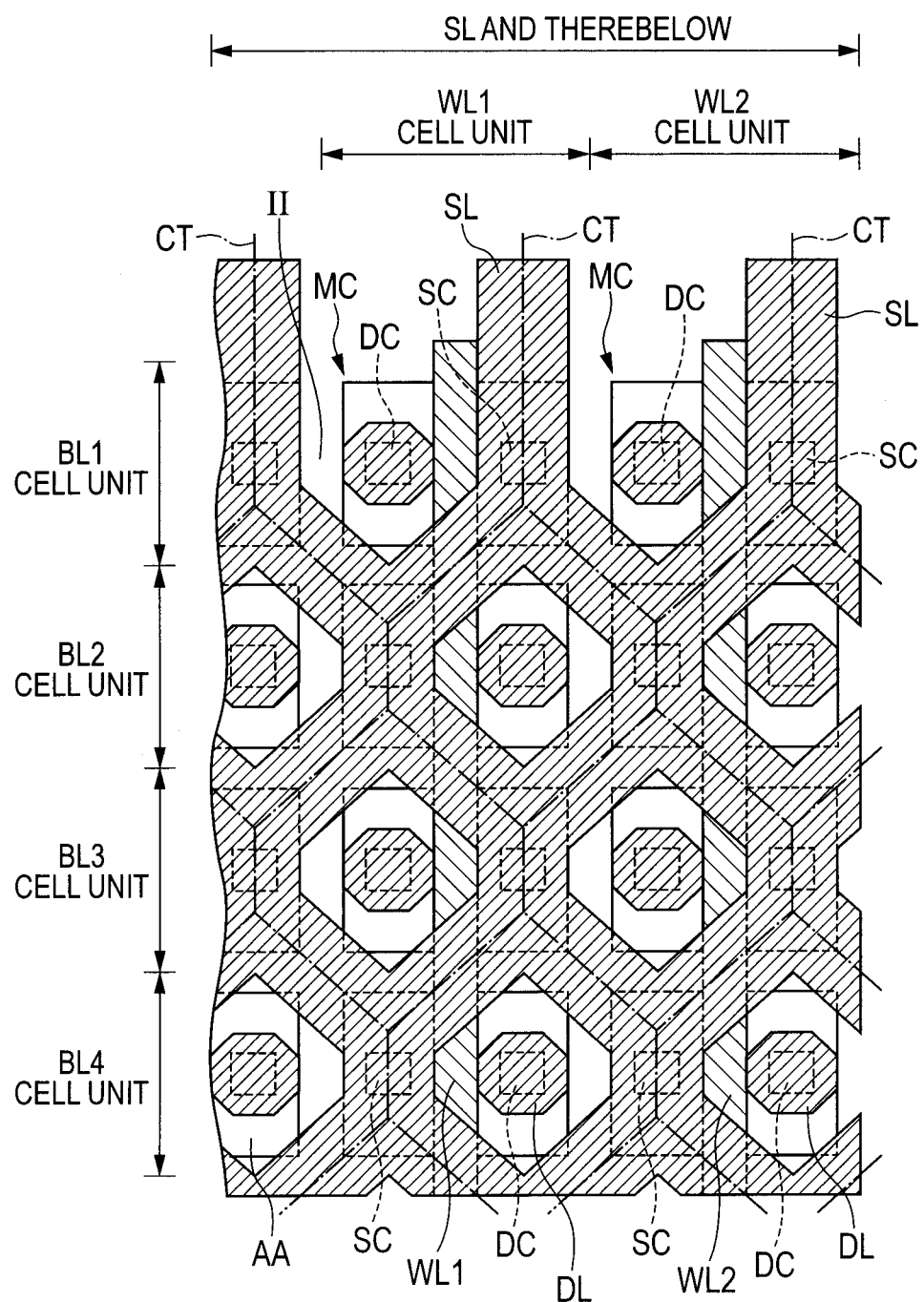
FIG. 52 is a schematic plan view of a fourth modification to the shape of the source lines in FIG. 48 as viewed in a plane, illustrating only the source lines and the layers located therebelow.

Or, as illustrated in FIG. 51, the source lines SL may have such a shape that they are bent in accordance with the positions of the source contacts SC and extended in the vertical direction. Or, as illustrated in FIG. 52, the source lines SL may have such a shape that the following measure is taken: they are extended both in the horizontal direction and in the vertical direction like mesh and overlap with the source contacts SC arranged in a staggered configuration as viewed in a plane.

Figure 53:
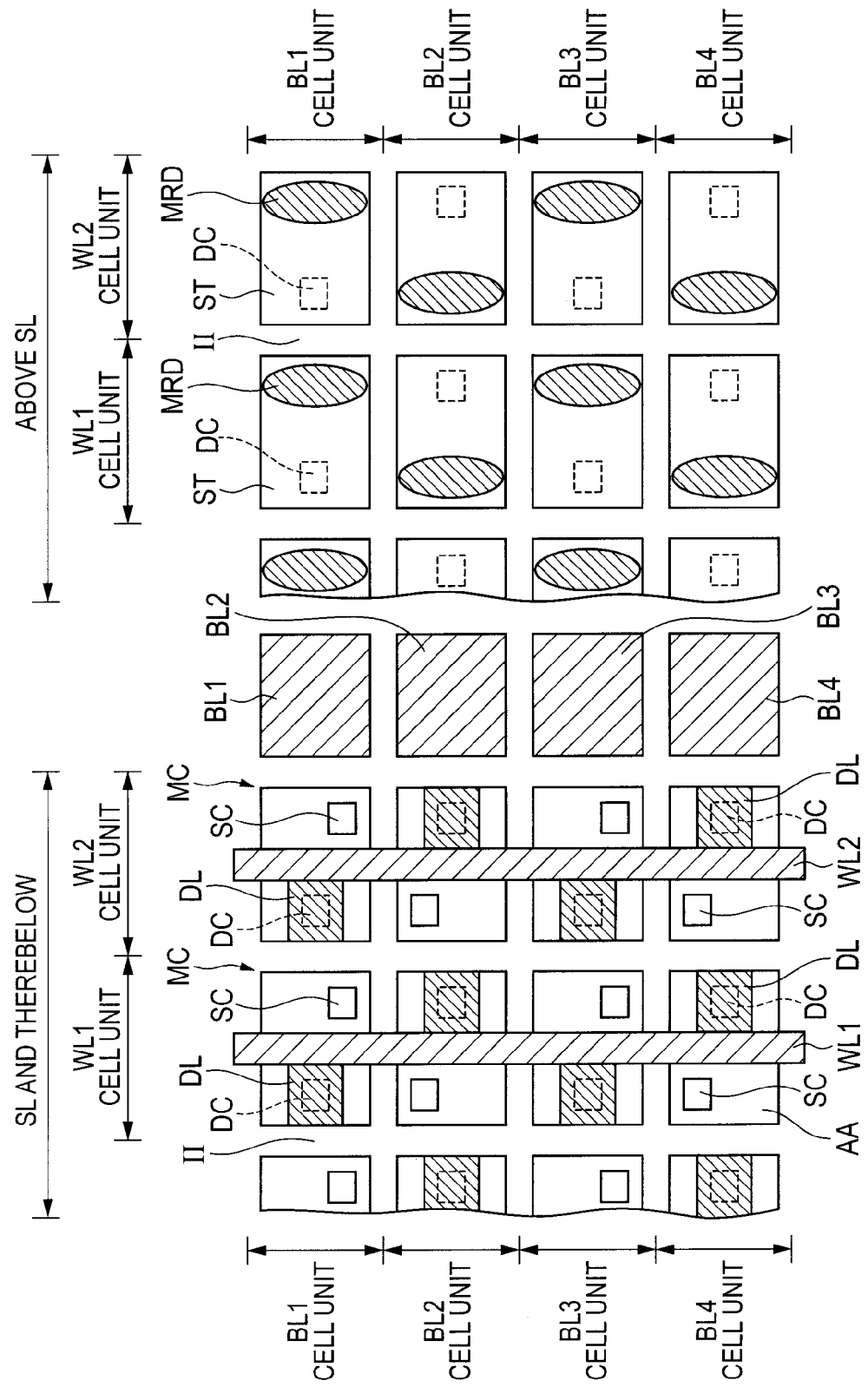
FIG. 53 is a plan view illustrating in detail the configuration of a memory cell area in a semiconductor device in a second example of the third embodiment of the invention.
Figure 54:
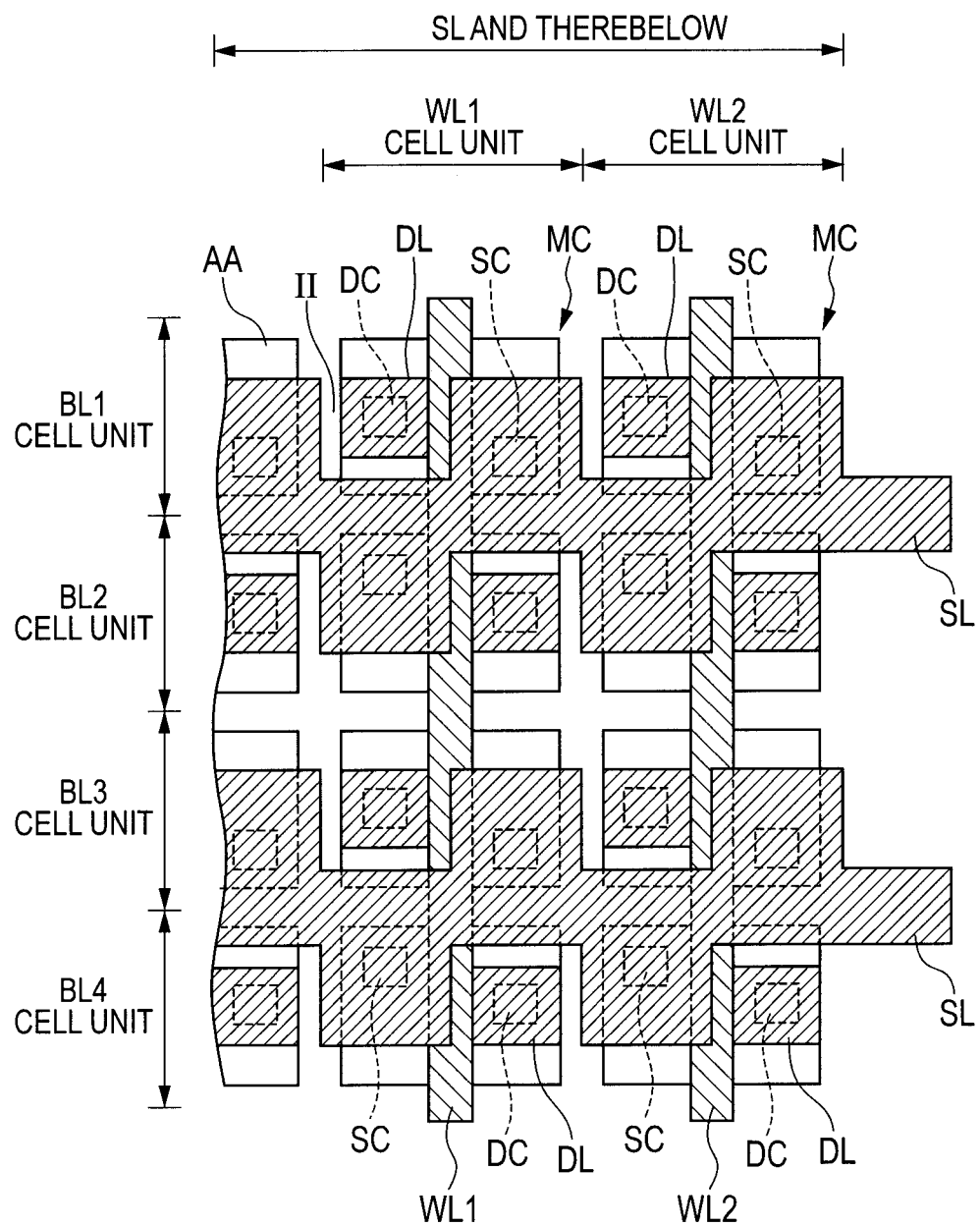
FIG. 54 is a schematic plan view of a first modification to the shape of the source lines in FIG. 53 as viewed in a plane, illustrating only the source lines and the layers located therebelow.

As illustrated in FIG. 53, the memory cell area in a second example of this embodiment also has substantially the same configuration as the memory cell area in the first example in FIG. 48. In FIG. 53, however, the source contact SC in each memory cell MC is placed in a position slightly different from that of each source contact SC in FIG. 48 similarly to the drain contacts DC in, for example, FIG. 44. Specifically, the source contacts SC in the BL1 and BL3 cell units in FIG. 53 are placed in slightly lower positions as compared with those in FIG. 48; and the source contacts SC in the BL2 and BL4 cell units in FIG. 53 are placed in slightly upper positions as compared with those in FIG. 48.

In the BL1 and BL2 cell units, therefore, the respective source contacts SC of a pair of memory cells MC opposed to each other in the vertical direction of the drawing are so placed that the following is implemented: they are placed in areas closer to each other's memory cells MC than the centers of the respective memory cells MC are in the vertical direction. This is the same with between the BL3 and BL4 cell units. In other words, in the BL1 and BL2 cell units (the BL3 and BL4 cell units), the distance A, defined below, is shorter than the distance B, defined below. Here, the distance in the vertical direction between the respective source contacts SC of a pair of memory cells MC opposed to each other in the vertical direction of the drawing is taken as the distance A; and the distance in the vertical direction between arbitrary positions (for example, the centers as viewed in a plane) in the pair of memory cells MC opposed to each other in the vertical direction is taken as the distance B. FIG. 53 is different from FIG. 48 in this respect.

Adoption of such a configuration as illustrated in FIG. 53 makes it possible to more easily overlap (couple) a source line SL and a source contact SC with each other as viewed in a plane. Specifically, it will be assumed that as illustrated in, for example, FIG. 54, two sets of cell units, the BL1 and BL2 cell units (the BL3 and BL4 cell units) share a single source line SL therebetween as in FIG. 50. In this case, the source line SL extended mainly in the area between the BL1 cell unit and the BL2 cell unit (the BL3 and BL4 cell units) is easily and reliably coupled with each source contact SC. This is because the distance between the center of the source line SL and each source contact SC is shorter in FIG. 54 than in FIG. 50.

Figure 55:
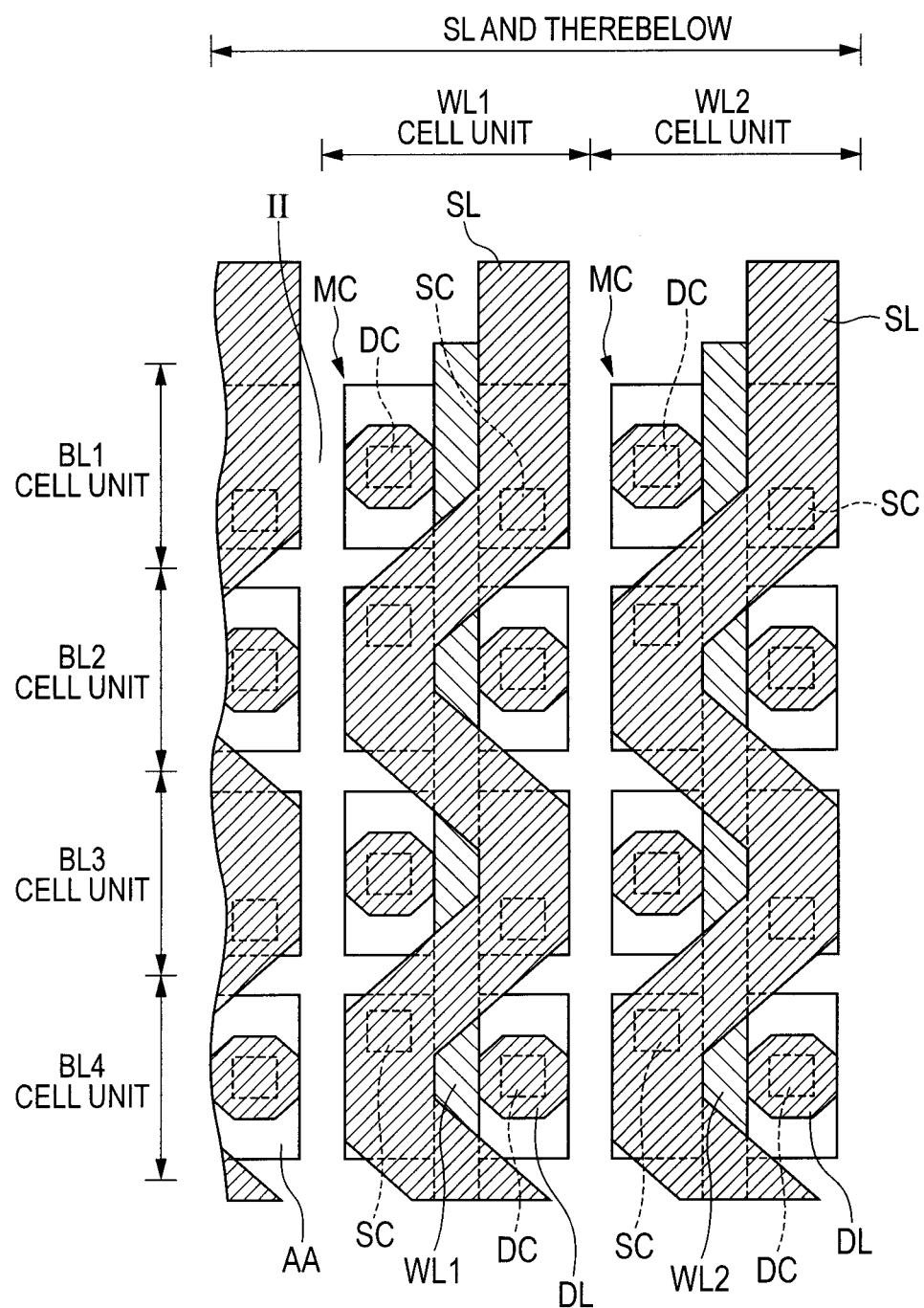
FIG. 55 is a schematic plan view of a second modification to the shape of the source lines in FIG. 53 as viewed in a plane, illustrating only the source lines and the layers located therebelow.
Figure 56:
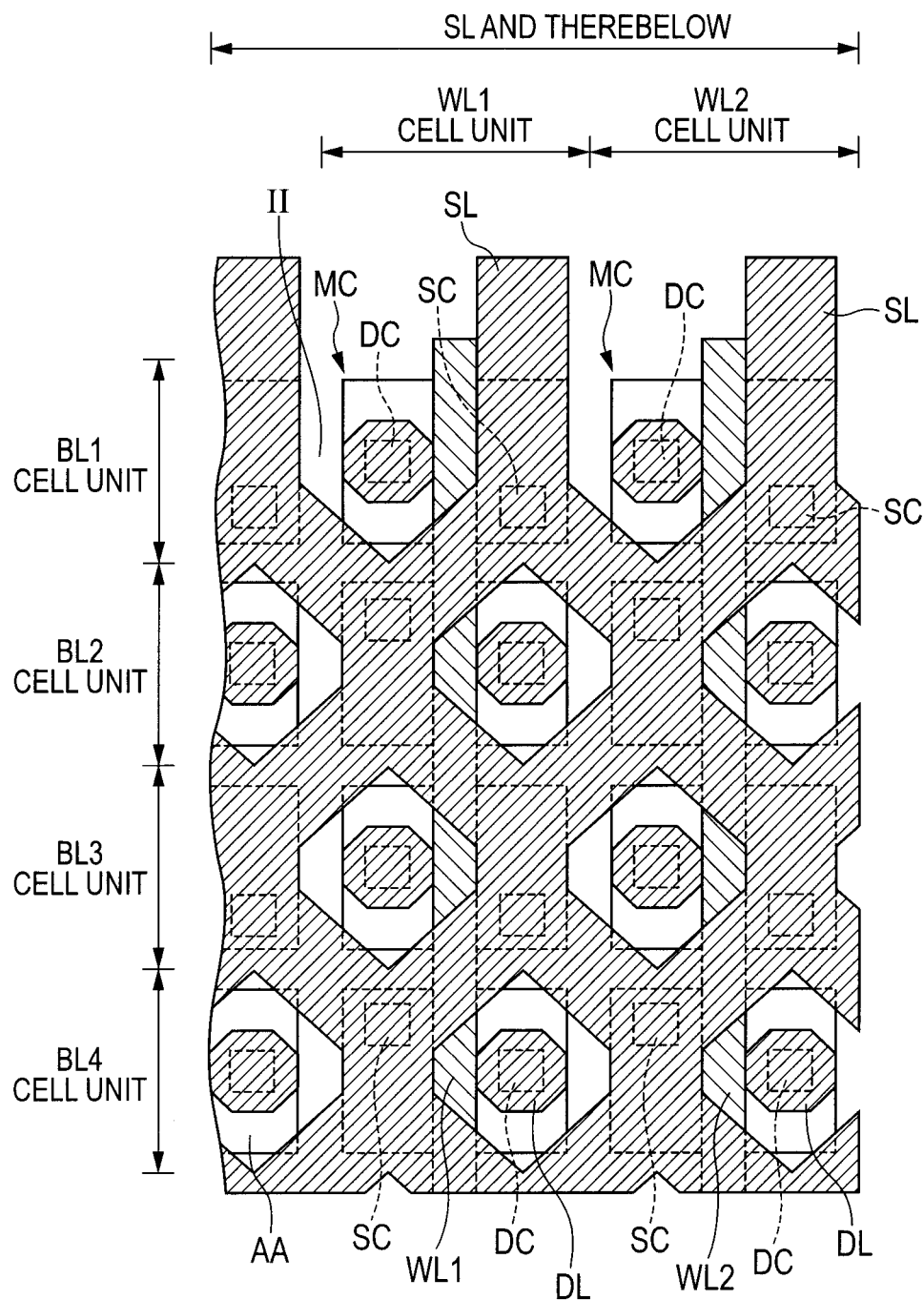
FIG. 56 is a schematic plan view of a third modification to the shape of the source lines in FIG. 53 as viewed in a plane, illustrating only the source lines and the layers located therebelow.

As illustrated in FIG. 55 and FIG. 56, source lines SL having the planar shape in FIG. 51 and FIG. 52 may be adopted in a configuration in which as in FIG. 53, the source contacts SC are shifted from the positions in FIG. 48.

Figure 57:
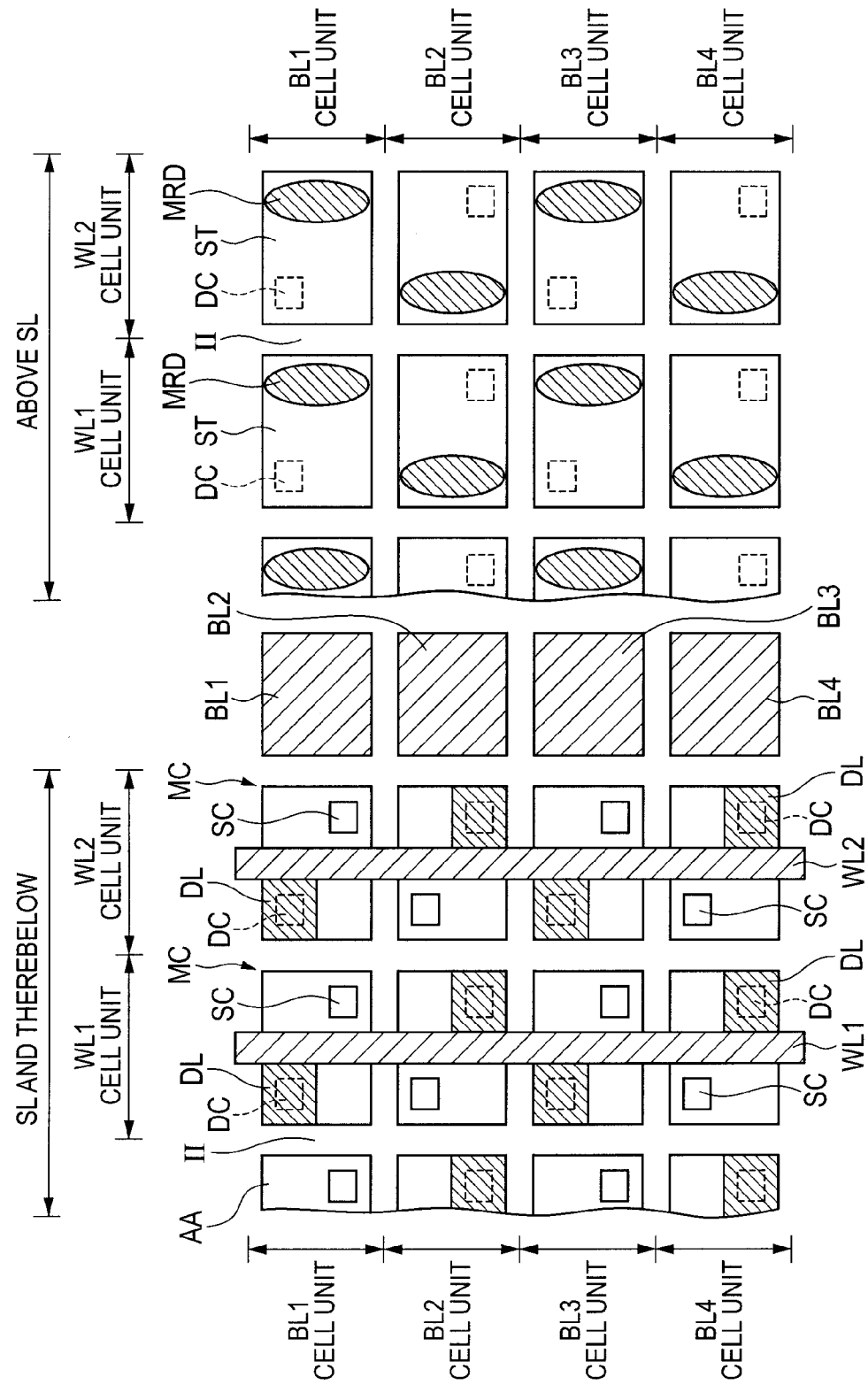
FIG. 57 is a plan view illustrating in detail the configuration of a memory cell area in a semiconductor device in a third example of the third embodiment of the invention.

As illustrated in FIG. 57, the memory cell area in a third example of this embodiment also has substantially the same configuration as the memory cell area in the second example in FIG. 53. In FIG. 57, however, the drain contact DC in each memory cell MC is placed in a position slightly different from that of each drain contact DC in FIG. 53 similarly to each drain contact DC in, for example, FIG. 44. Specifically, the drain contacts DC in the BL1 and BL3 cell units in FIG. 57 are placed in positions slightly above those in FIG. 53, that is, at the upper left corner of each memory cell MC. The drain contacts DC in the BL2 and BL4 cell units in FIG. 57 are placed in positions slightly below those in FIG. 53, that is, at the lower right corner of each memory cell MC. FIG. 57 is different from FIG. 53 in this respect.

Figure 58:
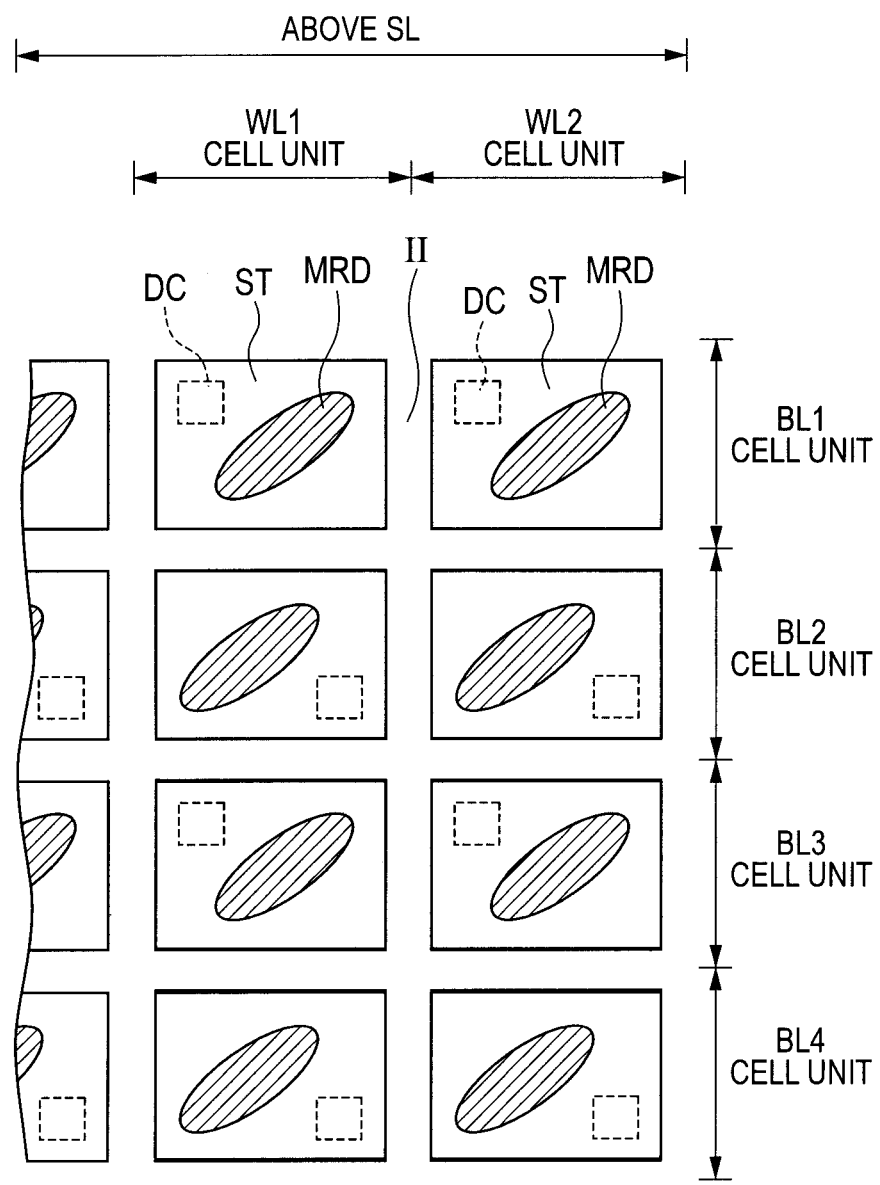
FIG. 58 is a schematic plan view of a modification to the arrangement of magnetoresistive elements in FIG. 57 as viewed in a plane, illustrating only the layers located above the source lines.

In the third example, the direction of length of each magnetoresistive element MRD may be arranged along the direction in which memory cells are arranged in an array as illustrated in FIG. 57. Or, the direction of length may be arranged in a direction oblique to the directions in which memory cells are arranged in an array as illustrated in FIG. 58. The aspect ratio of each magnetoresistive element MRD can be made so high as above 1 by arranging the magnetoresistive elements MRD in an oblique direction as illustrated in FIG. 58.

Figure 59:
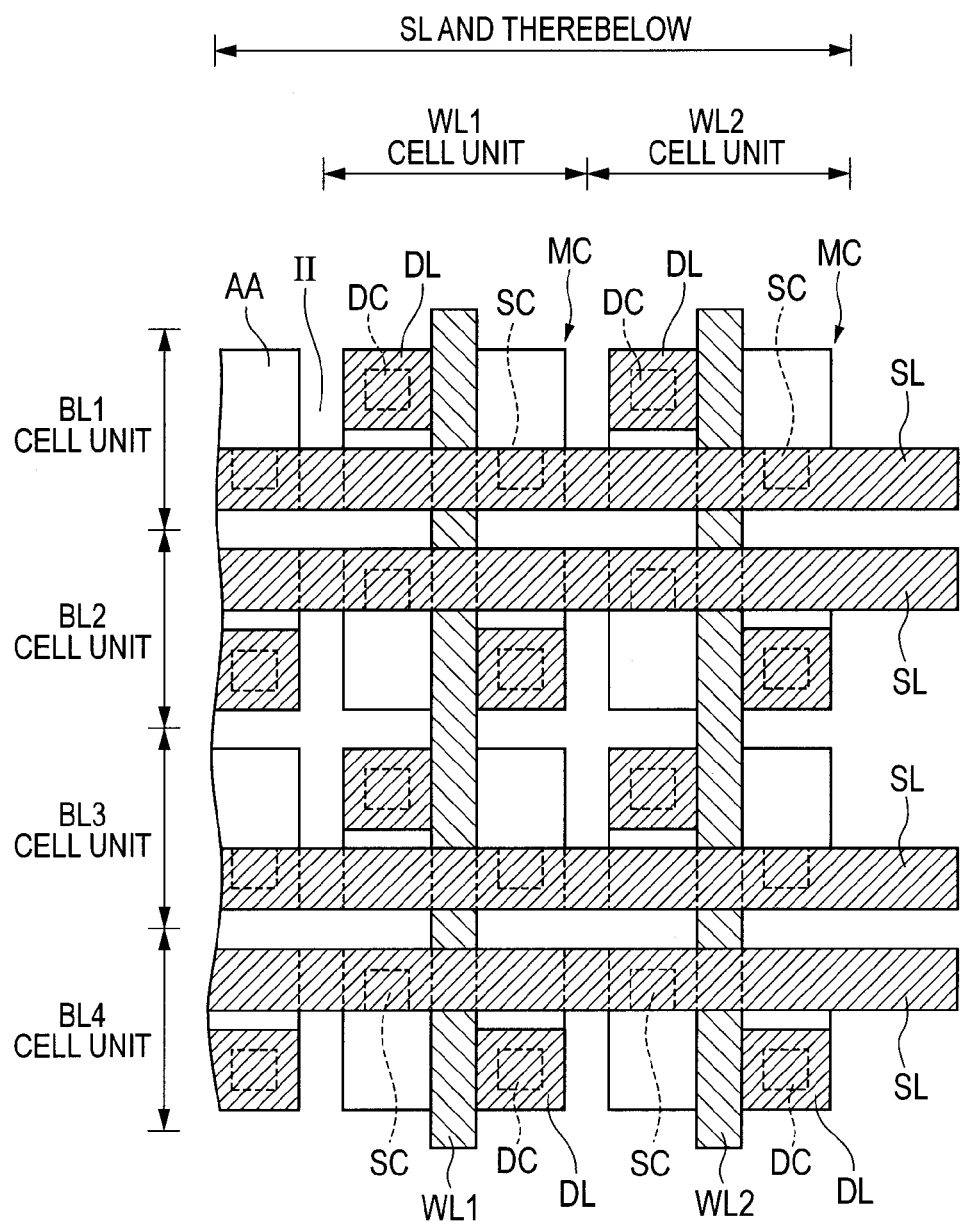
FIG. 59 is a schematic plan view of a first modification to the shape of the source lines in FIG. 57 as viewed in a plane, illustrating only the source lines and the layers located therebelow.
Figure 60:
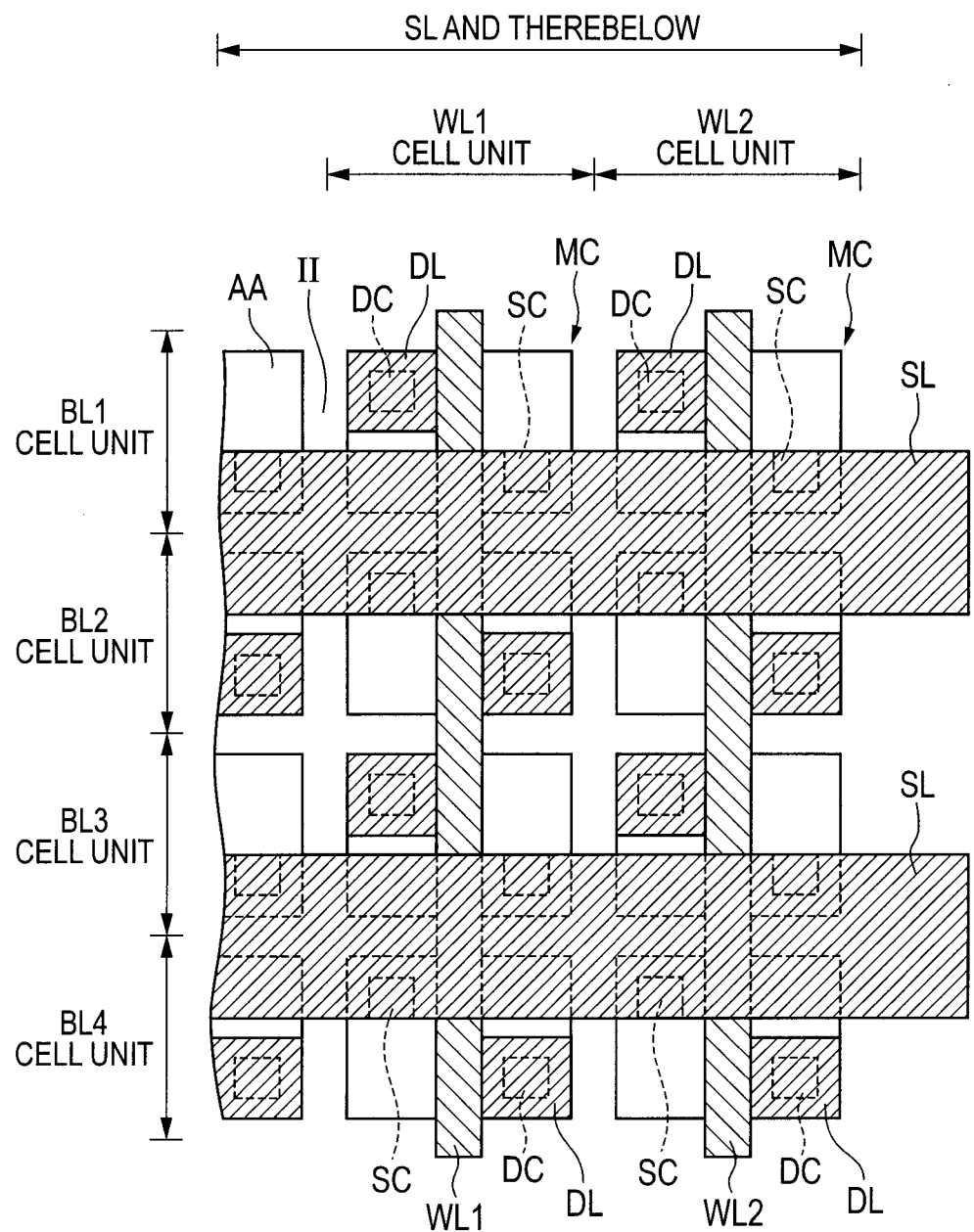
FIG. 60 is a schematic plan view of a second modification to the shape of the source lines in FIG. 57 as viewed in a plane, illustrating only the source lines and the layers located therebelow.
Figure 61:
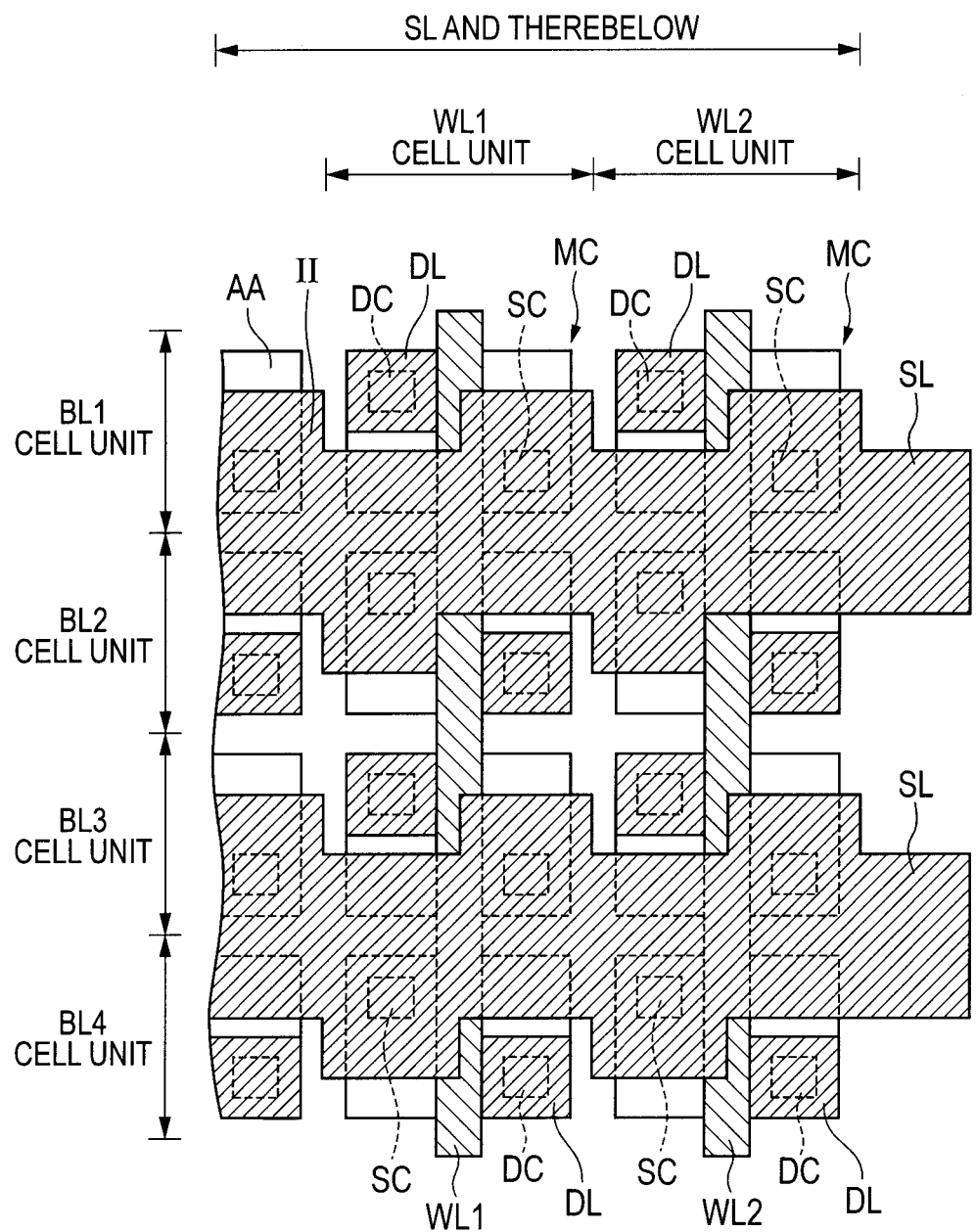
FIG. 61 is a schematic plan view of a third modification to the shape of the source lines in FIG. 57 as viewed in a plane, illustrating only the source lines and the layers located therebelow.

As illustrated in FIG. 59 to FIG. 61, the third example may has such a shape that the source lines SL are extended in the horizontal direction and overlap with the source contacts SC arranged in a staggered configuration as viewed in a plane. In FIG. 59, specifically, a single source line SL is placed for each of the BL1 to BL4 cell units. The source contacts SC arranged in each of the BL1 to BL4 cell units are substantially identical in coordinates in the vertical direction of the drawing. No drain contact DC is placed on each straight line coupling source contacts SC arranged in the horizontal direction of the drawing. This is because the drain contacts DC are so arranged that they are away from the straight lines coupling source contacts SC as viewed in a plane (that is, they are shifted upward or downward in the drawing). FIG. 59 is different from FIG. 49 in this respect.

In FIG. 59, for this reason, the following measure can be taken with respect to the source lines SL so arranged that they overlap with the source contacts SC as viewed in a plane unlike in FIG. 49: the source lines LS can be linearly extended without bending or protruding them from the direction of their extension. For this reason, it is possible to more easily design and form the source lines SL.

In FIG. 60, a single source line SL is so placed that it overlaps (is coupled) with two sets of source contacts SC in the BL1 cell unit and the BL2 cell unit as viewed in a plane as in FIG. 50. In addition, another signal source line SL is so placed that it overlaps (is coupled) with two sets of source contacts SC in the BL3 cell unit and the BL4 cell unit as viewed in a plane. Also in FIG. 60, the following measure can be taken with respect to the source lines SL so arranged that they overlap with the source contacts SC as viewed in a plane as in FIG. 59 (unlike in FIG. 50): the source lines LS can be linearly extended without bending or protruding them from the direction of their extension.

In FIG. 61, meanwhile, the source lines SL are extended in the horizontal direction of the drawing but they are bent in correspondence with the positions of the source contacts SC as in, for example, FIG. 50. This makes it possible to more reliably ensure areas where a source line SL and a source contact SC overlap with each other as viewed in a plane. As a result, it is possible to make more reliable electrical coupling between the source lines SL and the source contacts SC.

Adoption of any of the configurations of the third example in FIG. 57 to FIG. 61 makes it possible to take the following measure: the magnetoresistive elements MRD and the drain contacts DC in the individual memory cells MC can be so arranged that the distance between them as viewed in a plane is substantially identical. For this reason, it is possible to suppress variation in the flatness of the magnetoresistive element MRD and electrical characteristics from memory cell MC to memory cell MC.

Figure 62:
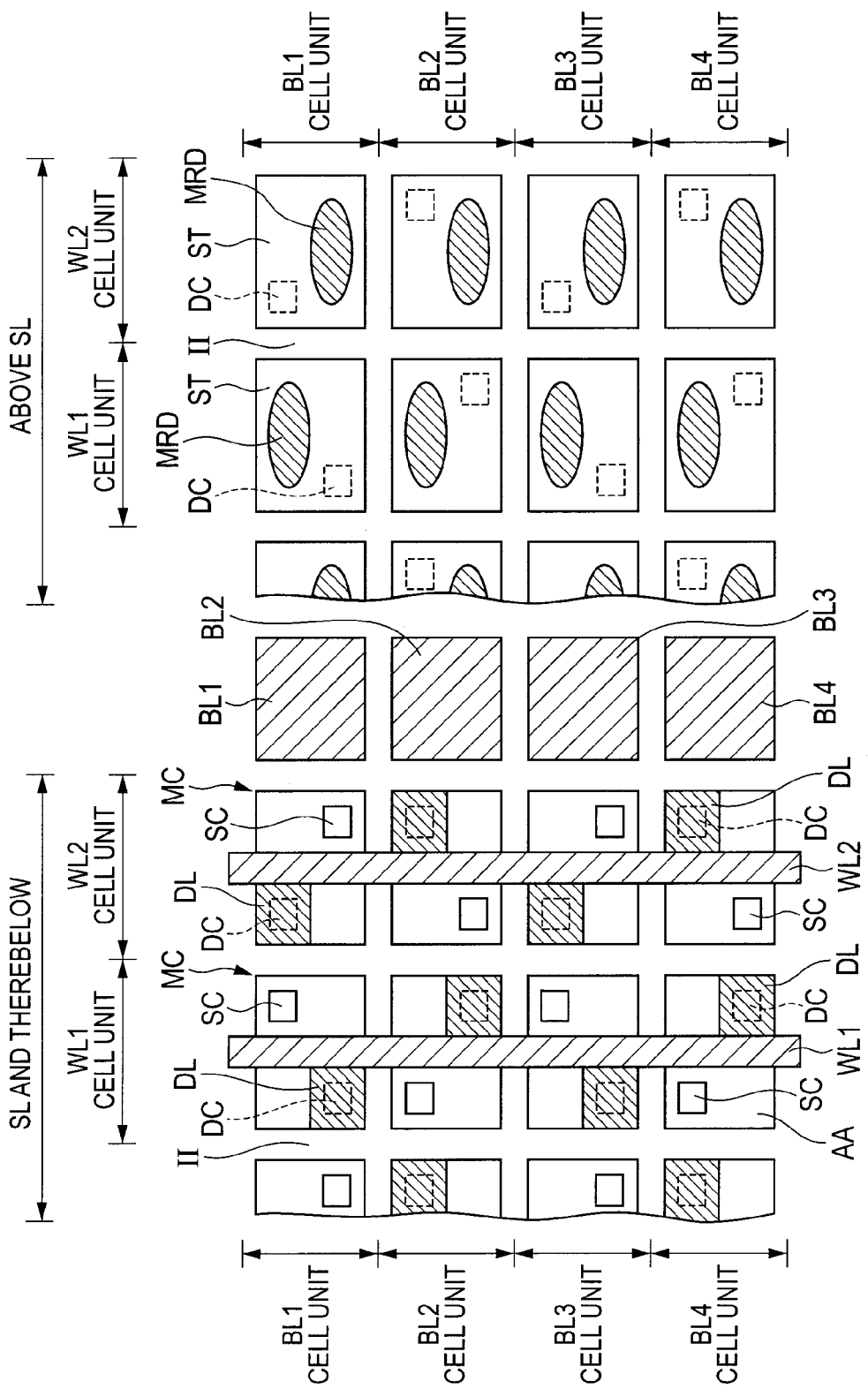
FIG. 62 is a plan view illustrating in detail the configuration of a memory cell area in a semiconductor device in a fourth example of the third embodiment of the invention.

In this embodiment, the configurations of the fourth example to the seventh example described below may be adopted. As illustrated in FIG. 62, the memory cell area in the fourth example of this embodiment also has substantially the same configuration as the memory cell area in the third example in FIG. 57. In FIG. 62, however, the arrangement of the source contacts SC and drain contacts DC in the BL1 cell unit and the BL3 cell unit is different from that in FIG. 57. More specific description will be given. In the BL1 and BL3 cell units in FIG. 57, each drain contact DC is placed at the upper left in the drawing and each source contact SC is placed at the lower right in the drawing. In the BL1 and BL3 cell units in FIG. 62, meanwhile, each drain contact DC is placed at the lower left in the drawing and each source contact SC is placed at the upper right in the drawing.

In the above configuration, it is desirable that the magnetoresistive elements MRD should be so arranged that the direction of their length is extended in the horizontal direction of the drawing. This makes it possible to arrange the magnetoresistive element MRD and drain contact DC in each memory cell MC so that the distance between them as viewed in a plane is substantially identical. FIG. 62 is different from FIG. 57 in the magnetoresistive elements MRD and in this respect.

Figure 63:
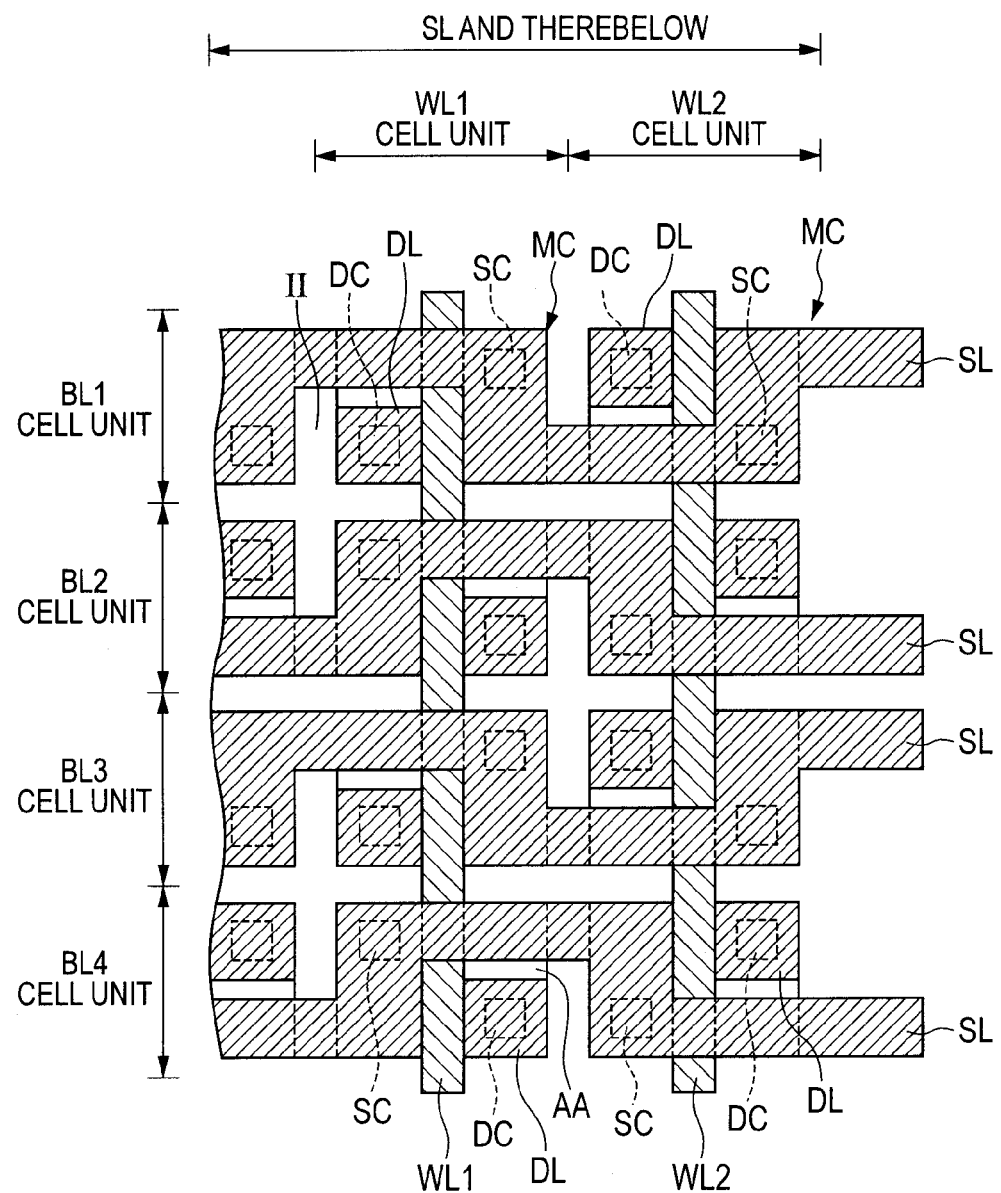
FIG. 63 is a schematic plan view of a first modification to the shape of the source lines in FIG. 62 as viewed in a plane, illustrating only the source lines and the layers located therebelow.
Figure 64:
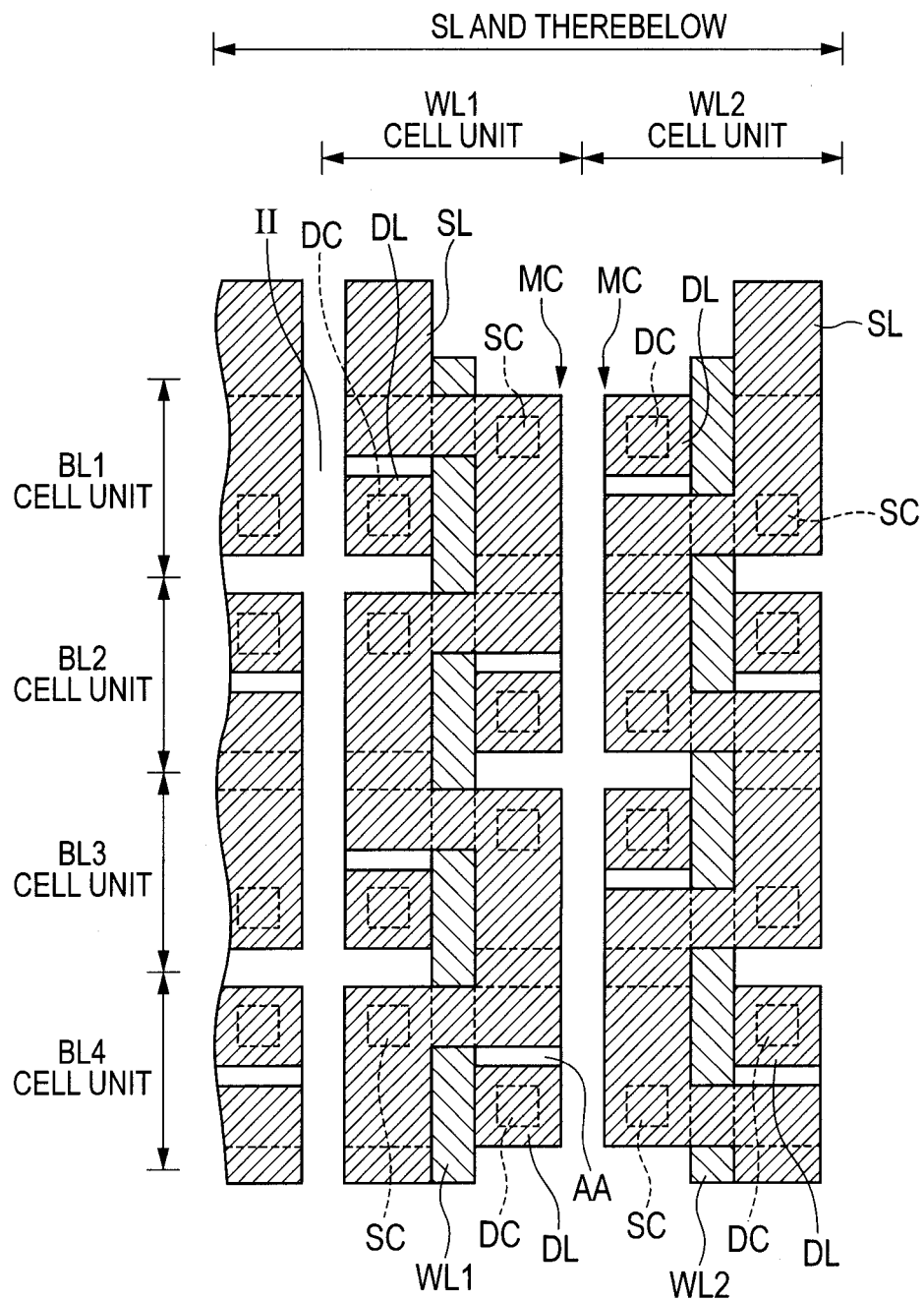
FIG. 64 is a schematic plan view of a second modification to the shape of the source lines in FIG. 62 as viewed in a plane, illustrating only the source lines and the layers located therebelow.
Figure 65:
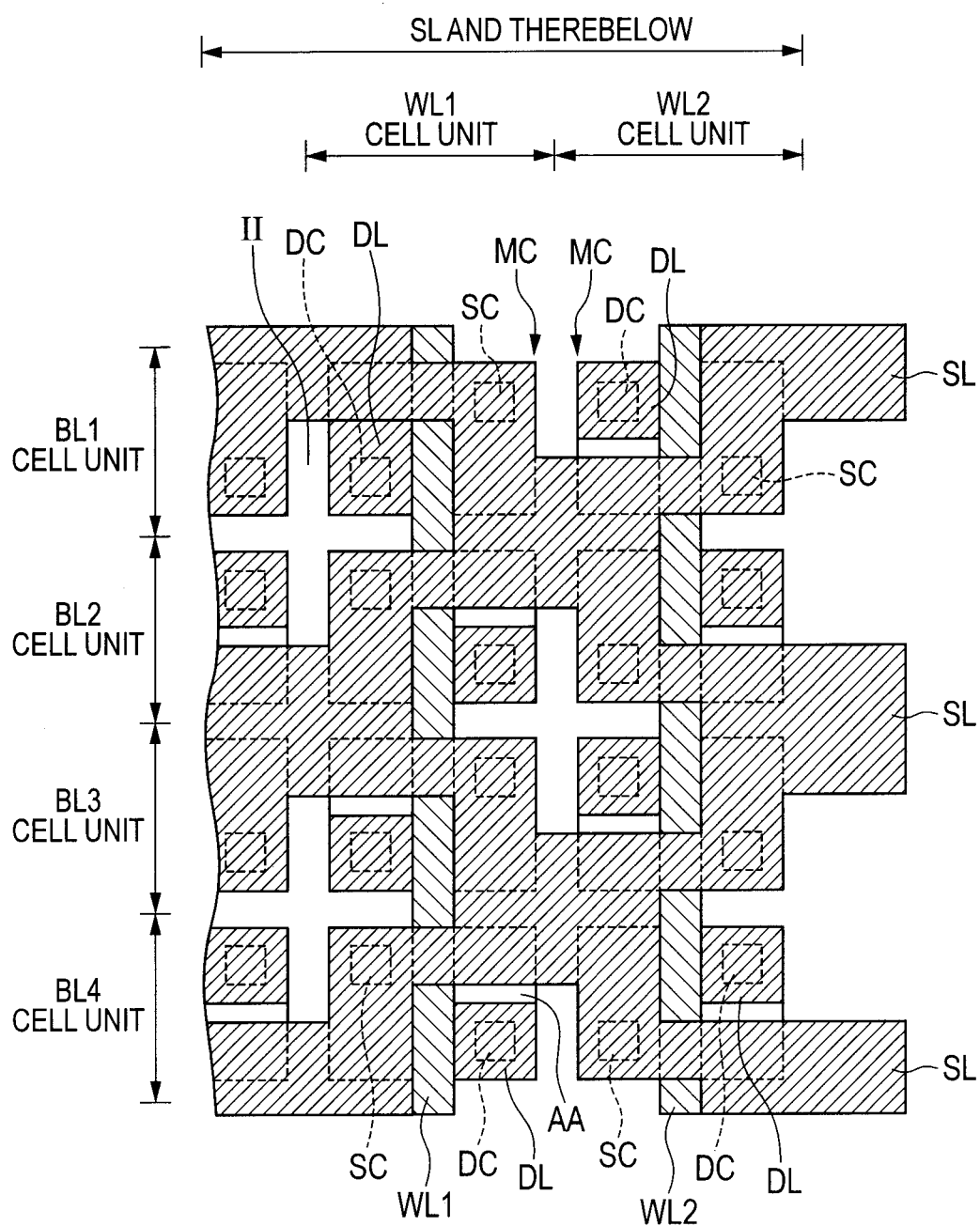
FIG. 65 is a schematic plan view of a third modification to the shape of the source lines in FIG. 62 as viewed in a plane, illustrating only the source lines and the layers located therebelow.

The source lines SL overlapping with the source contacts SC in the memory cell area as viewed in a plane in the fourth example may be provided with any of the planar shapes illustrated in, for example, FIG. 63 to FIG. 65. This makes it possible to suppress short-circuiting between a drain contact DC and a source line SL.

Figure 66:
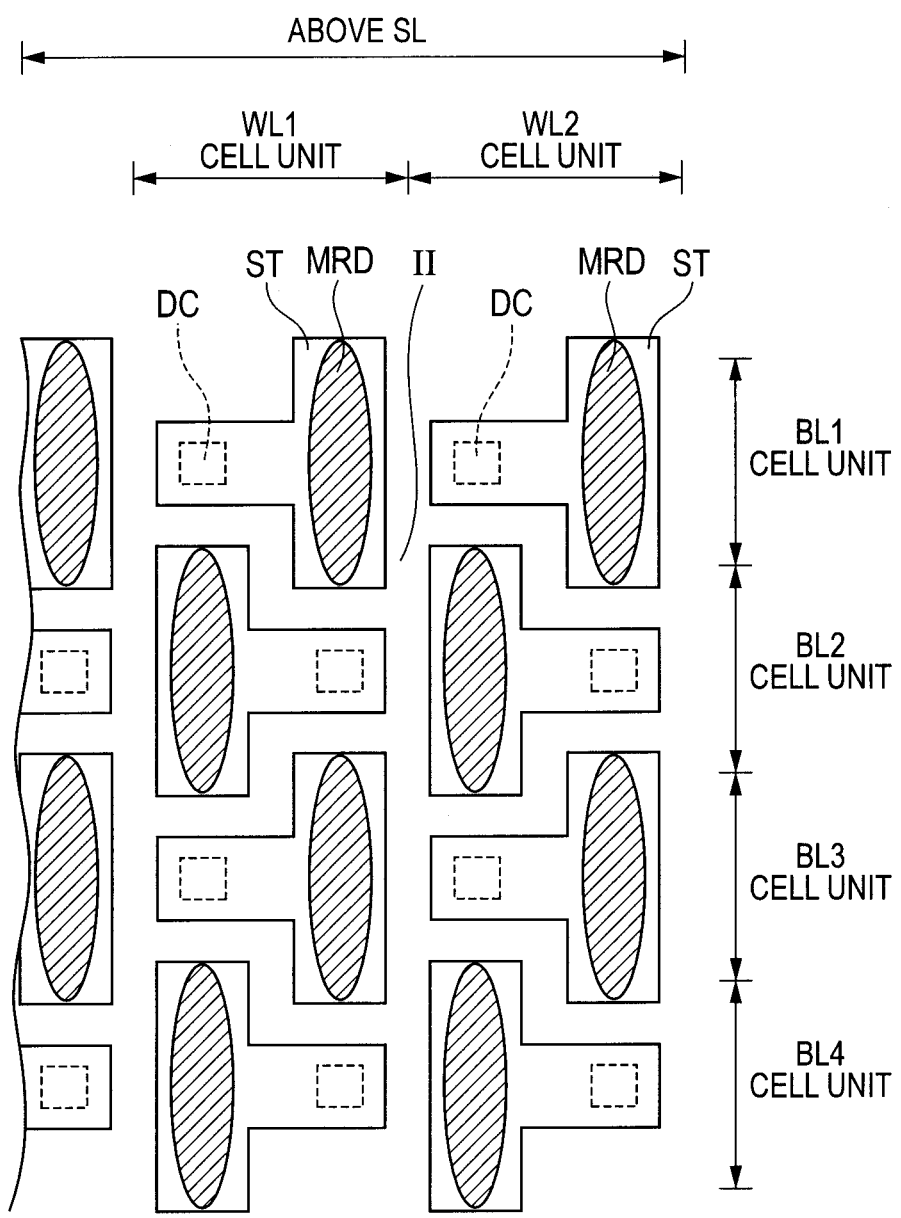
FIG. 66 is a plan view illustrating in detail the configuration of a memory cell area in a semiconductor device in a fifth example of the third embodiment of the invention.

As illustrated in FIG. 66, the memory cell area in the fifth example of this embodiment also has substantially the same configuration as the memory cell area in the first example and the second example in FIG. 48 and FIG. 53. In FIG. 66, however, the strap wirings ST having the same planar shape as in FIG. 30 are arranged. (That is, the strap wirings ST having a so-called T shape in which each of them is extended in the directions (third direction and fourth direction) in which the memory cells MC are arranged in an array.) FIG. 66 is different from FIG. 48 and FIG. 53 in this respect.

Figure 67:
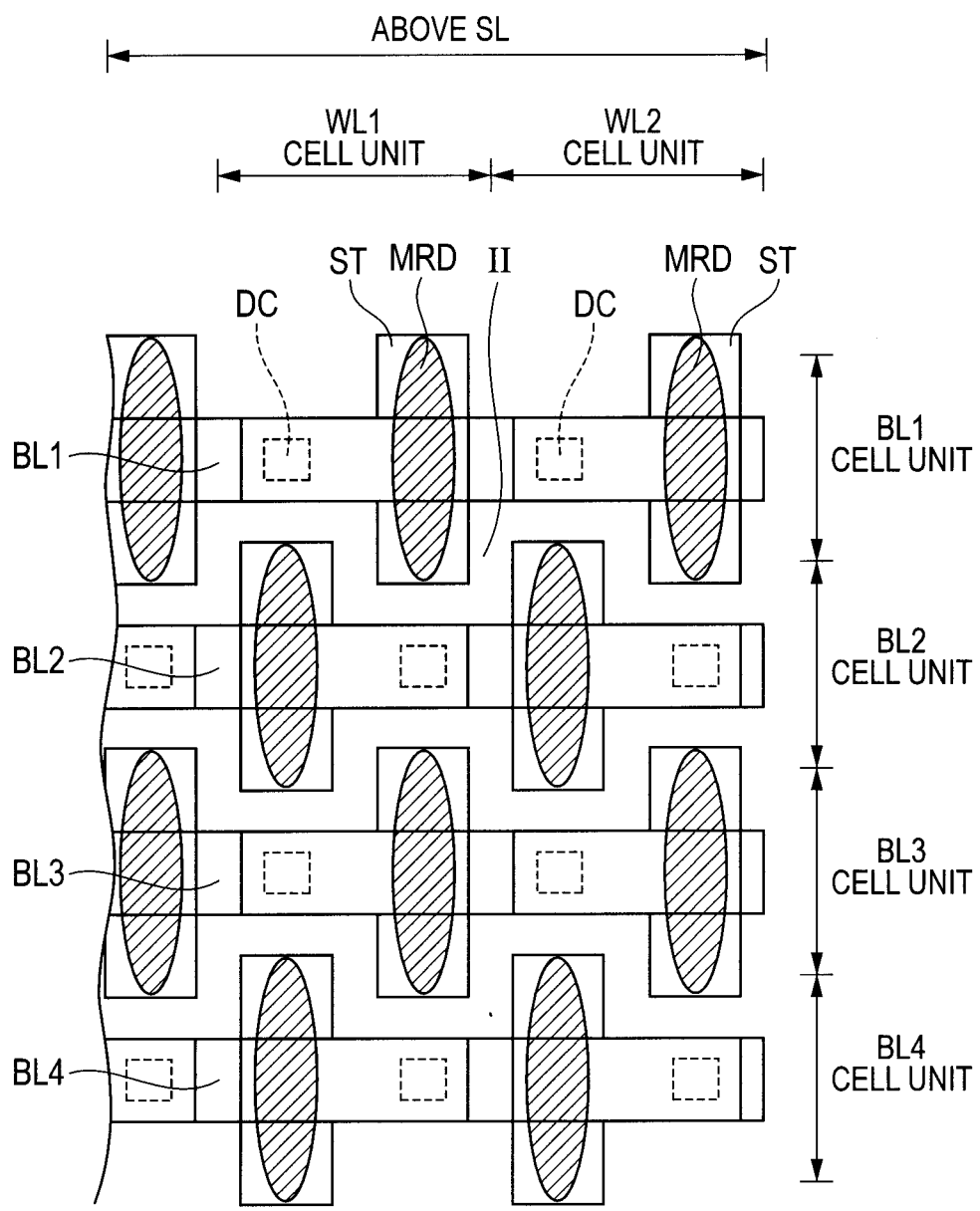
FIG. 67 is a schematic plan view of a first modification to the shape of the bit lines in FIG. 66 as viewed in a plane, illustrating only the layers located above the source lines.
Figure 68:
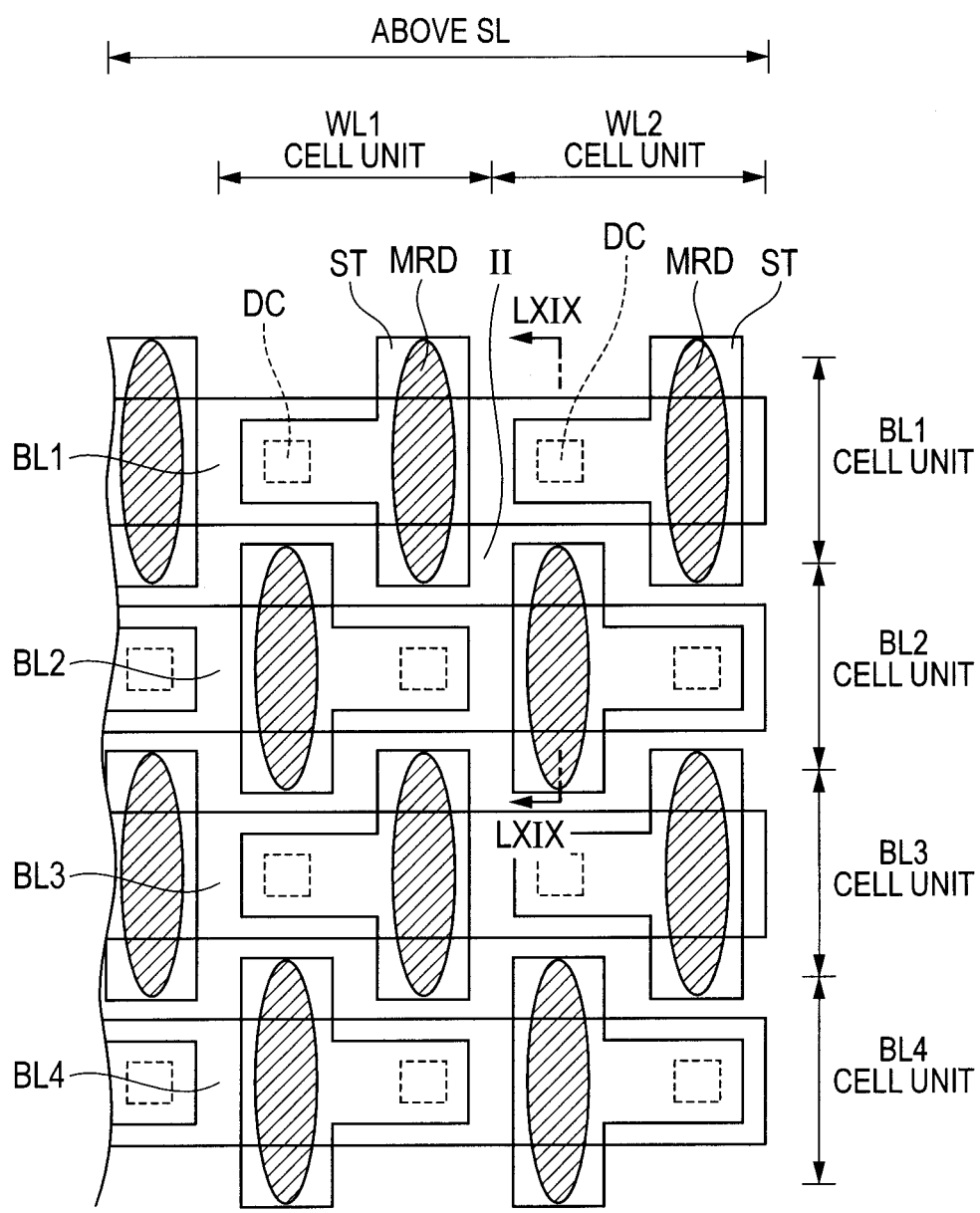
FIG. 68 is a schematic plan view of a second modification to the shape of the bit lines in FIG. 66 as viewed in a plane, illustrating only the layers located above the source lines.
Figure 69:
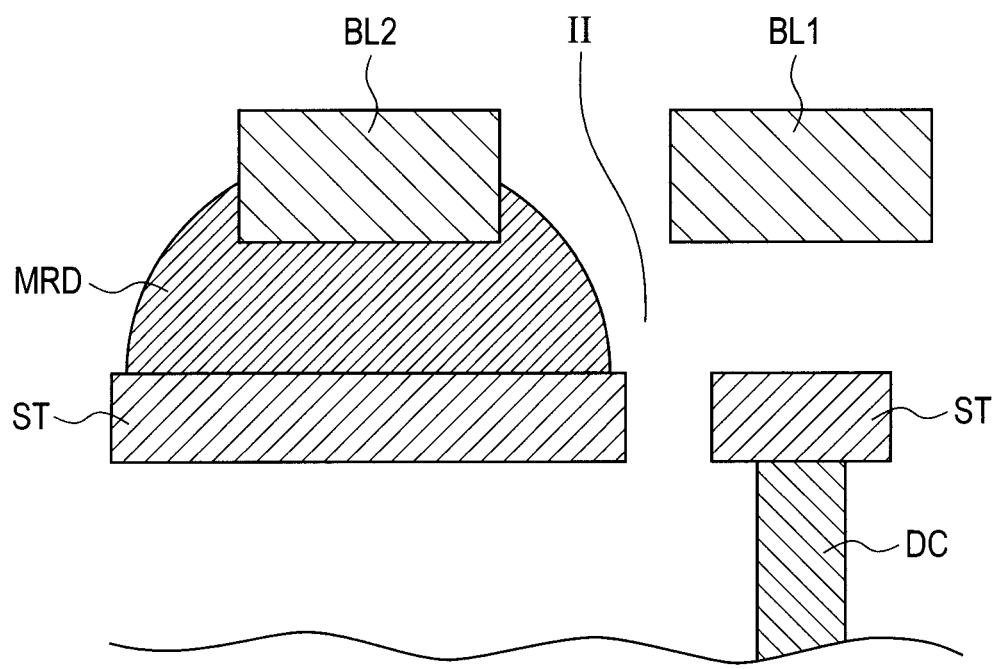
FIG. 69 is a schematic sectional view of an area where a magnetoresistive element in FIG. 68 is formed, taken along line LXIX-LXIX of FIG. 68.
Figure 70:
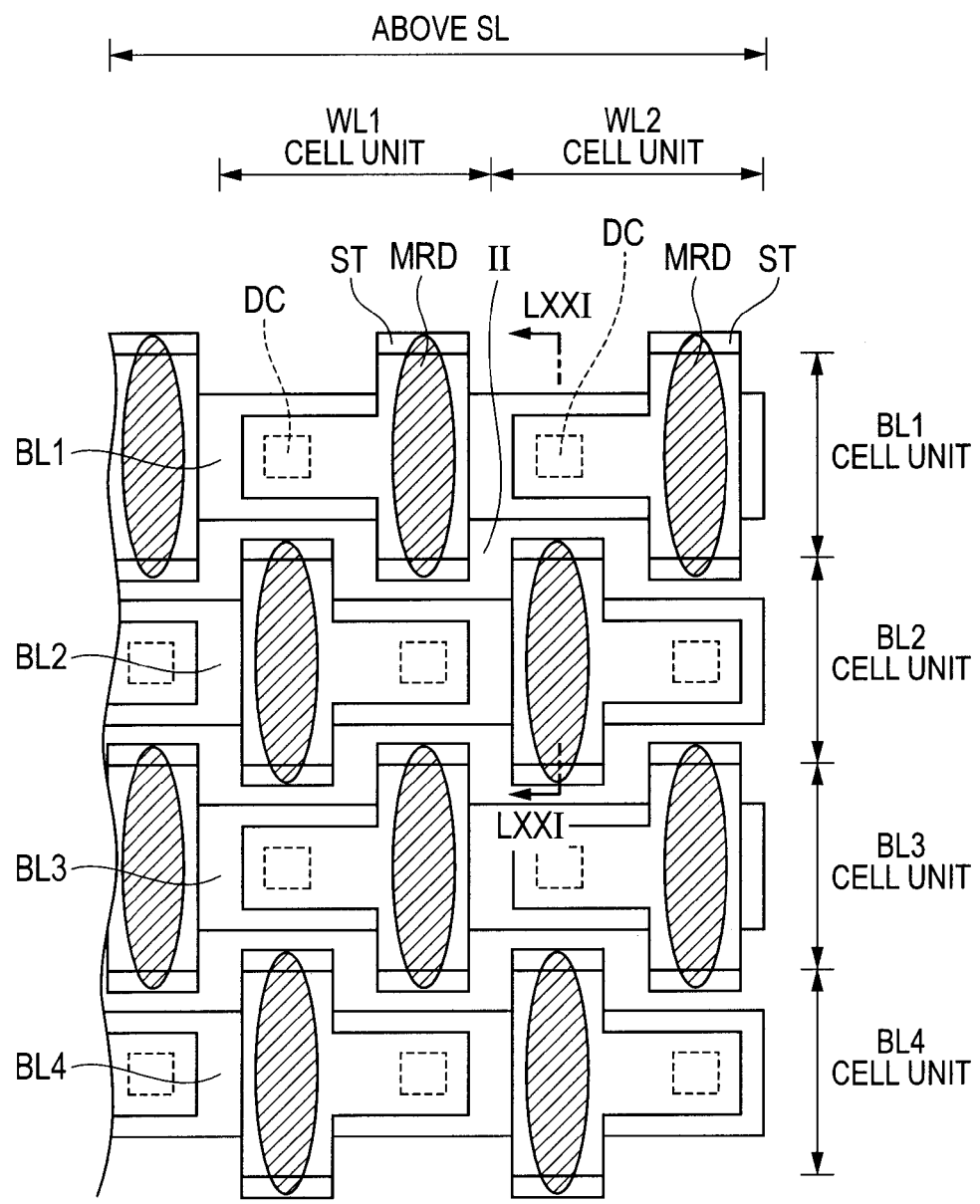
FIG. 70 is a schematic plan view of a third modification to the shape of the bit lines in FIG. 66 as viewed in a plane, illustrating only the layers located above the source lines.
Figure 71:
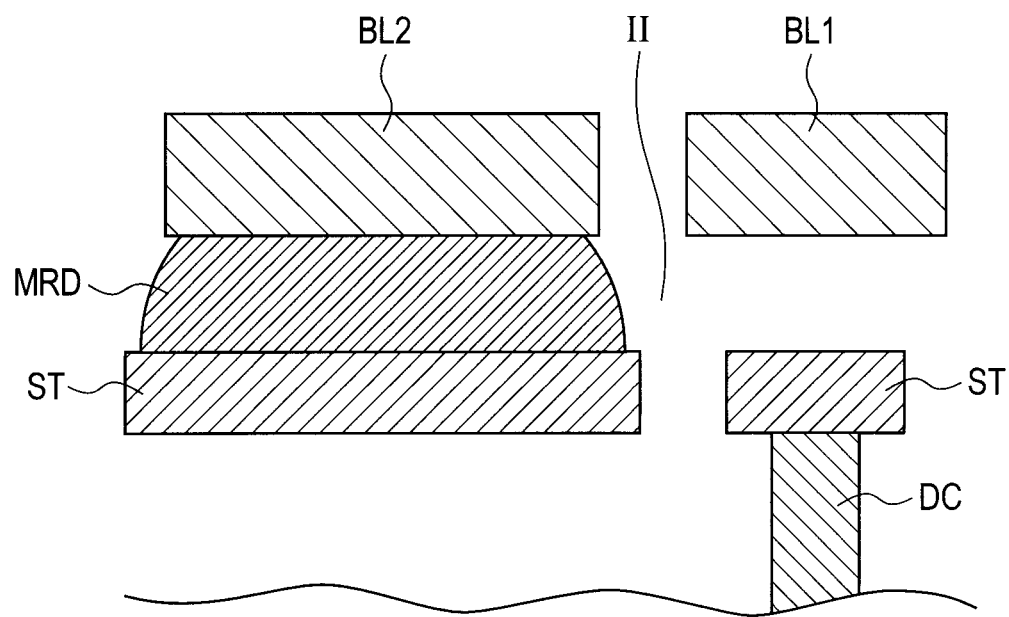
FIG. 71 is a schematic sectional view of an area where a magnetoresistive element in FIG. 70 is formed, taken along line LXXI-LXXI of FIG. 70.

As illustrated in FIG. 67, the width of each of the bit lines BL1 to bit line BL4 (in the vertical direction of the drawing) intersecting with the direction in which they are extended may be, for example, such that: it is substantially equal to the width (in the vertical direction of the drawing) of the strap wiring ST in areas where it overlaps with a drain contact DC as viewed in a plane and linearly extended. As illustrated in FIG. 68 and FIG. 69, the width of each of the bit lines BL1 to bit line BL4 (in the vertical direction of the drawing) intersecting with the direction in which they are extended may be such that: it is slightly wider than in FIG. 67 and linearly extended. Or, as illustrated in FIG. 70 and FIG. 71, the width of each bit line may be larger in areas where it overlaps with a magnetoresistive element MRD than in the other areas as in, for example, FIG. 31.

Figure 72:
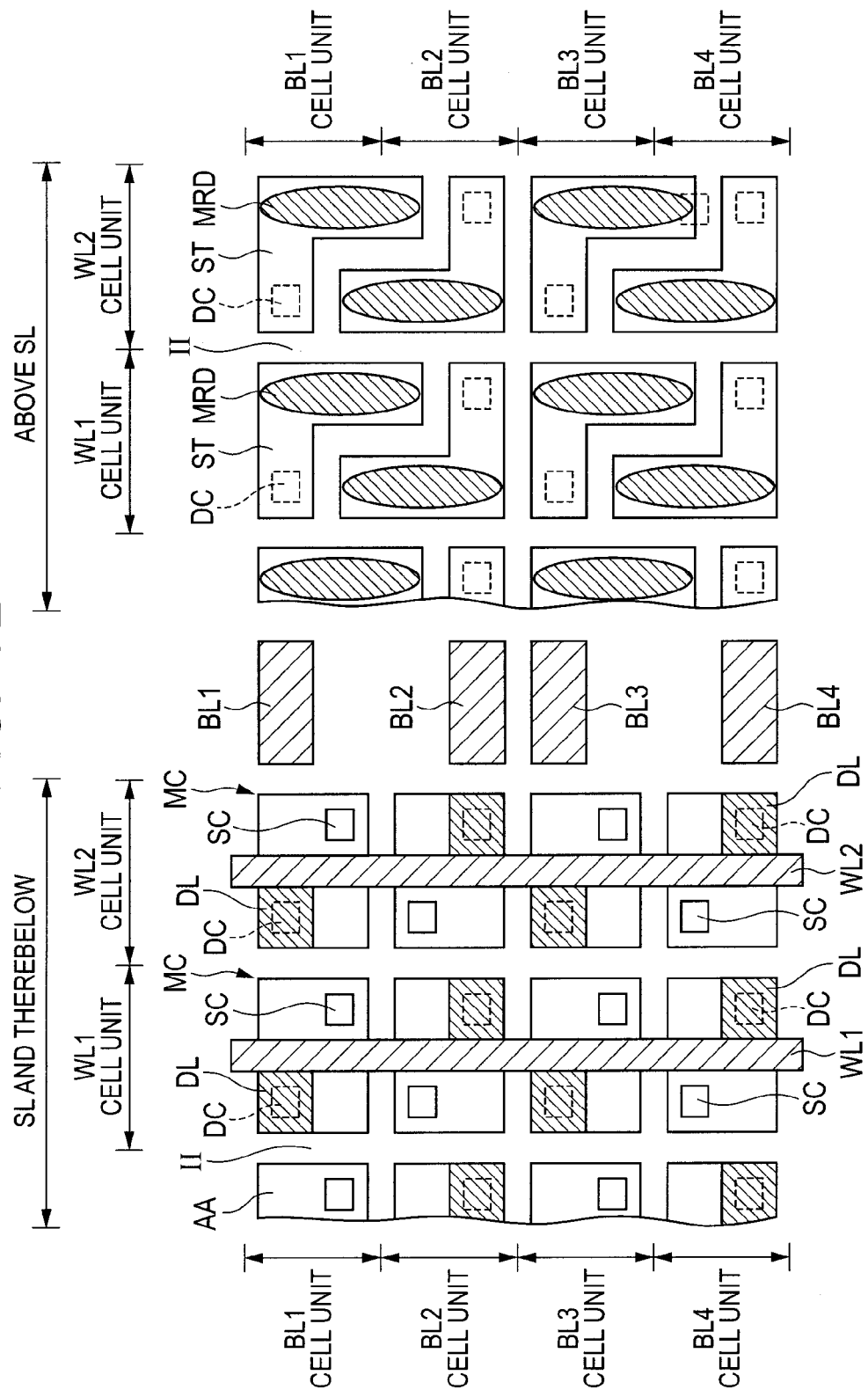
FIG. 72 is a plan view illustrating in detail the configuration of a memory cell area in a semiconductor device in a sixth example of the third embodiment of the invention.

As illustrated in FIG. 72, the memory cell area in the sixth example of this embodiment also has substantially the same configuration as the memory cell area in the third example in FIG. 57. However, FIG. 72 is obtained by using the same principle as in FIG. 30 in the example in FIG. 57. In FIG. 72, specifically, strap wirings ST having a planar shape extended in the third and fourth directions, not an oblong shape, are so formed that they overlap with a magnetoresistive element MRD and a drain contact DC. In FIG. 72, as a result, so-called L-shaped strap wirings ST are formed. FIG. 72 is different from FIG. 57 in this respect.

Figure 73:
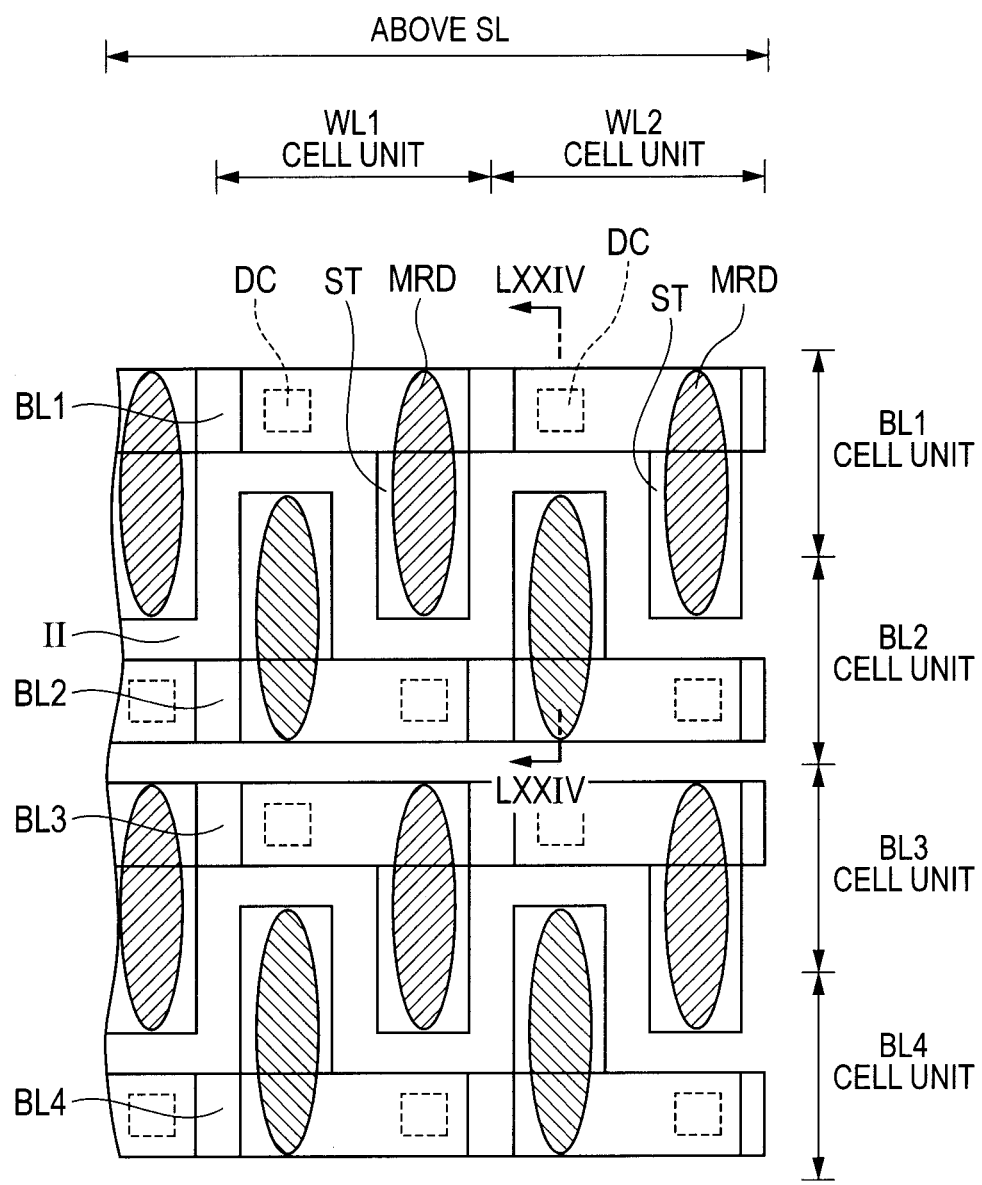
FIG. 73 is a schematic plan view of a first modification to the shape of the bit lines in FIG. 72 as viewed in a plane, illustrating only the layers located above the source lines.
Figure 74:
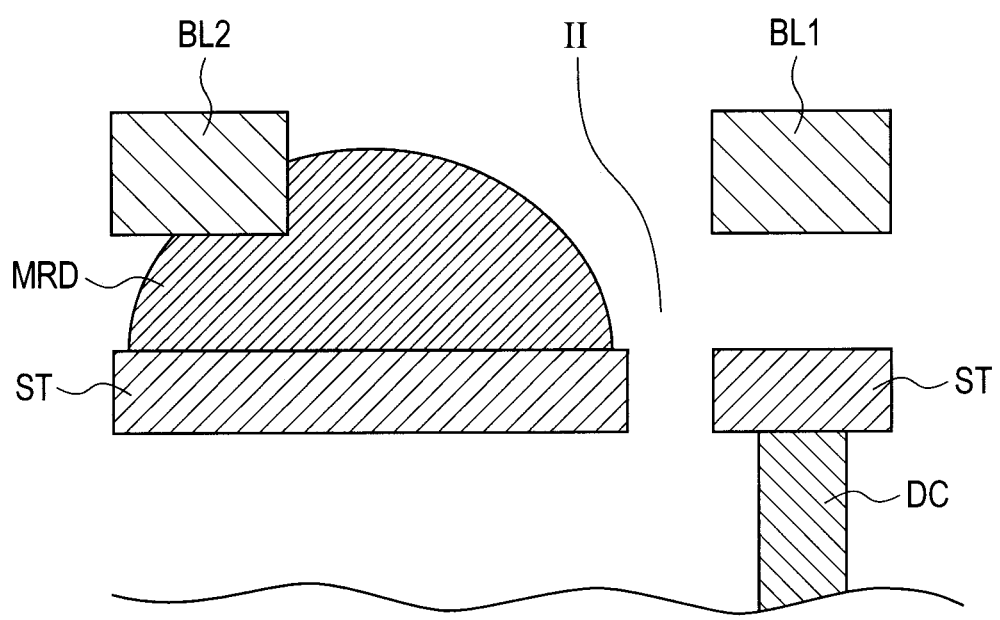
FIG. 74 is a schematic sectional view of an area where a magnetoresistive element in FIG. 73 is formed, taken along line LXXIV-LXXIV of FIG. 73.
Figure 75:
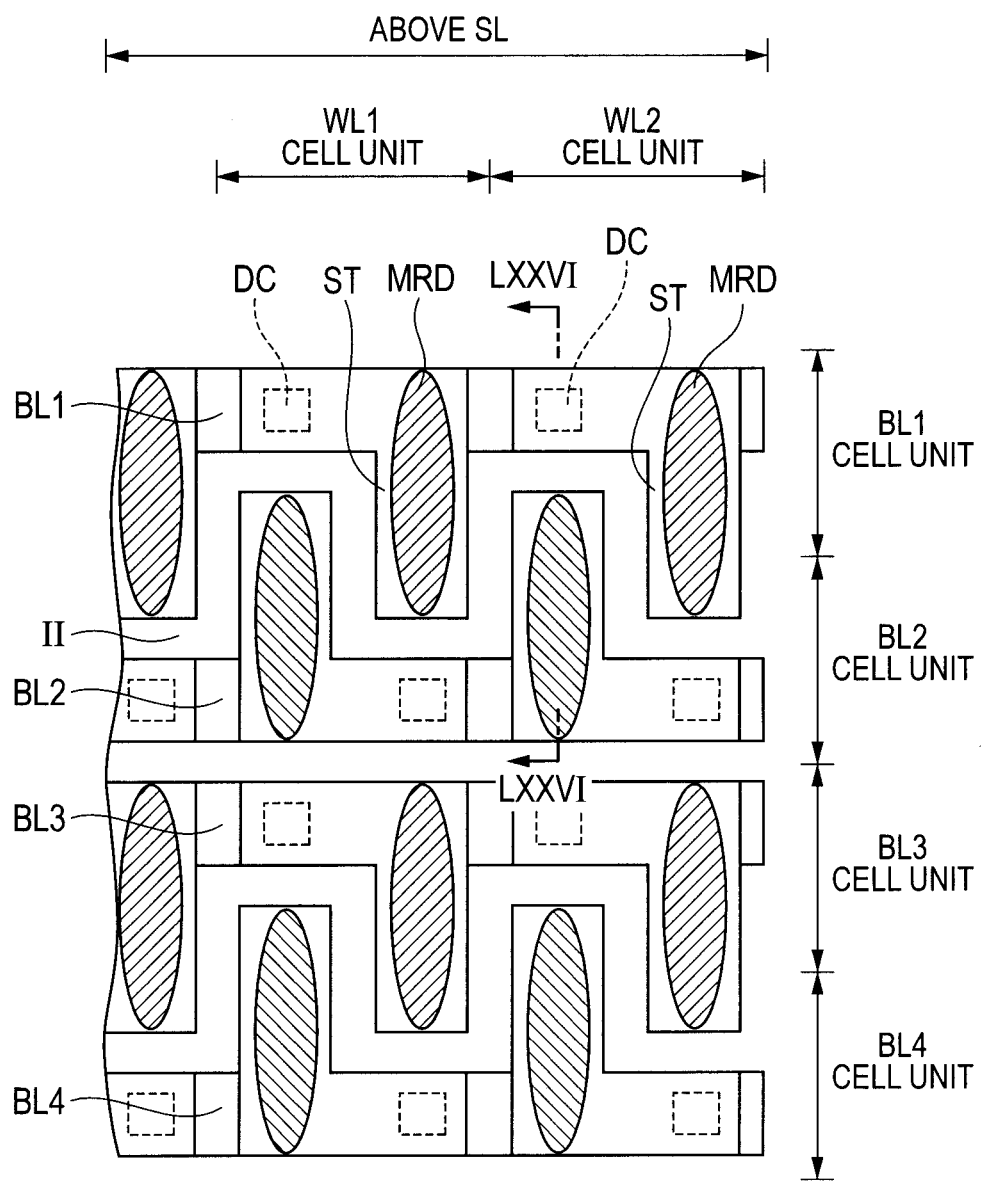
FIG. 75 is a schematic plan view of a second modification to the shape of the bit lines in FIG. 72 as viewed in a plane, illustrating only the layers located above the source lines.
Figure 76:
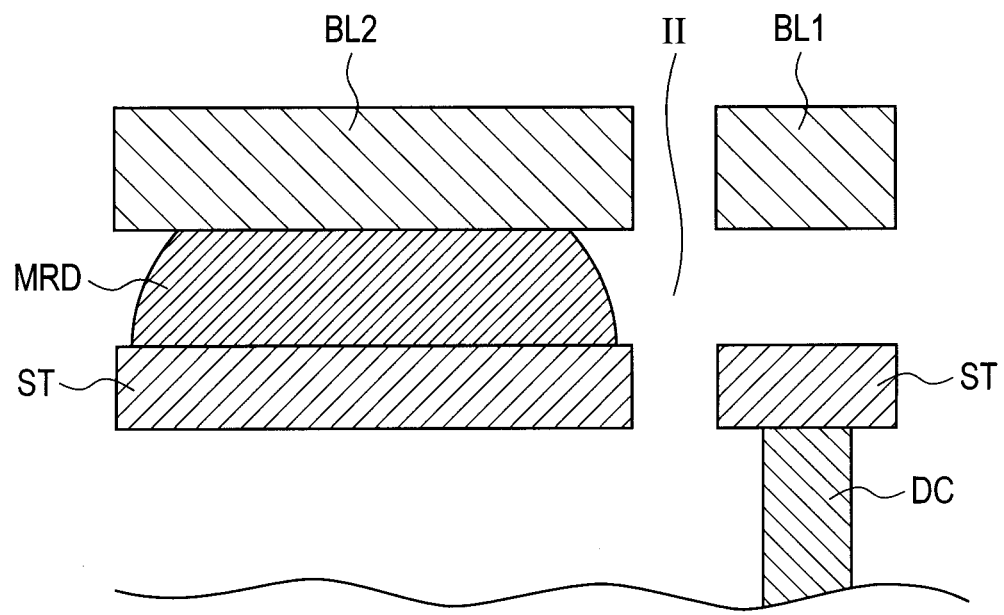
FIG. 76 is a schematic sectional view of an area where a magnetoresistive element in FIG. 75 is formed, taken along line LXXVI-LXXVI of FIG. 75.

As illustrated in FIG. 73 and FIG. 74, the width of each of the bit line BL1 to the bit line BL4 (in the vertical direction of the drawing) intersecting with the direction in which they are extended may be such that: it is substantially equal to, for example, the width (in the vertical direction of the drawing) of the strap wiring ST in areas where it overlaps with a drain contact DC as viewed in a plane and linearly extended. Or, as illustrated in FIG. 75 and FIG. 76, the width of each bit line may be larger in areas where it overlaps with a magnetoresistive element MRD than in the other areas as in, for example, FIG. 31.

Figure 77:
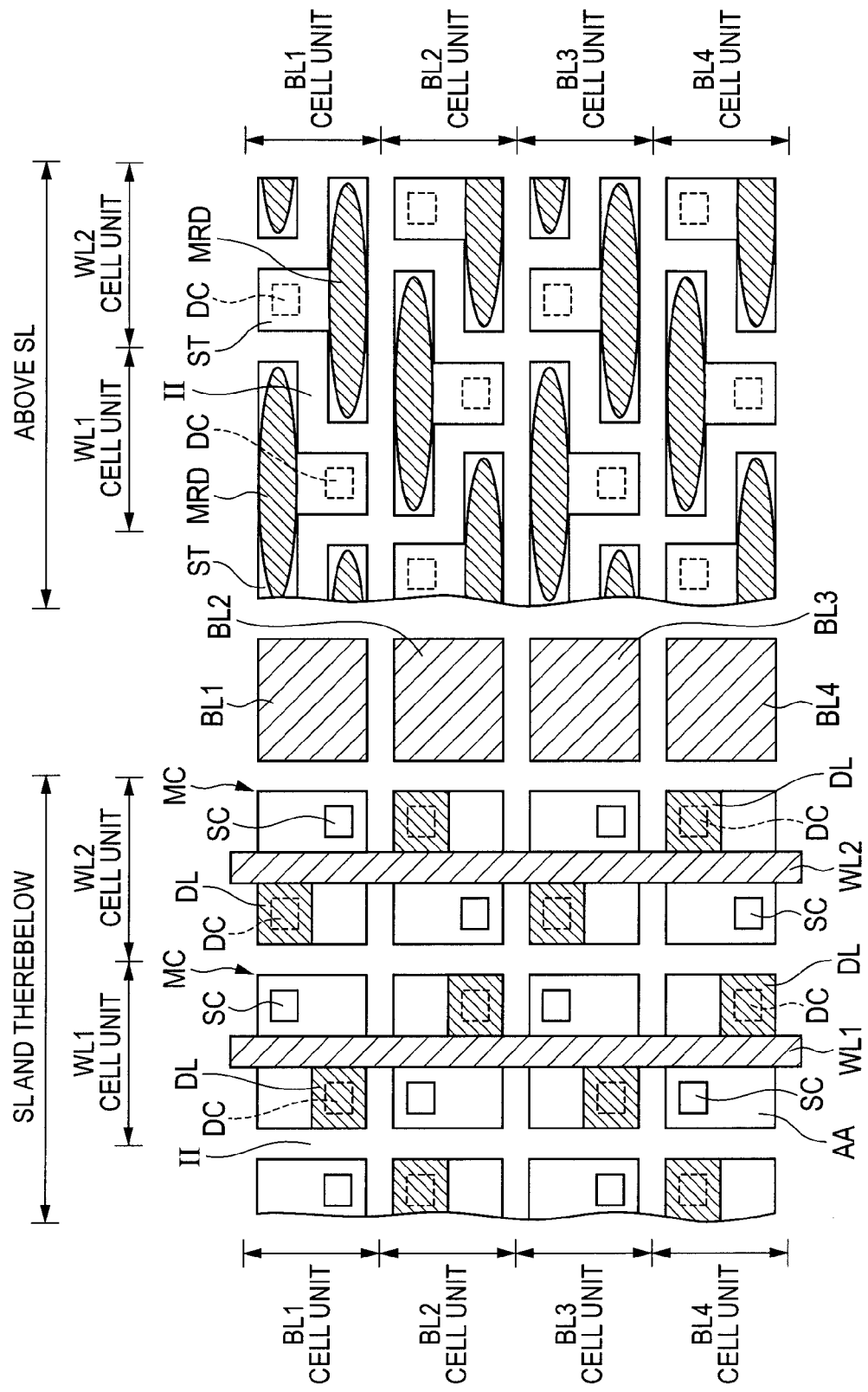
FIG. 77 is a plan view illustrating in detail the configuration of a memory cell area in a semiconductor device in a seventh example of the third embodiment of the invention.

As illustrated in FIG. 77, the memory cell area in the seventh example of this embodiment also has substantially the same configuration as the memory cell area in the fourth example in FIG. 62. (However, the aspect ratio of each magnetoresistive element MRD is (1 or above and) higher than in FIG. 62.) In FIG. 77, however, the strap wirings ST having the same planar shape as in FIG. 45 are arranged. (This planar shape is a so-called T shape extended in the directions (third direction and fourth direction) in which the memory cells MC are arranged in an array.) FIG. 77 is different from FIG. 62 in this respect.

Description will be given to the action and effect common to the examples of this embodiment. This embodiment brings about the following action and effect in addition to the action and effect of the first embodiment:

In this embodiment, the source contacts SC and the drain contacts DC are also arranged in a staggered configuration as viewed in a plane similarly to the magnetoresistive elements MRD. This makes it possible to reduce a difference in structure as viewed in a plane from memory cell MC to memory cell MC. Specifically, the following is implemented by, for example, arranging source contacts SC and drain contacts DC in a staggered configuration: the degree of freedom in layout for making substantially constant the planar distance between the magnetoresistive element MRD and the drain contact DC in each memory cell is enhanced. Therefore, it is possible to reduce variation in the functionality, such as electrical characteristics, of the magnetoresistive element MRD from memory cell MC to memory cell MC and make more stable the functionality of the entire memory cell area.

The following can be determined from the comparison of, for example, FIG. 66 related to this embodiment with FIG. 30 related to the first embodiment: the distance between the magnetoresistive element MRD and the drain contact DC in each memory cell MC is larger in FIG. 66. Because of this, the following can be implemented even when the microminiaturization of semiconductor devices is advanced in the future: the favorable flatness of each magnetoresistive element MRD (free layer MFL) can be maintained by ensuring the planar distance between the magnetoresistive element MRD and the drain contact DC.

The third embodiment of the invention is different from the first and second embodiments of the invention only in each of the above-mentioned respects. That is, with respect to the third embodiment of the invention, configurations, conditions, procedures, effects, and the like that are not described above are all in accordance with the first and second embodiments of the invention. Therefore, the configuration of the third embodiment of the invention may be combined with any configuration that can be combined with the third embodiment in terms of functionality among the configurations described in relation to the first and second embodiments.

Fourth Embodiment

The fourth embodiment of the invention is different from each of the above-mentioned embodiments in the configuration of bit lines BL. Hereafter, description will be given to the configuration of this embodiment with reference to FIG. 78 to FIG. 83.

Figure 78:
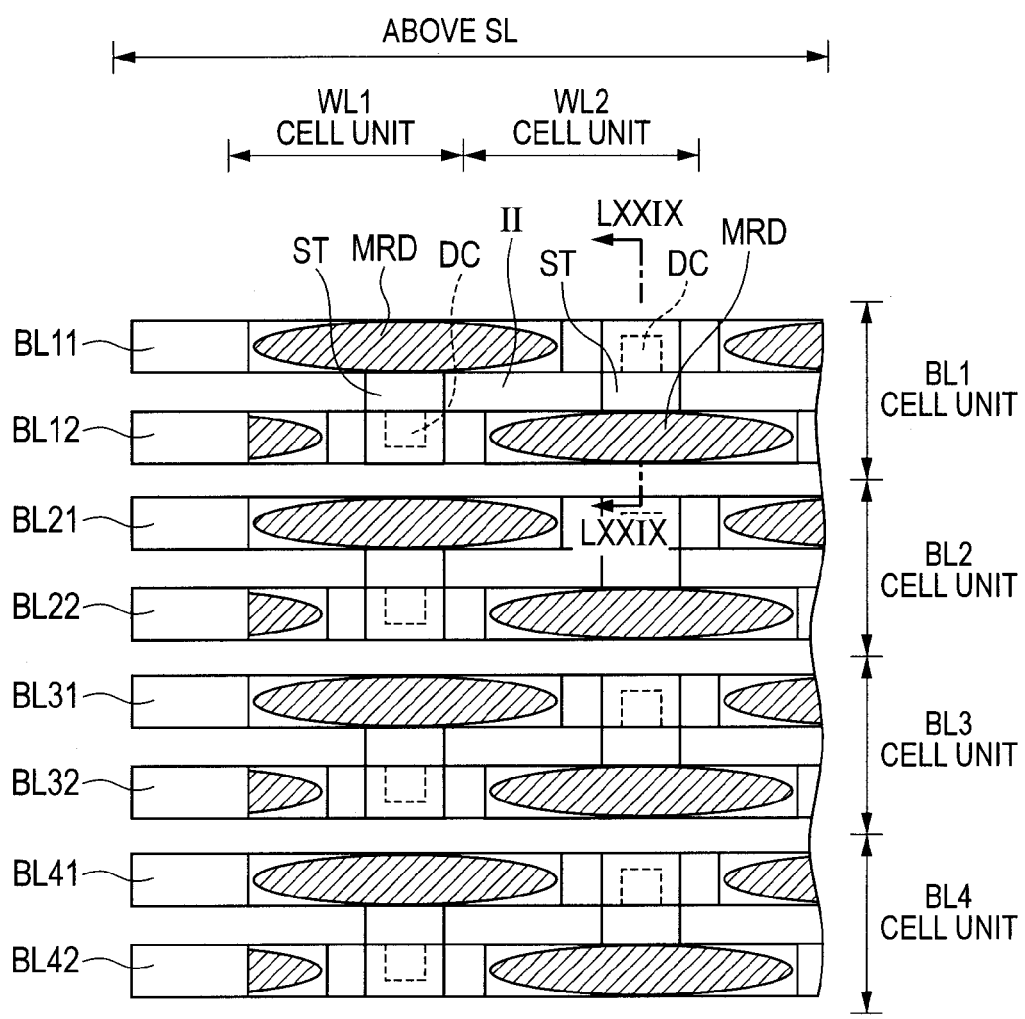
FIG. 78 is a plan view of the configuration of a memory cell area in a semiconductor device in a first example of a fourth embodiment of the invention, illustrating only the layers located above source lines in detail.
Figure 79:
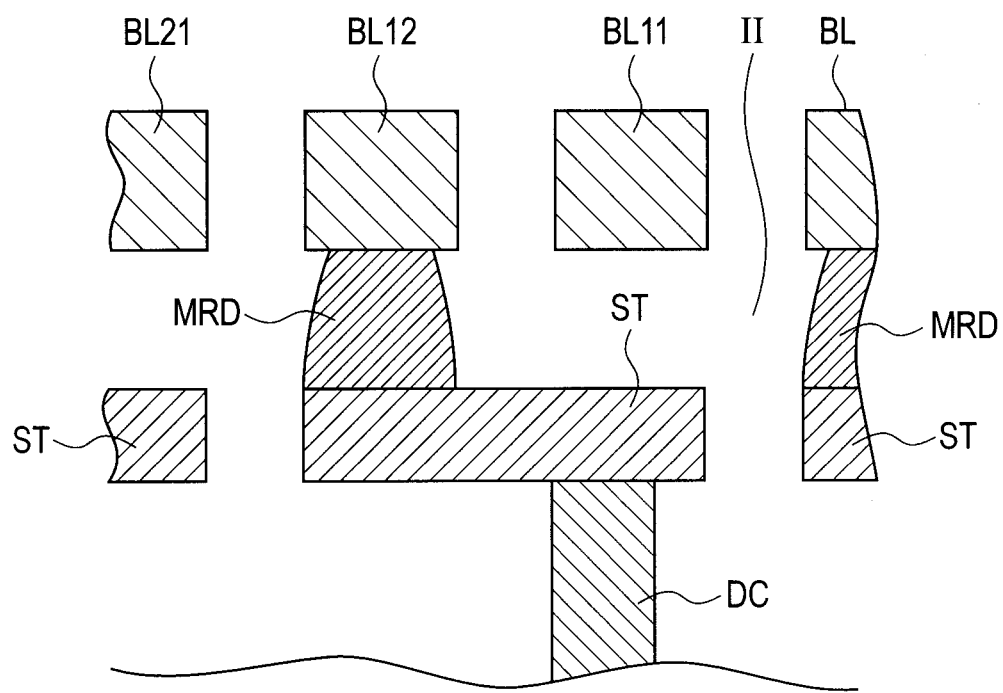
FIG. 79 is a schematic sectional view of an area where a magnetoresistive element in FIG. 78 is formed, taken along line LXXIX-LXXIX of FIG. 78.

As illustrated in FIG. 78 and FIG. 79, the memory cell area in a first example of this embodiment also has substantially the same configuration as, for example, the following memory cell areas: the memory cell areas in FIG. 45 related to the second embodiment and in FIG. 77 related to the third embodiment. In FIG. 78 and FIG. 79, however, each bit line extended in the BL1 to BL4 cell units is divided into two. That is, for example, two bit lines, the bit line BL11 and the bit line BL12, are placed in positions where they overlap with the BL1 cell unit as viewed in a plane.

In other words, the bit lines in this embodiment are placed in each single memory cell MC with which they overlap as viewed in a plane so that the following is implemented: each bit line is divided into two or more bit lines BL11, B12 at a distance in between in the direction (the vertical direction of the drawing) intersecting with the direction in which the bit lines are extended. This configuration is the same in the other BL2 to BL4 cell units and in each cell unit, two bit lines, the bit line BL21 (BL31, BL41) and the bit line BL22 (BL32, BL42), are placed.

In FIG. 78 and FIG. 79, two bit lines are placed for each of the BL1 to BL4 cell units; however, three or more bit lines may be placed for each cell unit. For the arrangement of the layers (drain contacts DC, source contacts SC, and the like) below, for example, the strap wiring ST and source line SL in each memory cell MC in FIG. 78 and FIG. 79, the following measure can be taken: any configuration, described in relation to each of the above-mentioned embodiments, that can be utilized in combination with the configuration in FIG. 78 and FIG. 79 can be adopted.

Figure 80:
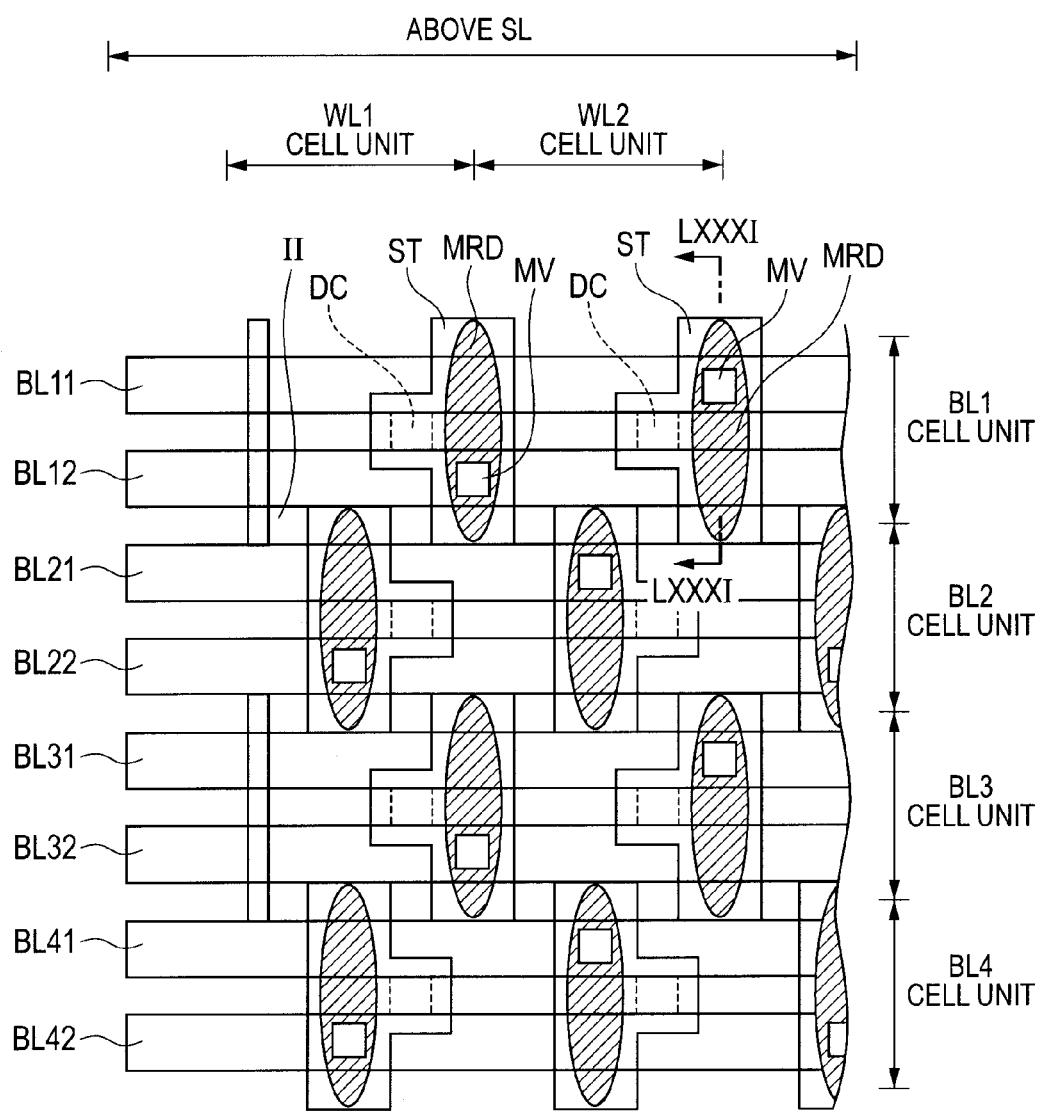
FIG. 80 is a plan view of the configuration of a memory cell area in a semiconductor device in a second example of the fourth embodiment of the invention, illustrating only the layers located above source lines in detail.
Figure 81:
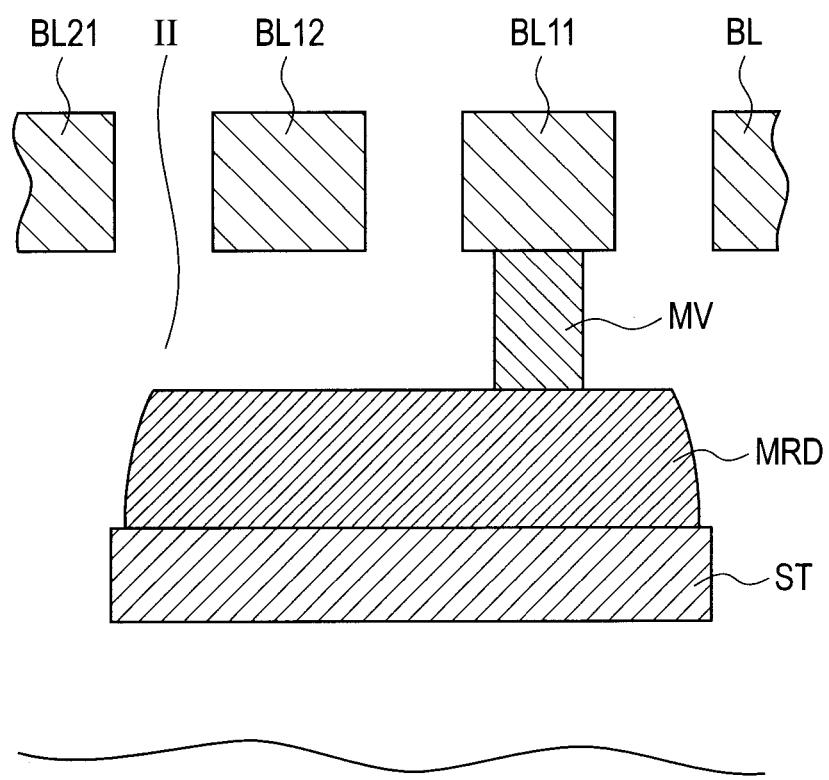
FIG. 81 is a schematic sectional view of an area where a magnetoresistive element in FIG. 80 is formed, taken along line LXXXI-LXXXI of FIG. 80.
Figure 82:
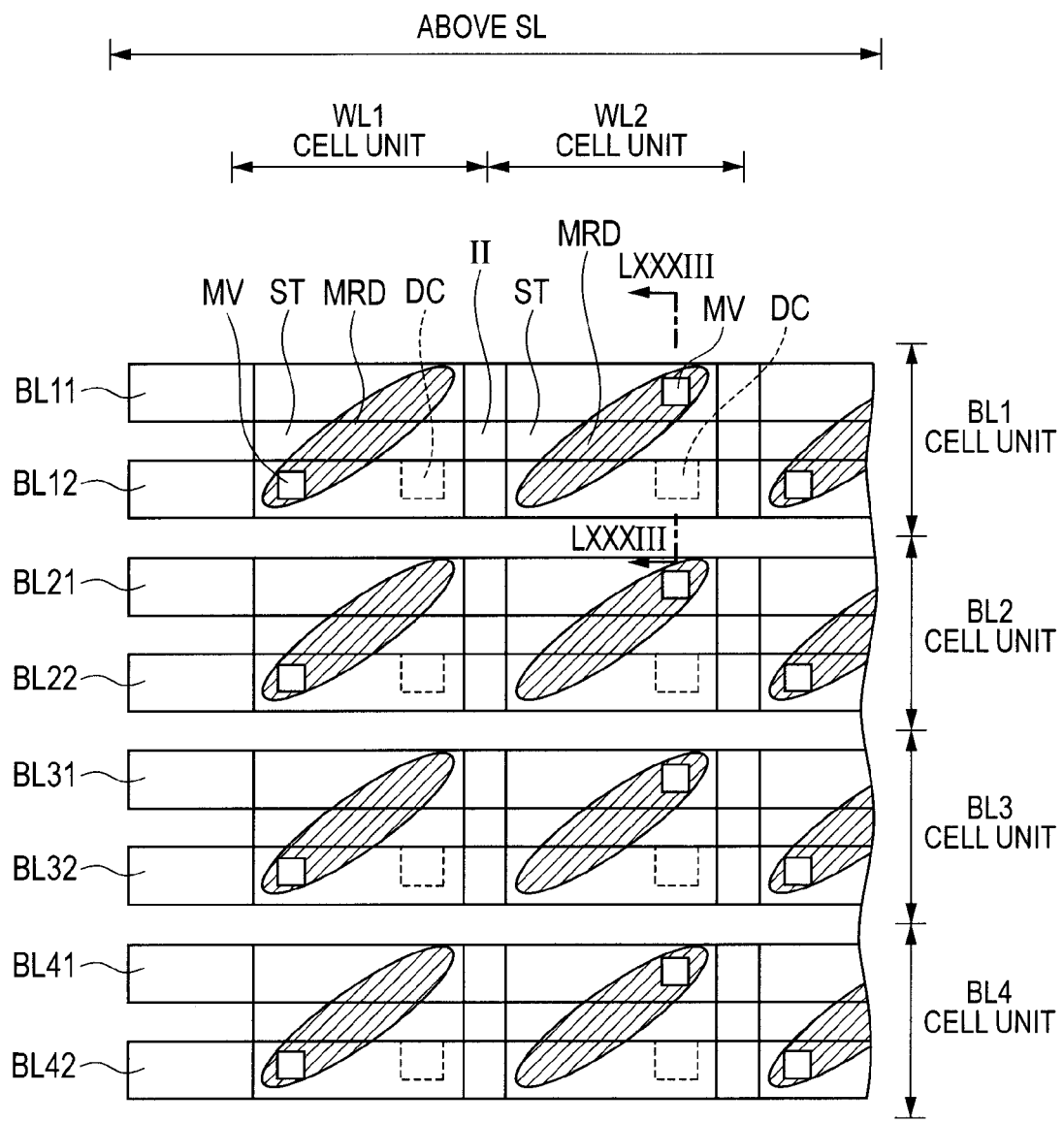
FIG. 82 is a plan view of the configuration of a memory cell area in a semiconductor device in a third example of the fourth embodiment of the invention, illustrating only the layers located above source lines in detail.
Figure 83:
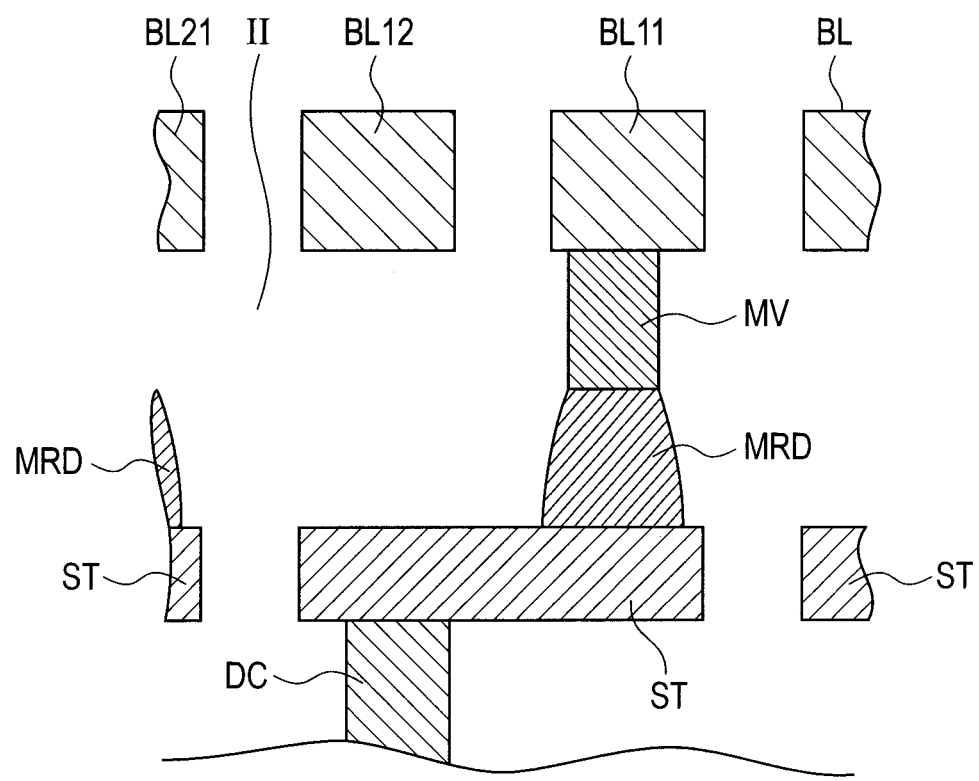
FIG. 83 is a schematic sectional view of an area where a magnetoresistive element in FIG. 82 is formed, taken along line LXXXIII-LXXXIII of FIG. 82.

As illustrated in FIG. 80 and FIG. 81, the memory cell area in a second example of this embodiment is obtained by combining the configuration of bit lines in FIG. 78 and FIG. 79 with the following memory cells MC: memory cells MC having the arrangement of magnetoresistive elements MRD in, for example, FIG. 30 and FIG. 66. As illustrated in FIG. 82 and FIG. 83, the memory cell area in a third example of this embodiment is obtained by combining the configuration of bit lines FIG. 78 and FIG. 79 with the following memory cells MC: memory cells MC having the arrangement of magnetoresistive elements MRD in, for example, FIG. 29 and FIG. 58. Also in the memory cells MC in FIG. 80 to FIG. 83, the following measure can be taken for the arrangement of the layers (drain contacts DC, source contacts SC, and the like) below, for example, the strap wirings ST and the source lines SL: any configuration, described in relation to each of the above-mentioned embodiments, that can be utilized in combination with the configurations in FIG. 80 to FIG. 83 can be adopted.

The measure illustrated in FIG. 81 or FIG. 83 may be taken in cases where each bit line is not so placed that it is in contact with the upper surface of a magnetoresistive element MRD. (Examples of these cases are cases where an interlayer insulating layer II is interposed between a bit line and a magnetoresistive element MRD.) That is, a bit line and a magnetoresistive element MRD may be electrically coupled with each other by, for example, forming a memory via MV between them. It is desirable that each memory via MV should be formed of a conductive film comprised of the same material as that of, for example, the drain contacts DC. The memory via MV can be formed by carrying out, for example, a step of forming a desired hole in the interlayer insulating layer II sandwiched between a bit line and a magnetoresistive element MRD and filling this hole with a conductive film. The memory via MV may be formed for the magnetoresistive elements MRD arranged as illustrated in FIG. 78 and FIG. 79. As illustrated in the sectional views in FIG. 81 and FIG. 83, the following procedure may be taken: the magnetoresistive elements MRD and the interlayer insulating layer II as the same layer as them are formed (as in FIG. 34 and FIG. 35); and then the upper surfaces of the magnetoresistive elements MRD and the like are flattened by CMP before the memory vias MV and the bit lines are formed.

Description will be given to the action and effect common to the examples of this embodiment. This embodiment brings about the following action and effect in addition to the action and effect of the first embodiment:

In this embodiment, a bit line, such as the bit line BL11 in FIG. 79, that is extended in positions where it overlaps with magnetoresistive elements MRD as viewed in a plane but is not electrically coupled with the magnetoresistive elements MRD is formed. For this reason, the number of memory cells MC (magnetoresistive elements MRD) electrically coupled with each bit line is reduced as compared with, for example, the following cases, from the view point of the bit line side: cases where one bit line overlaps with each magnetoresistive element MRD as viewed in a plane. The following can be implemented by dividing each bit line into two, BL11 and BL12 as illustrated in, for example, FIG. 78 to FIG. 83: the magnetoresistive element MRD of a first memory cell of two memory cells adjoining to each other of the BL1 cell unit can be coupled to the bit line BL11 and the magnetoresistive element MRD of a second memory cell can be coupled to the bit line BL12. For this reason, the number of magnetoresistive elements MRD electrically coupled with each bit line is reduced to approximately half by dividing each bit line BL into two as mentioned above.

For this reason, it is possible to reduce stress applied to each magnetoresistive element MRD and leading to increase in inversion probability at readout (Refer to FIG. 19) and suppress the occurrence of an inversion-at-readout error in the entire MRAM. However, use of this embodiment makes it possible also to electrically couple a bit line and a magnetoresistive element with each other using the above-mentioned memory via MV as required.

The fourth embodiment of the invention is different from the first to third embodiments of the invention only in each of the above-mentioned respects. That is, with respect to the fourth embodiment of the invention, configurations, conditions, procedures, effects, and the like that are not described above are all in accordance with the first to third embodiments of the invention. Therefore, the configuration of the fourth embodiment of the invention may be combined with any configuration that can be combined with the fourth embodiment in terms of functionality among the configurations described in relation to the first to third embodiments.

Fifth Embodiment

The fifth embodiment of the invention is different from each of the above-mentioned embodiments in the arrangement of word lines WL. Hereafter, description will be given to the configuration of this embodiment with reference to FIG. 84 to FIG. 98.

Figure 84:
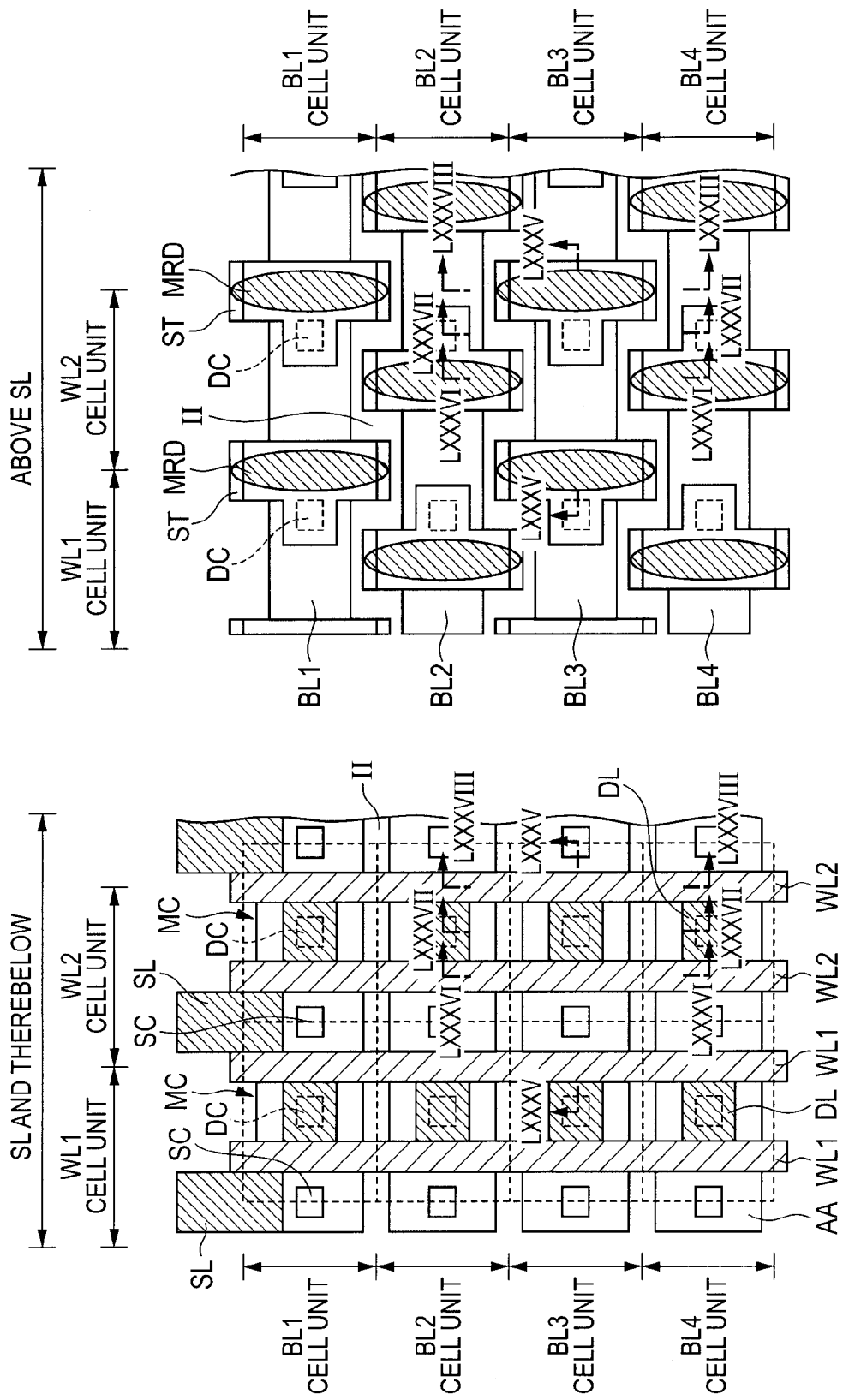
FIG. 84 is a plan view illustrating in detail the configuration of a memory cell area in a semiconductor device in a first example of a fifth embodiment of the invention.
Figure 85:
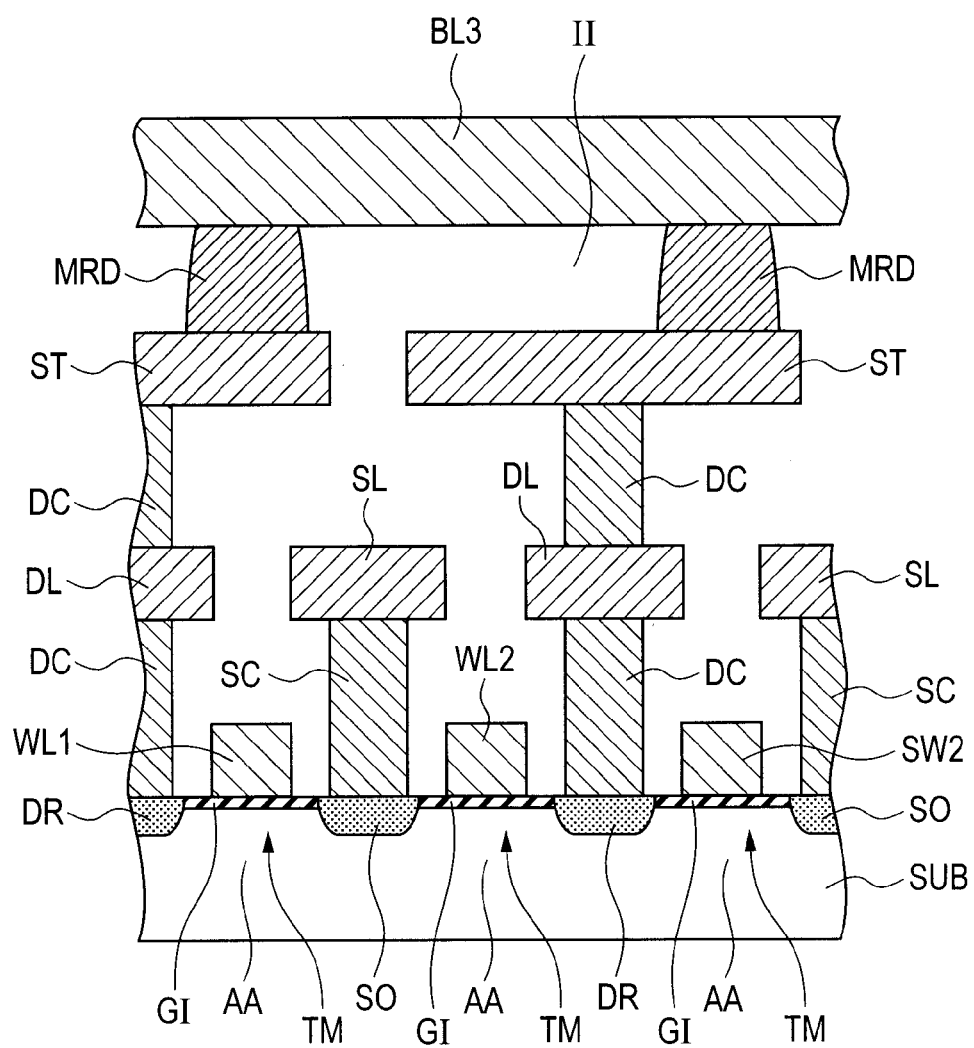
FIG. 85 is a schematic sectional view of the memory cell area in FIG. 84, taken along line LXXXV-LXXXV of FIG. 84.
Figure 86:
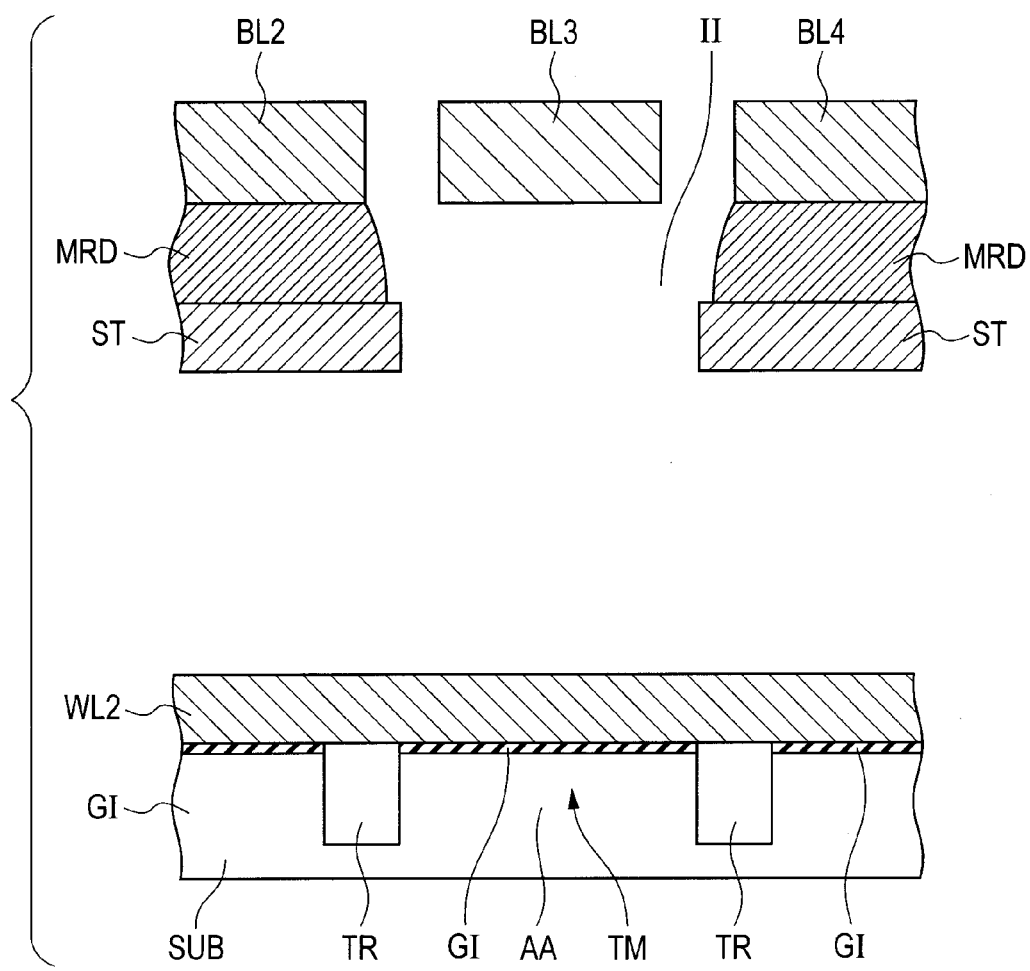
FIG. 86 is a schematic sectional view of the memory cell area in FIG. 84, taken along line LXXXVI-LXXXVI of FIG. 84.
Figure 87:
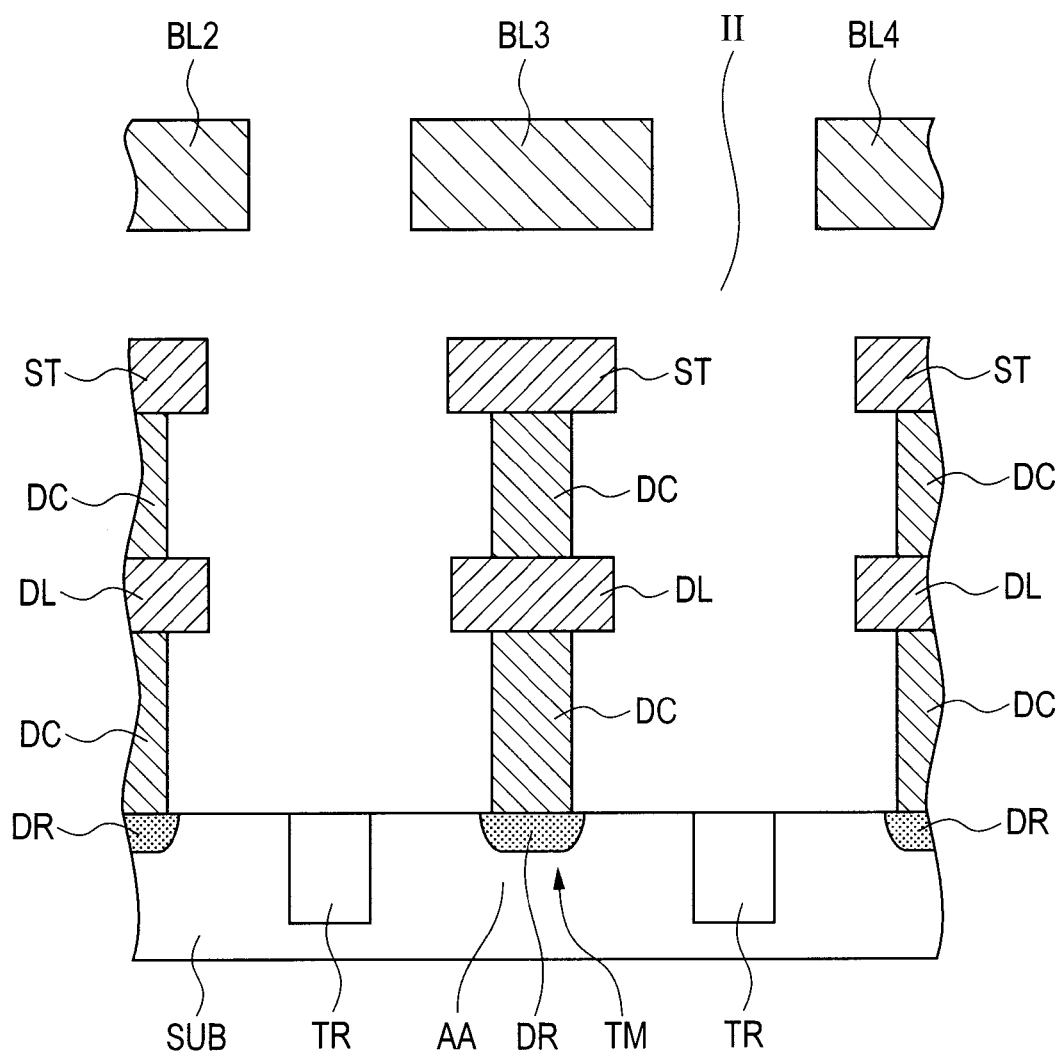
FIG. 87 is a schematic sectional view of the memory cell area in FIG. 84, taken along line LXXXVII-LXXXVII of FIG. 84.
Figure 88:
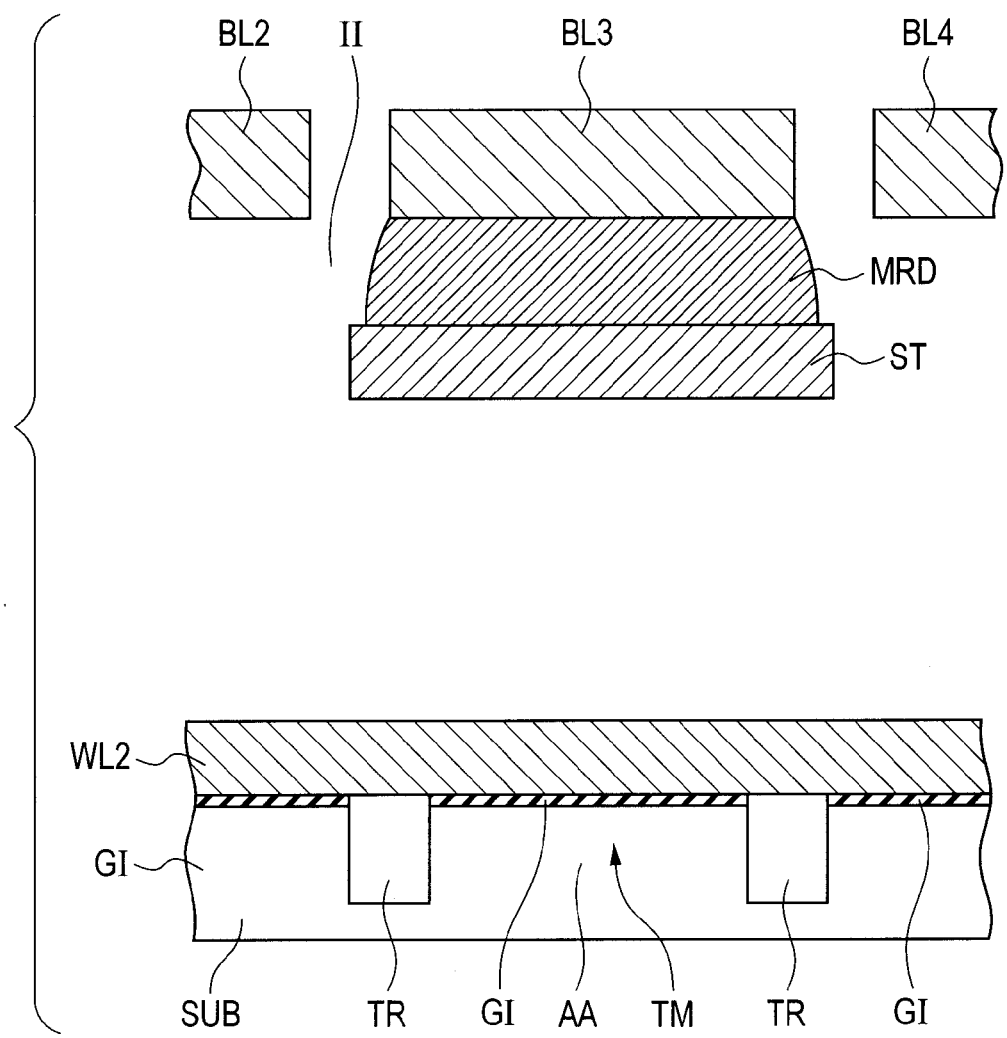
FIG. 88 is a schematic sectional view of the memory cell area in FIG. 84, taken along line LXXXVIII-LXXXVIII of FIG. 84.

As illustrated in FIG. 84, the memory cell area in a first example of this embodiment also has substantially the same configuration as the memory cell area in, for example, FIG. 31 related to the second embodiment. In each memory cell MC in FIG. 84, however, word lines extended in the vertical direction of the drawing are arranged two by two with a distance in between. More specific description will be given. A word line is extended in the vertical direction of the drawing in every area sandwiched between a source contact SC and a drain contact DC in the horizontal direction of the drawing. For this reason, the sectional views in FIG. 85 to FIG. 88 are different from FIG. 36 to FIG. 39 in that: a word line WL1, WL2 is placed in each area sandwiched between a source contact SC (source region SO) and a drain contact DC (drain region DR) as viewed in a plane.

In FIG. 31, for example, a word line WL1, WL2 is extended only in the area sandwiched between the source contact SC and the drain contact DC in each memory cell MC. For this reason, a word line is not placed in the area (the vicinity of the boundary between memory cells MC) sandwiched between one memory cell MC and another memory cell MC adjoining thereto. An interlayer insulating layer II is formed in the same layer as the word lines. In this embodiment, meanwhile, word lines WL1, WL2 are placed two by two with a distance in between in each memory cell indicated by broken lines in FIG. 84. For this reason, FIG. 84 is different from FIG. 31 in the areas of the WL1 to WL2 cell units. Specifically, the WL1 (WL2) cell unit is so defined that two word lines WL1 (WL2) on the left of the drawing come to the center.

In this embodiment, as mentioned above, the source regions SO and the drain regions DR are sandwiched between two word lines WL1, WL2 as viewed in a plane. FIG. 84 is different from FIG. 31 in this respect.

Description will be given to the operation of STT-MRAM in this embodiment with reference to the equivalent circuit in FIG. 89.

Figure 89:
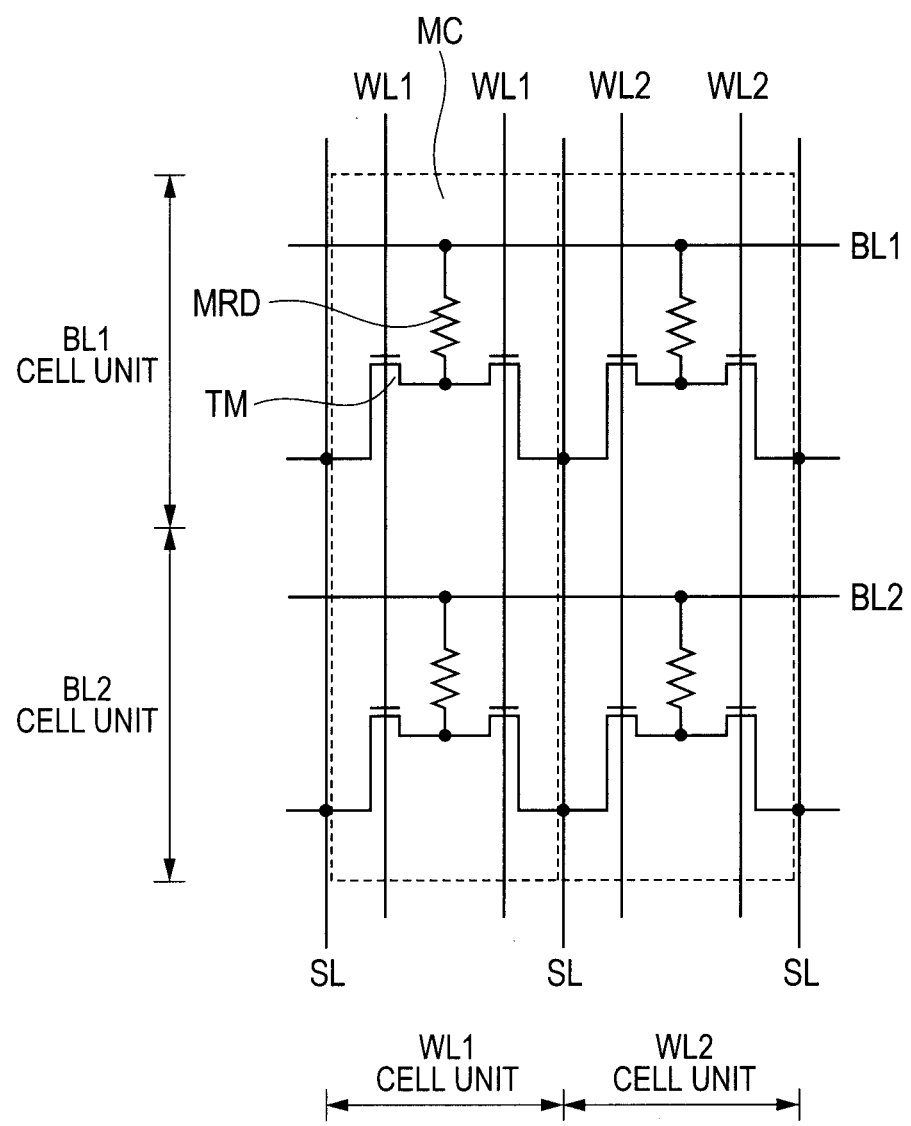
FIG. 89 is a diagram of an equivalent circuit of the memory cell area in FIG. 84.

The arrangement of the memory cells encircled with a broken line in FIG. 89 is the same as the arrangement of the memory cells as viewed in a plane in FIG. 84. The word lines placed in a selected memory cell MC are activated and the channel of the transistor TM in the memory cell MC is turned on. (This channel is a channel region overlapping with word lines extended in each memory cell MC in FIG. 84 as viewed in a plane.) At this time, the word lines placed in the unselected memory cells MC are deactivated and the channels of the transistors TM in these memory cells MC are turned off.

Consideration will be given to a case where the memory cell MC including two word lines WL1 and a bit line BL1 in FIG. 84 and FIG. 89 are a selected cell for rewriting or reading. In this case, the two word lines WL1 and the bit line BL1 are activated and the channel of the memory cell MC is turned on. At this time, the word lines (word lines WL2) and the bit lines BL2 to BL4 other than above are deactivated and the channels of the memory cells MC are turned off.

Also in cases where any memory cell MC other than above is selected, operation is carried out to activate only the word lines placed in the selected memory cell MC similarly to the foregoing.

Figure 90:
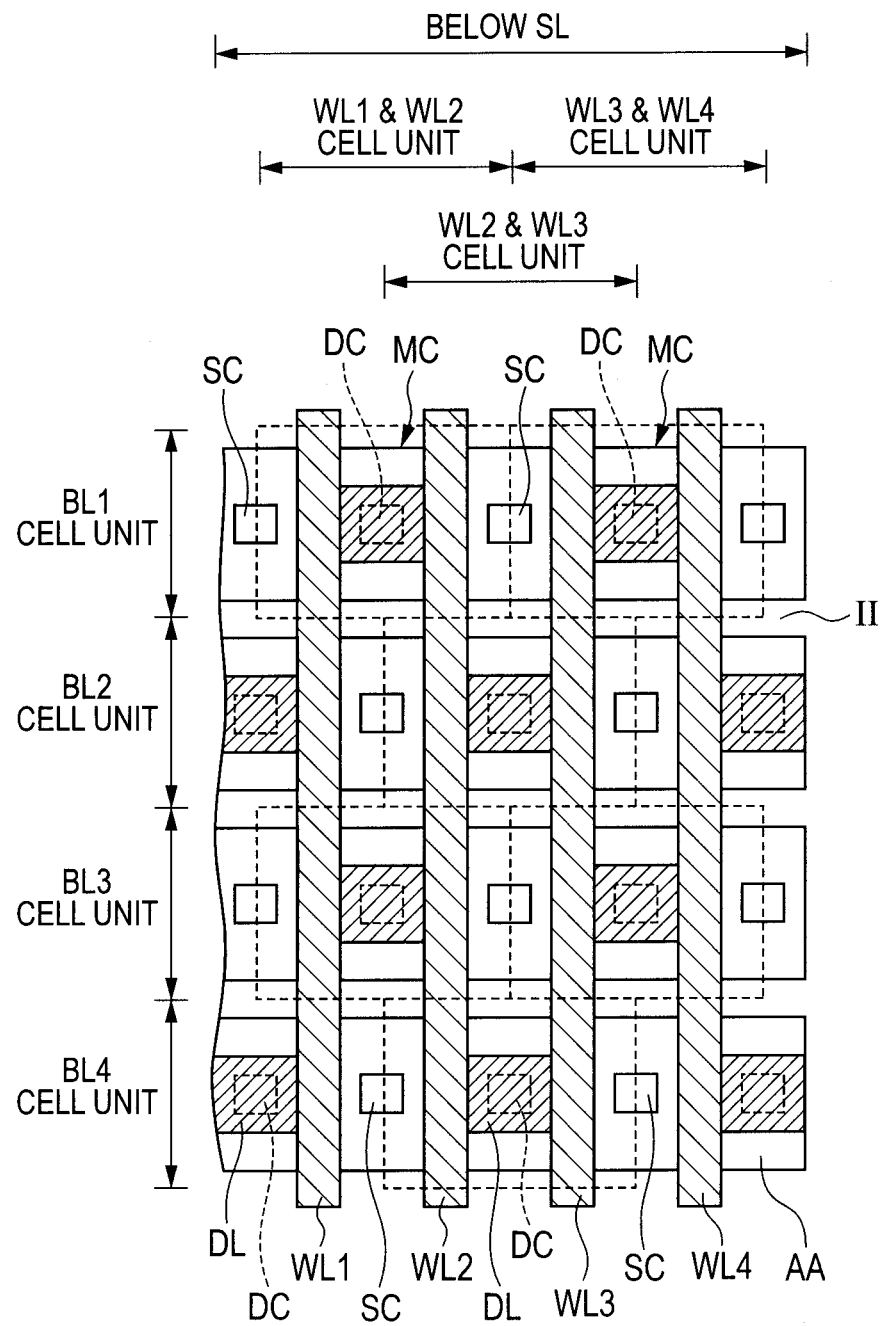
FIG. 90 is a plan view of the configuration of a memory cell area in a semiconductor device of a second example of the fifth embodiment of the invention, illustrating only the layers located below source lines in detail.

As illustrated in FIG. 90, the memory cell area in a second example of this embodiment also has substantially the same configuration as the memory cell areas in, for example, FIG. 48 to FIG. 52 related to the third embodiment. In FIG. 90, however, the following measure is taken as in FIG. 84: word lines WL1 to WL4 extended in the vertical direction of the drawing are placed two by two with a distance in between in each memory cell MC. That is, in every area sandwiched between a source contact SC and a drain contact DC in the horizontal direction of the drawing, a word line is extended in the vertical direction of the drawing. In the second example in FIG. 90, however, the source contacts SC and the drain contacts DC are respectively arranged in a staggered configuration unlike the first example in FIG. 84. For this reason, the individual memory cells MC are also arranged in a staggered configuration and the cell units of word lines are defined as "WL1&2 cell unit" and the like. FIG. 90 is different from FIG. 48 to FIG. 52 in this respect.

Figure 91:
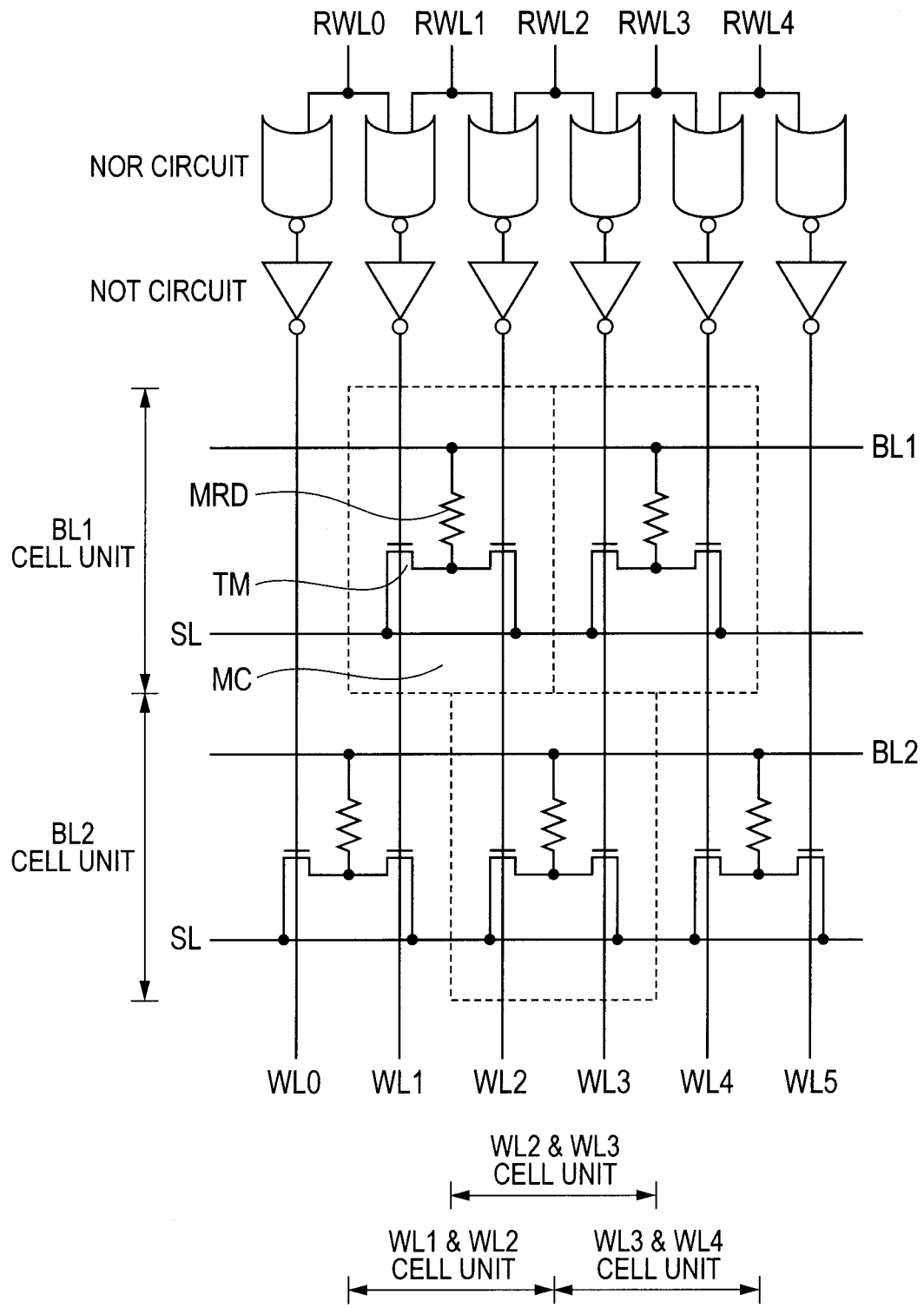
FIG. 91 is a diagram of an equivalent circuit of the memory cell area in FIG. 90.

Description will be given to the operation of STT-MRAM in the second example of this embodiment with reference to FIG. 90 and FIG. 91.

Though omitted in FIG. 90, sources lines SL are extended substantially in parallel to bit lines (in the left and right directions of the drawing). As indicated in the equivalent circuit in FIG. 91, the arrangement of the individual memory cells encircled with a broken line in FIG. 91 is the same as the arrangement of the individual memory cells in FIG. 90 as viewed in a plane. As an example, consideration will be given to a case where the memory cell MC including two word lines WL1, WL2 and a bit line BL1 in FIG. 90 is a selected cell for rewriting or reading. In this case, the word lines WL1, WL2 and the bit line BL1 are activated and the channel of the memory cell MC is turned on. At this time, the word lines (word lines WL0, WL3 to WL5) and bit lines BL2 to BL4 other than above are deactivated and the channels of these memory cells MC are turned off. At this time, operation is carried out to set the read word line RWL1 coupled to the word lines WL1, WL2 in FIG. 91 to the "H" level. In addition, the other read word lines RWL0, RWL2 to RWL4 are brought to "L" and the channels of the memory cells MC including the bit lines BL2 to BL4 are not supplied with a current. Also in cases where any memory cell MC other than above is selected, operation is carried out to activate only the word lines placed in the selected memory cell MC similarly to the foregoing.

Figure 92:
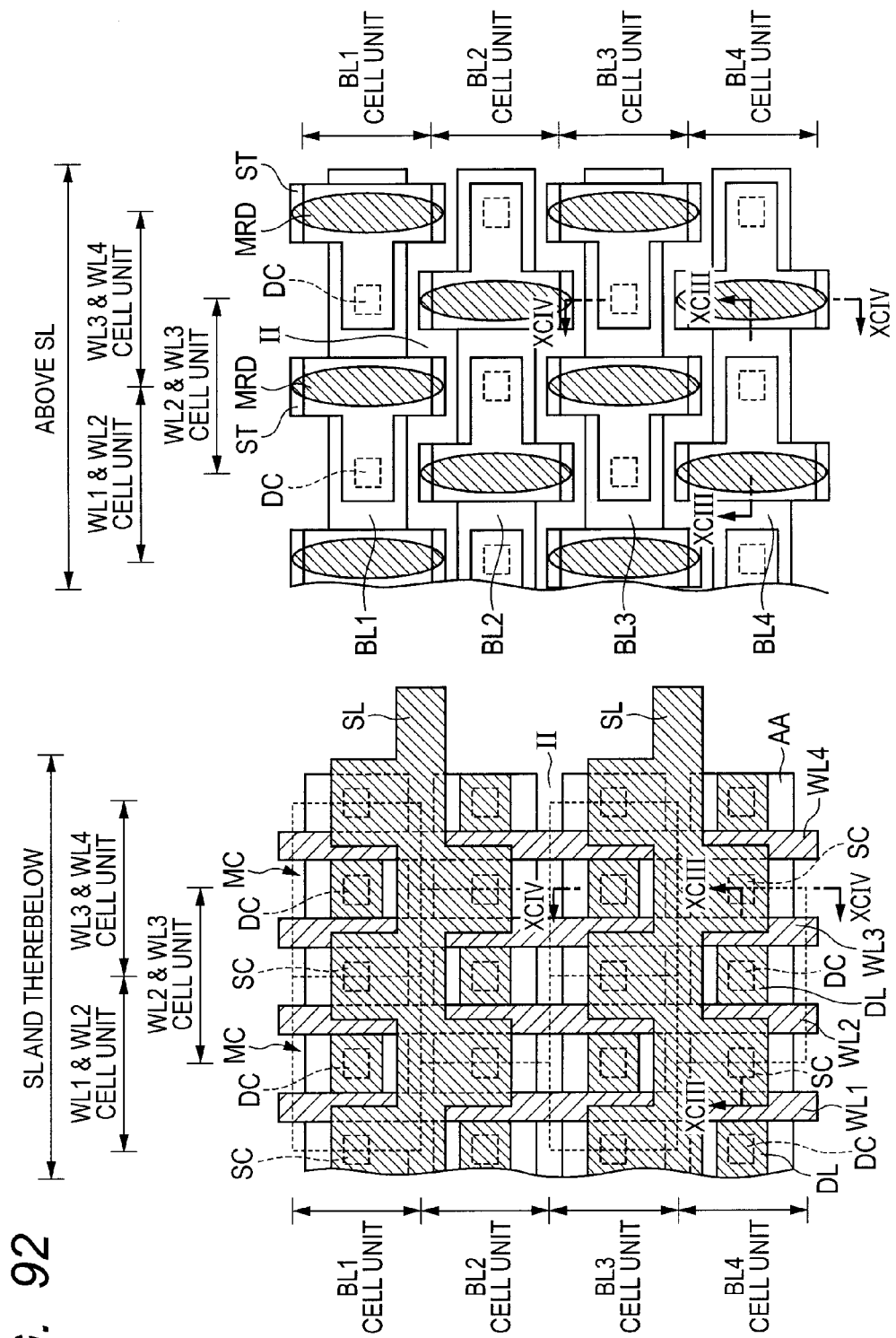
FIG. 92 is a plan view illustrating in detail the configuration of a memory cell area in a semiconductor device in a third example of the fifth embodiment of the invention.
Figure 93:
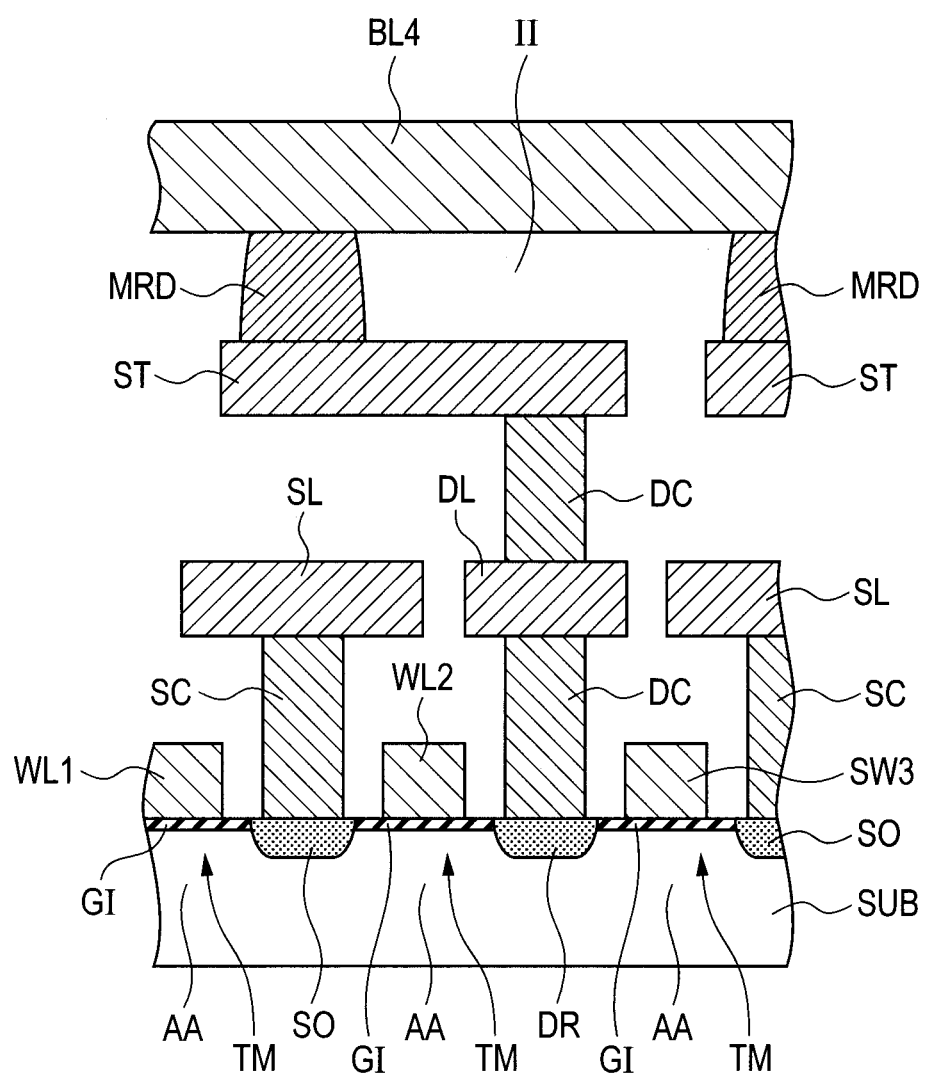
FIG. 93 is a schematic sectional view of the memory cell area in FIG. 92, taken along line XCIII-XCIII of FIG. 92.
Figure 94:
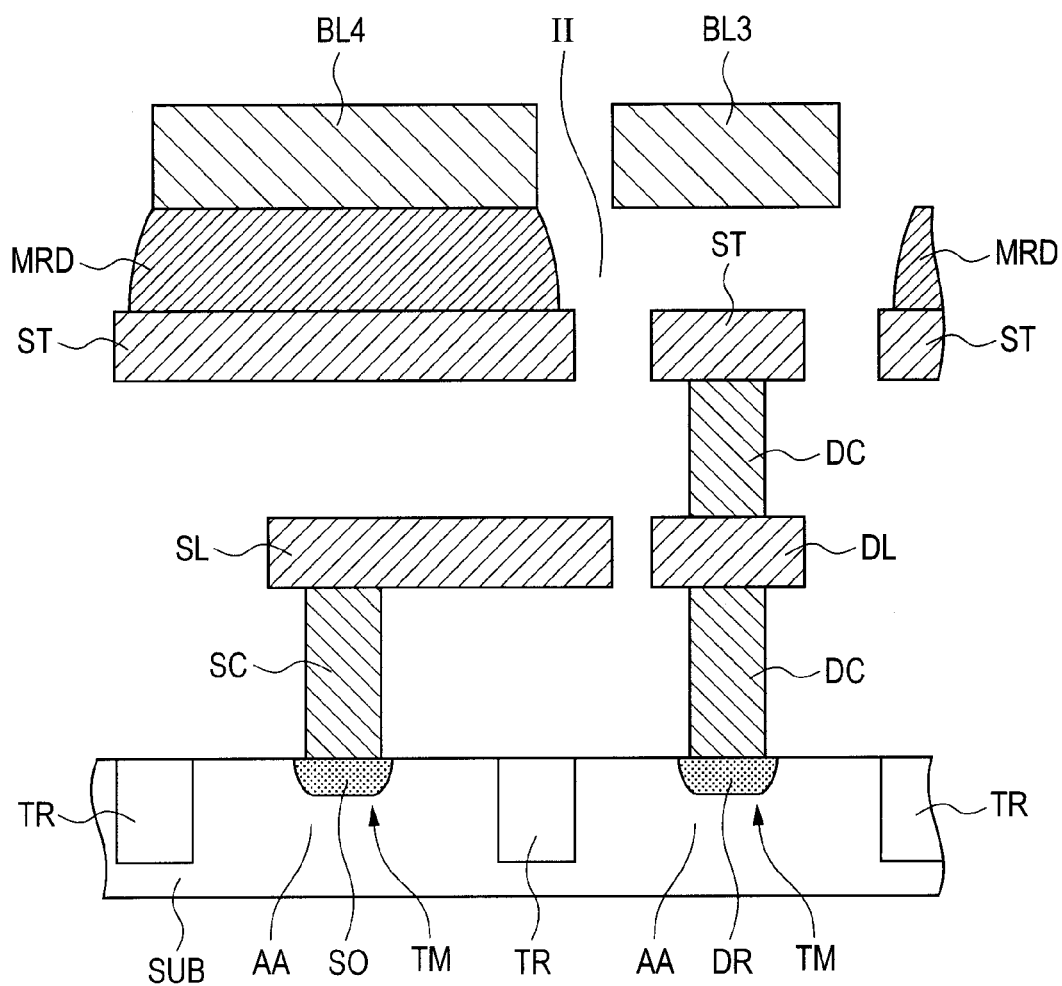
FIG. 94 is a schematic sectional view of the memory cell area in FIG. 92, taken along line XCIV-XCIV of FIG. 92.
Figure 95:
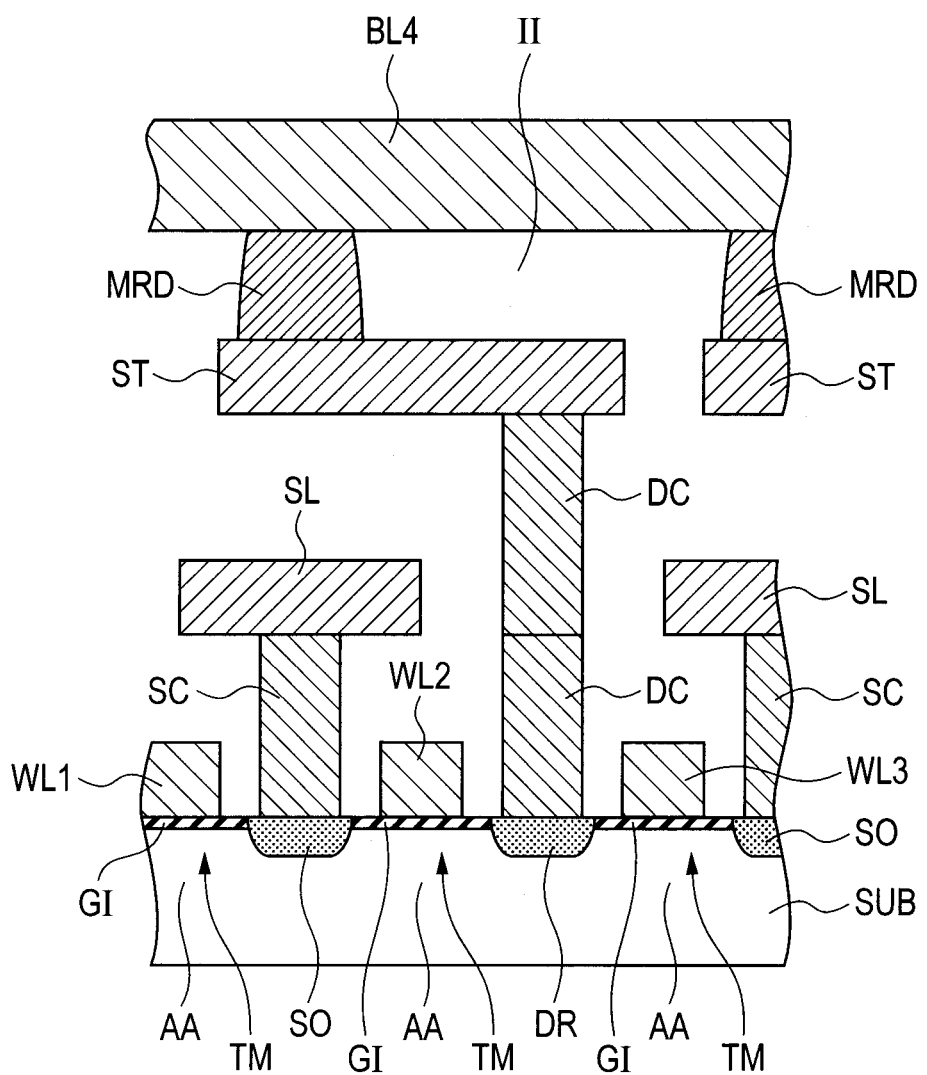
FIG. 95 is a schematic sectional view illustrating a first modification to the area illustrated in FIG. 93.
Figure 96:
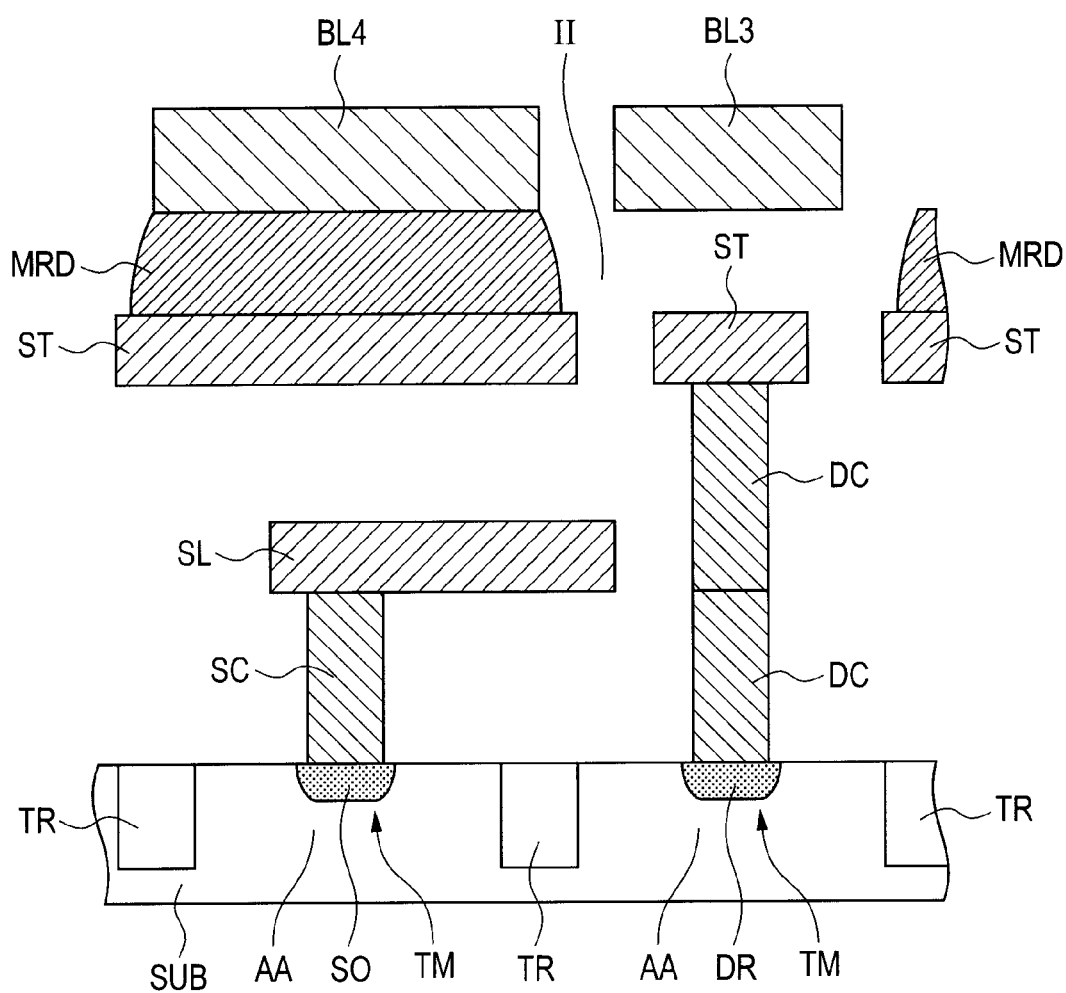
FIG. 96 is a schematic sectional view illustrating a first modification to the area illustrated in FIG. 94.
Figure 97:
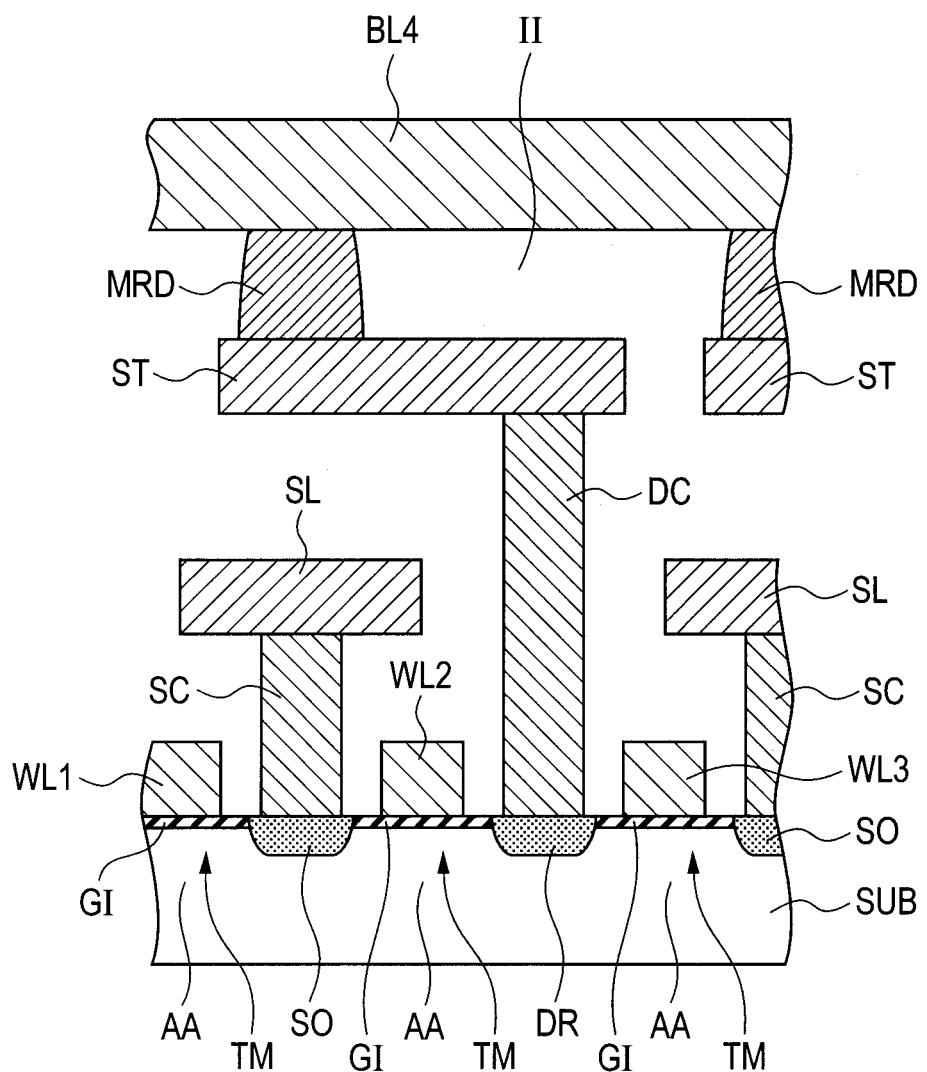
FIG. 97 is a schematic sectional view illustrating a second modification to the area illustrated in FIG. 93.
Figure 98:
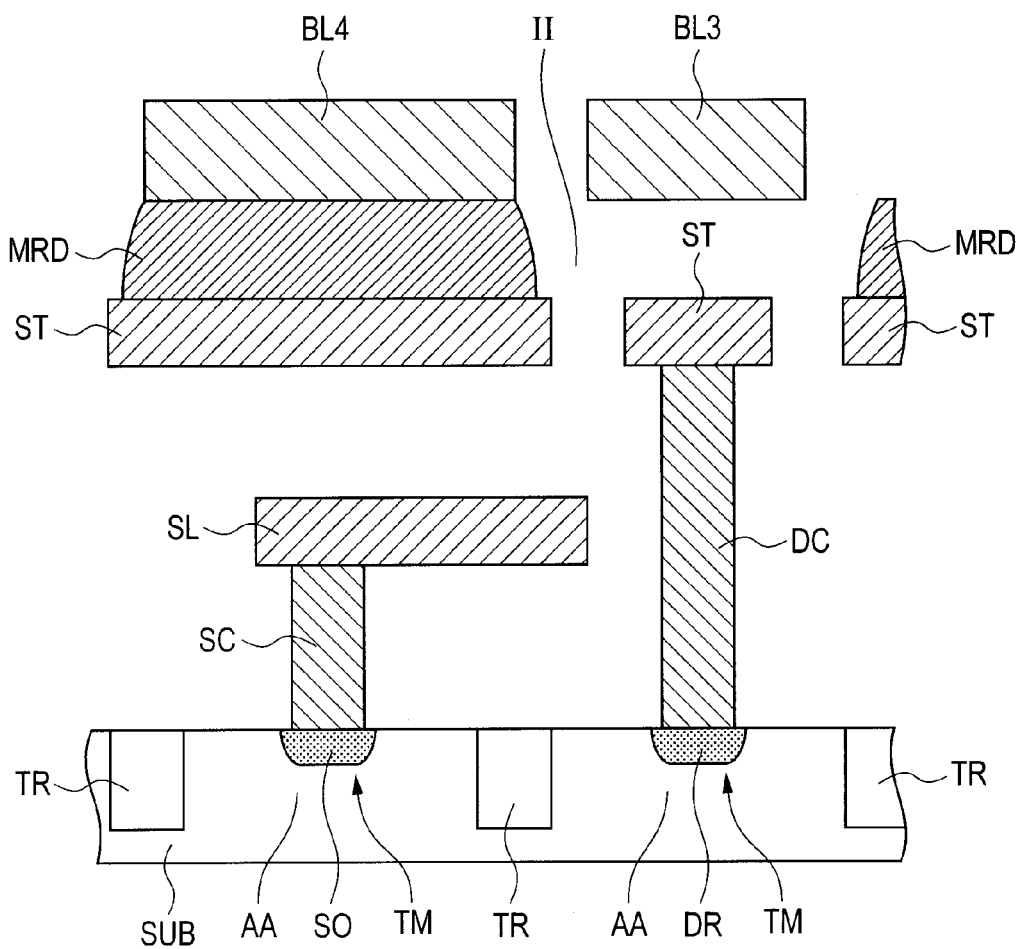
FIG. 98 is a schematic sectional view illustrating a second modification to the area illustrated in FIG. 94.

In each memory cell MC in the first example and the second example, any configuration can be adopted with respect to the following: the arrangement of the layers (drain contacts DC, source contacts SC, and the like) below, for example, the strap wirings ST and the source lines SL and the layers (magnetoresistive elements MRD and the like) above the source lines SL. The above configuration is any configuration that can be utilized in combination with the configurations of the first example and the second example described in relation to each of the above-mentioned embodiments. As an example, FIG. 92 to FIG. 94 illustrate a configuration obtained by combining a configuration in which the word lines WL1 to WL4 are placed as in the second example in FIG. 90 with the following: the arrangement of the magnetoresistive elements MRD and the like described in relation to the fifth example of the third embodiment illustrated in FIG. 70. As illustrated in FIG. 95 to FIG. 98, the same configurations as in FIG. 40 to FIG. 43 may be used in place of the drain contacts DC stacked in two layers in the example in FIG. 92 to FIG. 94.

Description will be given to the action and effect common to the examples of this embodiment. This embodiment brings about the following action and effect in addition to the action and effect of the first embodiment:

In each memory cell MC in this embodiment, two word lines are extended. For this reason, the width of the access transistor overlapping with these word lines as viewed in a plane is twice that in, for example, cases where one word line is extended in each memory cell MC. In this embodiment, for this reason, it is possible to approximately double the capability of the access transistor to supply a current to a magnetoresistive element MRD.

In cases where one word line is extended in each memory cell MC as in, for example, the first embodiment, it is necessary to take the following measure to ensure the channel width in this embodiment in each memory cell MC: it is necessary to double the area of the memory cell. For this reason, it is difficult to suppress increase in the unit area of memory cells. However, use of this embodiment makes it possible to widen this channel width to enhance the current supply capability of the access transistor without increasing the unit area of the memory cells MC.

In this embodiment, two word lines may be selected both in rewriting and in reading. A word line decoder that activates only one word line may be separately provided at the following word line ends: word line ends positioned on the opposite side to the word line ends (the vicinity of the word line driver band) in the memory cell array described in relation to the first example and the second example. The following processing may be carried out by the word line decoders: two word lines are selected only at the time of rewriting and one word line is selected at the time of readout. This make is possible to provide STT-MRAM in which the following can be implemented: it is possible to supply a current sufficient to rewrite information in a magnetoresistive element MRD in rewriting operation and suppress a readout error due to a low saturation current at the time of readout.

The fifth embodiment of the invention is different from the first to fourth embodiments of the invention only in each of the above-mentioned respects. That is, with respect to the fifth embodiment of the invention, configurations, conditions, procedures, effects, and the like that are not described above are all in accordance with the first to fourth embodiments. Therefore, the configuration of the fifth embodiment of the invention may be combined with any configuration that can be combined with the fifth embodiment in terms of functionality among the configurations described in relation to the first to fourth embodiments.

Reference Example

The magnetoresistive elements MRD of the STT-MRAM in each of the above-mentioned embodiments are basically of in-plane magnetization type and are magnetized in the direction along the main surfaces of a semiconductor substrate SUB and individual laminated thin films. However, the STT-MRAM may be of so-called perpendicular magnetization type. In perpendicular magnetization STT-MRAM, for example, the magnetoresistive elements MRD are magnetized along the direction intersecting with the main surfaces of a semiconductor substrate SUB and the like, that is, the direction in which individual thin films are laminated.

Figure 99:
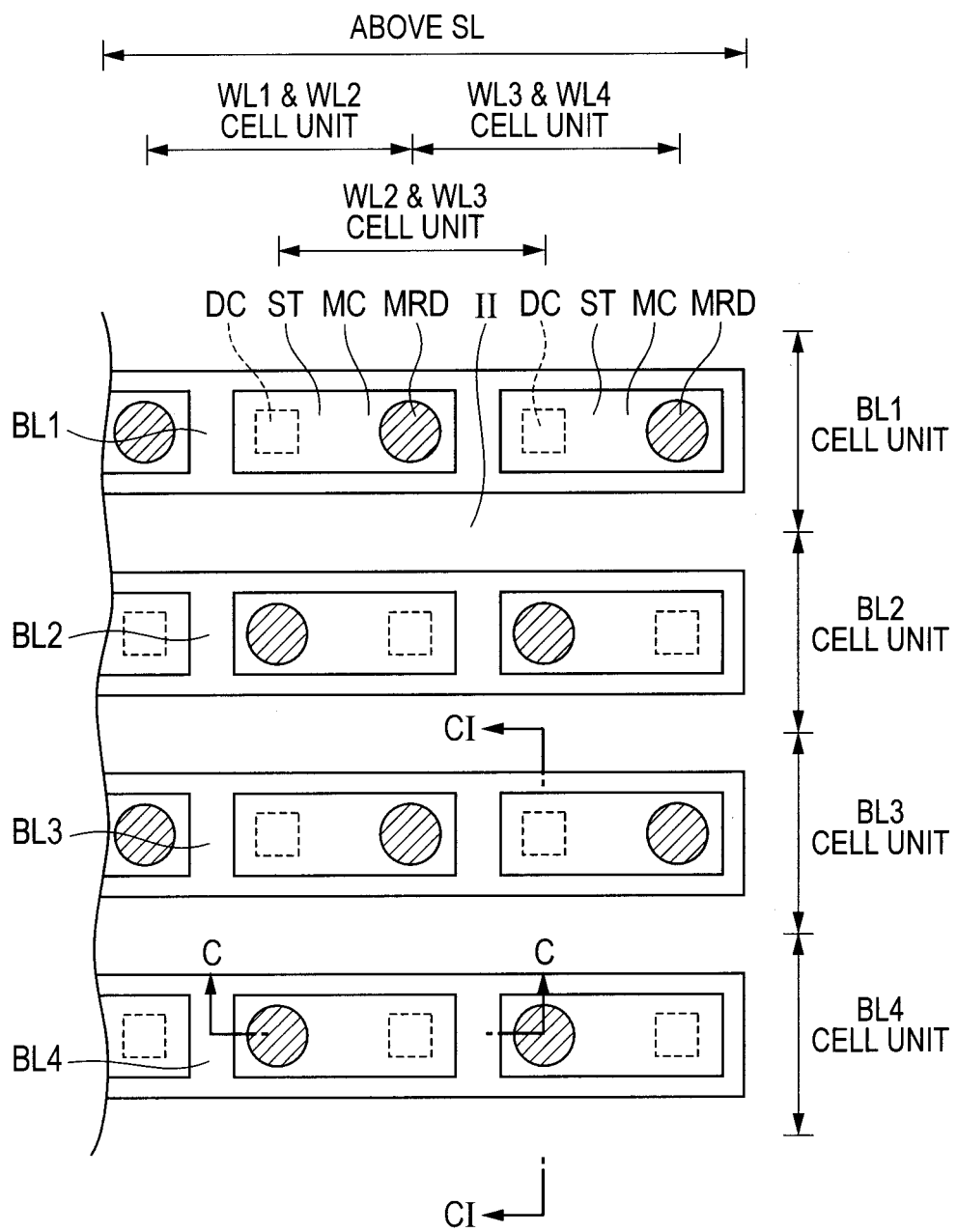
FIG. 99 is a plan view of the configuration of a memory cell area in a semiconductor device in a reference example of the invention, illustrating only the layers located above source lines in detail.
Figure 100:
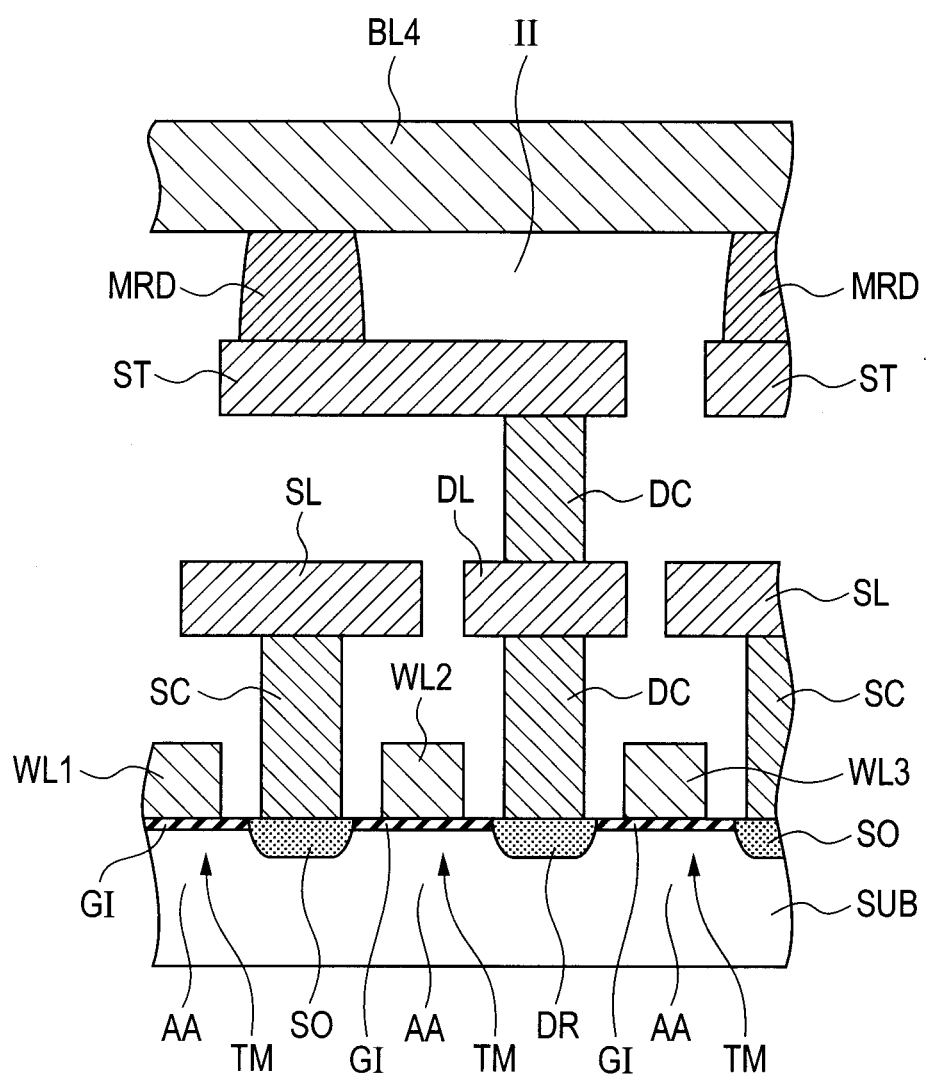
FIG. 100 is a schematic sectional view of the memory cell area in FIG. 99, taken along line C-C of FIG. 99.
Figure 101:
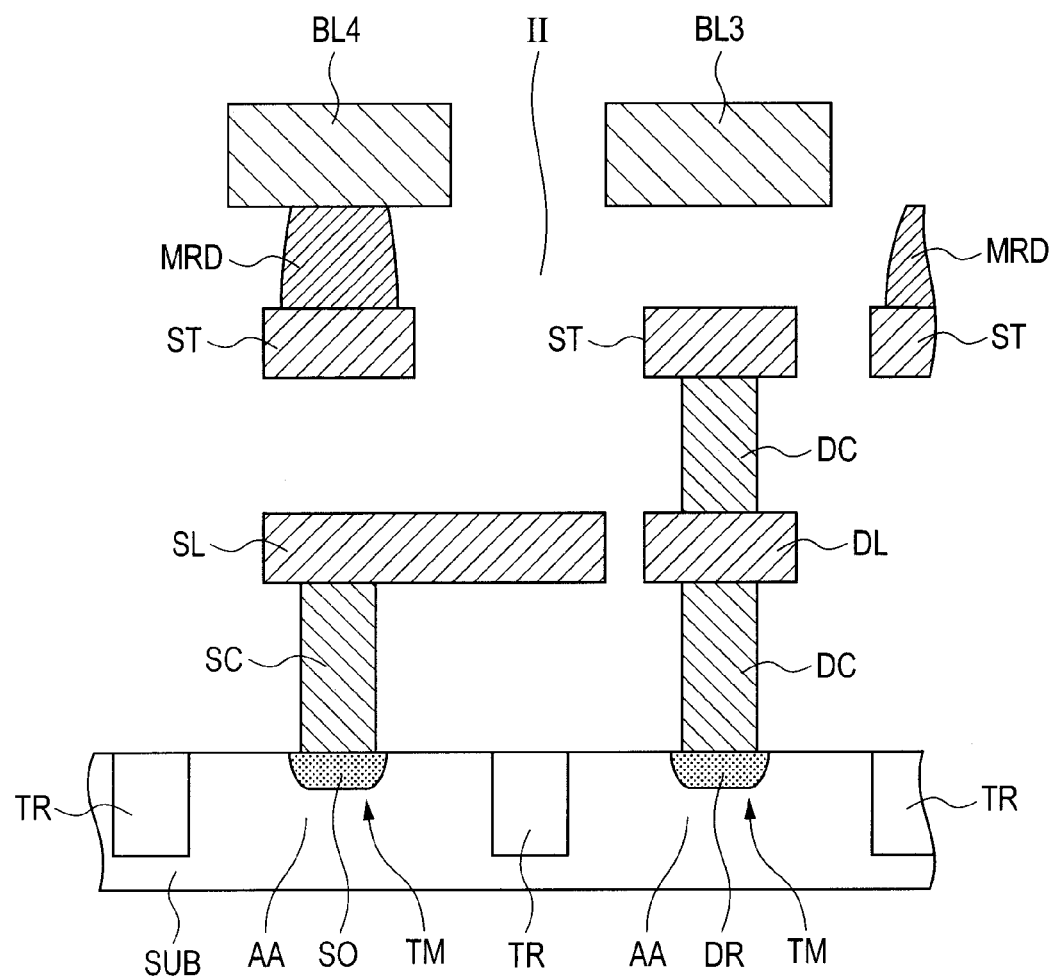
FIG. 101 is a schematic sectional view of the memory cell area in FIG. 99, taken along line CI-CI of FIG. 99.

As illustrated in FIG. 99 to FIG. 101, the memory cell area of STT-MTAM including perpendicular magnetization magnetoresistive elements has substantially the same configuration as the memory cell area of the STT-MRAM in the third example of the fifth embodiment illustrated in, for example, FIG. 92. Though not shown in the drawing, the configuration of SLs and the layers therebelow in each memory cell in FIG. 99 may be the same configuration as in, for example, FIG. 92. However, the perpendicular magnetization magnetoresistive element MRD need not have a high aspect ratio (other than 1) as viewed in a plane unlike the in-plane magnetization magnetoresistive element MRD. The perpendicular magnetization magnetoresistive element is different from the in-plane magnetization magnetoresistive element in this respect. The other configuration elements in the reference example in FIG. 99 are all in accordance with the configuration elements described in relation to the first embodiment.

The perpendicular magnetization magnetoresistive element does not have a planar shape with a high aspect ratio (other than 1). Even in this case, it is desirable that the magnetoresistive elements MRD, the drain contacts DC, and the source contacts SC, not shown, should be arranged in a staggered configuration as illustrated in FIG. 99. This increases the following as in, for example, the third embodiment: the degree of freedom in layout for arranging the magnetoresistive element MRD and drain contact DC in each memory cell so that the planar distance between them is substantially identical is enhanced. Therefore, it is possible to reduce variation in the functionality, such as electrical characteristics, of the magnetoresistive element MRD from to memory cell to memory cell and make more stable the functionality of the entire memory cell area.

As in, for example, the third embodiment, the distance between the magnetoresistive element MRD and drain contact DC in each memory cell is increased by arranging the source contacts SC and the drain contacts DC in a staggered configuration. Because of this, the following can be implemented even when the microminiaturization of semiconductor devices is advanced in the future: the favorable flatness of each magnetoresistive element MRD can be maintained by ensuring the planar distance between the magnetoresistive element MRD and the drain contact DC.

Sixth Embodiment

The sixth embodiment of the invention is different from each of the above-mentioned embodiments in the mode of each magnetoresistive element. Hereafter, description will be given to the configuration of this embodiment with reference to FIG. 102 to FIG. 118.

Figure 102:
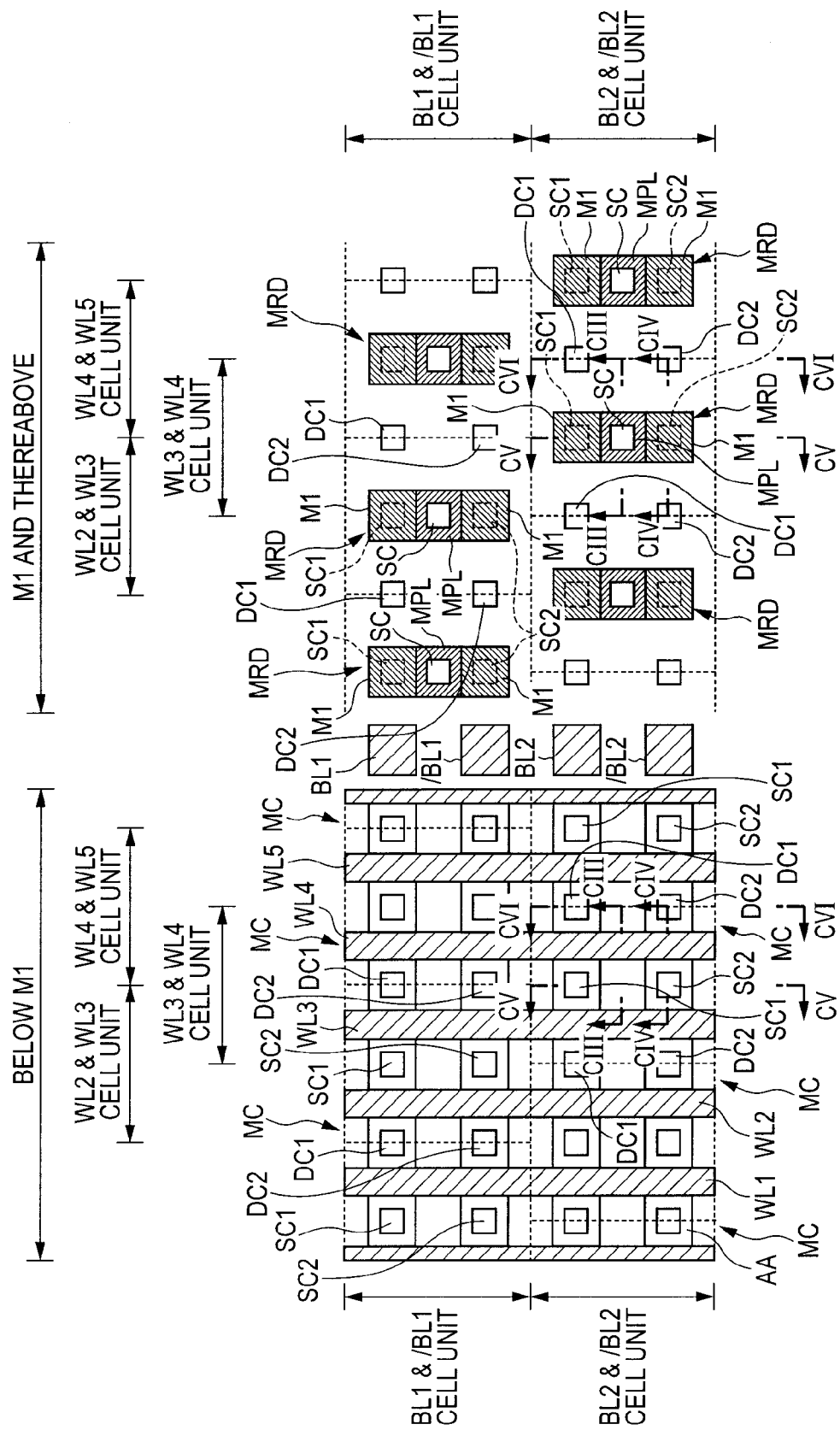
FIG. 102 is a plan view illustrating in detail the configuration of a memory cell area in a semiconductor device in a first example of a sixth embodiment of the invention.

In this embodiment, as illustrated in FIG. 102, the following magnetoresistive element is used as a magnetoresistive element MRD of such a type that recorded information is written by using spin torque to move a domain wall in place of the in-plane magnetization magnetoresistive element: a so-called domain wall motion magnetoresistive element MRD.

In FIG. 102, the configuration of the lower layers closer to the semiconductor substrate SUB than the domain wall motion layer M1 of the magnetoresistive element MRD (domain wall motion magnetoresistive element) is shown under "BELOW M1" on the left. That is, in the layers below each magnetoresistive element MRD, each active region AA of the semiconductor substrate, word lines WL1 to WL5 (third wiring), source contacts SC1, SC2, drain contacts DC1, DC2, and the like are formed.

In FIG. 102, the following configuration is mainly shown together with source contacts SC1, drain contacts DC1, and the like under "M1 AND THEREABOVE" on the right: the configuration of the magnetoresistive elements MRD and the upper layers farther from the semiconductor substrate SUB than they are. The areas encircled with a broken line in FIG. 102 form individual memory cells MC. Therefore, each magnetoresistive element MRD is so placed that the direction of its length as viewed in a plane is extended in the vertical direction of the drawing. Each magnetoresistive element MRD is in a long shape and its aspect ratio as viewed in a plane is other than 1. The shape of each magnetoresistive element MRD may be in the shape of rectangle or in a long shape, such as oval.

In FIG. 102, two bit lines BL1, /BL1 (BL2, /BL2) (first wiring) are placed in each memory cell MC with a distance in between as viewed in a plane as in, for example, the fourth embodiment. In FIG. 102, a word line extended in the vertical direction of the drawing is placed in each area sandwiched between a drain contact DC1, DC2 and a source contact SC1, SC2 in the horizontal direction of the drawing as in, for example, the fifth embodiment.

In this embodiment, a ground wiring GND is placed especially in a layer above M1. The ground wiring GND is a wiring with a potential of 0 and it functions similarly to a source line in readout operation in STT-MRAM including in-plane magnetization magnetoresistive elements. It is desirable that the ground wiring GND should be formed of a conductive film of, for example, copper like the other wirings, such as bit lines.

Also in FIG. 102, the bit line BL1 (first wiring) and the like are actually arranged so that they are extended throughout the area above M1 in FIG. 102 in the horizontal direction and electrically coupled with the magnetoresistive elements MRD. In FIG. 102, however, they are independently shown at the central part for facilitating visualization. The ground wirings GND are also actually extended so that they overlap with each memory cell MC as viewed in a plane; however, this diagrammatic representation is omitted in FIG. 102.

In this embodiment, the magnetoresistive elements MRD, drain contacts DC1, DC2, and source contacts SC1, SC2 are arranged in a staggered configuration with respect to the individual memory cells MC. For this reason, two magnetoresistive elements MRD adjoining to each other in the vertical direction, or the direction of length of each magnetoresistive element MRD (first direction), are placed as follows: they are placed in different coordinates in the horizontal direction, or the direction (second direction) intersecting with the first direction. In FIG. 102, a pair of drain contacts DC1, DC2 are placed in proximity to the area where the respective boundary portions of a pair of memory cells MC adjoining to each other overlap with each other.

In this embodiment, it may be considered that the paired drain contacts DC1, DC2 respectively form the memory cell MC placed on the left of each of them. Or, in this embodiment, it may be considered that the following two pairs of drain contacts form a single memory cell MC: a pair of drain contacts DC1, DC2 located on both side of the vicinity of the area where the boundary portions of a pair of memory cells MC adjoining to each other in the left and right directions in FIG. 102 overlap with each other; and a pair of drain contacts DC1, DC2 adjoining thereto (for example, on the left side in FIG. 102). Whichever way of thinking is used, two word lines are extended in each memory cell MC.

As illustrated in the sectional views in FIG. 103 to FIG. 106, a transistor TM (switching element) is formed in each active region AA over the main surface of the semiconductor substrate SUB. Above the transistor TM, a magnetoresistive element MRD including a magnetization pinned layer MHL1, MHL2, a domain wall motion layer M1, a tunnel insulating layer MTL, and a magnetization pinned layer MPL is placed. Each magnetoresistive element MRD (magnetization pinned layer MPL) in FIG. 102 and a ground wiring GND are electrically coupled with each other through a source contact SC. The source regions SO1, SO2 and the domain wall motion layer M1 are electrically coupled with each other through a source contacts SC1, SC2. However, the magnetization pinned layers MHL1, MHL2 are interposed between the source contacts SC1, SC2 and the domain wall motion layer M1. The drain regions DR1, DR2 and a bit line are electrically coupled with each other through a drain contact DC1, DC2.

Also in FIG. 102 to FIG. 106, the magnetoresistive elements MRD and the drain contacts DC1, DC2 are so arranged that they do not overlap with (are away from) each other as viewed in a plane.

Figure 107:
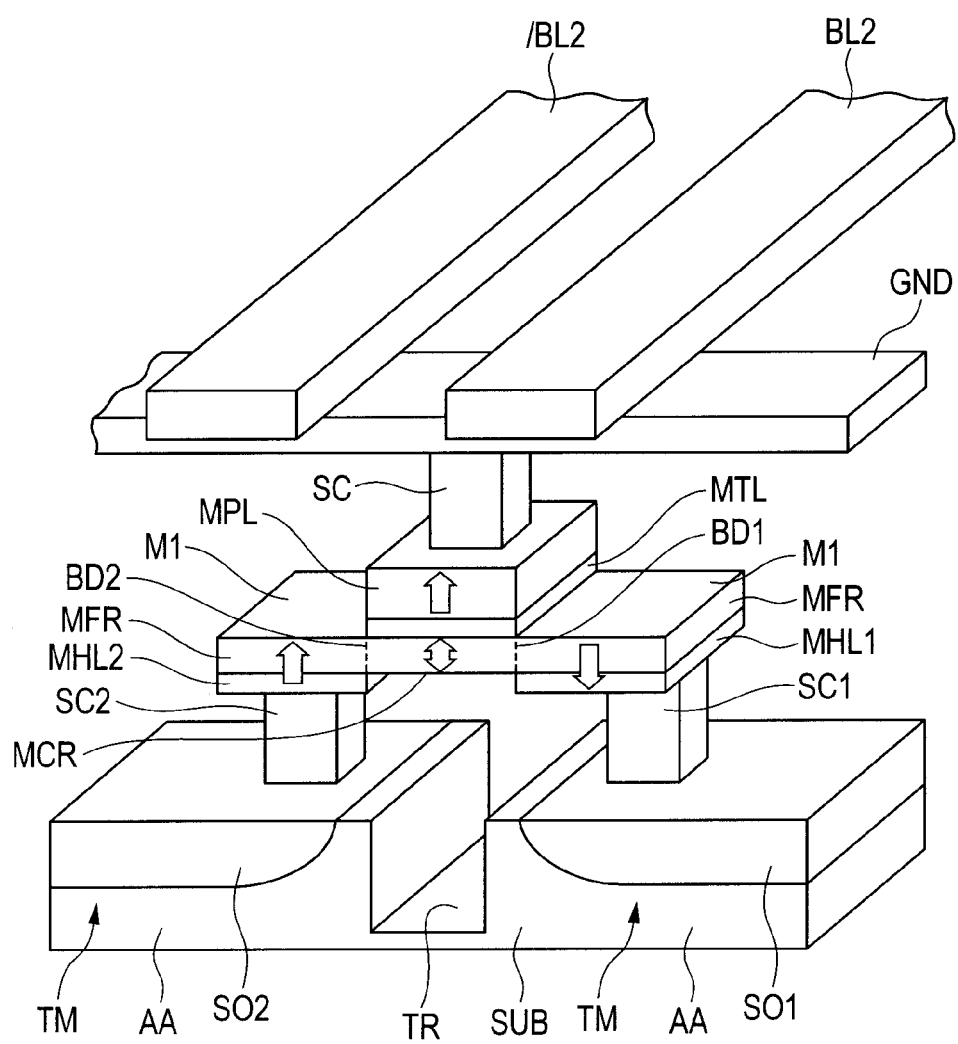
FIG. 107 is a schematic perspective view illustrating the configuration of a memory cell in which the magnetoresistive elements illustrated in FIG. 102 to FIG. 106 are formed.
Figure 108:
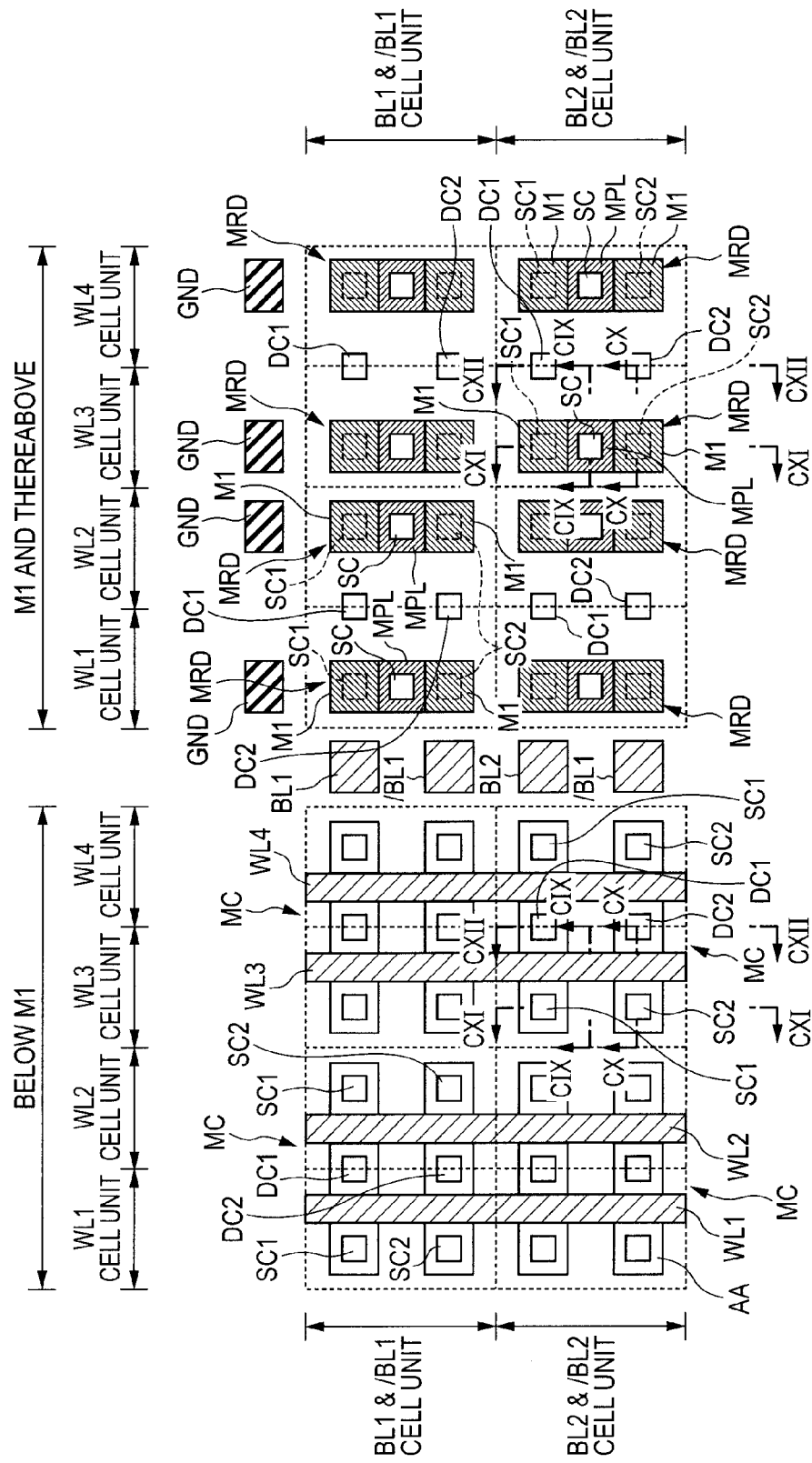
FIG. 108 is a plan view illustrating in detail the configuration of a memory cell area in a semiconductor device in a comparative example to the first example of the sixth embodiment of the invention.
Figure 109:
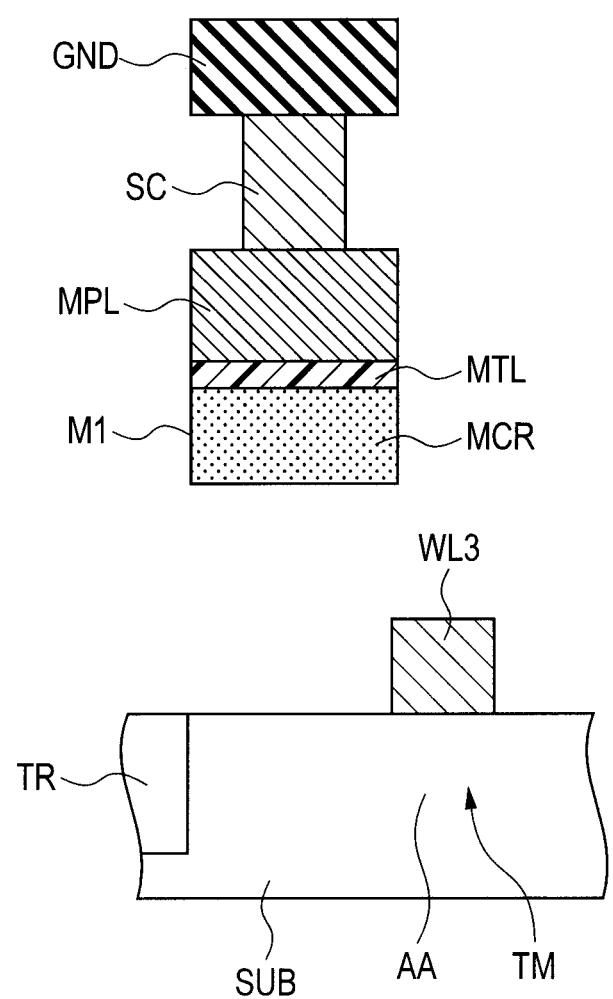
FIG. 109 is a schematic sectional view of the memory cell area in FIG. 108, taken along line CIX-CIX of FIG. 108.
Figure 110:
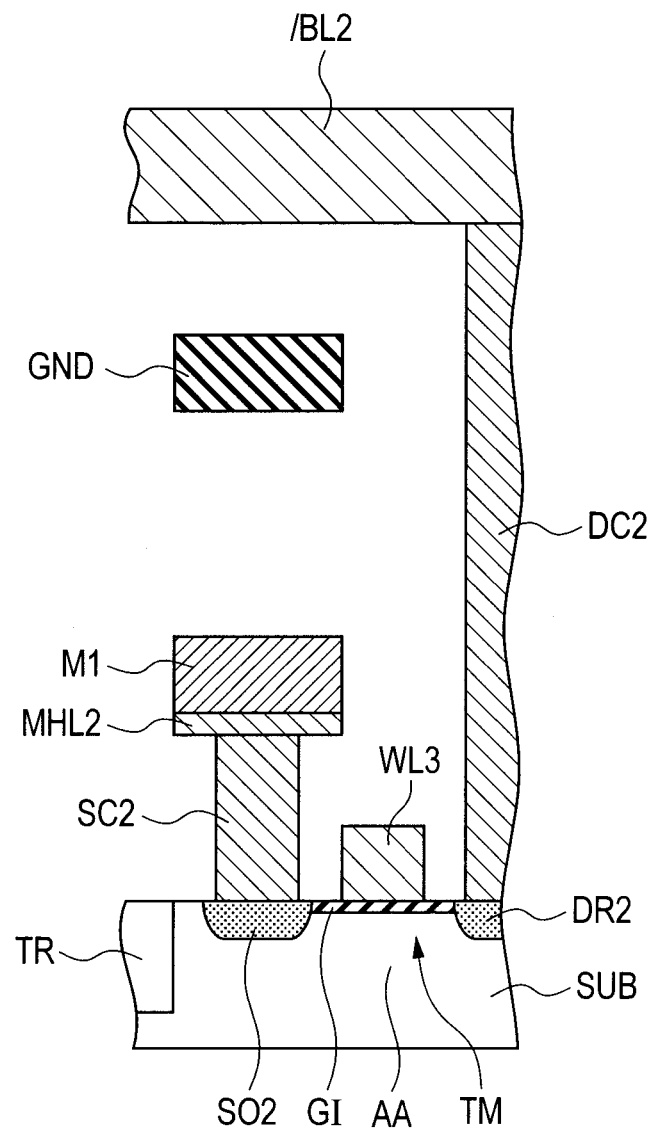
FIG. 110 is a schematic sectional view of the memory cell area in FIG. 108, taken along line CX-CX of FIG. 108.
Figure 111:
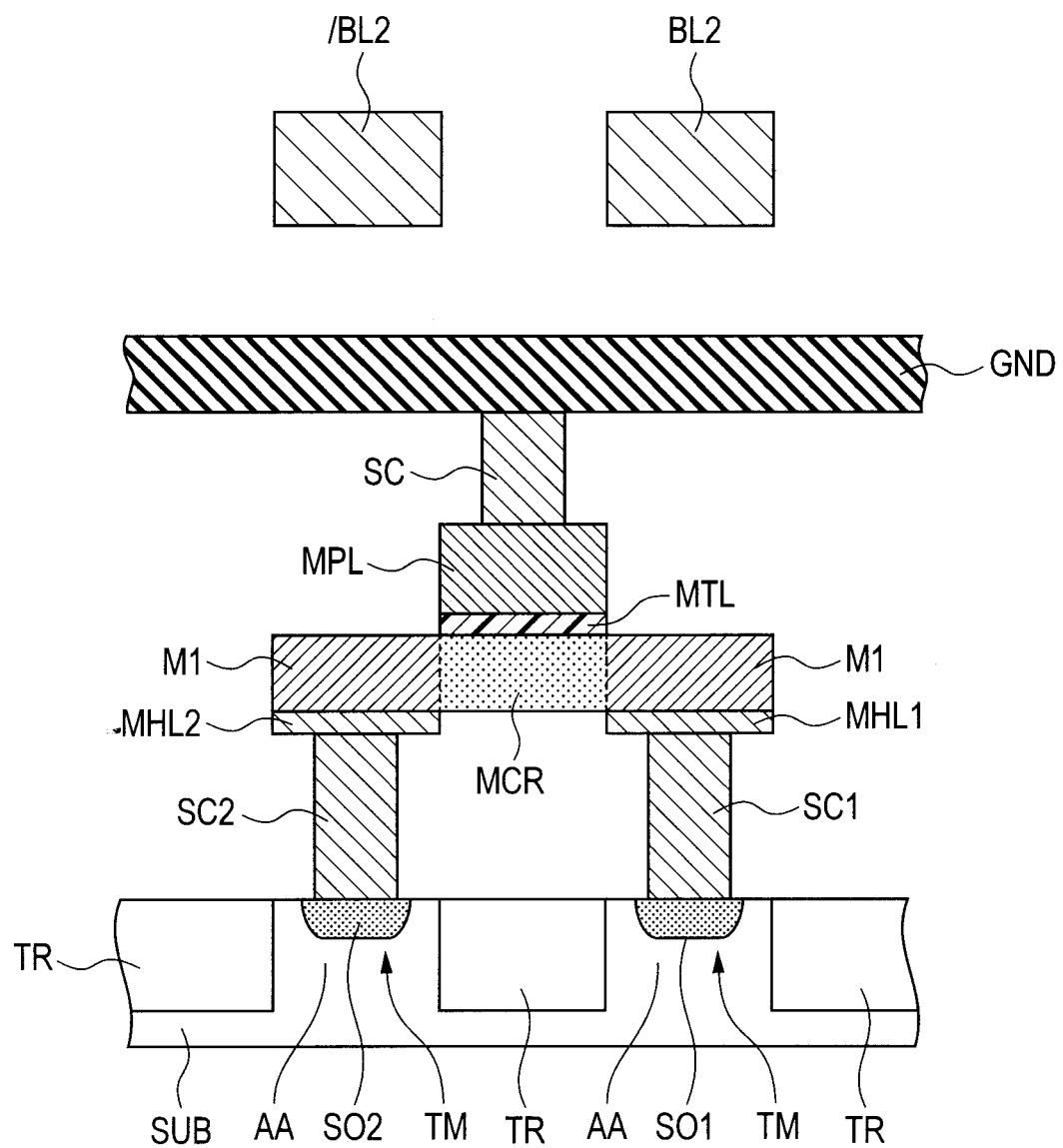
FIG. 111 is a schematic sectional view of the memory cell area in FIG. 108, taken along line CXI-CXI of FIG. 108.
Figure 112:
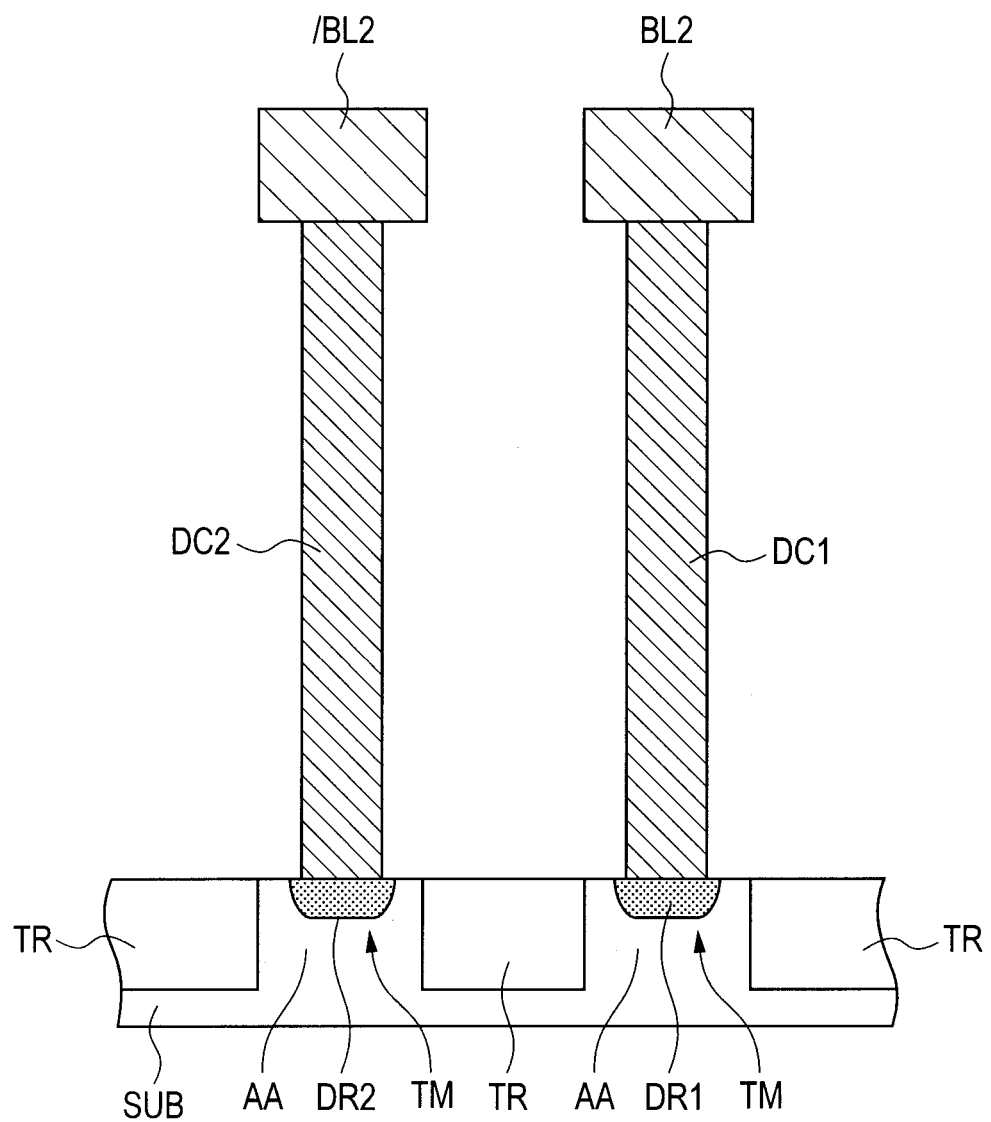
FIG. 112 is a schematic sectional view of the memory cell area in FIG. 108, taken along line CXII-CXII of FIG. 108.

FIG. 107 three-dimensionally illustrates the configuration of a memory cell illustrated in FIG. 102 to FIG. 106. As illustrated in FIG. 107 and FIG. 102 to FIG. 106, a single domain wall motion magnetoresistive element MRD has a configuration in which a domain wall motion layer M1, a tunnel insulating layer MTL, and a magnetization pinned layer MPL are laminated in this order; and this magnetoresistive element is electrically coupled with the source regions SO1, SO2 of two access transistors TM through two source contacts SC1, SC2 with magnetization pinned layers MHL1, MHL2 respectively in between. Each domain wall motion magnetoresistive element MRD is electrically coupled with two bit lines BL1, /BL1 (BL2, /BL2) through two drain contacts DC1, DC2.

The domain wall motion layer M1 includes: a domain wall motion region MCR extended in the vertical direction of FIG. 102 to FIG. 106 as viewed in a plane; and regions (magnetization fixation regions MFR), other than the domain wall motion region MCR, extended in the horizontal direction of FIG. 102 to FIG. 106 as viewed in a plane.

Among them, the domain wall motion region MCR is changed in the direction of magnetization according to the direction of a current passed through the region like the free layer MFL of the in-plane magnetization magnetoresistive element. (Refer to FIG. 9.) The domain wall motion region MCR is in contact with the under surface of the magnetization pinned layer MPL opposed thereto with the tunnel insulating layer MTL in between. The magnetization fixation region MFR in contact with the fixation layers MHL1, MHL2 is constant in the direction of magnetization at all times like the magnetization pinned layer MPL of the in-plane magnetization magnetoresistive element. (Refer to FIG. 9.) In other words, the magnetization fixation region MFR is part of the domain wall motion layer M1 and its direction of magnetization is fixed. The magnetization pinned layers MHL1, MHL2 are placed to fix the direction of magnetization of the domain wall motion layer M1 (to form the magnetization fixation region MFR).

Specifically, it is desirable that the fixation layers MHL1, MHL2 should be a film of single metal or alloy comprised of one or more selected from a group made up of cobalt (Co) and platinum (Pt). It is desirable that the domain wall motion layer M1 including the domain wall motion region MCR and the magnetization fixation region MFR should be the following film: a film of single metal or alloy comprised of one or more selected from a group made up of cobalt (Co) and nickel (Ni).

It is desirable that the tunnel insulating layer MTL should be an insulating film comprised of any of aluminum oxide $(AlO_x)$, magnesium oxide (MgO), and hafnium oxide (HfO). It is desirable that the magnetization pinned layer MPL in this embodiment should be a thin film formed of a ferromagnetic layer. Specifically, it is desirable that the magnetization pinned layer MPL should be the following film: a film of single metal or alloy comprised of one or more selected from a group made up of cobalt (Co), iron (Fe), boron (B), ruthenium (Ru), platinum (Pt), and manganese (Mn).

Figure 103:
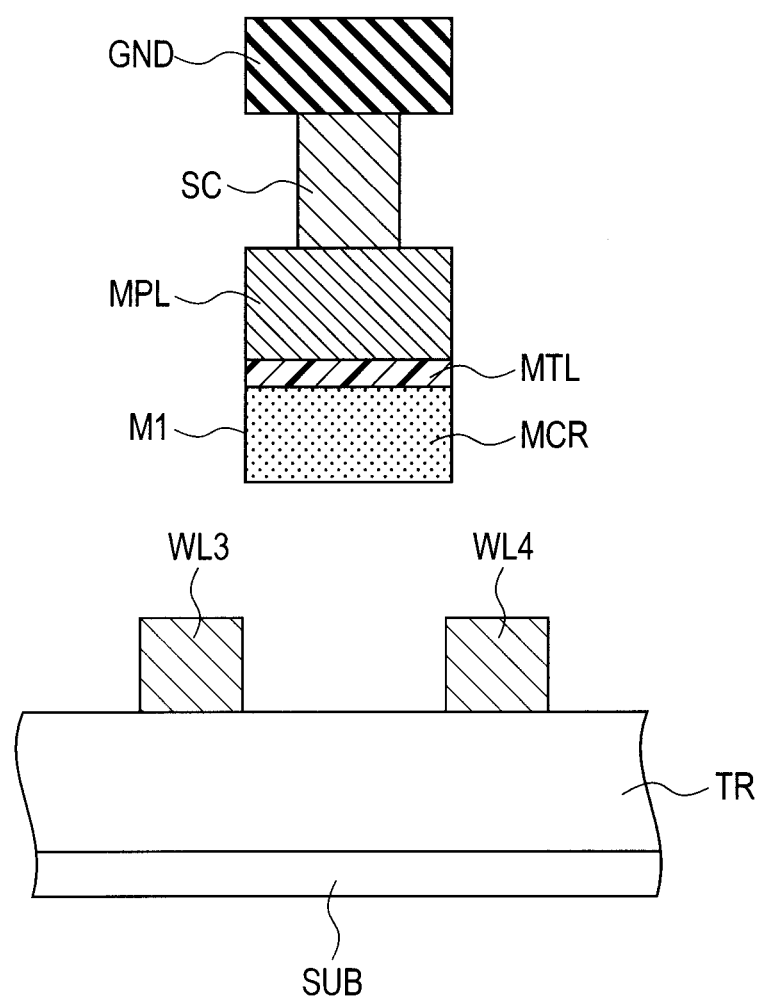
FIG. 103 is a schematic sectional view of the memory cell area in FIG. 102, taken along line CIII-CIII of FIG. 102.
Figure 104:
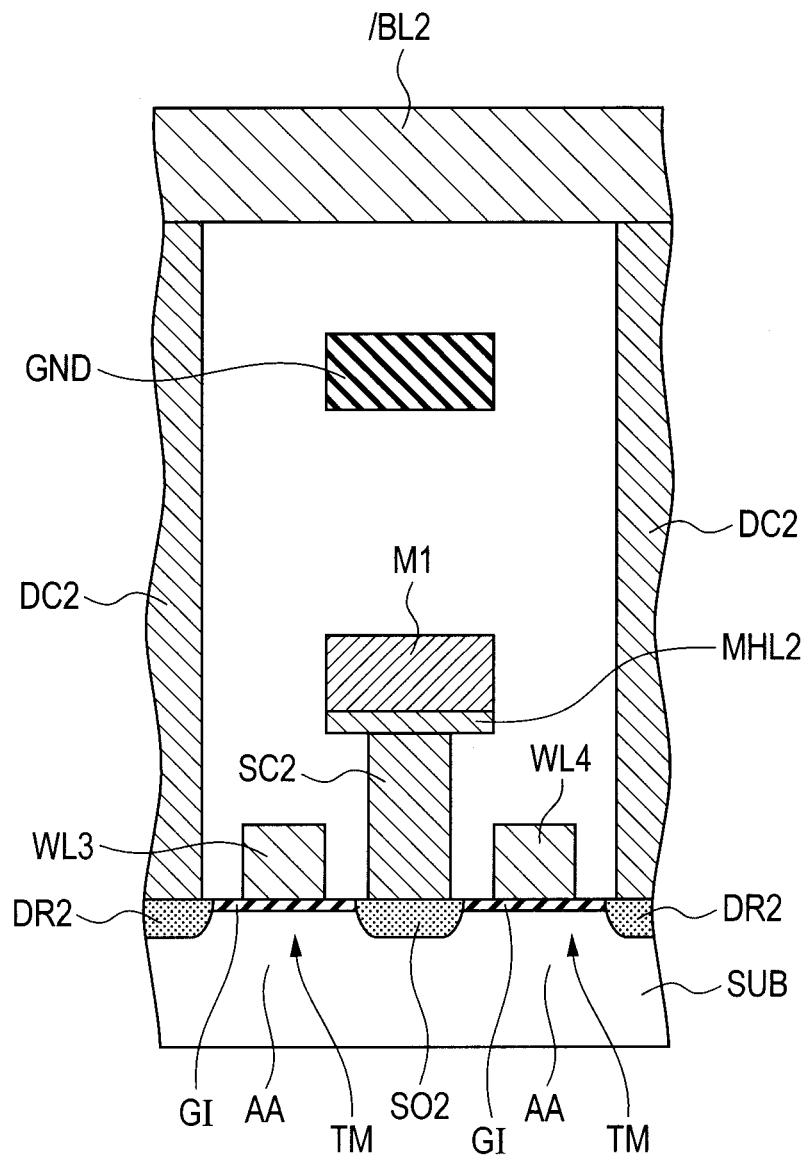
FIG. 104 is a schematic sectional view of the memory cell area in FIG. 102, taken along line CIV-CIV of FIG. 102.
Figure 105:
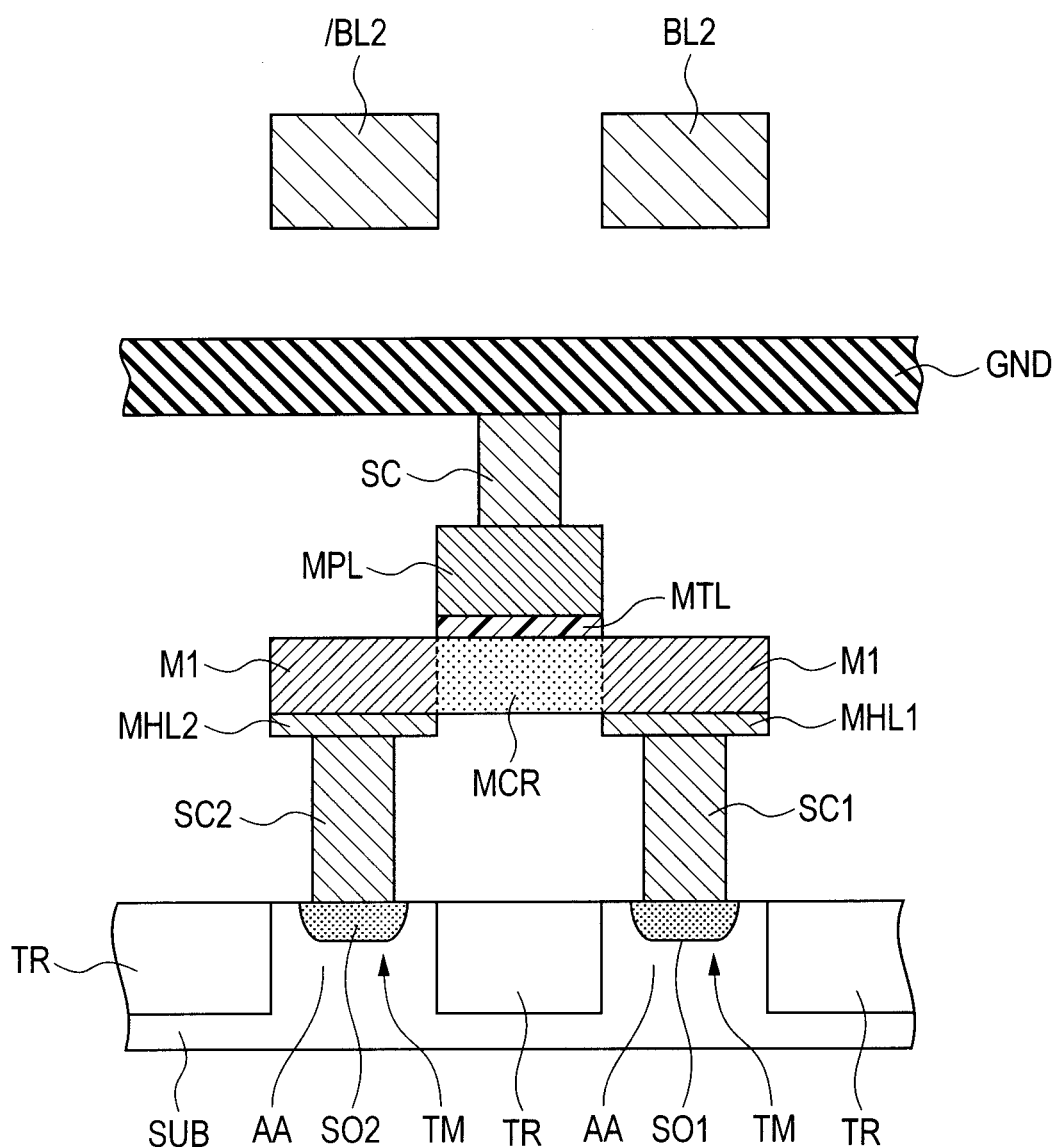
FIG. 105 is a schematic sectional view of the memory cell area in FIG. 102, taken along line CV-CV of FIG. 102.
Figure 106:
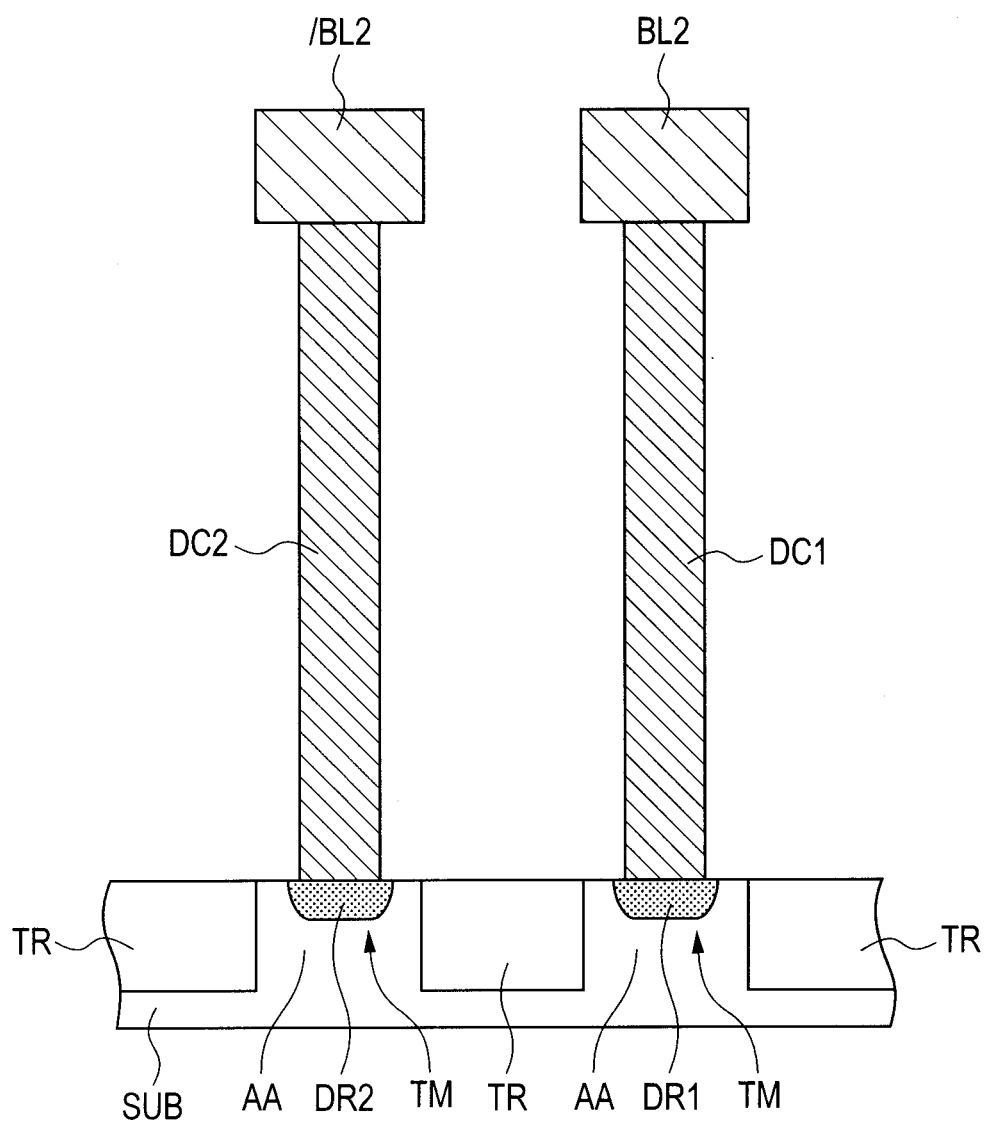
FIG. 106 is a schematic sectional view of the memory cell area in FIG. 102, taken along line CVI-CVI of FIG. 102.

In FIG. 103, FIG. 105, and FIG. 107, the magnetization pinned layer MPL in this embodiment is depicted as a single layer. In general, however, the following structures are used for the magnetization pinned layer MPL: a two-layered structure in which a ferromagnetic layer is laminated over an antiferromagnetic layer; a four-layered structure in which a ferromagnetic layer, a nonmagnetic layer, and a ferromagnetic layer are laminated in this order over an antiferromagnetic layer; a five-layered structure; and the like. However, the number of laminated layers or the order in which layers are laminated is not limited to the foregoing. For example, the magnetization pinned layer MPL in FIG. 103, FIG. 105, and FIG. 107 can be configured by laminating alloy layers of CoFeB, Ru, CoPt, Ru, and CoPt in this order.

Detailed description will be given to the principle through which information is rewritten in the domain wall motion magnetoresistive element MRD.

The domain wall motion layer M1 is a magnetic layer having magnetic properties. Data is written to the magnetoresistive element MRD by the direction of magnetization of, especially, the domain wall motion region MCR of the domain wall motion layer M1 being changed according to the direction of current passed through the domain wall motion layer M1. To describe a concrete example, it will be assumed that the following state is established in, for example, FIG. 107: the magnetization pinned layer MPL is magnetized upward perpendicularly to the main surface of the semiconductor substrate; and the fixation layer MHL2 and the fixation region MFR located thereabove are magnetized upward and the fixation layer MHL1 and the fixation region MFR located thereabove are magnetized downward.

When electrons flow from the left to the right of the domain wall motion layer M1, that is, from the source contact SC2 to the source contact SC1 along the main surface of the semiconductor substrate, the following takes place: only spin polarization electrons having upward spin in the drawing pass through the domain wall motion region MCR. Then the domain wall equivalent to the boundary between regions different in the direction of magnetization is displaced to the boundary BD1 in the drawing. As a result, the direction of magnetization of the domain wall motion region MCR becomes upward and this is substantially the same as the direction of magnetization of the magnetization pinned layer MPL. At this time, the resistance of the magnetoresistive element MRD is low.

Meanwhile, when electrons flow from the right to the left of the domain wall motion layer M1, that is, from the source contact SC1 to the source contact SC2 along the main surface of the semiconductor substrate, the following takes place: only spin polarization electrons having downward spin in the drawing passes through the domain wall motion region MCR. Then the domain wall equivalent to the boundary between regions different in the direction of magnetization is displaced to the boundary BD2 in the drawing. As a result, the direction of magnetization of the domain wall motion region MCR becomes downward and this is opposite to the direction of magnetization of the magnetization pinned layer MPL. At this time, the resistance of the magnetoresistive element MRD is high.

The above flow of electrons (current) is supplied by a potential difference between the selected magnetoresistive element MRD and a pair of bit lines (for example, BL1 and /BL1) when a selected word line is turned on.

When information written to the domain wall motion layer M1 is read, the following takes place with a ground wiring GND electrically coupled with the magnetization pinned layer MPL making up the magnetoresistive element MRD taken as a source: a current flows from the bit lines to the ground wiring GND by way of the access transistor TM, domain wall motion region MCR, tunnel insulating layer MTL, and magnetization pinned layer MPL. At this time, the direction of magnetization of the magnetoresistive element MRD by detecting the electrical resistance varied according to the direction of magnetization of the magnetoresistive element MRD (domain wall motion region MCR).

The configuration of this embodiment illustrated in FIG. 102 to FIG. 107 is different from the configuration of, for example, the second embodiment in FIG. 30 in each of the above-mentioned respects. Description will be given to the action and effect of this embodiment with reference to FIG. 108 to FIG. 112 illustrating a comparative example to this embodiment.

As illustrated in FIG. 108 to FIG. 112, the memory cell area in the comparative example to this embodiment also has substantially the same configuration as the memory cell area in this embodiment illustrated in FIG. 102 to FIG. 106. In the comparative example in FIG. 108, however, the magnetoresistive element MRD, drain contacts DC1, DC2, or source contacts SC1, SC2 in individual memory cells MC are not arranged in a staggered configuration. That is, two magnetoresistive elements MRD adjoining to each other in the vertical direction of FIG. 102 are so arranged that they are on an identical straight line extended in the vertical direction.

Each magnetoresistive element MRD in this embodiment also has a long shape and its aspect ratio as viewed in a plane is other than 1 like the magnetoresistive elements MRD in each of the other embodiments mentioned above. As in each of the above embodiments, for this reason, the following can be implemented even when the aspect ratio of each magnetoresistive element MRD is much larger than 1: short-circuiting between magnetoresistive elements MRD can be suppressed without increasing the area of each memory cell MC as viewed in a plane. Therefore, it is possible to reduce the value of current used to read/write information from/to a magnetoresistive element MRD and suppress read/write errors without increasing the area of each memory cell MC as viewed in a plane or reducing the number of integrated memory cells MC. At the same time, it is possible to provide a semiconductor device having an integrated circuit in which short-circuiting between magnetoresistive elements MRD is suppressed.

Also in this embodiment, the source contacts and the drain contacts are also arranged in a staggered configuration. Similarly to the third embodiment, for this reason, the degree of freedom in layout for arranging the magnetoresistive element MRD and drain contact in each memory cell so that the planar distance between them is substantially identical is enhanced. Therefore, it is possible to reduce variation in the functionality, such as electrical characteristics, of the magnetoresistive element MRD from memory cell MC to memory cell MC and make more stable the functionality of the entire memory cell area. Even when the microminiaturization of semiconductor devices is advanced in the future, the following can be implemented: the favorable flatness of each magnetoresistive element MRD can be maintained by ensuring the planar distance between the magnetoresistive element MRD and the drain contact.

Also in this embodiment, as illustrated in FIG. 102, the following can be implemented by increasing the number of word lines as in the fifth embodiment: it is possible to increase the supply current of each transistor without increasing the area of each memory cell MC as in the fifth embodiment.

In this embodiment, it is desirable to take the measures illustrated in FIG. 113 to FIG. 118 to suppress short-circuiting between a ground wiring GND and a drain contact DC1, DC2: each ground wiring GND is so configured that it is bent and extended in the directions (fifth and sixth directions) in which the memory cells MC are arranged in an array. This is based on the same idea as that on which the configurations of the source lines in, for example, FIG. 49 to FIG. 52 are based. Based on this idea, the source lines are bent and extended in the directions in which the memory cells are arranged in an array to suppress short-circuiting between a source line and a drain contact.

Figure 113:
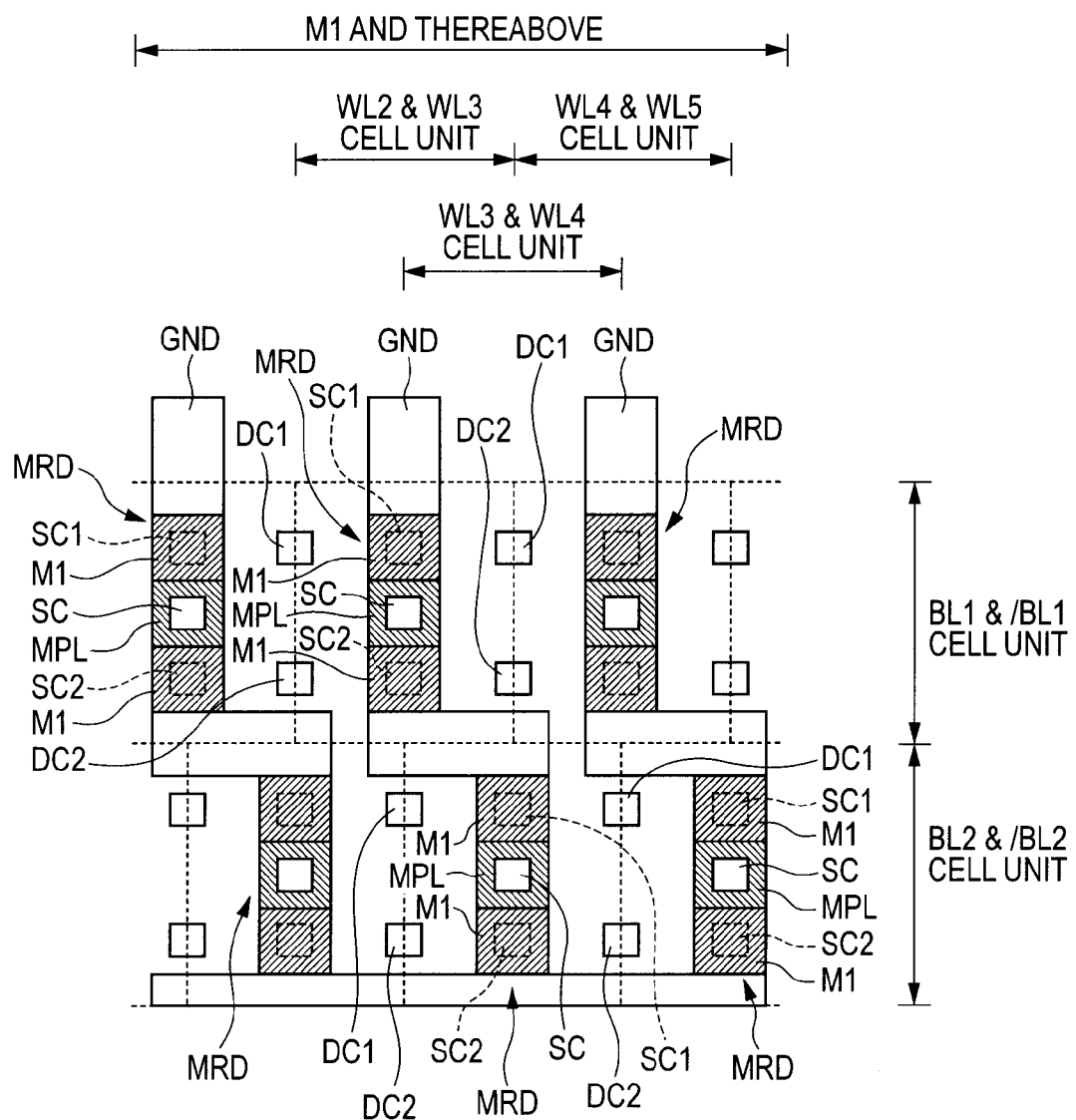
FIG. 113 is a schematic plan view of a first modification to the shape of the ground wiring in FIG. 102 as viewed in a plane, illustrating mainly the domain wall motion layer and the layers located thereabove.
Figure 114:
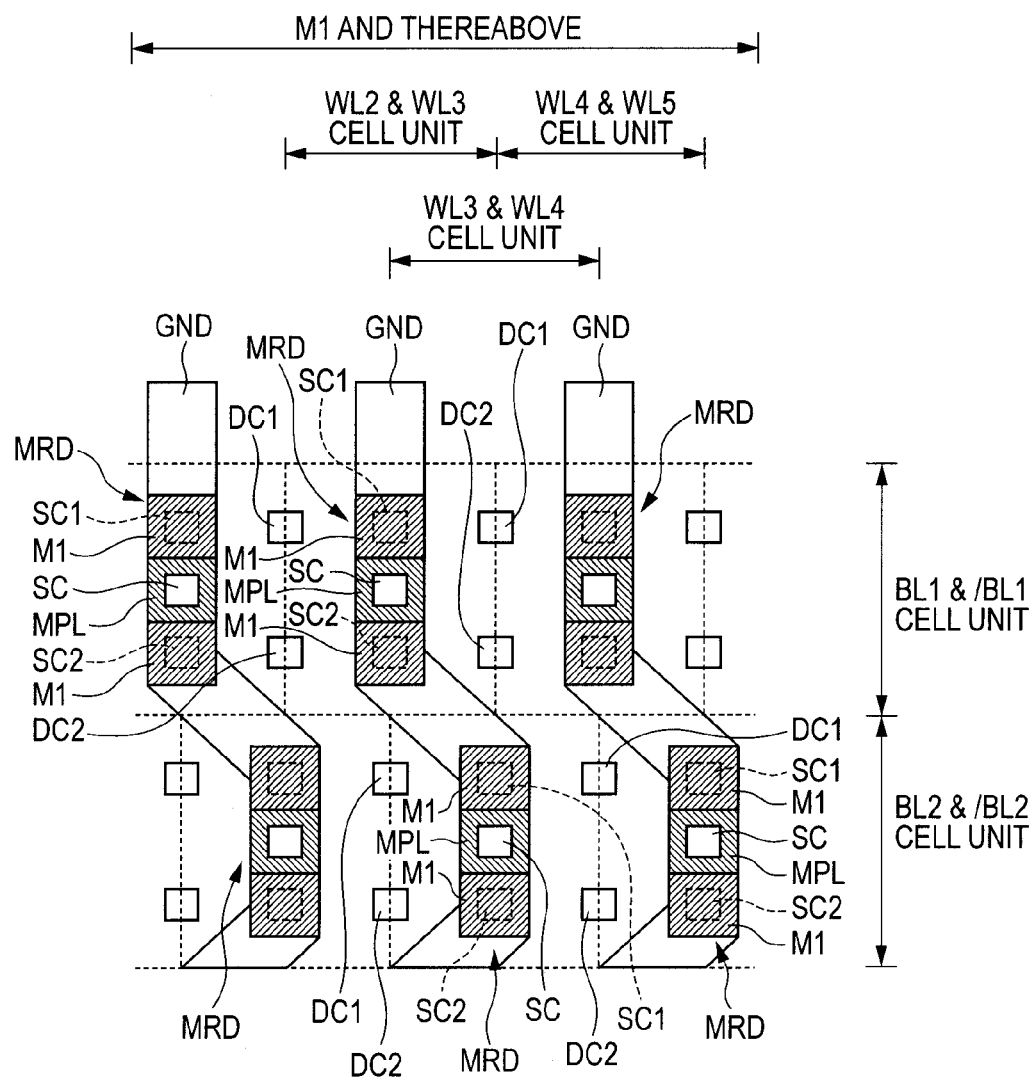
FIG. 114 is a schematic plan view of a second modification to the shape of the ground wiring in FIG. 102 as viewed in a plane, illustrating mainly the domain wall motion layer and the layers located thereabove.
Figure 115:
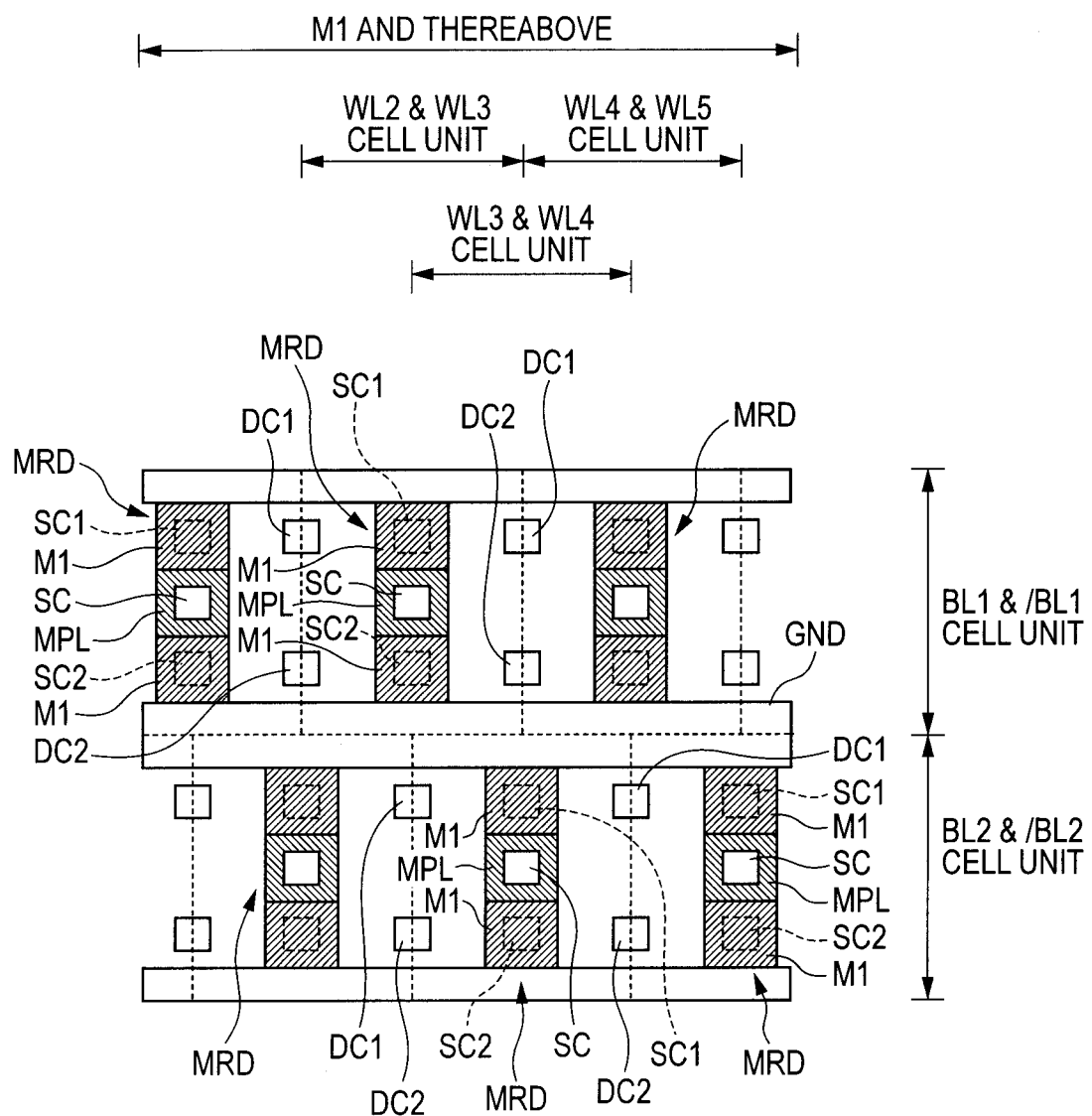
FIG. 115 is a schematic plan view of a third modification to the shape of the ground wiring in FIG. 102 as viewed in a plane, illustrating mainly the domain wall motion layer and the layers located thereabove.
Figure 116:
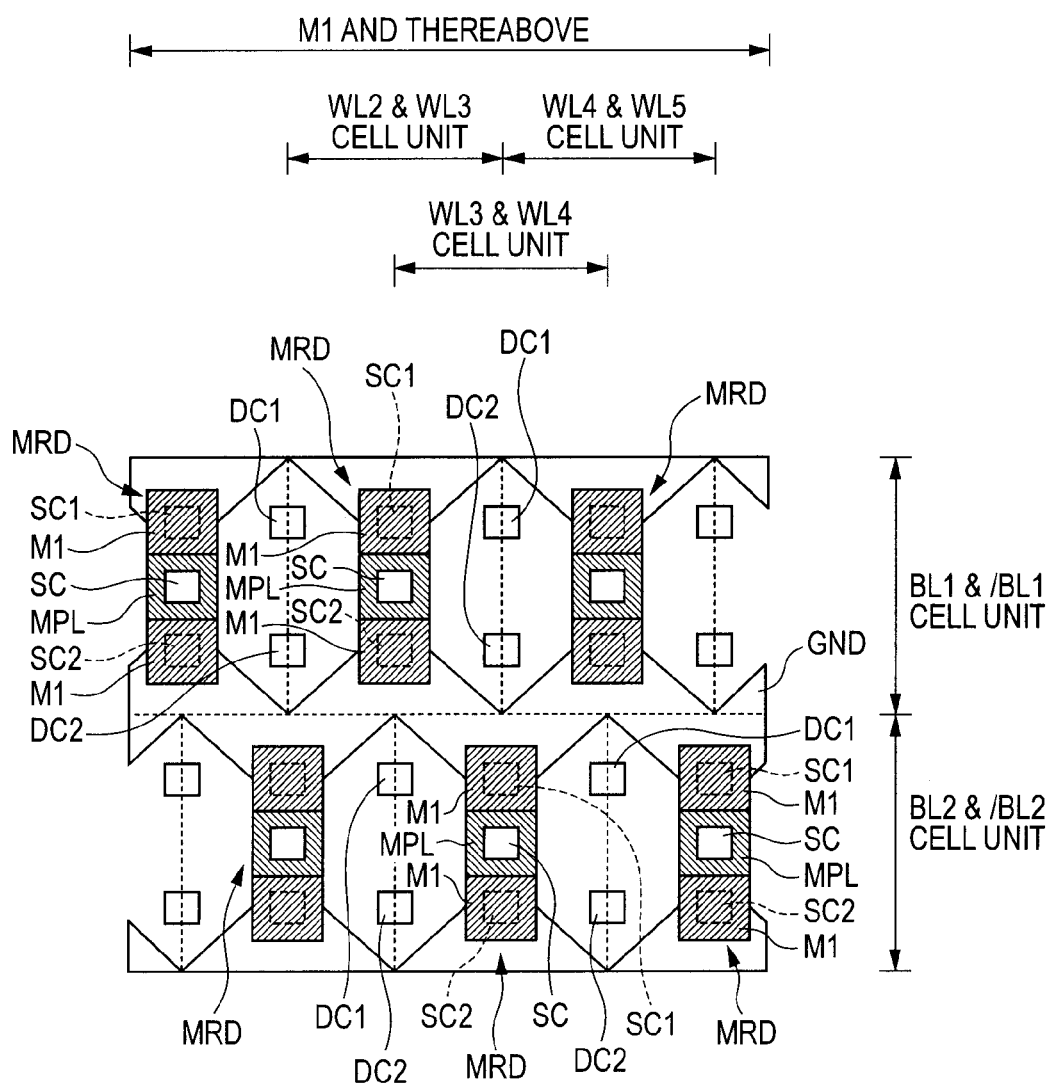
FIG. 116 is a schematic plan view of a fourth modification to the shape of the ground wiring in FIG. 102 as viewed in a plane, illustrating mainly the domain wall motion layer and the layers located thereabove.
Figure 117:
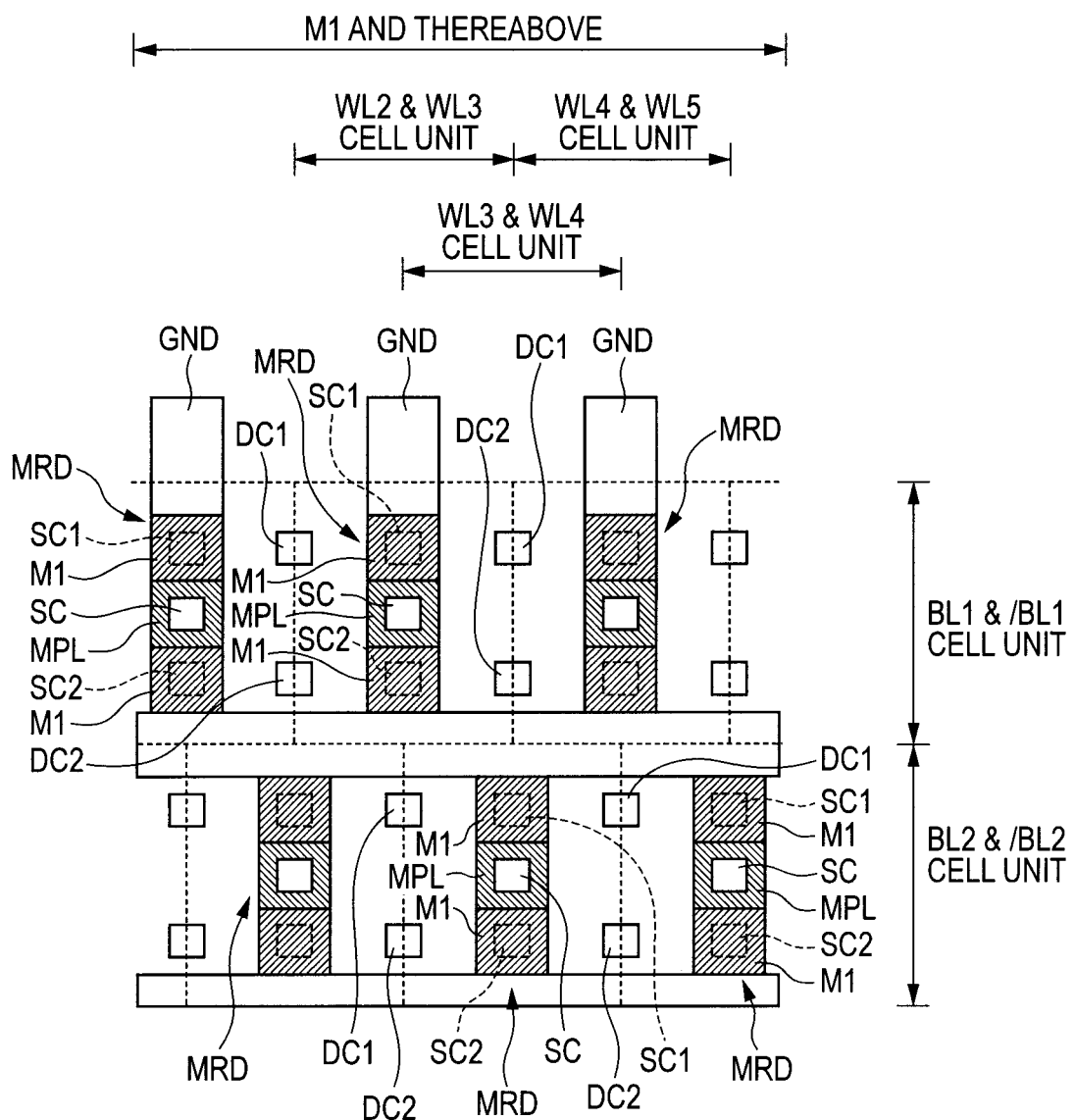
FIG. 117 is a schematic plan view of a fifth modification to the shape of the ground wiring in FIG. 102 as viewed in a plane, illustrating mainly the domain wall motion layer and the layers located thereabove.
Figure 118:
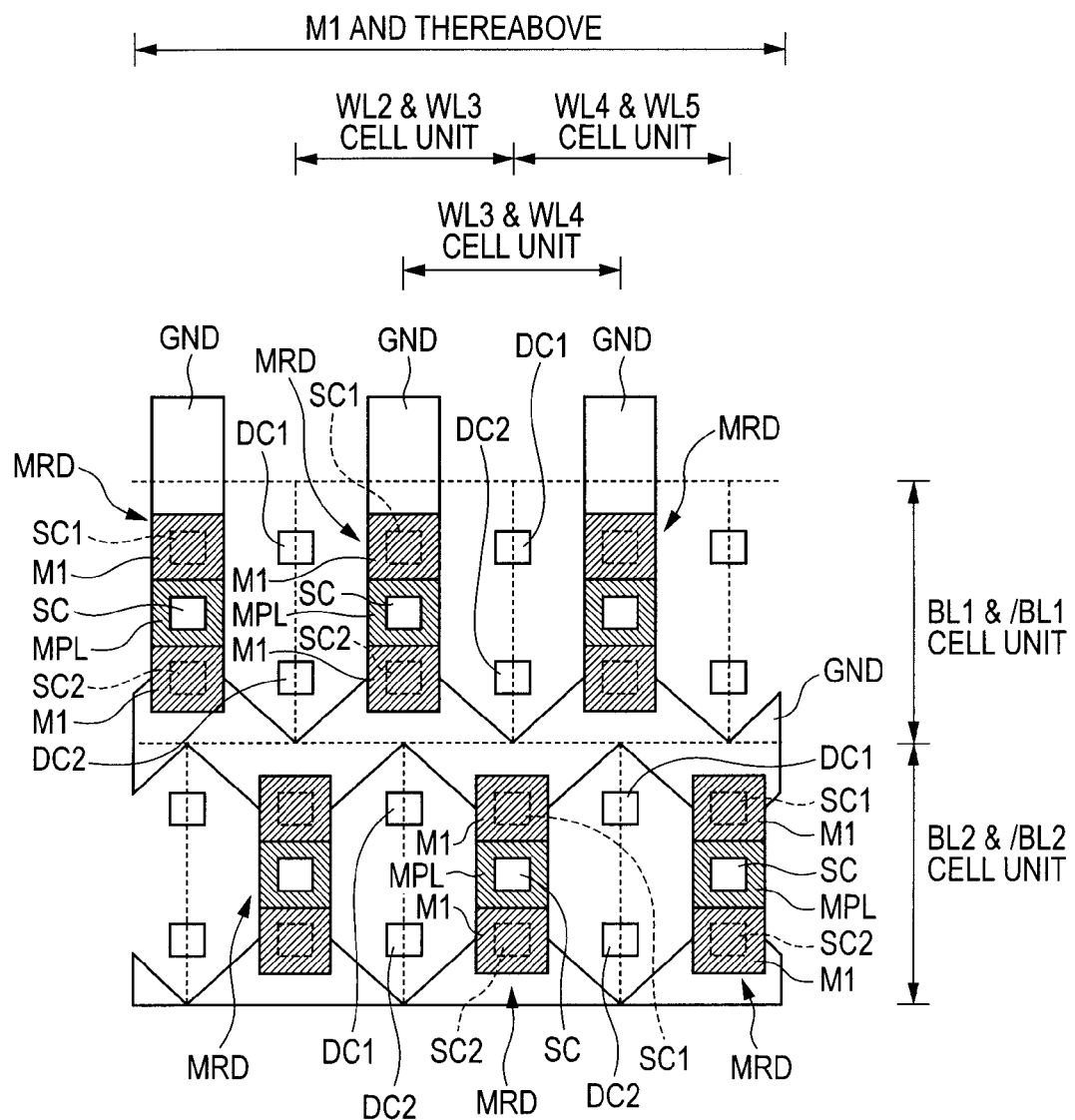
FIG. 118 is a schematic plan view of a sixth modification to the shape of the ground wiring in FIG. 102 as viewed in a plane, illustrating mainly the domain wall motion layer and the layers located thereabove.

As illustrated in FIG. 113 and FIG. 114, specifically, the ground wirings GND may have such a shape that they are extended in the vertical direction and overlap with source contacts (magnetoresistive elements MRD) arranged in a staggered configuration as viewed in a plane. Or, as illustrated in FIG. 115 and FIG. 116, the ground wirings GND may have such a shape that they are extended in the horizontal direction and overlap with source contacts (magnetoresistive elements MRD) arranged in a staggered configuration as viewed in a plane. Or, as illustrated in FIG. 117 and FIG. 118, the source lines SL may have such a shape that they are extended in the horizontal direction and in the vertical direction like mesh and overlap with source contacts SC arranged in a staggered configuration as viewed in a plane.

The sixth embodiment of the invention is different from the first to fifth embodiments of the invention only in each of the above-mentioned respects. That is, with respect to the sixth embodiment of the invention, configurations, conditions, procedures, effects, and the like that are not described above are all in accordance with the first to fifth embodiments of the invention. Therefore, the configuration of the sixth embodiment of the invention may be combined with any configuration that can be combined with the sixth embodiment in terms of functionality among the configurations described in relation to the first to fifth embodiments.

The embodiments disclosed here should be considered as examples in every respect and should not be considered as limitative. The scope of the invention is indicated by WHAT IS CLAIMED IS, not by the above description and the invention is intended to include all the modifications within the meaning and scope equivalent to WHAT IS CLAIMED IS.

The invention can be advantageously applied to semiconductor devices including spin torque written magnetoresistive elements.

What is claimed is:

1. A semiconductor device comprising:
a semiconductor substrate having a main surface;
a switching element including a source region and a drain region, placed over the main surface of the semiconductor substrate;
a flat plate-like lead-out wiring placed above the switching element;
a spin torque written in-plane magnetization magnetoresistive element, positioned above the lead-out wiring, whose magnetization state can be changed according to the direction of a current flow; and
a first wiring electrically coupled with the magnetoresistive element and extended toward the direction along the main surface,
wherein the aspect ratio as viewed in a plane of the magnetoresistive element is a value other than 1,
wherein in a memory cell area where a plurality of memory cells in which the magnetoresistive element and switching an element are electrically coupled with each other are arranged, a plurality of the magnetoresistive elements adjoining to each other in a first direction, or the direction of length of each the magnetoresistive element as viewed in a plane, are so arranged that the magnetoresistive elements are not on an identical straight line extended in the first direction, and
wherein in an identical memory cell, the lead-out wiring is so arranged that the lead-out wiring does not at least partly overlap with an active region of the switching element in the main surface of the semiconductor substrate as viewed in a plane.

2. The semiconductor device according claim 1,
wherein in an area where the first wiring overlaps with the magnetoresistive element as viewed in a plane, the width of the first wiring in the direction intersecting with the direction in which the first wiring is extended is wider than the width thereof in the areas other than the area of overlap.

3. The semiconductor device according to claim 2, further comprising:
a second wiring placed along the main surface and electrically coupling a plurality of the source contacts together,
wherein the center line of the second wiring is bent and extended in the third direction or the fourth direction.

4. The semiconductor device according to claim 2,
wherein of a pair of the memory cells adjoining to each other in the third direction, the source contact in one of the memory cells is placed in an area closer to the other of the memory cells than to the center of the memory cell in the third direction.

5. The semiconductor device according to claim 2,
wherein the drain contact is not placed on a straight line joining together a plurality of the source contacts in the fourth direction.

6. The semiconductor device according to claim 2,
wherein the first wiring is so extended that the first wiring overlaps with the memory cells as viewed in a plane, and
wherein two or more of the first wirings are placed in a plane along the main surface for the single memory cell at a distance in between in the direction intersecting with the direction in which the first wirings are extended.

7. The semiconductor device according to claim 2,
wherein a third wiring for selecting a row of the memory cells arranged as viewed in a plane is placed over the main surface of the semiconductor substrate, and
wherein the source region and the drain region are sandwiched between two of the third wirings as viewed in a plane.

8. A semiconductor device comprising:
a semiconductor substrate having a main surface;
a switching element placed over the main surface of the semiconductor substrate;
a spin torque written domain wall motion magnetoresistive element positioned above the switching element and including a domain wall motion layer, extended toward the direction along the main surface, whose magnetization state can be changed according to the direction of a current flow and a magnetization pinned layer placed over the domain wall motion layer with a tunnel insulating layer in between; and
a first wiring electrically coupled with the domain wall motion layer and extended toward the direction along the main surface,
wherein the aspect ratio of the magnetoresistive element as viewed in a plane is a value other than 1, and
wherein in a memory cell area where a plurality of memory cells in which the magnetoresistive element and the switching element are electrically coupled with each other are arranged, a plurality of the magnetoresistive elements adjoining to each other in a first direction, or the direction of length of each the magnetoresistive element as viewed in a plane, are so arranged that the magnetoresistive elements are not on an identical straight line extended in the first direction; and
a ground wiring extended along the main surface and electrically coupled with the magnetoresistive element,
wherein the ground wiring is bent and extended in the memory cell area in a fifth direction and in a sixth direction in which the memory cells are arranged as viewed in a plane.

9. The semiconductor device according to claim 8,
wherein the source contact and the drain contact comprising each of a pair of the memory cells adjoining to each other in the first direction are so arranged that the source contact and the drain contact are not on a straight line extended in the first direction.

10. The semiconductor device according to claim 9,
wherein a third wiring for selecting a row of the memory cells arranged as viewed in a plane is placed over the main surface of the semiconductor substrate, and
wherein the source region and the drain region are sandwiched between two of the third wirings as viewed in a plane.

* * * * *